United States Patent [19]

Saitoh et al.

[11] Patent Number: 4,675,263

[45] Date of Patent: Jun. 23, 1987

[54] MEMBER HAVING SUBSTRATE AND LIGHT-RECEIVING LAYER OF A-SI:GE FILM AND A-SI FILM WITH NON-PARALLEL INTERFACE WITH SUBSTRATE

[75] Inventors: Keishi Saitoh, Ibaraki; Masahiro Kanai, Tokyo; Tetsuo Sueda, Chofu; Teruo Misumi, Kawasaki; Yoshio Tsuezuki, Toride; Kyosuke Ogawa, Tokyo, all of Japan

[73] Assignee: Canon Kabushiki Kaisha, Tokyo, Japan

[21] Appl. No.: 709,688

[22] Filed: Mar. 8, 1985

[30] Foreign Application Priority Data

| Mar. 12, 1984 | [JP] | Japan | 59-46859 |
| Mar. 13, 1984 | [JP] | Japan | 59-48579 |
| Mar. 16, 1984 | [JP] | Japan | 59-51400 |
| Mar. 26, 1984 | [JP] | Japan | 59-58005 |
| Mar. 28, 1984 | [JP] | Japan | 59-61338 |
| Mar. 28, 1984 | [JP] | Japan | 59-61339 |
| Mar. 29, 1984 | [JP] | Japan | 59-61969 |
| Mar. 29, 1984 | [JP] | Japan | 59-61970 |
| Mar. 30, 1984 | [JP] | Japan | 59-64970 |
| Apr. 2, 1984 | [JP] | Japan | 59-66586 |
| Apr. 3, 1984 | [JP] | Japan | 59-66136 |
| Aug. 30, 1984 | [JP] | Japan | 59-182280 |

[51] Int. Cl.$^4$ .......................................... G03G 5/082
[52] U.S. Cl. ........................................ 430/57; 430/95
[58] Field of Search ................ 357/2, 30, 16, 61; 430/56, 57, 64, 84, 95

[56] References Cited

U.S. PATENT DOCUMENTS

| 4,359,514 | 11/1982 | Shimizu et al. | 430/65 |
| 4,492,745 | 1/1985 | Mimura et al. | 430/67 |
| 4,514,483 | 4/1985 | Matsuura et al. | 430/84 |
| 4,517,269 | 5/1985 | Shimizu et al. | 357/2 |

FOREIGN PATENT DOCUMENTS

| 2733187 | 1/1978 | Fed. Rep. of Germany | 430/65 |
| 56150754 | 11/1981 | Japan | 430/65 |

*Primary Examiner*—John L. Goodrow
*Attorney, Agent, or Firm*—Fitzpatrick, Cella, Harper & Scinto

[57] ABSTRACT

A light-receiving member comprises light-receiving layer of a multi-layer structure having a first layer comprising an amorphous material containing silicon atoms and germanium atoms and a second layer comprising an amorphous material containing silicon atoms and exhibiting photoconductivity provided on a substrate successively from the substrate side, said light-receiving layer having at least one pair of non-parallel interfaces within a short range and said non-parallel interfaces being arranged in a large number in at least one direction within the plane perpendicular to the layer thickness direction.

59 Claims, 80 Drawing Figures

(A)

(B)

(C)

MEMBER HAVING SUBSTRATE AND LIGHT-RECEIVING LAYER OF A-SI:GE FILM AND A-SI FILM WITH NON-PARALLEL INTERFACE WITH SUBSTRATE

CROSS-REFERENCE TO RELATED APPLICATIONS

This application contains subject matter related to commonly assigned, co-pending application Ser. Nos. 697,141; 699,868; 705,516; 720,011; 740,901; 786,970; 717,821; 719,980; 725,751; 726,768; 739,867; 740,714; 741,300; 753,048; 753,011; and 752,920.

BACKGROUND OF THE INVENTION

1. Field of the invention

This invention relates to a light receiving member having sensitivity to electromagnetic waves such as light [herein used in a broad sense, including ultraviolet rays, visible light, infrared rays, X-rays and gamma-rays]. More particularly, it pertains to a light receiving member suitable for using a coherent light such as laser beam.

2. Description of the prior art

As the method for recording a digital image information as an image, there have been well known the methods in which an electrostatic latent image is formed by scanning optically a light receiving member with a laser beam modulated corresponding to a digital image information, then said latent image is developed, followed by processing such as transfer or fixing, if desired, to record an image. Among them, in the image forming method employing electrophotography, image recording has been generally practiced with the use of a small size and inexpensive He-Ne laser or a semiconductor laser (generally having an emitted wavelength of 650–820 nm).

In particular, as the light receiving member for electrophotography which is suitable when using a semiconductor laser, an amorphous material containing silicon atoms (hereinafter written briefly as "A-Si") as disclosed in Japanese Laid-open patent application Nos. 86341/1979 and 83746/1981 is attracting attention for its high Vickers hardness and non-polluting properties in social aspect in addition to the advantage of being by far superior in matching in its photosensitive region as compared with other kinds of light receiving members.

However, when the photosensitive layer is made of a single A-Si layer, for ensuring dark resistance of $10^{12}$ ohm.cm or higher required for electrophotography while maintaining high photosensitivity, it is necessary to incorporate structurally hydrogen atoms or halogen atoms or boron atoms in addition thereto in controlled form within specific ranges of amounts. Accordingly, control of layer formation is required to be performed severely, whereby tolerance in designing of a light receiving member is considerably limited.

As attempts to enlarge this tolerance in designing, namely to enable effective utilization of its high photosensitivity in spite of somewhat lower dark resistance, there have been proposed a light receiving layer with a multi-layer structure of two or more laminated layers with different conductivity characteristics with formation of a depletion layer within the light receiving layer, as disclosed in Japanese Laid-open patent application Nos. 121743/1979, 4053/1982 and 4172/1982, or a light receiving member with a multi-layer structure in which a barrier layer is provided between the substrate and the photosensitive layer and/or on the upper surface of the photosensitive layer, thereby enhancing apparent dark resistance of the light receiving layer as a whole, as disclosed in Japanese Laid-open patent application Nos. 52178/1982, 52179/1982, 52180/1982, 58159/1982, 58160/1982 and 58161/1982.

According to such proposals, A-Si type light receiving members have been greatly advanced in tolerance in designing of commercialization thereof or easiness in management of its production and productivity, and the speed of development toward commercialization is now further accelerated.

When carrying out laser recording by use of such a light receiving member having a light receiving layer of a multi-layer structure, due to irregularity in thickness of respective layers, and also because of the laser beam which is an coherent monochromatic light, it is possible that the respective reflected lights reflected from the free surface on the laser irradiation side of the light receiving layer and the layer interface between the respective layers constituting the light receiving layer and between the substrate and the light receiving layer (hereinafter "interface" is used to mean comprehensively both the free surface and the layer interface) may undergo interference.

Such an interference phenomenon results in the so-called interference fringe pattern in the visible image formed and causes a poor image. In particular, in the case of forming a medium tone image with high gradation, bad appearance of the image will become marked.

Moreover, as the wavelength region of the semiconductor laser beam is shifted toward longer wavelength, absorption of said laser beam in the photosensitive layer becomes reduced, whereby the above interference phenomenon becomes more marked.

This point is explained by referring to the drawings.

FIG. 1 shows a light $I_0$ entering a certain layer constituting the light receiving layer of a light receiving member, a reflected light $R_1$ from the upper interface 102 and a reflected light $R_2$ reflected from the lower interface 101.

Now, the average layer thickness of the layer is defined as d, its refractive index as n and the wavelength of the light as λ, and when the layer thickness of a certain layer is ununiform gently with a layer thickness difference of λ/2n or more, changes in absorbed light quantity and transmitted light quantity occur depending on to which condition of 2nd=mλ(m is an integer, reflected lights are strengthened with each other) and 2nd=(m+½)λ(m is an integer, reflected lights are weakened with each other) the reflected lights $R_1$ and $R_2$ conform.

In the light receiving member of a multi-layer structure, the interference effect as shown in FIG. 1 occurs at each layer, and there ensues a synergistic deleterious influence through respective interferences as shown in FIG. 2. For this reason, the interference fringe corresponding to said interference fringe pattern appears on the visible image transferred and fixed on the transfer member to cause bad images.

As the method for cancelling such an inconvenience, it has been proposed to subject the surface of the substrate to diamond cutting to provide unevenness of ±500 Å–±10000 Å, thereby forming a light scattering surface (as disclosed in Japanese Laid-open patent application No. 162975/1983); to provide a light absorbing layer by subjecting the aluminum substrate surface to black Alumite treatment or dispersing carbon, color pigment or dye in a resin (as disclosed in Japanese Laid-open patent application No. 165845/1982); and to provide a light scattering reflection preventive layer on the substrate surface by subjecting the aluminum substrate surface to satin-like Alumite treatment or by providing a sandy fine unevenness by sand blast (as disclosed in Japanese Laid-open patent application No. 16554/1982).

However, according to these methods of the prior art, the interference fringe pattern appearing on the image could not completely be cancelled.

For example, because only a large number of unevenness with specific sized are formed on the substrate surface according to the first method, although prevention of appearance of interference fringe through light scattering is indeed effected, regular reflection light component yet exists. Therefore, in addition to remaining of the interference fringe by said regular reflection light, enlargement of irradiated spot occurs due to the light scattering effect on the surface of the substrate to be a cause for substantial lowering of resolution.

As for the second method, such a black Alumite treatment is not sufficient for complete absorption, but reflected light from the substrate surface remains. Also, there are involved various inconveniences. For example, in providing a resin layer containing a color pigment dispersed therein, a phenomenon of degassing from the resin layer occurs during formation of the A-Si photosensitive layer to markedly lower the layer quality of the photosensitive layer formed, and the resin layer suffers from a damage by the plasma during formation of A-Si photosensitive layer to be deteriorated in its inherent absorbing function. Besides, worsening of the surface state deleteriously affects subsequent formation of the A-Si photosensitive layer.

In the case of the third method of irregularly roughening the substrate surface, as shown in FIG. 3, for example, the incident light $I_0$ is partly reflected from the surface of the light receiving layer 302 to become a reflected light $R_1$, with the remainder progressing internally through the light receiving layer 302 to become a transmitted light $I_1$. The transmitted light $I_1$ is partly scattered on the surface of the substrate 301 to become scattered lights $K_1, K_2, K_3 \ldots K_n$, with the remainder being regularly reflected to become a reflected light $R_2$, a part of which goes outside as an emitted light $R_3$. Thus, since the reflected light $R_1$ and the emitted light $R_3$ which is an interferable component remain, it is not yet possible to extinguish the interference fringe pattern.

On the other hand, if diffusibility of the surface of the substrate 301 is increased in order to prevent multiple reflections within the light receiving layer 302 through prevention of interference, light will be diffused within the light receiving layer 302 to cause halation, whereby resolution is disadvantageously lowered.

Particularly, in a light receiving member of a multilayer structure, as shown in FIG. 4, even if the surface of the substrate 401 may be irregularly roughened, the reflected light $R_2$ from the first layer 402, the reflected light $R_1$ from the second layer 403 and the regularly reflected light $R_3$ from the surface of the substrate 401 are interfered with each other to form an interference fringe pattern depending on the respective layer thicknesses of the light receiving member. Accordingly, in a light receiving member of a multi-layer structure, it was impossible to completely prevent appearance of interference fringes by irregularly roughening the surface of the substrate 401.

In the case of irregularly roughening the substrate surface according to the method such as sand blasting, etc., the roughness will vary so much from lot to lot, and there is also nonuniformity in roughness even in the same lot, and therefore production control could be done with inconvenience. In addition, relatively large projections with random distributions are frequently formed, hence causing local breakdown of the light receiving layer during charging treatment.

On the other hand, in the case of simply roughening the surface of the substrate 501 regularly, as shown in FIG. 5, since the light-receiving layer 502 is deposited along the uneven shape of the surface of the substrate 501, the slanted plane of the unevenness of the substrate 501 becomes parallel to the slanted plane of the unevenness of the light receiving layer 502.

Accordingly, for the incident light on that portion, $2nd_1 = m\lambda$ or $2nd_1 = (m+\frac{1}{2})\lambda$ holds, to make it a light portion or a dark portion. Also, in the light receiving layer as a whole, since there is nonuniformity in which the maximum difference among the layer thicknesses $d_1$, $d_2$, $d_3$ and $d_4$ of the light receiving layer is $\lambda/2n$ or more, there appears a light and dark fringe pattern.

Thus, it is impossible to completely extinguish the interference fringe pattern by only roughening regularly the surface of the substrate 501.

Also, in the case of depositing a light receiving layer of a multi-layer structure on the substrate, the surface of which is regularly roughened, in addition to the interference between the regularly reflected light from the substrate surface and the reflected light from the light receiving layer surface as explained for light receiving member of a single layer structure in FIG. 3, interferences by the reflected lights from the interfaces between the respective layers participate to make the extent of appearance of interferance fringe pattern more complicated than in the case of the light receiving member of a single layer structure.

SUMMARY OF THE INVENTION

An object of the present invention is to provide a novel light-receiving member sensitive to light, which has cancelled the drawbacks as described above.

Another object of the present invention is to provide a light-receiving member which is suitable for image formation by use of a coherent monochromatic light and also easy in production management.

Still another object of the present invention is to provide a light-receiving member which can cancel the interference fringe pattern appearing during image formation and appearance of speckles on reversal developing at the same time and completely.

Still another object of the prevent invention is to provide a light-receiving member which is high in dielectric strength and photosensitivity and excellent in electrophotographic characteristics.

It is also another object of the present invention to provide a light-receiving member, which can provide an image of high quality which is high in density, clear in halftone and high in resolution and is suitable for electrophotography.

Still another object of the present invention is to provide a light-receiving member comprising a light-receiving layer of a multi-layer structure having a first layer comprising an amorphous material containing silicon atoms and germanium atoms and a second layer comprising an amorphous material containing silicon atoms and exhibiting photoconductivity provided on a substrate successively from the substrate side, said light-receiving layer having at least one pair of non-parallel interfaces within a short range and said non-parallel interfaces being arranged in a large number in at least one direction within the plane perpendicular to the layer thickness direction.

DESCRIPTION OF THE PREFERRED EMBODIMENTS

Referring now to the accompnaying drawings, the present invention is to be described in detail.

Figure 6:
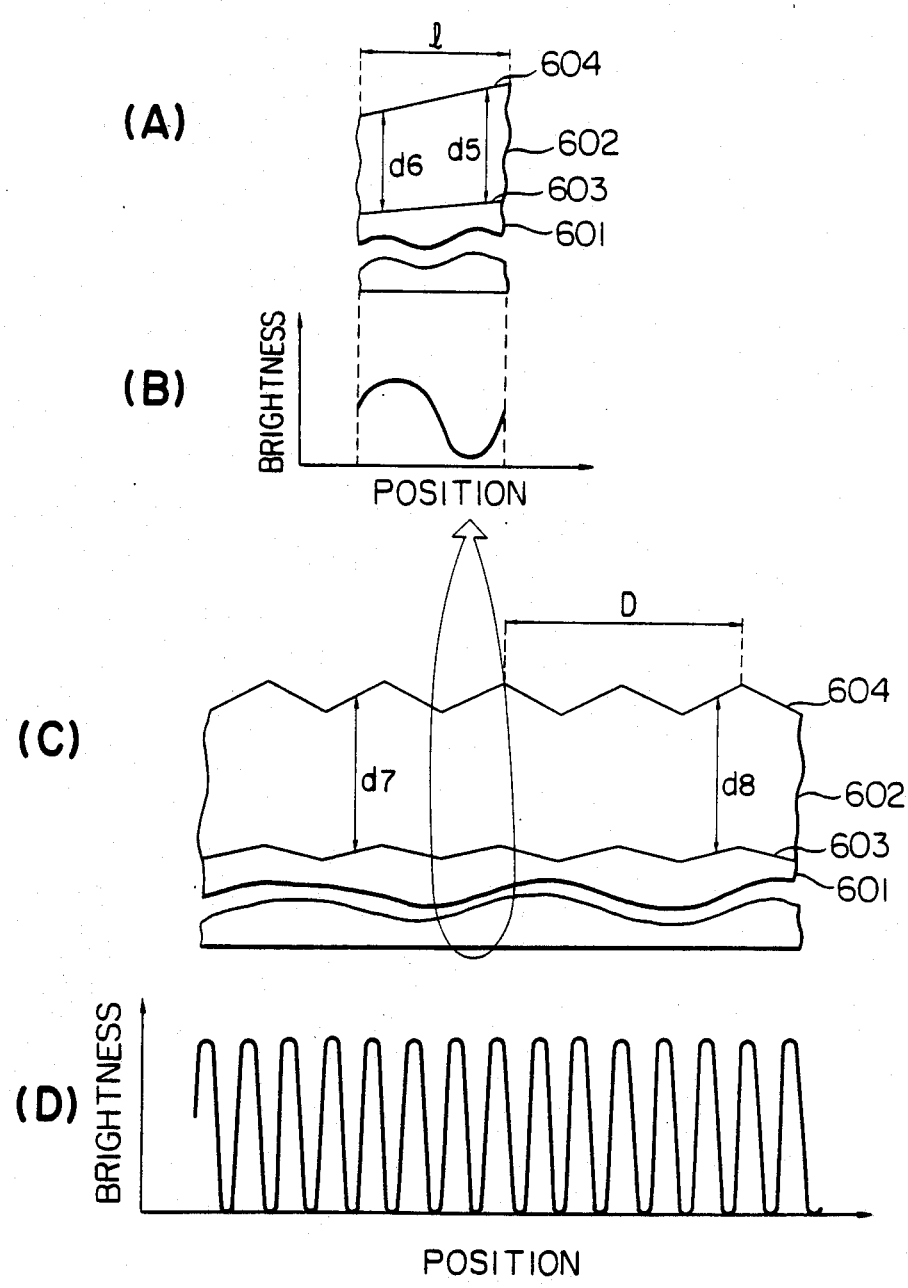
FIG. 6 (A), (B), (C) and (D) are schematic illustrations of no appearance of interference fringe in the case of non-parallel interfaces between respective layers of a light-receiving member.

FIG. 6 is a schematic illustration for explanation of the basic principle of the present invention.

In the present invention, on a substrate (not shown) having a fine uneven shape smaller than the resolution required for the device, a light-receiving layer of a multi-layer constitution is provided along the uneven slanted plane, with the thickness of the second layer 602 being continuously changed from $d_5$ to $d_6$, as shown enlarged in a part of FIG. 6, and therefore the interface 603 and the interface 604 have respective gradients. Accordingly, the coherent light incident on this minute portion (short range region ) l [indicated schematically in FIG. 6 (C), and its enlarged view shown in FIG. 6 (A)]undergoes interference at said minute portion l to form a minute interference fringe pattern.

Figure 7:
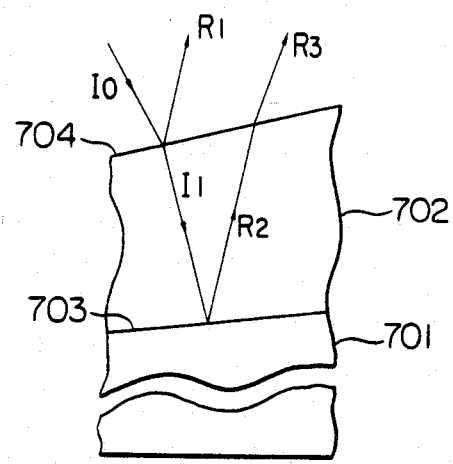
FIG. 7 (A), (B) and (C) are schematic illustration of comparison of the reflected light intensity between the case of parallel interfaces and non-parallel interfaces between the respective layers of a light-receiving member.
Figure 7:
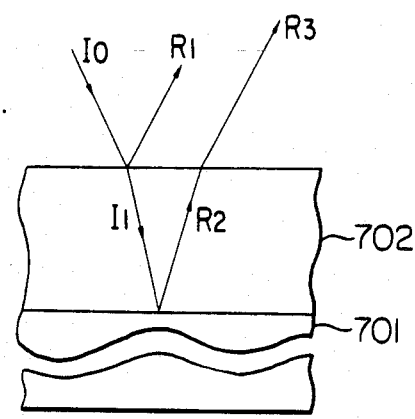
Figure 7:
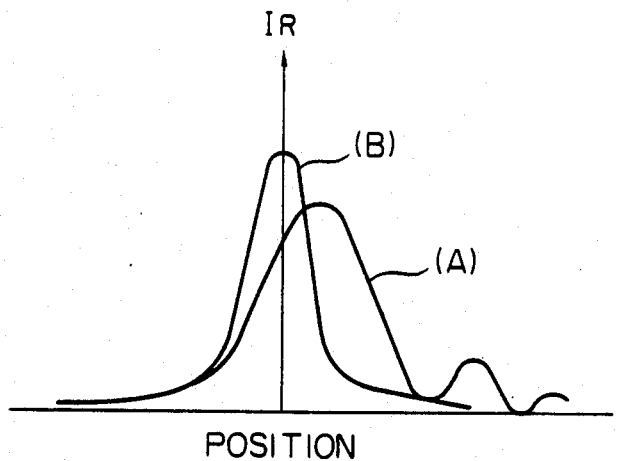
Figure 8:
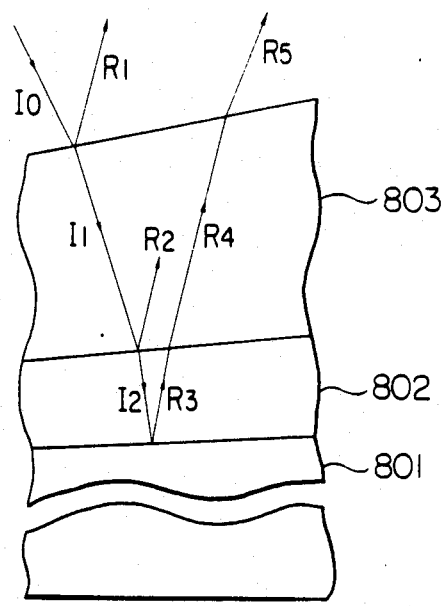
FIG. 8 is a schematic illustration of no appearance of interference fringe in the case of non-parallel interfaces between respective layers.

Also, as shown in FIG. 7, when the interface 703 between the first layer 701 and the second layer 702 and the free surface 704 are non-parallel to each other, the reflected light $R_1$ and the emitted lgiht $R_3$ are different in direction of progress from each other relative to the incident light $I_0$ as shown in FIG. 7 (A), and therefore the degree of interference will be reduced as compared with the case (FIG. 7 (B)) when the interfaces 703 and 704 are parallel to each other.

Accordingly, as shown in FIG. 7 (C), as compared with the case "(B)" where a pair of the interfaces are in parallel relation, the difference in lightness and darkness in the interference fringe pattern becomes negligibly small even if interfered, if any, in the non-parallel case "(A)".

The same is the case, as shown in FIG. 6, even when the layer thickness of the layer 602 may be macroscopically ununiform ($d_7 \neq d_8$), and therefore the incident light quantity becomes uniform all over the layer region (see FIG. 6 (D)).

To describe about the effect of the present invention when coherent light is transmitted from the irradiation side to the first layer in the case of a light-receiving layer of a multi-layer structure, reflected lights $R_1$, $R_2$, $R_3$, $R_4$ and $R_5$ exsit in connection with the incident light $I_0$. Accordingly, at the respective layers, the same phenomenon as described with reference to FIG. 7 occurs.

Therefore, when considered for the light-receiving layer as a whole, interference occurs as a synergetic effect of the respective layers and, according to the present invention, appearance of interference can further be prevented as the number of layers constituting the light-receiving layer is increased.

The interference fringe occurring within the minute portion cannot appear on the image, because the size of the minute portion is smaller than the spot size of the irradiated light, namely smaller than the resolution limit. Further, even if appeared on the image, there is no problem at all, since it is less than resolving ability of the eyes.

In the present invention, the slanted plane of unevenness should desirably be mirror finished in order to direct the reflected light assuredly in one direction.

The size l (one cycle of uneven shape) of the minute portion suitable for the present invention is $l \leq L$, wherein L is the spot size of the irradiation light.

Further, in order to accomplish more effectively the objects of the present invention, the layer thickness difference ($d_5 - d_6$) at the minute portion 1 should desirably be as follows:

$d_5 - d_6 \geq \lambda/2n$ (where $\lambda$ is the wavelength of the irradiation light and n is the refractive index of the second layer 602).

In the present invention, within the layer thickness of the minute portion l (hereinafter called as "minute column") in the light-receiving layer of a multi-layer structure, the layer thicknesses of the respective layers are controlled so that at least two interfaces between layers may be in non-parallel relationship, and, provided that this condition is satisfied, any other pair of two interfaces between layers may be in parallel relationship within said minute column.

However, it is desirable that the layers forming parallel interfaces should be formed to have uniform layer thicknesses so that the difference in layer thickness at any two positions may be not more than:

$\lambda/2n$ (n: refractive index of the layer).

For formation of the respective layers of the first layer and the second layer constituting the light-receiving layer, in order to accomplish more effectively and easily the objects of the present invention, the plasma chemical vapor deposition method (PCVD method), the optical CVD method and thermal CVD method can be employed, because the layer thickness can accurately be controlled on the optical level thereby.

The unevenness to be provided on the substrate surface can be formed by fixing a bite having a V-shaped cutting blade at a predetermined position on a cutting working machine such as milling machine, lathe, etc., and cut working accurately the substrate surface by, for example, moving regularly in a certain direction while rotating a cylindrical substrate according to a program previously designed as desired, thereby forming to a desired unevenness shape, pitch and depth. The reverse-V-shaped linear projection produced by the unevenness formed by such a cutting working has a spiral structure with the center axis of the cylindrical substrate as its center. The spiral structure of the reverse-V-shaped projection may be made into a mutiple spiral structure such as double or triple structure or a crossed spiral structure.

Alternatively, a straight line structure along the center axis may also be introduced in addition to the spiral structure.

Figure 9:
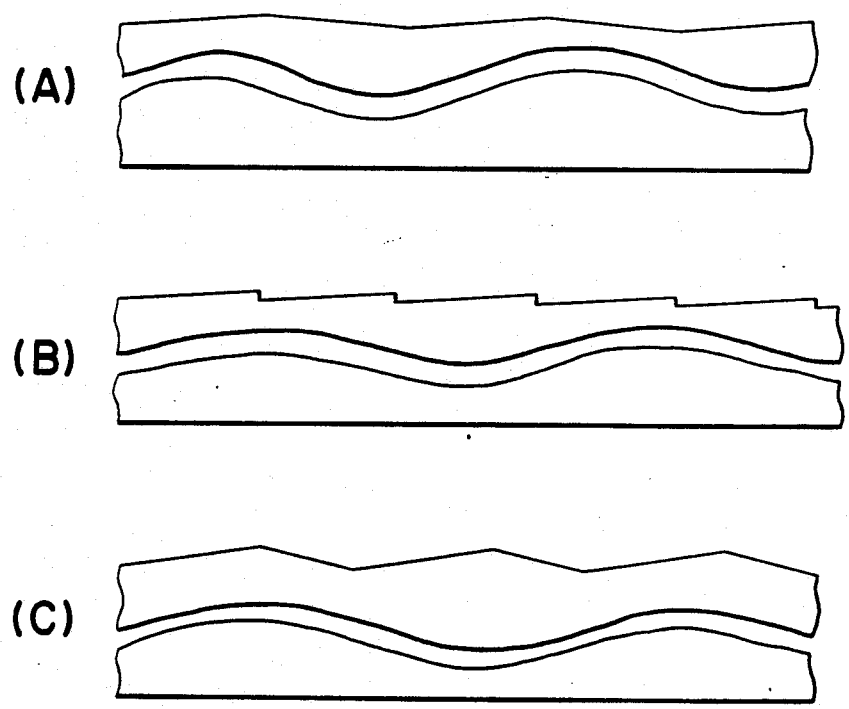
FIG. 9 (A), (B) and (C) are schematic illustrations of the surface condition of typical substrates.

The shape of the longitudinal section of the protruded portion of the unevenness provided on the substrate surface is made reverse-V-shape in order to ensure managed ununiformization of layer thickness within minute columns of respective layers and good adhesion as well as desired electrical contact between the substrate and the layer provided directly on said substrate, and it should preferably be made as shown in FIG. 9 as isosceles triangle, a right triangle or a scalene triangle. Of these shapes, an isosceles triangle and a right triangle are preferred.

In the present invention, the respective dimensions of the unevenness provided on the substrate surface under managed condition are set so as to accomplish effectively the objects of the present invention in view of the following points.

More specifically, in the first place, the A-Si layer constituting the light receiving layer is sensitive to the structure of the surface on which the layer formation is effected, and the layer quality will be changed greatly depending on the surface condition.

Accordingly, it is desirable to set dimensions of the unevenness to be provided on the substrate surface so that lowering in layer quality of the A-Si layer may not be brought about.

Secondly, when there is extreme unevenness on the free surface of the light-receiving layer, cleaning cannot frequently be performed completely in cleaning step after image formation.

Further, in case of practicing blade cleaning, there is involved the problem that the blade will be damaged more earlier.

As the result of investigations of the problems is layer deposition as described above, problems in process of electrophotography and the conditions for prevention of interference fringe pattern, it has been found that the pitch at the recessed portion on the substrate surface should preferably be 500 $\mu$m to 0.3 $\mu$m, more preferably 200 $\mu$m to 1 $\mu$m, most preferably 50 $\mu$m to 5 $\mu$m.

It is also desirable that the maximum depth of the recessed portion should preferably be made 0.1 $\mu$m to 5 $\mu$m, more preferably 0.3 $\mu$m to 3 $\mu$m, most preferably 0.6 $\mu$m to 2 $\mu$m. When the pitch and the maximum depth of the recessed portions on the substrate surface are within the ranges as specified above, the gradient of the slanted plane at the recessed portion (or linear projection) may preferably be 1° to 20°, more preferably 3° to 15°, most preferably 4° to 10°.

On the other hand, the maximum of the difference in the layer thickness based on such an uniformness in layer thickness of the respective layers formed on such a substrate should preferably be made 0.1 $\mu$m to 2 $\mu$m within the same pitch, more preferably 0.1 $\mu$m to 1.5 $\mu$m, most preferably 0.2 $\mu$m to 1 $\mu$m.

Further, the light-receiving layer in the light-receiving member of the present invention has a multi-layer structure comprising a first layer constituted of an amorphous material containing silicon atoms and germanium atoms and a second layer constituted of an amorphous material containing silicon atoms and exhibiting photoconductivity provided on a substrate successively from the substrate side, and therefore can exhibit very excellent electrical, optical and photoconductive characteristics, dielectric strength as well as good use environmental characteristics.

In particular, when it is applied as a light-receiving member for electrophotography, there is no influence of residual potential on image formation at all, with its electrical properties being stable with high sensitivity and high SN ratio, also excellent in light fatigue resistance and repeated use characteristics, whereby it is possible to obtain repeatedly and stably images of high quality with high density, clear halftone and high resolution.

Further, the light-receiving member of the present invention is high in photosensitivity over the all visible light regions, particularly in photosensitivity to the light of longer wavelength region and is therefore excellent in matching to semiconductor laser and also rapid in light response.

Referring now the drawings, the light-receiving member of the present invention is to be described in detail.

Figure 10:
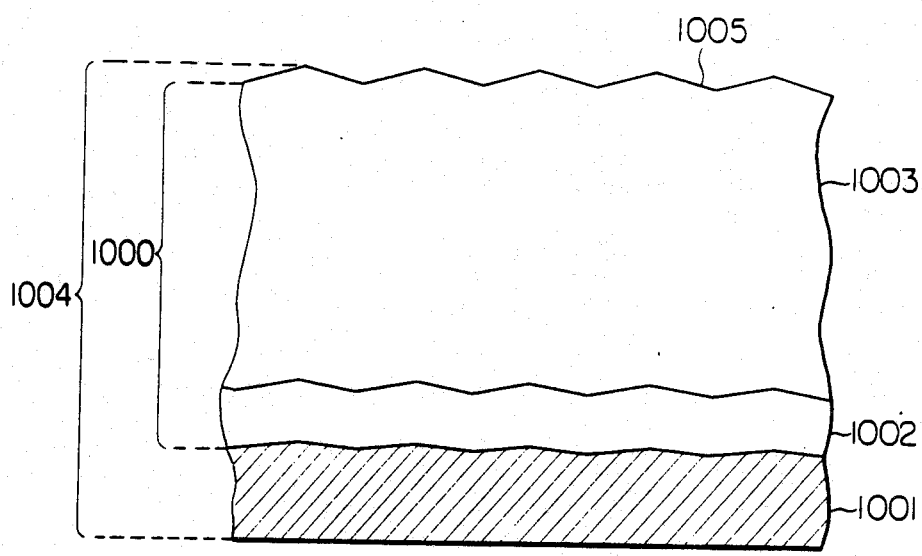
FIG. 10 is a schematic illustration of the layer constitution of a light-receiving member.

FIG. 10 shows a schematic sectional view for illustration of the layer structure of an embodiment of the light-receiving member of the present invention.

The light-receiving member 1004 as shown in FIG. 10 has a light-receiving layer 1000 on a substrate for light-receiving member 1001, said light-receiving layer 1000 having a free surface 1005 on one end surface.

The light-receiving layer 1000 has a layer structure constituted of a first layer (G) 1002 comprising an amorphous material containing silicon atoms and germanium atoms and, if desired, hydrogen atoms (H) and/or halogen atoms (X) (hereinafter abbreviated as "A-SiGe(H,X)") and a second layer (S) 1003 comprising A-Si containing, if desired, hydrogen atoms (H) and/or halogen atoms (X) (hereinafter abbreviated as A-Si(H,X)) and exhibiting photoconductivity laminated successively from the substrate 1001 side.

The germanium atoms contained in the first layer (G) 1002 may be contained so that the distribution state may be uniform within the first layer (G), or they can be contained continuously in the layer thickness direction in said first layer (G) 1002, being more enriched at the substrate 1001 side toward the side opposite to the side where said substrate 1001 is provided (the surface 1005 side of the light-receiving layer 1001).

When the distribution state of the germanium atoms contained in the first layer (G) is ununiform in the layer thickness direction, it is desirable that the distribution state should be made uniform in the interplanar direction in parallel to the surface of the substrate.

In the present invention, in the second layer (S) provided on the first layer (G), no germanium atoms is contained and by forming a light-receiving layer to such a layer structure, the light-receiving member obtained can be excellent in photosensitivity to the light with wavelengths of all the regions from relatively shorter wavelength to relatively longer wavelength, including visible light region.

Also, when the distribution state of germanium atoms in the first layer (G) is ununiform in the layer thickness direction, the germanium atoms are distributed continuously throughout the whole layer region while giving a change in distribution concentration C of the germanium atoms in the layer thickness direction which is decreased from the substrate toward the second layer (S), and therefore affinity between the first layer (G) and the second layer (S) is excellent. Also, as described as hereinafter, by extremely increasing the distribution concentration C of germanium atoms at the end portion on the substrate side extremely great, the light on the longer wavelength side which cannot substantially be absorbed by the second layer (S) can be absorbed in the first layer (G) substantially completely, when employing a semiconductor laser, whereby interference by reflection from the substrate surface can be prevented.

Also, in the light-receiving member of the present invention, the respective amorphous materials constituting the first layer (G) and the second layer (S) have the common constituent of silicon atoms, and therefore chemical stability can sufficiently be ensured at the laminated interface.

FIGS. 11 through 19 show typical examples of distribution in the layer thickness direction of germanium atoms contained in the first layer region (G) of the light-receiving member in the present invention.

In FIGS. 11 through 19, the abscissa indicates the content C of germanium atoms and the ordinate the layer thickness of the first layer (G), $t_B$ showing the position of the end surface of the first layer (G) on the substrate side and $t_T$ the position of the end surface of the first layer (G) on the side opposite to the substrate side. That is, layer formation of the first layer (G) containing germanium atoms proceeds from the $t_B$ side toward the $t_T$ side.

Figure 11:
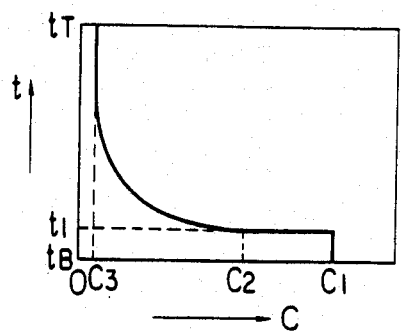
FIGS. 11 through 19 are schematic illustrations of the distribution states of germanium atoms in the first layer.

In FIG. 11, there is shown a first typical embodiment of the depth profile of germanium atoms in the layer thickness direction contained in the first layer (G).

In the embodiment as shown in FIG. 11, from the interface position $t_B$ at which the surface, on which the first layer (G) containing germanium atoms is to be formed, comes into contact with the surface of said first layer (G) to the position $t_1$, germanium atoms are contained in the first layer (G) formed, while the distribution concentration C of germanium atoms taking a constant value of $C_1$, the concentration being gradually decreased from the concentration $C_2$ continuously from the position $t_1$ to the interface position $t_T$. At the interface position $t_T$, the distribution concentration C of germanium atoms is made $C_3$.

Figure 12:
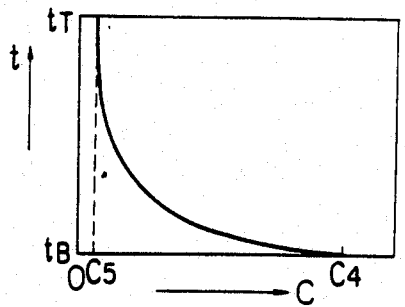

In the embodiment shown in FIG. 12, the distribution concentration C of germanium atoms contained is decreased gradually and continuously from the position $t_B$ to the position $t_T$ from the concentration $C_4$ until it becomes the concentration $C_5$ at the position $t_T$.

Figure 13:
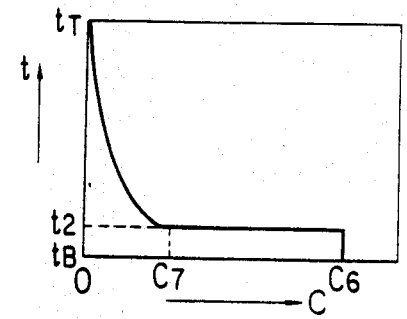

In case of FIG. 13, the distribution concentration C of germanium atoms is made constant as $C_6$ at the position $t_B$, gradually decreased continuously from the position $t_2$ to the position $t_T$, and the concentration C is made substantially zero at the position $t_T$ (substantially zero herein means the content less than the detectable limit).

Figure 14:
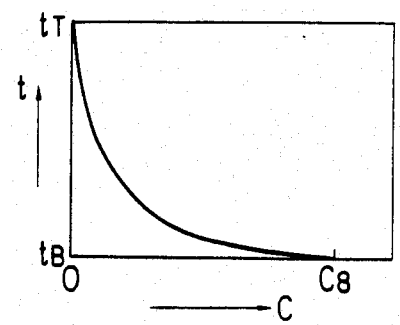

In case of FIG. 14, germanium atoms are decreased gradually and continuously from the position $t_B$ to the position $t_T$ from the concentration $C_8$, until it is made substantially zero at the position $t_T$.

Figure 15:
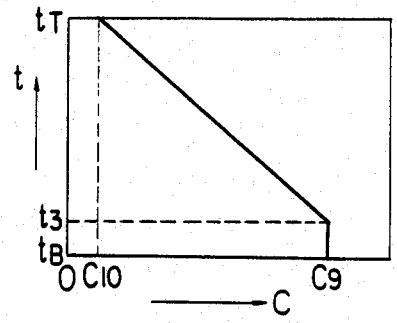

In the embodiment shown in FIG. 15, the distribution concentration C of germanium atoms is constantly $C_9$ between the position $t_B$ and the position $t_3$, and it is made $C_{10}$ at the position $t_T$. Between the position $t_3$ and the position $t_T$, the concentration C is decreased as a first order function from the position $t_3$ to the position $t_T$.

Figure 16:
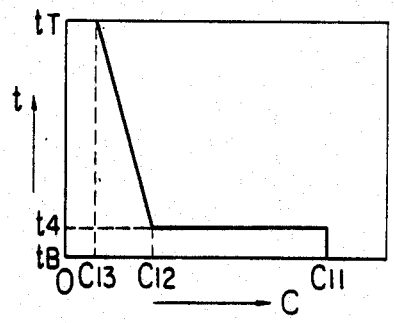

In the embodiment shown in FIG. 16, there is formed a depth profile such that the distribution concentration C takes a constant value of $C_{11}$ from the position $t_B$ to the position $t_4$, and is decreased as a first order function from the concentration $C_{12}$ to the concentration $C_{13}$ from the position $t_4$ to the position $t_T$.

Figure 17:
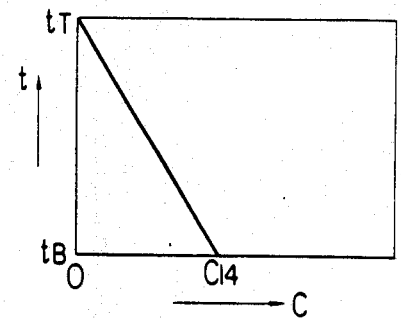

In the embodiment shown in FIG. 17, the distribution concentration C of germanium atoms is decreased as a first order function from the concentration $C_{14}$ to zero from the position $t_B$ to the position $t_T$.

Figure 18:
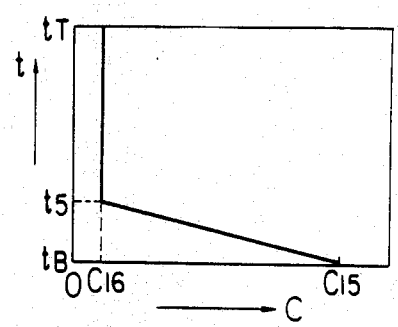

In FIG. 18, there is shown an embodiment, where the distribution concentration C of germanium atoms is decreased as a first order function from the concentration $C_{15}$ to $C_{16}$ from the position $t_B$ to $t_5$ and made constantly at the concentration $C_{16}$ between the position $t_5$ and $t_T$.

Figure 19:
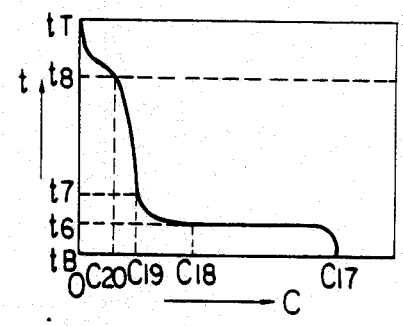

In the embodiment shown in FIG. 19, the distribution concentration C of germanium atoms is at the concentration $C_{17}$ at the position $t_B$, which concentration $C_{17}$ is initially decreased gradually and abruptly near the position $t_6$ to the position $t_6$, until it is made the concentration $C_{18}$ at the position $t_6$.

Between the position $t_6$ and the position $t_7$, the concentration is initially decreased abruptly and thereafter gradually, until it is made the concentration $C_{19}$ at the position $t_7$. Between the position $t_7$ and the position $t_8$, the concentration is decreased very gradually to the concentration $C_{20}$ at the position $t_8$. Between the position $t_8$ and the position $t_T$, the concentration is decreased along the curve having a shape as shown in the Figure from the concentration $C_{20}$ to substantially zero.

As described above about some typical examples of depth profiles of germanium atoms contained in the first layer (G) in the direction of the layer thickness by referring to FIGS. 11 through 19, when the distribution state of germanium atoms is ununiform in the layer thickness direction, the first layer (G) is provided desirably in a depth profile so as to have a portion enriched in distribution concentration C of germanium atoms on the substrate side and a portion depleted in distribution concentration C of germanium atoms considerably lower than that of the substrate side on the interface $t_T$ side.

The first layer (G) constituting the light-receiving member in the present invention is desired to have a localized region (A) containing germanium atoms at a relatively higher concentration on the substrate side as described above.

In the present invention, the localized region (A), as explained in terms of the symbols shown in FIG. 11 through FIG. 19, may be desirably provided within $5\mu$ from the interface position $t_B$.

In the present invention, the above localized region (A) may be made to be identical with the whole of the layer region ($L_T$) on the interface position $t_B$ to the thickness of 5 $\mu$, or alternatively a part of the layer region ($L_T$).

It may suitably be determined depending on the characteristics required for the light-receiving layer to be formed, whether the localized region (A) is made a part or whole of the layer region ($L_T$).

The localized region (A) may preferably be formed according to such a layer formation that the maximum value Cmax of the concentrations of germanium atoms in a distribution in the layer thickness direction may preferably be 1000 atomic ppm or more, more preferably 5000 atomic ppm or more, most preferably $1\times 10^4$ atomic ppm or more based on silicon atoms.

That is, according to the present invention, it is desirable that the layer region (G) containing germanium atoms is formed so that the maximum value Cmax of the distribution concentration C may exist within a layer thickness of $5\mu$ from the substrate side (the layer region within $5\mu$ thickness from $t_B$).

In the present invention, the content of germanium atoms in the first layer (G), which may suitably be determined as desired so as to acheive effectively the objects of the present invention, may preferably be 1 to $9.5\times 10^5$ atomic ppm, more preferably 100 to $8\times 10^5$ atomic ppm, most preferably 500 to $7\times 10^5$ atomic ppm.

In the present invention, the layer thickness of the first layer (G) and the thickness of the second layer (S) are one of the important factors for accomplishing effectively the objects of the present invention, and therefore sufficient care should desirably be paid in designing of the light-receiving member so that desirable characteristics may be imparted to the light-receiving member formed.

In the present invention, the layer thickness $T_B$ of the first layer (G) may preferably be 30 Å to $50\mu$, more preferably 40 Å to $40\mu$, most preferably 50 Å to $30\mu$.

On the other hand, the layer thickness T of the second layer (S) may be preferably 0.5 to $90\mu$, more preferably 1 to $80\mu$, most preferably 2 to $50\mu$.

The sum of the above layer thicknesses T and $T_B$, namely ($T+T_B$) may be suitably determined as desired in designing of the layers of the light-receiving member, based on the mutual organic relationship between the characteristics required for both layer regions and the characteristics required for the whole light-receiving layer.

In the light-receiving member of the present invention, the numerical range for the above ($T_B+T$) may generally be from 1 to $100\mu$, preferably 1 to $80\mu$ most preferably 2 to $50\mu$.

In a more preferred embodiment of the present invention, it is preferred to select the numerical values for respective thicknesses $T_B$ and T as mentioned above so that the relation of $T_B/T \leq 1$ may be satisfied.

In selection of the numerical values for the thicknesses $T_B$ and T in the above case, the values of $T_B$ and T should preferably be determined so that the relation $T_B/T \leq 0.9$, most preferably, $T_B/T \leq 0.8$, may be satisfied.

In the present invention, when the content of germanium atoms in the first layer (G) is $1\times 10^5$ atomic ppm or more, the layer thickness $T_B$ should desirably be made considerably thinner, preferably $30\mu$ or less, more preferably $25\mu$ or less, most preferably $20\mu$ or less.

In the present invention, illustrative of halogen atoms (X), which may optionally be incorporated in the first layer (G) and the second layer (S) constituting the light-receiving layer, are fluorine, chlorine, bormine and iodine, particularly preferably fluorine and chlorine.

In the present invention, formation of the first layer (G) constituted of A-SiGe(H,X) may be conducted according to the vacuum deposition method utilizing discharging phenomenon, such as glow discharge method, sputtering method or ion-plating method. For example, for formation of the first layer (G) constituted of A-SiGe(H,X) according to the glow discharge method, the basic procedure comprises introducing a starting gas for Si supply capable of supplying silicon atoms (Si), a starting gas for Ge supply capable of supplying germanium atoms (Ge) optionally together with a starting gas for introduction of hydrogen atoms (H) and/or a starting gas for introduction of halogen atoms (X) into a deposition chamber which can be internally brought to a reduced pressure, and exciting glow discharge in said deposition chamber, thereby effecting layer formation on the surface of a substrate placed at a predetermined position while controlling the depth profile of germanium atoms according to a desired rate of change curve to form a layer constituent of A-SiGe (H,X). Alternatively, for formation according to the sputtering method, when carrying out sputtering by use of two sheets of targets of a target constituted of Si and a target constituted of Ge, or a target of a mixture of Si and Ge in an atmosphere of an inert gas such as Ar, He, etc. or a gas mixture based on these gases, a gas for introduction of hydrogen atoms (H) and/or a gas for introduction of halogen atoms (X) may be introduced, if desired, into a deposition chamber for sputtering.

The starting gas for supplying Si to be used in the present invention may include gaseous or gasifiable hydrogenated silicons (silanes) such as $SiH_4$, $Si_2H_6$, $Si_3H_8$, $Si_4H_{10}$ and others as effective materials. In particular, $SiH_4$ and $Si_2H_6$ are preferred because of easiness in handling during layer formation and high efficiency for supplying Si.

As the substances which can be used as the starting gases for Ge supply, there may be effectively employed gaseous or gasifiable hydrogenated germanium such as $GeH_4$, $Ge_2H_6$, $Ge_3H_8$, $Ge_4H_{10}$, $Ge_5H_{12}$, $Ge_6H_{14}$, $Ge_7H_{16}$, $Ge_8H_{18}$, $Ge_9H_{20}$, etc. In particular, $GeH_4$, $Ge_2H_6$ and $Ge_3H_8$ are preferred because of easiness in handling during layer formation and high efficiency for supplying Ge.

Effective starting gases for introduction of halogen atoms to be used in the present invention may include a large number of halogenic compounds, as exemplified preferably by halogenic gases, halides, interhalogen compounds, or gaseous or gasifiable halogenic compounds such as silane derivatives substituted with halogens.

Further, there may also be included gaseous or gasifiable hydrogenated silicon compounds containing halogen atoms constituted of silicon atoms and halogen atoms as constituent elements as effective ones in the present invention.

Typical examples of halogen compounds preferably used in the present invention may include halogen gases such as of fluorine, chlorine, bromine or iodine, interhalogen compounds such as $BrF$, $ClF$, $ClF_3$, $BrF_5$, $BrF_3$, $IF_3$, $IF_7$, $ICl$, $IBr$, etc.

As the silicon compounds containing halogen atoms, namely so called silane derivatives substituted with halogens, there may preferably be employed silicon halides such as $SiF_4$, $Si_2F_6$, $SiCl_4$, $SiBr_4$ and the like.

When the light-receiving member of the present invention is formed according to the glow discharge method by employment of such a silicon compound containing halogen atoms, it is possible to form the first layer (G) constituted of A-SiGe containing halogen atoms on a desired substrate without use of a hydrogenated silicon gas as the starting gas capable of supplying Si together with the starting gas for Ge supply.

In the case of forming the first layer (G) containing halogen atoms according to the glow discharge method, the basic procedure comprises introducing, for example, a silicon halide as the starting gas for Si supply, a hydrogenated germanium as the starting gas for Ge supply and a gas such as Ar, $H_2$, He, etc. at a predetermined mixing ratio into the deposition chamber for formation of the first layer (G) and exciting glow discharge to form a plasma atmosphere of these gases, whereby the first layer (G) can be formed on a desired substrate. In order to control the ratio of hydrogen atoms incorporated more easily, hydrogen gas or a gas of a silicon compound containing hydrogen atoms may also be mixed with these gases in a desired amount to form the layer.

Also, each gas is not restricted to a single species, but multiple species may be available at any desired ratio.

For formation of the first layer (G) comprising A-SiGe(H,X) according to the reactive sputtering method or the ion plating method, for example, in the case of the sputtering method, two sheets of a target of Si and a target of Ge or a target of Si and Ge is employed and subjected to sputtering in a desired gas plasma atmosphere. In the case of the ion-plating method, for example, a vaporizing source such as a polycrystalline silicon or a single crystalline silicon and a polycrystalline germanium or a single crystalline germanium may be placed as vaporizing source in an evaporating boat, and the vaporizing source is heated by the resistance heating method or the electron beam method (EB method) to be vaporized, and the flying vaporized product is permitted to pass through a desired gas plasma atmosphere.

In either case of the sputtering method and the ion-plating method, introduction of halogen atoms into the layer formed may be performed by introducing the gas of the above halogen compound or the above silicon compound containing halogen atoms into a deposition chamber and forming a plasma atmosphere of said gas.

On the other hand, for introduction of hydrogen atoms, a starting gas for introduction of hydrogen atoms, for example, $H_2$ or gases such as silanes and/or hydrogenated germanium as mentioned above, may be introduced into a deposition chamber for sputtering, followed by formation of the plasma atmosphere of said gases.

In the present invention, as the starting gas for introduction of halogen atoms, the halides or halo-containing silicon compounds as mentioned above can effectively be used. Otherwise, it is also possible to use effectively as the starting material for formation of the first layer (G) gaseous or gasifiable substances, including halides containing hydrogen atom as one of the constituents, e.g. hydrogen halide such as HF, HCl, HBr, HI, etc.; halo-substituted hydrogenated silicon such as $SiH_2F_2$, $siH_2I_2$, $SiH_2Cl_2$, $SiHCl_3$, $SiH_2Br_2$, $SiHBr_3$, etc.; hydrogenated germanium halides such as $GeHF_3$, $GeH_2F_2$, $GeH_3F$, $GeHCl_3$, $GeH_2Cl_2$, $GeH_3Cl$, $GeHBr_3$, $GeH_2Br_2$, $GeH_3Br$, $GeHI_3$, $GeH_2I_2$, $GeH_3I$, etc.; germanium halides such as $GeF_4$, $GeCl_4$, $GeBr_4$, $GeI_4$, $GeF_2$, $GeCl_2$, $GeBr_2$, $GeI_2$, etc.

Among these substances, halides containing halogen atoms can preferably be used as the starting material for introduction of halogens, because hydrogen atoms, which are very effective for controlling electrical or photoelectric characteristics, can be introduced into the layer simultaneously with introduction of halogen atoms during formation of the first layer (G).

For introducing hydrogen atoms structurally into the first layer (G), other than those as mentioned above, $H_2$ or a hydrogenated silicon such as $SiH_4$, $Si_2H_6$, $Si_3H_8$, $Si_4H_{10}$, etc. together with germanium or a germanium compound for supplying Ge, or a hydrogenated germanium such as $GeH_4$, $Ge_2H_6$, $Ge_3H_8$, $Ge_4H_{10}$, $Ge_5H_{12}$, $Ge_6H_{14}$, $Ge_7H_{16}$, $Ge_8H_{18}$, $Ge_9H_{20}$, etc. together with silicon or a silicon compound for supplying Si can be permitted to co-exist in a deposition chamber, followed by excitation of discharging.

According to a preferred embodiment of the present invention, the amount of hydrogen atoms (H) or the amount of halogen atoms (X) or the sum of the amounts of hydrogen atoms and halogen atoms (H+X) to be contained in the first layer (G) constituting the light-receiving layer to be formed should preferably be 0.01 to 40 atomic %, more preferably 0.05 to 30 atomic %, most preferably 0.1 to 25 atomic %.

For controlling the amount of hydrogen atoms (H) and/or halogen atoms (X) to be contained in the first layer (G), for example, the substrate temperature and/or the amount of the starting materials used for incorporation of hydrogen atoms (H) or halogen atoms (X) to be introduced into the deposition device system, discharging power, etc. may be controlled.

In the present invention, for formation of the second layer (S) constituted of A-Si(H,X), the starting materials (I) for formation of the first layer (G), from which the starting materials for the starting gas for supplying Ge are omitted, are used as the starting materials (II) for formation of the second layer (S), and layer formation can be effected following the same procedure and conditions as in formation of the first layer (G).

More specifically, in the present invention, formation of the second layer region (S) constituted of a-Si(H,X) may be carried out according to the vacuum deposition method utilizing discharging phenomenon such as the glow discharge method, the sputtering method or the ion-plating method. For example, for formation of the second layer (S) constituted of A-Si(H,X) according to the glow discharge method, the basic procedure comprises introducing a starting gas for Si supply capable of supplying silicon atoms (Si) as described above, optionally together with starting gases for introduction of hydrogen atoms (H) and/or halogen atoms (X), into a deposition chamber which can be brought internally to a reduced pressure and exciting glow discharge in said deposition chamber, thereby forming a layer comprising A-Si(H,X) on a desired substrate placed at a predetermined position. Alternatively, for formation according to the sputtering method, gases for introduction of hydrogen atoms (H) and/or halogen atoms (X) may be introduced into a deposition chamber when effecting sputtering of a target constituted of Si in an inert gas such as Ar, He, etc. or a gas mixture based on these gases.

In the present invention, the amount of hydrogen atoms (H) or the amount of halogen atoms (X) or the sum of the amounts of hydrogen atoms and halogen atoms (H+X) to be contained in the second layer (S) constituting the light-receiving layer to be formed should preferably be 1 to 40 atomic %, more preferably 5 to 30 atomic %, most preferably 5 to 25 atomic %.

In the light-receiving member 1004, by incorporating a substance (C) for controlling conductivity in at least the first layer (G) 1002 and/or the second layer (S) 1003, desired conductivity characteristics can be given to the layer containing said substance (C).

In this case, the substance (C) for controlling conductivity may be contained throughout the whole layer region in the layer containing the substance (C) or contained locally in a part of the layer region of the layer containing the substance (C).

Also, in the layer region (PN) containing said substance (C), the distribution state of said substance (C) in the layer thickness direction may be either uniform or nonuniform, but desirably be made uniform within the plane in parallel to the substrate surface. When the distribution state of the substance (C) is nonuniform in the layer thickness direction, and when the substance (C) is to be incorporated in the whole layer region of the first layer (G), said substance (C) is contained in the first layer (G) so that it may be more enriched on the substrate side of the first layer (G).

Thus, in the layer region (PN), when the distribution concentration in the layer thickness direction of the above substance (C) is made nonuniform, optical and electrical junction at the contacted interface with other layers can further be improved.

In the present invention, when the substance (C) for controlling conductivity is incorporated in the first layer (G) so as to be locally present in a part of the layer region, the layer region (PN) in which the substance (C) is to be contained is provided as an end portion layer region of the first layer (G), which is to be determined case by case suitably as desired depending on.

In the present invention, when the above substance (C) is to be incorporated in the second layer (S), it is desirable to incorporate the substance (C) in the layer region including at least the contacted interface with the first layer (G).

When the substance (C) for controlling conductivity is to be incorporated in both the first layer (G) and the second layer (S), it is desirable that the layer region containing the substance (C) in the first layer (G) and the layer region containing the substance (C) in the second layer (S) may contact each other.

Also, the above substance (C) contained in the first layer (G) may be either the same as or different from that contained in the second layer (S), and their contents may be either the same or different.

However, in the present invention, when the above substance (C) is of the same kind in the both layers, it is preferred to make the content in the first layer (G) sufficiently greater, or alternatively to incorporate substances (C) with different electrical characteristics in respective layers desired.

In the present invention, by incorporating a substance (C) for controlling conductivity in at least the first layer (G) and/or the second layer (S) constituting the light-receiving layer, conductivity of the layer region containing the substance (C) [which may be either a part or the whole of the layer region of the first layer (G) and/or the second layer (S)] can be controlled as desired. As a substance (C) for controlling conductivity characteristics, there may be mentioned so called impurities in the field of semiconductors. In the present invention, there may be included p-type impurities giving p-type condutivity characteristics and n-type impurities and/or giving n-type conductivity characteristics to A-Si(H,X) and/or A-SiGe(H,X) constituting the light receiving layer to be formed.

More specifically, there may be mentioned as p-type impurities atoms belonging to the group III of the periodic table (Group III atoms), such as B (boron), Al (aluminum), Ga(gallium), In(indium), Tl(thallium), etc., particularly preferably B and Ga.

As n-type impurities, there may be included the atoms belonging to the group V of the periodic table, such as P (phosphorus), As (arsenic), Sb (antimony), Bi (bismuth), etc., particularly preferably P and As.

In the present invention, the content of the substance (C) for controlling conductivity in the layer region (PN) may be suitably be determined depending on the conductivity required for said layer region (PN), or when said layer region (PN) is provided in direct contact with the substrate, the organic relationships such as relation with the characteristics at the contacted interface with the substrate, etc.

Also, the content of the substance (C) for controlling conductivity is determined suitably with due considerations of the relationships with characteristics of other layer regions provided in direct contact with said layer region or the characteristics at the contacted interface with said other layer regions.

In the present invention, the content of the substance (C) for controlling conductivity contained in the layer region (PN) should preferably be 0.01 to $5 \times 10^4$ atomic ppm, more preferably 0.5 to $1 \times 10^4$ atomic ppm, most preferably 1 to $5 \times 10^3$ atomic ppm.

In the present invention, by making the content of said substance (C) in the layer region (PN) preferably 30 atomic ppm or more, more preferably 50 atomic ppm or more, most preferably 100 atomic ppm or more, for example, in the case when said substance (C) to be incorporated is a p-type impurity as mentioned above, migration of electrons injected from the substrate side into the light-receiving layer can be effectively inhibited when the free surface of the light-receiving layer is subjected to the charging treatment to $\oplus$ polarity. On the other hand, when the substance to be incorporated is a n-type impurity, migration of positive holes injected from the substrate side into the light-receiving layer may be effectively inhibited when the free surface of the light-receiving layer is subjected to the charging treatment to $\ominus$ polarity.

In the case as mentioned above, the layer region (Z) at the portion excluding the above layer region (PN) under the basic constitution of the present invention as described above may contain a substance for controlling conductivity of the other polarity, or a substance for controlling conductivity having characteristics of the same polarity may be contained therein in an amount by far smaller than that practically contained in the layer region (PN).

In such a case, the content of the substance (C) for controlling conductivity contained in the above layer region (Z) can be determined adequately as desired depending on the polarity or the content of the substance contained in the layer region (PN), but it is preferably 0.001 to 1000 atomic ppm, more preferably 0.05 to 500 atomic ppm, most preferably 0.1 to 200 atomic ppm.

In the present invention, when the same kind of a substance for controlling conductivity is contained in the layer region (PN) and the layer region (Z), the content in the layer region (Z) should preferably be 30 atomic ppm or less.

In the present invention, it is also possible to provide a layer region containing a substance for controlling conductivity having one polarity and a layer region containing a substance for controlling conductivity having the other polarity in direct contact with each other, thus providing a so called depletion layer at said contact region.

In short, for example, a layer containing the aforesaid p-type impurity and a layer region containing the aforesaid n-type impurity are provided in the light-receiving layer in direct contact with each other to form the so called p-n junction, whereby a depletion layer can be provided.

FIGS. 27 through 35 show typical examples of the depth profiles in the layer thickness direction of the substance (C) contained in the layer region (PN) in the light-receiving layer of the present invention. In each of these Figures, representations of layer thickness and concentration are shown in rather exaggerated forms for illustrative purpose, since the difference between respective Figures will be indistinct if represented by the real values as such, and it should be understood that these Figures are schematic in nature. As practical distribution, the values of ti ($1 \leq i \leq 9$) or Ci ($1 \leq i \leq 17$) should be chosen so as to obtain desired distribution concentration lines, or values obtained by multiplying the distribution curve as a whole with an appropriate coefficient should be used.

In FIGS. 27 through 35, the abscissa shows the distribution concentration C of the substance (C), and the ordinate the layer thickness of the layer region (PN), $t_B$ indicating the position of the end surface on the substrate side of the layer region (G) and $t_T$ the position of the end surface on the side opposite to the substrate side. Thus, layer formation of the layer region (PN) containing the substance (C) proceeds from the $t_B$ side toward the $t_T$ side.

Figure 27:
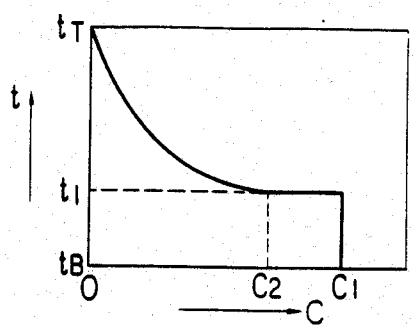
FIGS. 27 through 35 are schematic illustrations of the distribution state of the substance (C) in the layer region (PN)

FIG. 27 shows a first typical example of the depth profile of the substance (C) in the layer thickness direction contained in the layer region (PN).

In the embodiment shown in FIG. 27, from the interface position $t_B$ where the surface at which the layer region (PN) containing the substance (C) contacts the surface of said layer (G) to the position $t_1$, the substance (C) is contained in the layer region (PN) formed while the distribution concentration C of the substance (C) taking a constant value of $C_1$, and the concentration is gradually decreased from the concentration $C_2$ continuously from the position $t_1$ to the interface position $t_T$. At the interface position $t_T$, the distribution concentration C of the substance (C) is made substantially zero (here substantially zero means the case of less than detectable limit).

Figure 28:
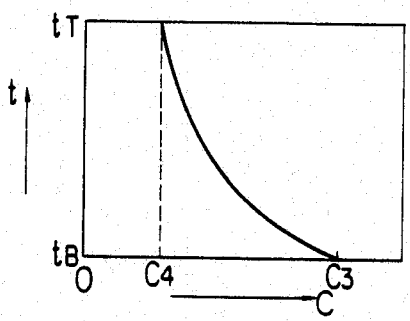

In the embodiment shown in FIG. 28, the distribution concentration C of the substance (C) contained is decreased from the position $t_B$ to the position $t_T$ gradually and continuously from the concentration $C_3$ to the concentration $C_4$ at $t_T$.

Figure 29:
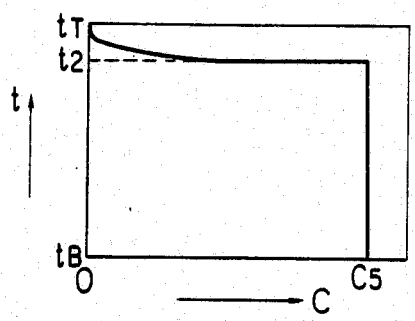

In the case of FIG. 29, from the position $t_B$ to the position $t_2$, the distribution concentration C of the substance (C) is made constantly at $C_5$, while between the position $t_2$ and the position $t_T$, it is gradually and continuously decreased, until the distribution concentration is made substantially zero at the position $t_T$.

Figure 30:
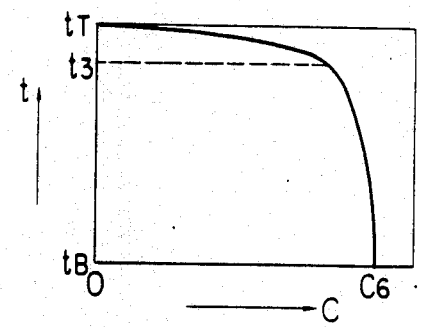

In the case of FIG. 30, the distribution concentration C of the substance (C) is first decreased continuously and gradually from the concentration $C_6$ from the position $t_B$ to the position $t_3$, from where it is abruptly decreased to substantially zero at the position $t_T$.

Figure 31:
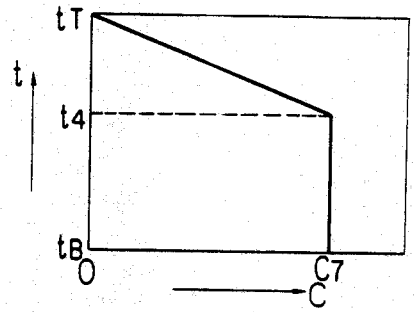

In the embodiment shown in FIG. 31, the distribution concentration of the substance (C) is constantly $C_7$ between the position $t_B$ and the position $t_T$, and the distribution concentration is made zero at the position $t_T$. Between the $t_4$ and the position $t_T$, the distribution concentration C is decreased as a first order function from the position $t_4$ to the position $t_T$.

Figure 32:
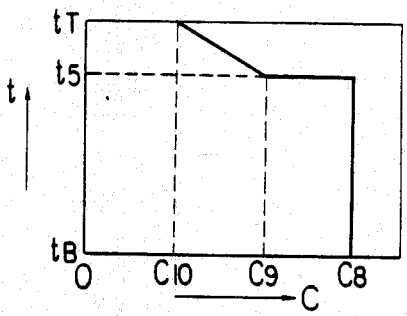

In the embodiment shown in FIG. 32, the distribution concentration C takes a constant value of $C_8$ from the position $t_B$ to the position $t_5$, while it was decreased as a first order function from the concentration $C_9$ to the concentration $C_{10}$ from the position $t_5$ to the position $t_T$.

Figure 33:
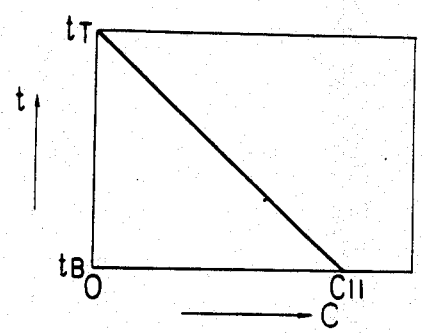

In the embodiment shown in FIG. 33, from the position $t_B$ to the position $t_T$, the distribution concentration C of the substance (C) is decreased continuously as a first order function from the concentration $C_{11}$ to zero.

Figure 34:
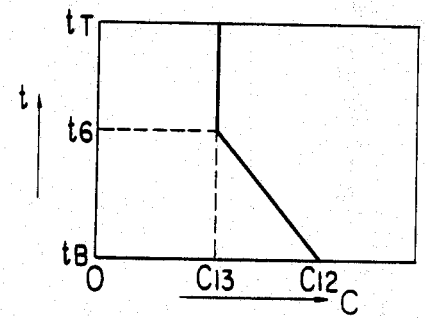

In FIG. 34, there is shown an embodiment, in which, from the position $t_B$ to the position $t_6$, the distribution concentration C of the substance C is decreased as a first order function from the concentration $C_{12}$ to the concentration $C_{13}$, and the concentration is made a constant value of $C_{13}$ between the position $t_6$ and the position $t_T$.

Figure 35:
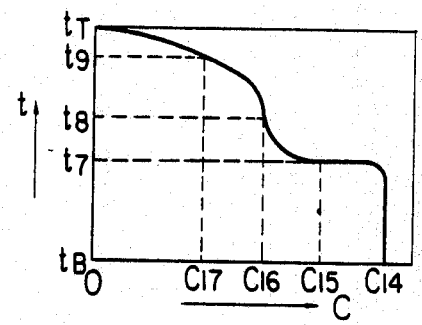

In the embodiment shown in FIG. 35, the distribution concentration C of the substance (C) is $C_{14}$ at the position $t_B$, which is gradually decreased initially from $C_{14}$ and then abruptly near the position $t_7$, where it is made $C_{15}$ at the position $t_7$.

Between the position $t_7$ and the position $t_8$, the concentration is initially abruptly decreased and then moderately gradually, until it becomes $C_{16}$ at the position $t_8$, and between the position $t_8$ and the position $t_9$, the concentration is gradually decreased to reach $C_{17}$ at the position $t_9$. Between the position $t_9$ and the position $t_T$, the concentration is decreased from $C_{17}$, following the curve with a shape as shown in Figure, to substantially zero.

As described above by referring to some typical examples of depth profiles in the layer thickness direction of the substance (C) contained in the layer region (PN) shown FIGS. 27 through 35, it is desirable in the present invention that a depth profile of the substance (C) should be provided in the layer region (PN) so as to have a portion with relatively higher distribution concentration C of the substance (C) on the substrate side, while having a portion on the interface $t_T$ side where said distribution concentration is made considerably lower as compared with the substrate side.

The layer region (PN) constituting the light-receiving member in the present invention is desired to have a localized region (B) containing the substance (C) preferably at a relatively higher concentration on the substrate side as described above.

In the present invention, the localized region (B) as explained in terms of the symbols shown in FIGS. 27 through 35, may be desirably provided within $5\mu$ from the interface position $t_B$.

In the present invention, the above localized region (B) may be made to be identical with the whole of the layer region (L) from the interface position $t_B$ to the thickness of $5\mu$, or alternatively a part of the layer region (L).

It may suitably be determined depending on the characteristics required for the light-receiving layer to be formed whether the localized region (B) should be made a part or the whole of the layer region (L).

For formation of the layer region (PN) containing the aforesaid substance (C) by incorporating a substance (C) for controlling conductivity such as the group III atoms or the group V atoms structurally into the light-receiving layer, a starting material for introduction of the group III atoms or a starting material for introduction of the group V atoms may be introduced under gaseous state into a deposition chamber together with other starting materials for formation of the respective layers during layer formation.

As the starting material which can be used for introduction of the group III atoms, it is desirable to use those which are gaseous at room temperature under atmospheric pressure or can readily be gasified under layer forming conditions. Typical examples of such starting materials for introduction of the group III atoms, there may be included as the compounds for introduction of boron atoms boron hydrides such as $B_2H_6$, $B_4H_{10}$, $B_5H_9$, $B_5H_{11}$, $B_6H_{10}$, $B_6H_{12}$, $B_6H_{14}$, etc. and boron halides such as $BF_3$, $BCl_3$, $BBr_3$, etc. Otherwise, it is also possible to use $AlCl_3$, $GaCl_3$, $Ga(CH_3)_3$, $InCl_3$, $TlCl_3$ and the like.

The starting materials which can effectively be used in the present invention for introduction of the group V atoms may include, for introduction of phosphorus atoms, phosphorus hydrides such as $PH_3$, $P_2H_4$, etc., phosphorus halides such as $PH_4I$, $PF_3$, $PF_5$, $PCl_3$, $PCl_5$, $PBr_3$, $PBr_5$, $PI_3$ and the like. Otherwise, it is possible to utilize $AsH_3$, $AsF_3$, $AsCl_3$, $AsBr_3$, $AsF_5$, $SbH_3$, $SbF_3$, $SbF_5$, $SbCl_3$, $SbCl_5$, $SbCl$, $BiH_3$, $BiCl_3$, $BiBr_3$ and the like effectively as the starting material for introduction of the group V atoms.

In the light-receiving member of the present invention, for the purpose of obtaining higher photosensitivity and dark resistance, and further for the purpose of improving adhesion between the substrate and the light-receiving layer, at least one kind of atoms selected from oxygen atoms, carbon atoms and nitrogen atoms can be contained in the light-receiving layer in either uniform or ununiform distribution state in the layer thickness direction. Such atoms (OCN) to be contained in the light-receiving layer may be contained therein throughout the whole layer region of the light-receiving layer or localized by being contained in a part of the layer region of the light-receiving layer.

The distribution concentration C (OCN) of the atoms (OCN) should desirably be uniform within the plane parallel to the surface of the substrate.

In the present invention, the layer region (OCN) where atoms (OCN) are contained is provided so as to occupy the whole layer region of the light-receiving layer when it is primarily intended to improve photosensitivity and dark resistance, while it is provided so as to occupy the end portion layer region on the substrate side of the light-receving layer when it is primarily intended to strengthen adhesion between the substrate and the light-receiving layer.

In the former case, the content of atoms (OCN) contained in the layer region (OCN) should desirably be made relatively smaller in order to maintain high photosensitivity, while in the latter case relatively larger in order to ensure reinforcement of adhesion to the substrate.

In the present invention, the content of the atoms (OCN) to be contained in the layer region (OCN) provided in the light-receiving layer can be selected suitably in organic relationship with the characteristics required for the layer region (OCN) itself, or with the characteristic at the contacted interface with the substrate when the said layer region (OCN) is provided in direct contact with the substrate, etc.

When other layer regions are to be provided in direct contact with the layer region (OCN), the content of the atoms (OCN) may suitably be selected with due considerations about the characteristics of said other layer regions or the characteristics at the contacted interface with said other layer regions.

The amount of the atoms (OCN) contained in the layer region (OCN) may be determined as desired depending on the characteristics required for the light-receiving member to be formed, but it may preferably be 0.001 to 50 atomic %, more preferably 0.002 to 40 atomic %, most preferably 0.003 to 30 atomic %.

In the present invention, when the layer region (OCN) occupies the whole region of the light-receiving layer or, although not occupying the whole region, the proportion of the layer thickness $T_O$ of the layer region (OCN) occupied in the layer thickness T of the light-receiving layer is sufficiently large, the upper limit of the content of the atoms (OCN) contained in the layer region (OCN) should desirably be made sufficiently smaller than the value as specified above.

In the case of the present invention, when the proportion of the layer thickness $T_O$ of the layer region (OCN) occupied relative to the layer thickness T of the light-receiving layer is 2/5 or higher, the upper limit of the atoms (OCN) contained in the layer region (OCN) should desirably be made 30 atomc % or less, more preferably 20 atomic % or less, most preferably 10 atomic % or less.

According to a preferred embodiment of the present invention, it is desirable that the atoms (OCN) should be contained in at least the above first layer to be provided directly on the substrate. In short, by incorporating the atoms (OCN) at the end portion layer region on the substrate side in the light-receiving layer, it is possible to effect reinforcement of adhesion between the substrate and the light-receiving layer.

Further, in the case of nitrogen atoms, for example, under the co-presence with boron atoms, improvement of dark resistance and improvement of photosensitivity can further be ensured, and therefore they should preferably be contained in a desired amount in the light-receiving layer.

Plural kinds of these atoms (OCN) may also be contained in the light-receiving layer. For example, oxygen atoms may be contained in the first layer, nitrogen atoms in the second layer, or alternatively oxygen atoms and nitrogen atoms may be permitted to be co-present in the same layer region.

FIGS. 43 through 51 show typical examples of ununiform depth profiles in the layer thickness direction of the atoms (OCN) contained in the layer region (OCN) in the light-receiving member of the present invention.

In FIGS. 43 through 51, the abscissa indicates the distribution concentration C of the atoms (OCN), and the ordinate the layer thickness of the layer region (OCN), $t_B$ showing the position of the end surface of the layer region on the substrate side, while $t_T$ shows the position of the end face of the layer region (OCN) opposite to the substrate side. Thus, layer formation of the layer region (OCN) containing the atoms (OCN) proceeds from the $t_B$ side toward the $t_T$ side.

Figure 43:
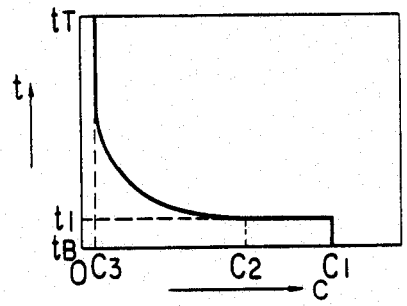
FIGS. 43 through 51 are schematic illustrations of the distribution states of the atoms (OCN) in the layer region (OCN).

FIG. 43 shows a first typical embodiment of the depth profile in the layer thickness direction of the atoms (OCN) contained in the layer region (OCN).

In the embodiment shown in FIG. 43, from the interface position $t_B$ where the surface on which the layer region (OCN) containing the atoms (OCN) is formed contacts the surface of said layer region (OCN) to the position of $t_1$, the atoms (OCN) are contained in the layer region (OCN) to be formed while the distribution concentration of the atoms (OCN) taking a constant value of $C_1$, said distribution concentration being gradually continuously reduced from $C_2$ from the position $t_1$ to the interface position $t_T$, until at the interface position $t_T$, the distribution concentration C is made $C_3$.

Figure 44:
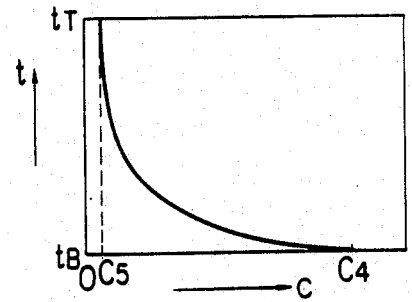

In the embodiment shown in FIG. 44, the distribution concentration C of the atoms (OCN) contained is reduced gradually continuously from the concentration $C_4$ from the position $t_B$ to the position $t_T$, at which it becomes the concentration $C_5$.

Figure 45:
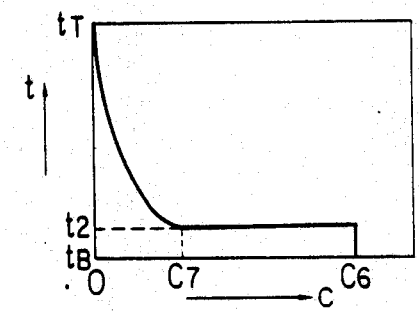

In the case of FIG. 45, from the position $t_B$ to the position $t_2$, the distribution concentration of the atoms (OCN) is made constantly at $C_6$, reduced gradually continuously from the concentration $C_7$ between the position $t_2$ and the position $t_T$, until at the position $t_T$, the distribution concentration C is made substantially zero (here substantially zero means the case of less than the detectable level).

Figure 46:
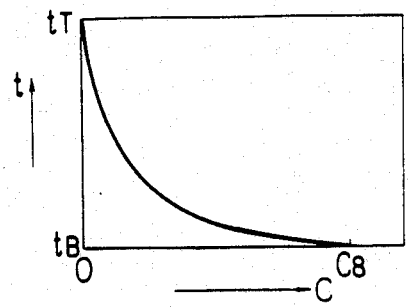

In the case of FIG. 46, the distribution concentration C of the atoms (OCN) is reduced gradually continuously from the concentration $C_8$ from the position $t_B$ up to the position $t_T$, to be made substantially zero at the position $t_T$.

Figure 47:
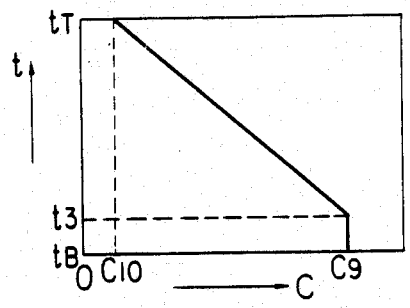

In the embodiment shown in FIG. 47, the distribution concentration C of the atoms (OCN) is made constantly $C_9$ between the position $t_B$ and the position $t_3$, and it is made the concentration $C_{10}$ at the position $t_T$. Between the position $t_3$ and the position $t_T$, the distribution concentration C is reduced from the concentration $C_9$ to substantially zero as a first order function from the position $t_3$ to the position $t_T$.

Figure 48:
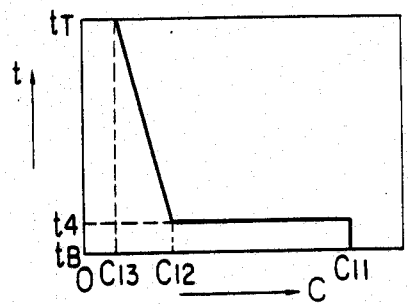

In the embodiment shown in FIG. 48, from the position $t_B$ to the position $t_4$, the distribution concentration C takes a constant value of $C_{11}$, while the distribution state is changed to a first order function in which the concentration is decreased from the concentration $C_{12}$ to the concentration $C_{13}$ from the position $t_4$ to the position $t_T$, and the concentration C is made substantially zero at the position $t_T$.

Figure 49:
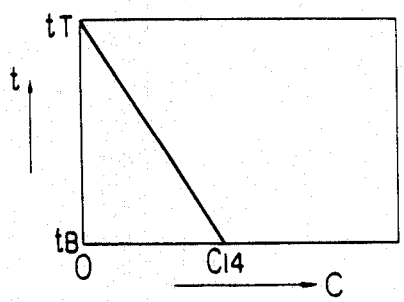

In the embodiment shown in FIG. 49, from the position $t_B$ to the position $t_T$, the distribution concentration C of the atoms (OCN) is reduced as a first order function from the concentration $C_{14}$ to substantially zero.

Figure 50:
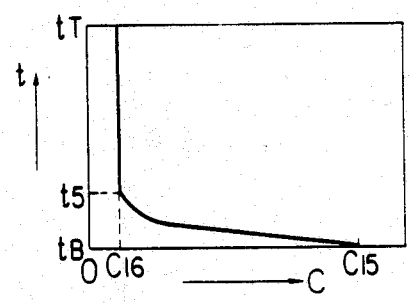

In FIG. 50, there is shown an embodiment, wherein from the position $t_B$ to the position $t_5$, the distribution concentration of the atoms (OCN) is reduced approximately as a first order function from the concentration $C_{15}$ to $C_{16}$, and it is made constantly $C_{16}$ between the position $t_5$ and the position $t_T$.

Figure 51:
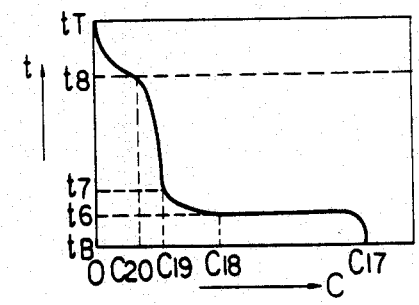

In the embodiment shown in FIG. 51, the distribution concentration C of the atoms (OCN) is $C_{17}$ at the position $t_B$, and, toward the position $t_6$, this $C_{17}$ is initially reduced gradually and then abruptly reduced near the position $t_6$, until it is made the concentration $C_{18}$ at the position $t_6$.

Between the position $t_6$ and the position $t_7$, the concentration is initially reduced abruptly and thereafter gently gradually reduced to become $C_{19}$ at the position $t_7$, and between the position $t_7$ and the position $t_8$, it is reduced very gradually to become $C_{20}$ at the position $t_8$. Between the position $t_8$ and the position $t_T$, the concentration is reduced from the concentration $C_{20}$ to substantially zero along a curve with a shape as shown in the Figure.

As described above about some typical examples of depth profiles in the layer thickness direction of the atoms (OCN) contained in the layer region (OCN) by referring to FIGS. 43 through 51, it is desirable in the present invention that, when the atoms (OCN) are to be contained ununiformly in the layer region (OCN), the atoms (OCN) should be distributed in the layer region (OCN) with higher concentration on the substrate side, while having a portion considerably depleted in concentration on the interface $t_T$ side as compared with the substrate side.

The layer region (OCN) containing atoms (OCN) should desirably be provided so as to have a localized region (B) containing the atoms (OCN) at a relatively higher concentration on the substrate side as described above, and in this case, adhesion between the substrate and the light-receiving layer can be further improved.

The above localized region (B) should desirably be provided within 5µ from the interface position $t_B$, as explained in terms of the symbols indicated in FIGS. 43 through 51.

In the present invention, the above localized region (B) may be made the whole of the layer region ($L_T$) from the interface position $t_B$ to 5µ thickness or a part of the layer region ($L_T$).

It may suitably be determined depending on the characteristics required for the light-receiving layer to be formed whether the localized region (B) is made a part or the whole of the layer region ($L_T$).

The localized region (B) should preferably be formed to have a depth profile in the layer thickness direction such that the maximum value Cmax of the distribution concentration of the atoms (OCN) may preferably be 500 atomic ppm or more, more preferably 800 atomic ppm or more, most preferably 1000 atomic ppm or more.

In other words, in the present invention, the layer region (OCN) containing the atoms (OCN) should preferably be formed so that the maximum value Cmax of the distribution concentration C may exist within 5µ layer thickness from the substrate side (in the layer region with 5µ thickness from $t_B$).

In the present invention, when the layer region (OCN) is provided so as to occupy a part of the layer region of the light-receiving layer, the depth profile of the atoms (OCN) should desirably be formed so that the refractive index may be changed moderately at the interface between the layer region (OCN) and other layer regions.

By doing so, reflection of the light incident upon the light-receiving layer from the interface between contacted interfaces can be inhibited, whereby appearance of interference fringe pattern can more effectively be prevented.

It is also preferred that the distribution concentration C of the atoms (OCN) in the layer region (OCN) should be changed along a line which is changed continuously and moderately, in order to give smooth refractive index change.

In this regard, it is preferred that the atoms (OCN) should be contained in the layer region (OCN) so that the depth profiles as shown, for example, in FIGS. 43 through 46, FIG. 49 and FIG. 51 may be assumed.

In the present invention, for provision of a layer region (OCN) containing the atoms (OCN) in the light-receiving layer, a starting material for introduction of the atoms (OCN) may be used together with the starting material for formation of the light-receiving layer during formation of the light-receiving layer and incorporated in the layer formed while controlling its amount.

When the glow discharge method is employed for formation of the layer region (OCN), a starting material for introduction of the atoms (OCN) is added to the material selected as desired from the starting materials for formation of the light-receiving layer as described above. For such a starting material for introduction of the atoms (OCN), there may be employed most of gaseous or gasified gasifiable substances containing at least the atoms (OCN) as the constituent atoms.

More specifically, there may be included, for example, oxygen ($O_2$), ozone ($O_3$), nitrogen monoxide (NO), nitrogen dioxide ($NO_2$), dinitrogen monoxide ($N_2O$), dinitrogen trioxide ($N_2O_3$), dinitrogen tetraoxide ($N_2O_4$), dinitrogen pentaoxide ($N_2O_5$), nitrogen trioxide ($NO_3$); lower siloxanes containing silicon atom (Si), oxygen atom (O) and hydrogen atom (H) as constituent atoms, such as disiloxane ($H_3SiOSiH_3$), trisiloxane ($H_3SiOSiH_2OSiH_3$), and the like; saturated hydrocarbons having 1-5 carbon atoms such as methane ($CH_4$), ethane ($C_2H_6$), propane ($C_3H_8$), n-butane (n-$C_4H_{10}$), pentane ($C_5H_{12}$); ethylenic hydrocarbons having 2-5 carbon atoms such as ethylene ($C_2H_4$), propylene ($C_3H_6$), butene-1 ($C_4H_8$), butene-2 ($C_4H_8$), isobutylene ($C_4H_8$), pentene ($C_5H_{10}$); acetylenic hydrocarbons having 2-4 carbon atoms such as acetylene ($C_2H_2$), methyl acetylene ($C_3H_4$), butyne ($C_4H_6$); and the like; nitrogen ($N_2$), ammonia ($NH_3$), hydrazine ($H_2NNH_2$), hydrogen azide ($HN_3$), ammonium azide ($NH_4N_3$), nitrogen trifluoride ($F_3N$), nitrogen tetrafluoride ($F_4N$) and so on.

In the case of the sputtering method, as the starting material for introduction of the atoms (OCN), there may also be employed solid starting materials such as $SiO_2$, $Si_3N_4$ and carbon black in addition to those gasifiable as enumerated for the glow discharge method. These can be used in the form of a target for sputtering together with the target of Si, etc.

In the present invention, when forming a layer region (OCN) containing the atoms (OCN) during formation of the light-receiving layer, formation of the layer region (OCN) having a desired depth profile in the direction of layer thickness formed by varying the distribution concentration C of the atoms (OCN) contained in said layer region (OCN) may be conducted in the case of glow discharge by introducing a starting gas for introduction of the atoms (OCN) the distribution concentration C of which is to be varied into a deposition chamber, while varying suitably its gas flow rate according to a desired change rate curve.

For example, by the manual method or any other method conventionally used such as an externally driven motor, etc., the opening of a certain needle valve provided in the course of the gas flow channel system may be gradually varied. During this operation, the rate of variation is not necessarily required to be linear, but the flow rate may be controlled according to a variation rate curve previously designed by means of, for example, a microcomputer to give a desired content curve.

When the layer region (OCN) is formed according to the sputtering method, formation of a desired depth profile of the atoms (OCN) in the layer thickness direction by varying the distribution concentration C of the atoms (OCN) may be performed first similarly as in the case of the glow discharge method by employing a starting material for introduction of the atoms (OCN) under gaseous state and varying suitably as desired the gas flow rate of said gas when introduced into the deposition chamber. Secondly, formation of such a depth profile can also be achieved by previously changing the composition of a target for sputtering. For example, when a target comprising a mixture of Si and $SiO_2$ is to be used, the mixing ratio of Si to $SiO_2$ may be varied in the direction of layer thickness of the target.

The substrate to be used in the present invention may be either electroconductive or insulating. As the electroconductive substrate, there may be mentioned metals such as NiCr, stainless steel, Al, Cr, Mo, Au, Nb, Ta, V, Ti, Pt, Pd etc. or alloys thereof.

As insulating substrates, there may conventionally be used films or sheets of synthetic resins, including polyester, polyethylene, polycarbonate, cellulose acetate, polypropylene, polyvinyl chloride, polyvinylidene chloride, polystyrene, polyamide, etc., glasses, ceramics, papers and so on. At least one side surface of these substrates is preferably subjected to treatment for imparting electroconductivity, and it is desirable to provide other layers on the side at which said electroconductive treatment has been applied.

For example, electroconductive treatment of a glass can be effected by providing a thin film of NiCr, Al, Cr, Mo, Au, Ir, Nb, Ta, V, Ti, Pt, Pd, $In_2O_3$, $SnO_2$, ITO ($In_2O_3+SnO_2$) thereon. Alternatively, a synthetic resin film such as polyester film can be subjected to the electroconductive treatment on its surface by vacuum vapor deposition, electron-beam deposition or sputtering of a metal such as NiCr, Al, Ag, Pb, Zn, Ni, Au, Cr, Mo, Ir, Nb, Ta, V, Ti, Pt, etc. or by laminating treatment with said metal, thereby imparting electroconductivity to the surface. The substrate may be shaped in any form such as cylinders, belts, plates or others, and its form may be determined as desired. For example, when the light-receiving member 1004 in FIG. 10 is to be used as the light-receiving member for electrophotography, it may desirably be formed into an endless belt or a cylinder for use in continuous high speed copying. The substrate may have a thickness, which is conveniently determined so that the light-receiving member as desired may be formed. When the light-receiving member is required to have a flexibility, the substrate is made as thin as possible, so far as the function of a support can be exhibited. However, in such a case, the thickness is generally 10$\mu$ or more from the points of fabrication and handling of the substrate as well as its mechanical strength.

Next, an example of the process for producing the light-receiving member of this invention is to be briefly described.

Figure 20:
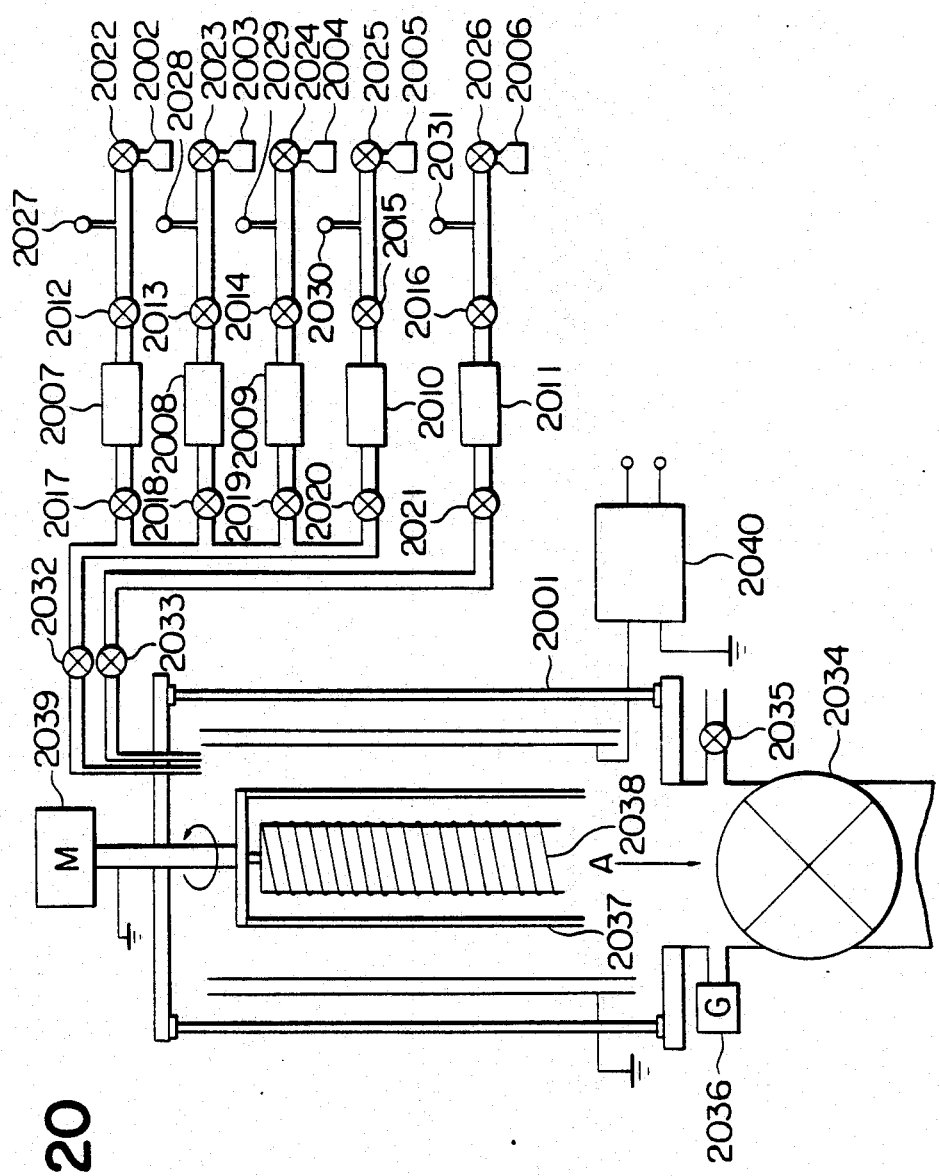
FIG. 20 and FIG. 63 are schematic illustrations of the vacuum deposition devices for preparation of the light-receiving members employed in Examples.

FIG. 20 shows one example of a device for producing a light-receiving member.

In the gas bombs 2002 to 2006, there are hermetically contained starting gases for formation of the light-receiving member of the present invention. For example, 2002 is a bomb containing SiH₄ gas (purity 99.999%, hereinafter abbreviated as SiH₄), 2003 is a bomb containing GeH₄ gas (purity 99.999%, hereinafter abbreviated as GeH₄), 2004 is a bomb containing NO gas (purity 99.99%, hereinafter abbreviated as NO), 2005 is bomb containing B₂H₆ gas diluted with H₂ (purity 99.999%, hereinafter abbreviated as B₂H₆/H₂) and 2006 is a bomb containing H₂ gas (purity: 99.999%).

For allowing these gases to flow into the reaction chamber 2001, on confirmation of the valves 2022 to 2026 of the gas bombs 2002 to 2006 and the leak valve 2035 to be closed, and the inflow valves 2012 to 2016, the outflow valves 2017 to 2021 and the auxiliary valves 2032 and 2033 to be opened, the main valve 2034 is first opened to evacuate the reaction chamber 2001 and the gas pipelines. As the next step, when the reading on the vacuum indicator 2036 becomes $5 \times 10^{-6}$ Torr, the auxiliary valves 2032, 2033 and the outflow valves 2017 to 2021 are closed.

Referring now to an example of forming a light-receiving layer on the cylindrical substrate 2037, SiH₄ gas from the gas bomb 2002, GeH₄ gas from the gas bomb 2003, NO gas from the gas bomb 2004, B₂H₆/H₂ gas from the gas bomb 2005 and H₂ gas from the gas bomb 2006 are permitted to flow into the mass-flow controllers 2007, 2008, 2009, 2010 and 2011, respectively, by opening the valves 2022, 2023, 2024, 2025 and 2026 and controlling the pressures at the output pressure gauges 2027, 2028, 2029 2030 and 2031 to 1 Kg/cm² and opening gradually the inflow valves 2012, 2013, 2014, 2015 and 2016, respectively. subsequently, the outflow valves 2017, 2018, 2019, 2020 and 2021 and the auxiliary valves 2032 and 2033 were gradually opened to permit respective gases to flow into the reaction chamber 2001. The outflow valves 2017, 2018, 2019, 2020 and 2021 are controlled so that the flow rate ratio of SiH₄ gas, GeH₄ gas, B₂H₆/H₂ gas, NO gas and H₂ may have a desired value and opening of the main valve 2034 is also controlled while watching the reading on the vacuum indicator 2036 so that the pressure in the reaction chamber 2001 may reach a desired value. And, after confirming that the temperature of the substrate 2037 is set at 50° to 400° C. by the heater 2038, the power source 2040 is set at a desired power to excite glow discharge in the reaction chamber 2001, simultaneously with controlling of the distributed concentrations of germanium atoms and boron atoms to be contained in the layer formed by carrying out the operation to change gradually the openings of the valves 2018, 2020 by the manual method or by means of an externally driven motor, etc. thereby changing the flow rates of GeH₄ gas and B₂H₆ gas according to previously designed change rate curves.

By maintaining the glow discharge as described above for a desired period time, the first layer (G) is formed on the substrate 2037 to a desired thickness. At the stage when the first layer (G) is formed to a desired thickness, the second layer (S) containing substantially no germanium atom can be formed on the first layer (G) by maintaining glow discharge according to the same conditions and procedure as those in formation of the first layer (G) except for closing completely the outflow valve 2018 and changing, if desired, the discharging conditions. Also, in the respective layers of the first layer (G) and the second layer (S), by opening or closing as desired the outflow valves 2019 or 2020, oxygen atoms or boron atoms may be contained or not, or oxygen atoms or boron atoms may be contained only in a part of the layer region of the respective layers.

When nitrogen atoms or carbon atoms are to be contained in place of oxygen atoms, layer formation may be conducted by replacing NO gas in the gas bomb 2004 with NH₃ or CH₄. Also, when the kinds of the gases employed are desired to be increased, bombs of desirable gases may be provided additionally before carrying out layer formation similarly. During layer formation, for uniformization of the layer formation, it is desirable to rotate the substrate 2037 by means of a motor 2039 at a constant speed.

The present invention is described in more detail by referring to the following Examples.

EXAMPLE 1

By means of a lathe, an aluminum substrate was worked to have the surface characteristic of No. 101 A shown in Table 1A.

Next, by use of the deposition device shown in FIG. 20, following various procedures under the conditions as shown in Table 2A, a light-receiving member for electrophotography of A-Si was deposited on the above aluminum substrate.

The layer thickness distribution of the light-receiving member for electrophotography of A-Si:H thus prepared was measured by an electron microscope to find that the average layer thickness difference was 0.1 μm between the center and both ends of the A-SiGe:H layer and 2 μm between the center and both ends of the A-Si:H layer, with the layer thickness difference at the minute portion being 0.02 μm in the A-SiGe:H layer and 0.3 μm in the A-Si:H layer.

Figure 26:
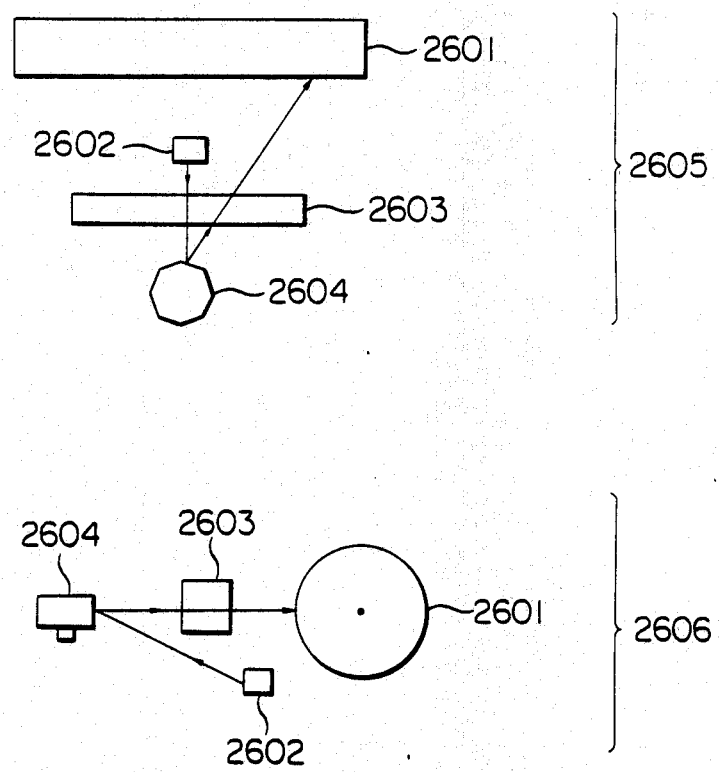
FIG. 26 is a schematic illustration of the image exposure device employed in Examples.

The light-receiving member for electrophotography as prepared above was subjected to image exposure by means of a device as shown in FIG. 26 (wavelength of laser beam: 780 nm, spot diameter ent and transfer to 80 μm), followed by development and transfer to obtain an image. The image was free from any interference fringe pattern observed and proved to be satisfactory for practical application.

EXAMPLE 2

By means of a lathe, an aluminum substate was worked by the same manner as in Example 1 to have the surface characteristic of No. 102 A shown in Table 1A.

Next, by use of the deposition device shown in FIG. 20, following the same procedures as in Example 1 under the conditions as shown in Table 3A, a light-receiving member for electrophotography of A-Si:H was deposited on the above aluminum substrate.

The layer thickness distribution of the light-receiving member for electrophotography of A-Si:H thus prepared was measured by an electron microscope to find that the average layer thickness difference was 0.1 μm between the center and both ends of the A-SiGe:H layer and 2 μm between the center and both ends of the A-Si:H layer, with the layer thickness difference at the minute portion being 0.03 μm in the A-siGe:H layer and 0.3 μm in the A-Si:H layer.

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 3

By means of a lathe, an aluminum substrate was worked by the same manner as in Example 1 to have the surface characteristic of No. 103 A shown in Table 1A.

Next, by use of the deposition device shown in FIG. 20, following the sane procedures as in Example 1 under the conditions as shown in Table 4A, a light-receiving member for electrophotography of A-Si was deposited on the above aluminum substrate.

The layer thickness distribution of the light-receiving member for electrophotography of A-Si:H thus prepared was measured by an electron microscope to find that the average layer thickness difference was 0.6 μm between the center and both ends of the A-SiGe:H layer and 2 μm between the center and both ends of the A-Si:H layer, with the layer thickness difference at the minute portion being 0.01 μm in the A-SiGe:H layer and 0.3 μm in the A-Si:H layer.

The light-receiving member for electrophotography as prepared above was subjected to image exposure by means of a device as shown in FIG. 26 (wavelength of laser beam: 780 μnm, spot diameter 80 μm), followed by development and transfer to obtain an image. The image was free from any interference fringe pattern observed and proved to be satisfactory for practical application.

EXAMPLE 4

By means of a lathe, an aluminum substrate was worked by the same manner as in Example 1 to have the surface characteristic of No. 104 A shown in Table 1A.

Next, by use of the deposition device shown in FIG. 20, following the same procedures as in Example 1 under the conditions as shown in Table 5A, a light-receiving member for electrophotography of A-Si:H was deposited on the above aluminum substrate.

The layer thickness distribution of the light-receiving member for electrophotography of A-Si:H thus prepared was measured by an electron microscope to find that the average layer thickness difference was 0.8 μm between the center and both ends of the A-SiGe:H layer and 2 μm between the center and both ends of the A-Si:H layer, with the layer thickness difference at the minute portion being 0.15 μm in the A-SiGe:H layer and 0.3 μm in the A-Si:H layer.

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 5

Figure 21:
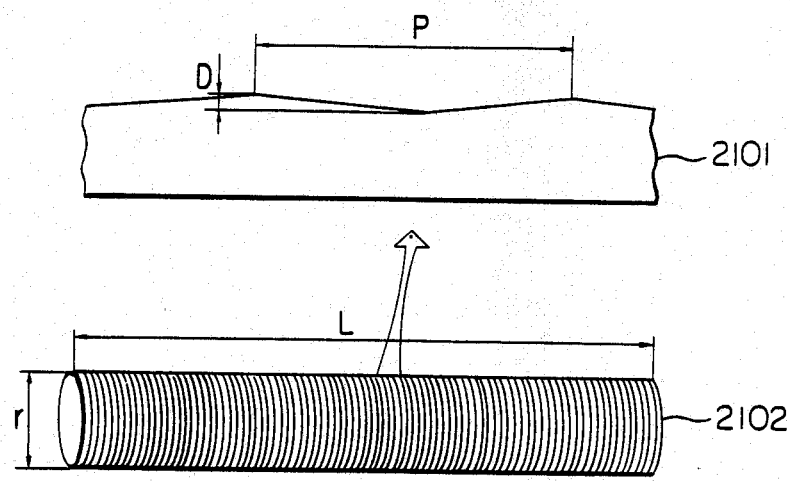
FIG. 21, FIG. 64 and FIG. 65 are schematic illustrations of the surface states of the aluminum substrates employed in Examples.

By means of a lathe, an aluminum substrate (length (L): 357 mm, outerdiameter (r): 80 mm) was worked as shown in FIG. 21 (P: pitch, D: depth) under the conditions shown in Table 2B (Nos. 201–204).

Next, a light-receiving member for electrophotography of a-Si:H was prepared following various procedures using the film deposition device in FIG. 20 under the conditions as shown in Table 1B (Sample Nos. 201B–204B).

Figure 22:
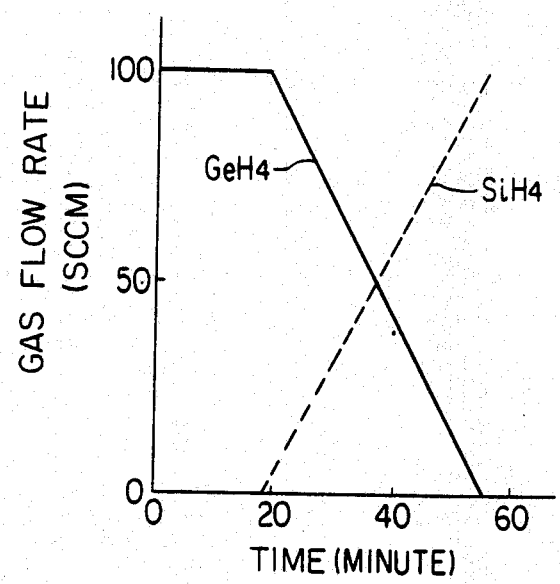
FIGS. 22 through 25, FIGS. 36 through 42, FIGS. 52 through 59, FIGS. 60 through 62, FIGS. 66 through FIGS. 80 are schematic illustrations of the changes in gas flow rates of the respective gases in Examples.

The a-(Si;Ge):H layer as the first layer was formed while controlling the flow rate of GeH$_4$ and SiH$_4$ as shown in FIG. 22 by operating mass flow controllers 2008 and 2007 for GeH$_4$ and SiH$_4$, respectively, using a computer (HP9845B: produced by Hewlett-Packard Inc.).

The thickness of each layer of the light-receiving members thus prepared was measured using an electron microscope to obtain the results as shown in Table 2B (Sample Nos. 201B–204B).

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application (Sample Nos. 201B–204B).

EXAMPLE 6

By means of a lathe, an aluminum substrate (length (L): 357 mm, outerdiameter (r): 80 mm) was worked as shown in FIG. 21 (P: pitch, D: depth) under the conditions shown in Table 3B (Nos. 301–304).

Next, a light-receiving member for electrophotography of a-Si:H was prepared following various procedures using the film deposition device in FIG. 20 under the conditions as shown in Table 1B (Sample Nos. 301B–304B).

Figure 23:
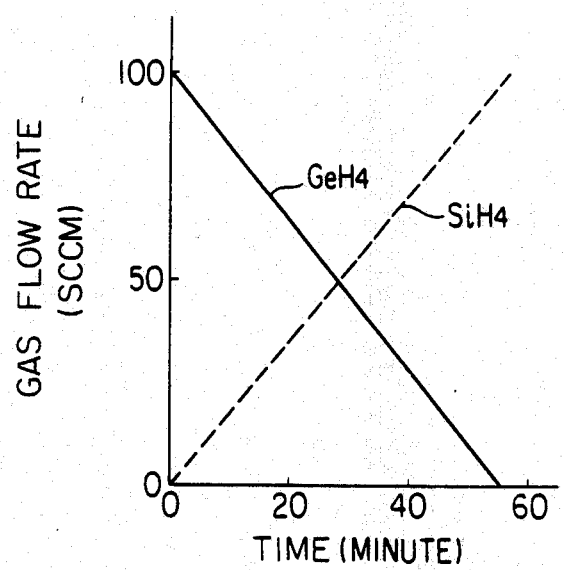

The a-(Si;Ge):H layer as the first layer was formed while controlling the flow rate of GeH$_4$ and SiH$_4$ as shown in FIG. 23 by operating mass flow controllers 2008 and 2007 for GeH$_4$ and SiH$_4$, respectively, using a computer (HP9845B).

The thickness of each layer of the light-receiving members thus prepared was measured using an electron microscope to obtain the results as shown in Table 3B (Sample Nos. 301B–304B).

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application (Sample Nos. 301B–304B).

EXAMPLE 7

By means of a lathe, an aluminum substrate (length (L): 357 mm, outerdiameter (r): 80 mm) was worked as shown in FIG. 21 (P: pitch, D: depth) under the conditions shown in Table 5B (Nos. 501–504).

Next, a light-receiving member for electrophotography of a-Si:H was prepared following various procedures using the film deposition device in FIG. 20 under the conditions as shown in Table 4B (Sample Nos. 501B–504B).

Figure 24:
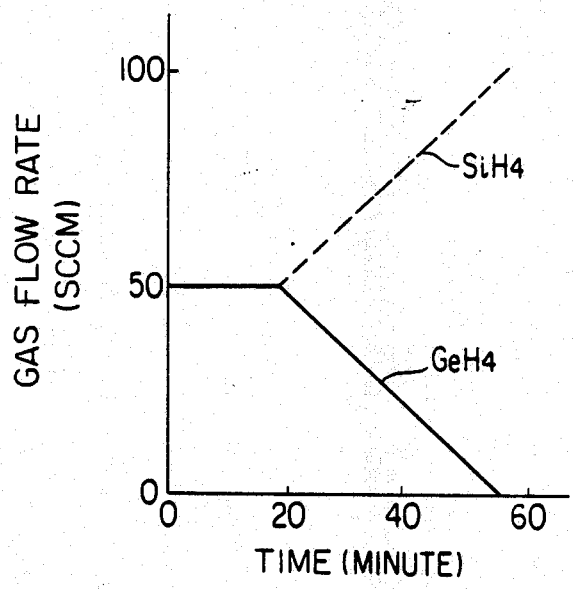

The a-(Si;Ge):H layer as the first layer was formed while controlling the flow rate of GeH$_4$ and SiH$_4$ as shown in FIG. 24 by operating mass flow controllers 2008 and 2007 for GeH$_4$ and SiH$_4$, respectively, using a computer (HP9845B).

The thickness of each layer of the light-receiving members thus prepared was measured using an electron microscope to obtain the results as shown in Table 5B (Sample Nos. 501B–504B).

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application (Sample Nos. 501B–504B).

EXAMPLE 8

By means of a lathe, an aluminum substrate (length (L): 357 mm, outerdiameter (r): 80 mm) was worked as shown in FIG. 21 (P: pitch, D: depth) under the conditions shown in Table 6B (Nos. 601–604).

Next, a light-receiving member for electrophotography of a-Si:H was prepared following various procedures using the film deposition device in FIG. 20 under the conditions as shown in Table 4B (Sample Nos. 601B–604B).

Figure 25:
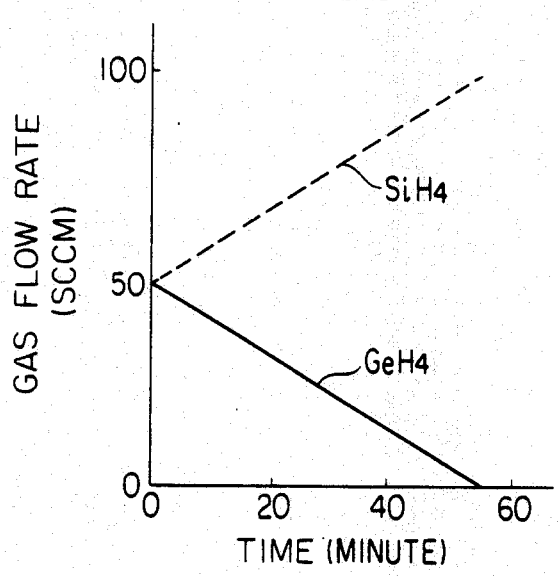

The a-(Si;Ge):H layer as the first layer was formed while controlling the flow rate of $GeH_4$ and $SiH_4$ as shown in FIG. 25 by operating mass flow controllers 2008 and 2007 for $GeH_4$ and $SiH_4$, respectively, using a computer (HP9845B).

The thickness of each layer of the light-receiving members thus prepared was measured using an electron microscope to obtain the results as shown in Table 6B (Sample Nos. 601B–604B).

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application (Sample Nos. 601B–604B).

EXAMPLE 9

By means of a lathe, an aluminum substrate (length (L): 357 mm, outerdiameter (r): 80 mm) was worked as shown in FIG. 21 (P: pitch, D: depth) under the conditions shown in Table 2C (Cylinder Nos. 201–204).

Next, a light-receiving member for electrophotography was prepared following various procedures using the deposition device in FIG. 20 under the conditions as shown in Table 1C (Sample Nos. 201C–204C).

The thickness of each layer of the light-receiving members thus prepared was measured using an electron microscope to obtain the results as shown in Table 2C (Nos. 201C–204C).

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 10

By means of a lathe, an aluminum substrate (length (L): 357 mm, outer diameter (r): 80 mm) was worked as shown in FIG. 21 (P: pitch, D: depth) under the conditions shown in Table 4C (Cylinder Nos. 401–404).

Next, a light-receiving member for electrophotography was prepared following various procedures using the film deposition device in FIG. 20 under the conditions as shown in Table 3C (Sample Nos. 401C–404C).

The thickness of each layer of the light-receiving members thus prepared was measured using an electron microscope to obtain the results as shown in Table 4C (Nos. 401C–404C).

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 11

By means of a lathe, an aluminum substrate (length (L): 357 mm, outerdiameter (r): 80 mm) was worked as shown in FIG. 21 (P: pitch, D: depth) under the conditions shown in Table 6C (Cylinder Nos. 601–604).

Next, a light-receiving member for electrophotography was prepared following various procedures using the film deposition device in FIG. 20 under the conditions as shown in Table 5C (Sample Nos. 601C–604C).

The thickness of each layer of the light-receiving members thus prepared was measured using an electron microscope to obtain the results as shown in Table 6C (Nos. 601C–604C).

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 12

By means of a lathe, an aluminum substrate (length (L): 357 mm, outerdiameter (r): 80 mm) was worked as shown in FIG. 21 (P: pitch, D: depth) under the conditions shown in Table 8C (Cylinder Nos. 801–804).

Next, a light-receiving member for electrophotography was prepared following various procedures using the film deposition device in FIG. 20 under the conditions as shown in Table 7C (Sample Nos. 801C–804C).

The thickness of each layer of the light-receiving members thus prepared was measured using an electron microscope to obtain the results as shown in Table 8C (Nos. 801C–804C).

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 13

Figure 1:
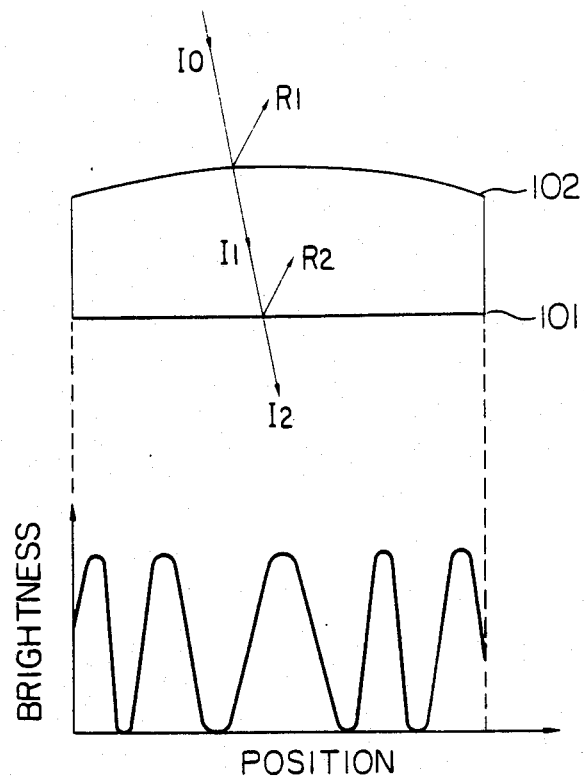
FIG. 1 is a schematic illustration of interference fringe in general.
Figure 2:
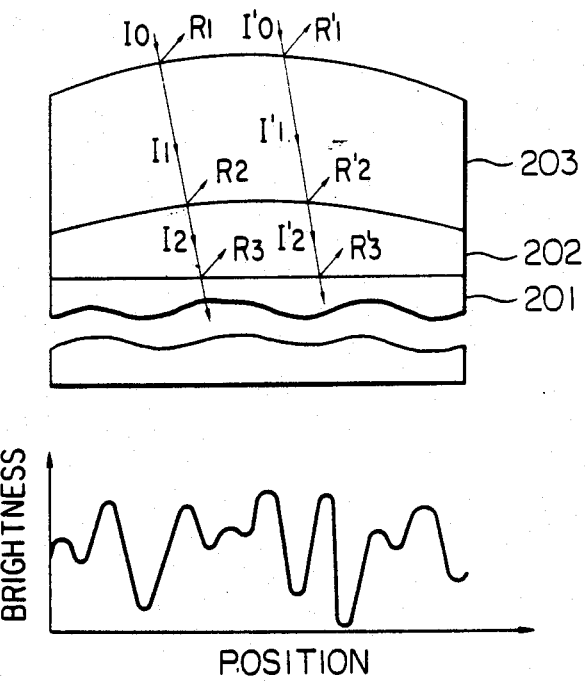
FIG. 2 is a schematic illustration of interference fringe in the case of a multi-layer light-receiving member.
Figure 3:
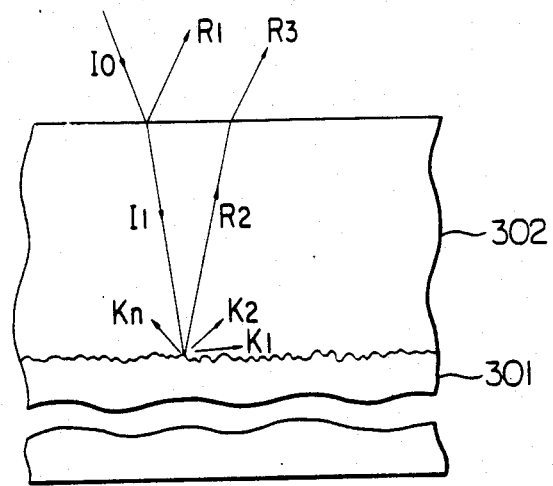
FIG. 3 is a schematic illustration of interference fringe by scattered light.
Figure 4:
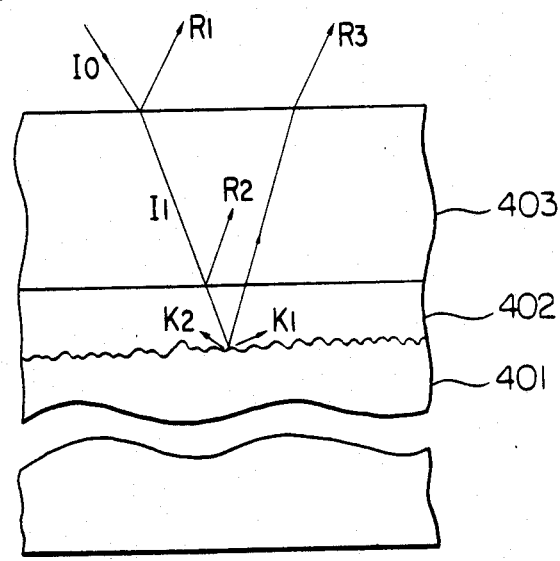
FIG. 4 is a schematic illustration of interference fringe by scattered light in the case of a multi-layer light-receiving member.
Figure 5:
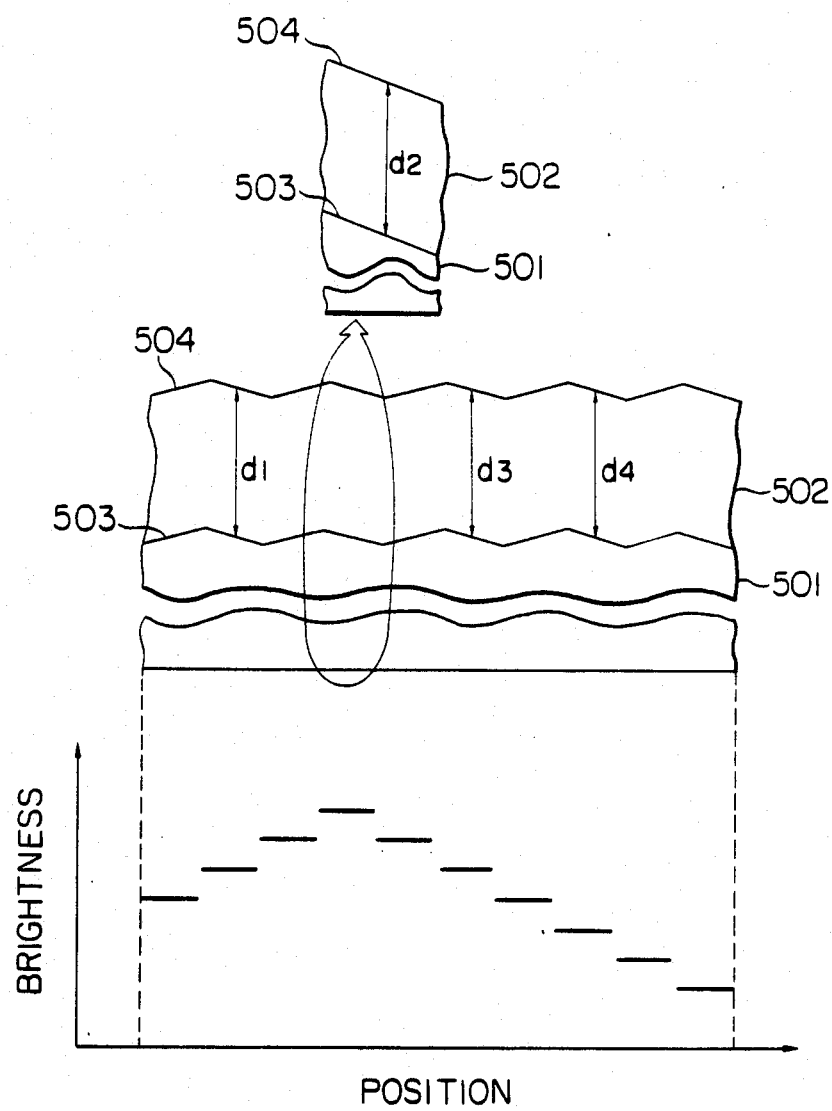
FIG. 5 is a schematic illustration of interference fringe in the case where the interfaces of respective layers of a light-receiving member are parallel to each other.

By means of a lathe, an aluminum substrate (length (L): 357 mm, outerdiameter (r): 80 mm) was worked as shown in FIG. 2I (P: Pitch, D: depth) under the conditions shown in Table 7C (Cylinder Nos. 1001–1004 ).

Next, a light-receiving member for electrophotography was prepared following various procedures using the film deposition device in FIG. 20 under the conditions as shown in Table 7C (Sample Nos. 1001C–1004C).

The thickness of each layer of the light-receiving members thus prepared was measured using an electron microscope to obtain the results as shown in Table 10C (Nos. 1001C–1004C).

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 14

By means of a lathe, an aluminum substrate (length (L): 357 mm, outerdiameter (r): 80 mm) was worked as shown in FIG. 21 (P: pitch, D: depth) under the conditions shown in Table 12C (Cylinder Nos. 1201–1204).

Next, a light-receiving member for electrophotography was prepared following various procedures using the fill deposition device in FIG. 20 under the conditions as shown in Table 11C (Sample Nos. 1201C–1204C).

The thickness of each layer of the light-receiving members thus prepared was measured using an electron microscope to obtain the results as shown in Table 12C (Nos. 1201C–1204C).

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 15

By means of a lathe, an aluminum substrate (length (L): 357 mm, outerdiameter (r): 80 mm) was worked as shown in FIG. 21 (P: pitch, D: depth) under the conditions shown in Table 14C (Cylinder Nos. 1401–1404 ).

Next, a light-receiving member for electrophotography was prepared following various procedures using the film deposition device in FIG. 20 under the conditions as shown in Table 13C (Sample Nos. 1401C–1404C).

The thickness of each layer of the light-receiving members thus prepared was measured using an electron microscope to obtain the results as shown in Table 14C (Nos. 1401C–1404C).

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 16

By means of a lathe, an aluminum substrate (length (L): 357 mm, outerdiameter (r): 80 mm) was worked as shown in FIG. 21 (P: pitch, D: depth) under the conditions shown in Table 16C (Cylinder Nos. 1601–1604).

Next, a light-receiving member for electrophotography was prepared following various procedures using the film deposition device in FIG. 20 under the conditions as shown in Table 15C (Sample Nos. 1601C–1604C).

The thickness of each layer of the light-receiving members thus prepared was measured using an electron microscope to obtain the results as shown in Table 16C (Nos. 1601C–1604C).

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 17

By means of a lathe, an aluminum substrate (length (L): 357 mm, outerdiameter (r): 80 mm) was worked as shown in FIG. 21 (P: pitch, D: depth) under the conditions shown in Table 18C (Cylinder Nos. (1801–1804).

Next, a light-receiving member for electrophotography was prepared following various procedures using the film deposition device in FIG. 20 under the conditions as shown in Table 17C (Sample Nos. 1801C–1804C).

The thickness of each layer of the light-receiving members thus prepared was measured using an electron microscope to obtain the results as shown in Table 18C (Nos. 1801C–1804C).

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 18

By means of a lathe, an aluminum substrate (length (L): 357 mm, outerdiameter (r): 80 mm) was worked as shown in FIG. 21 (P: pitch, D: depth) under the conditions shown in Table 20C (Cylinder Nos. 2001–2004).

Next, a light-receiving member for electrophotography was prepared following various procedures using the film deposition device in FIG. 20 under the conditions as shown in Table 19C (Sample Nos. 2001C–2004C).

The thickness of each layer of the light-receiving members thus prepared was measured using an electron microscope to obtain the results as shown in Table 20C (Nos. 2001C–2004C).

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 19

By means of a lathe, an aluminum substrate (length (L): 357 mm, outerdiameter (r): 80 mm) was worked as shown in FIG. 21 (P: pitch, D: depth) under the conditions shown in Table 22C (Cylinder Nos. 2201–2204).

Next, a light-receiving member for electrophotography was prepared following various procedures using the film deposition device in FIG. 20 under the conditions as shown in Table 21C (Sample Nos. 2201C–2204C).

The thickness of each layer of the light-receiving members thus prepared was measured using an electron microscope to obtain the results as shown in Table 22C (Nos. 2201C–2204C).

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 20

By means of a lathe, an aluminum substrate (length (L): 357 mm, outerdiameter (r): 80 mm) was worked as shown in FIG. 21 (P: pitch, D: depth) under the conditions shown in Table 24C (Cylinder Nos. 2401–2404).

Next, a light-receiving member for electrophotography was prepared following various procedures using the film deposition device in FIG. 20 under the conditions as shown in Table 23C (Sample Nos. 2401C–2404C).

The thickness of each layer of the light-receiving members thus prepared was measured using an electron microscope to obtain the results as shown in Table 24C (Nos. 2401C–2404C).

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 21

By means of a lathe, an aluminum substrate (length (L): 357 mm, outerdiareter (r): 80 mm) was worked as shown in FIG. 21 (P: pitch, D: depth) under the conditions shown in Table 26C (Cylinder Nos. 2601–2604).

Next, a light-receiving member for electrophotography was prepared following various procedures using the film deposition device in FIG. 20 under the conditions as shown in Table 25C (Sample Nos. 2601C–2604C).

The thickness of each layer of the light-receiving members thus prepared was measured using an electron microscope to obtain the results as shown in Table 26C (Nos. 2601C–2604C).

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 22

By means of a lathe, an aluminum substrate (length (L): 357 mm, outerdiameter (r): 80 mm) was worked as shown in FIG. 21 (P: pitch, D: depth) under the conditions shown in Table 28C (Cylinder Nos. 2801–2804).

Next, a light-receiving member for electrophotography was prepared following various precedures using the film deposition device in FIG. 20 under the conditions as shown in Table 27C (Sample Nos. 2801C–2804C).

The thickness of each layer of the light-receiving members thus prepared was measured using an electron microscope to obtain the results as shown in Table 28C (Nos. 2801C–2804C).

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 23

For examples 9 through 22, light-receiving members for electrophotography (Sample Nos. 2901C–2913C) were prepared by use of $PH_3$ gas diluted with $H_2$ (to further 100-fold as compared with the case of $B_2H_6$) in place of $B_2H_6$ gas diluted with $H_2$.

Other preparstion conditions were the same as in Examples 9 through 22.

These light-receiving members for electrophogography were each subjected to image exposure by means of a device as shown in FIG. 26 (wavelength of laser beam: 780 nm, spot diameter 80 μm), followed by development and transfer to obtain an image. Each image was free from any interference fringe pattern observed and proved to be satisfactory for practical application.

EXAMPLE 24

By means of a lathe, an aluminum substrate (length (L): 357 mm, outerdiameter (r): 80 mm) was worked as shown in FIG. 21 (P: pitch, D: depth) under the conditions shown in Table 2D (Nos. 201–204).

Next, a light-receiving member for electrophotography of a-Si:H was prepared following various procedures using the film deposition device in FIG. 20 under the conditions as shown in Table 1D (Sample Nos. 201D–204D).

The a-SiGe:H:B layer as the first layer was formed while controlling the flow rate of $GeH_4$ and $SiH_4$ as shown in FIG. 22 by operation mass flow controllers 2008 and 2007 for $GeH_4$ and $SiH_4$, respectively, using a computer (HP9845B).

The thickness of each layer of the light-receiving members thus prepared was measured using an electron microscope to obtain the results as shown in Table 2D.

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application (Sample Nos. 201D–204D).

EXAMPLE 25

By means of a lathe, an aluminum substrate (length (L): 357 mm, outerdiameter (r): 80 mm) was worked as shown in FIG. 21 (P: Pitch, D: depth) under the conditions shown in Table 3D (Nos. 301–304).

Next, a light-receiving member for electrophotography of a-Si:H was prepared following various procedures using the film deposition device in FIG. 20 under the conditions as shown in Table 1D (Sample Nos. 301D–304D).

The a-SiGe:H:B layer as the first layer was formed while controlling the flow rate of $GeH_4$ and $SiH_4$ as shown in FIG. 23 by operating mass flow controllers 2008 and 2007 for $GeH_4$ and $SiH_4$, respectively, using a computer (HP9845B).

The thickness of each layer of the light-receiving members thus prepared was measured using an electron microscope to obtain the results as shown in Table 3D.

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application (Sample Nos. 301D–304D).

EXAMPLE 26

By means of a lathe, an aluminum substrate (length (L): 357 mm, outerdiameter (r): 80 mm) was worked as shown in FIG. 21 (P: pitch, D: depth) under the conditions shown in Table 5D (Nos. 501–504). 504).

Next, a light-receiving member for electrophotography of a-Si:H was prepared following various procedures using the film deposition device in FIG. 20 under the conditions as shown in Table 4D (Sample Nos. 501D–504D).

The a- SiGe:H:B layer as the first layer was formed while controlling the flow rate of $GeH_4$ and $SiH_4$ as shown in FIG. 24 by operating mass flow controllers 2008 and 2007 for $GeH_4$ and $SiH_4$, respectively, using a computer (HP9845B).

The thickness of each layer of the light-receiving members thus prepared was measured using an electron microscope to obtain the results as shown in Table 5D.

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application (Sample Nos. 501D–504D).

EXAMPLE 27

By means of a lathe, an aluminum substrate (length (L): 357 mm, outerdiameter (r): 80 mm) was worked as shown in FIG. 21 (P: pitch, D: depth) under the conditions shown in Table 6D (Nos. 601–604).

Next, a light-receiving member for electrophotography of a-Si:H type was prepared following various procedures using the film deposition device in FIG. 20 under the conditions as shown in Table 4D (Sample Nos. 601D–604D).

The a-SiGe:H:B layer as the first layer was formed while controlling the flow rate of $GeH_4$ and $SiH_4$ as shown in FIG. 25 by operating mass flow controllers 2008 and 2007 for $GeH_4$ and $SiH_4$, respectively, using a computer (HP9845B).

The thickness of each layer of the light-receiving members thus prepared was measured using an electron microscope to obtain the results as shown in Table 6D.

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application (Sample Nos. 601D–604D).

EXAMPLE 28

By means of a lathe, an aluminum substrate (length (L): 357 mm, outerdiameter (r): 80 mm) was worked as shown in FIG. 21 (P: pitch, D: depth) under the conditions shown in Table 8D.

Next, a light-receiving member for electrophotography was prepared following various procedures using the film deposition device in FIG. 20 under the conditions as shown in Table 7D (Sample Nos. 801D–804D).

The a-SiGe:H:B layer as the first layer was formed while controlling the flow rate of $GeH_4$ and $SiH_4$ as shown in FIG. 22 by operating mass flow controllers 2008 and 2007 for $GeH_4$ and $SiH_4$, respectively, using a computer (HP9845B).

The thickness of each layer of the light-receiving members thus prepared was measured using an electron microscope to obtain the results as shown in Table 8D.

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 29

By means of a lathe, an aluminum substrate (length (L): 357 mm, outerdiameter (r): 80 mm) was worked as shown in FIG. 21 (P: pitch, D: depth) under the conditions shown in Table 10D.

Next, a light-receiving member for electrophotography of a-Si type was prepared following various procedures using the film deposition device in FIG. 20 under the conditions as shown in Table 9D (Sample Nos. 1001D–1004D).

The a-SiGe:H:B layer as the fifst layer was formed while controlling the flow rate of $GeH_4$ and $SiH_4$ as shown in FIG. 24 by operating mass flow controllers 2008 and 2007 for $GeH_4$ and $SiH_4$, respectively, using a computer (HP9845B).

The thickness of each layer of the light-receiving members thus prepared was measured using an electron microscope to obtain the results as shown in Table 10D.

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 30

By means of a lathe, an aluminum substrate (length (L): 357 mm, outerdiameter (r): 80 mm) was worked as shown in FIG. 21 (P: pitch, D: depth) under the conditions shown in Table 12D.

Next, a light-receiving member for electrophotography was prepared following various procedures using the film deposition device in FIG. 20 under the conditions as shown in Table 11D (Sample Nos. 1201D-1204D).

The a-SiGe:H:B layer as the first layer was formed while controlling the flow rate of GeH$_4$ and SiH$_4$ as shown in FIG. 25 by operating mass flow controllers 2008 and 2007 for GeH$_4$ and SiH$_4$, respectively, using a computer (HP9845B).

The thickness of each layer of the light-receiving members thus prepared was measured using an electron microscope to obtain the results as shown in Table 12D.

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 31

By means of a lathe, an aluminum substrate (length (L): 357 mm, outerdiameter (r): 80 mm) was worked as shown in FIG. 21 (P: pitch, D: depth) under the conditions shown in Table 14D.

Next, a light-receiving member for electrophotography was prepared following various procedures using the film deposition device in FIG. 20 under the conditions as shown in Table 13D (Sample Nos. 1401D-1404D).

The a-SiGe:H:B layer as the first layer was firmed while controlling the flow rate of GeH$_4$ and SiH$_4$ as shown in FIG. 23 by operating mass flow controllers 2008 and 2007 for GeH$_4$ and SiH$_4$, respectively, using a computer (HP9845B).

The thickness of each layer of the light-receiving members thus prepared was measured using an electron microscope to obtain the results as shown in Table 14D.

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 32

For Examples 24 through 31, light-receiving members for electrophotography (Sample Nos. 2001D-2028D) were prepared by use of PH$_3$ gas diduted with H$_2$ to 3000 vol.ppm in place of B$_2$H$_6$ gas diluted with H$_2$ to 3000 vol.ppm.

Other preparation conditions were the same as in Examples 24 through 31.

These light-receiving members for electrophotography were each subjected to image exposure by means of a device as shown in FIG. 26 (wavelength of laser beam: 780 nm, spot diameter 80 μm), followed by development and transfer to obtain an image. Each image was free from any interference fringe pattern observed and proved to be satisfactory for practical application.

EXAMPLE 33

By means of a lathe, an aluminum substrate was worked to have the surface characteristic of No. 101 A shown in Table 1A.

Next, by use of the deposition device shown in FIG. 20, following various procedures under the conditions as shown in Table 2E, a light-receiving member for electrophotography of A-Si type was deposited on the above aluminum substrate.

The layer thickness distribution of the light-receiving member for electrophotography of A-Si type thus prepared was measured by an electron microscope to find that the average layer thickness difference was 0.1 μm between the center and both ends of the first layer and 2 μm between the center and both ends of the second layer, with the layer thickness difference at the minute portion being 0.02 μm in the first layer and 0.03 μm in the second layer.

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 34

By means of a lathe, an aluminum substrate was worked by the same manner as in Example 33 to have the surface characteristic of No. 102 A shown in Table 1A.

Next, by use of the deposition device shown in FIG. 20, following the same procedures as in Example 1 under the conditions as shown in Table 3E, a light-receiving member for electrophotography of A-Si type was deposited on the above aluminum substrate.

The layer thickness distribution of the light-receiving member for electrophotography of A-Si type thus prepared was measured by an electron microscope to find that the average layer thickness difference was 0.1 μm between the center and both ends of the first layer and 2 μm between the center and both ends of the second layer, with the layer thickness difference at the minute portion being 0.03 μm in the first layer and 0.03 μm in the second layer.

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 35

By means of a lathe, an aluminum substrate was worked by the same manner as in Example 33 to have the surface characteristic of No. 103 A shown in Table 1A.

Next, by use of the deposition device shown in FIG. 20, following the same procedures as in Example 1 under the conditions as shown in Table 4E, a light-receiving member for electrophotography of A-Si type was deposited on the above aluminum substrate.

The layer thickness distribution of the light-receiving member for electrophotography of A-Si type thus prepared was measured by an electron microscope to find that the average layer thickness difference was 0.6 μm between the center and both ends of the first layer and 2 μm between the center and both ends of the second layer, with the layer thickness difference at the minute portion being 0.1 μm in the first layer and 0.3 μm in the second layer.

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 36

By means of a lathe, an aluminum substrate was worked by the same manner as in Example 33 to have the surface characteristic of No. 104 A shown in Table 1A.

Next, by use of the deposition device shown in FIG. 20, following the same procedures as in Example 1 under the conditions as shown in Table 5E, a light-receiving member for electrophotography of A-Si type was deposited on the above aluminum substrate.

The layer thickness distribution of the light-receiving member for electrophotography of A-Si type thus prepared was measured by an electron microscope to find that the average layer thickness difference was 0.08 μm between the center and both ends of the first layer and 2 μm between the center and both ends of the second layer, with the layer thickness difference at the minute portion being 0.15 μm in the first layer and 0.3 μm in the second layer.

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 37

By means of a lathe, an aluminum substrate (length (L): 357 mm, outerdiameter (r): 80 mm) was worked as shown in FIG. 21 (P: pitch, D: depth) under the conditions shown in Table 7E.

Next, a light-receiving member for electrophotography was prepared following various procedures using the film deposition device in FIG. 20 under the conditions as shown in Table 6E (Sample Nos. 701E–704E).

Figure 60:
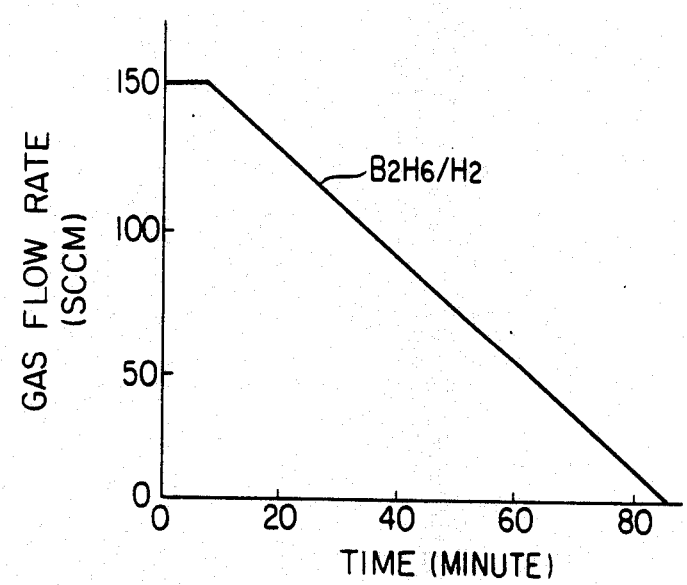

The boron-containing layer was formed while controlling the flow rate of $B_2H_6/H_2$ as shown in FIG. 60 by operating mass flow controller 2010 for $B_2H_6/H_2$ using a computer (HP9845B).

The thickness of each layer of the light-receiving members thus prepared was measured using an electron microscope to obtain the results as shown in Table 7E.

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 38

By means of a lathe, an aluminum substrate (length (L): 357 mm, outerdiameter (r): 80 mm) was worked as shown in FIG. 21 (P: pitch, D: depth) under the conditions shown in Table 9E.

Next, a light-receiving member for electrophotography of a-Si: type was prepared following various procedures using the film deposition device in FIG. 20 under the conditions as shown in Table 8E (Sample Nos. 901E–904E).

Figure 61:
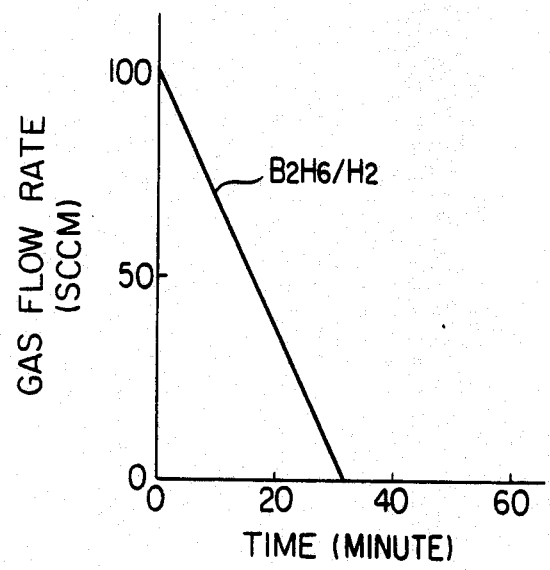

The boron-containing layer was formed while controlling the flow rate of $B_2H_6/H_2$ as shown in FIG. 61 by operating mass flow controller 2010 for $B_2H_6/H_2$ using a computer (HP9845B).

The thickness of each layer of the light-receiving members thus prepared was measured using an electron microscope to obtain the results as shown in Table 9E.

The light-receiving member for electrophotography as prepared above was subjected to image exposure by means of a device as shown in FIG. 26 (wavelength of laser beam: 780 nm, spot diameter 80 μm), followed by development and transfer to obtain an image The image was free from any interference fringe pattern observed and proved to be satisfactory for practical application.

EXAMPLE 39

By means of a lathe, an aluminum substrate (length (L): 357 mm, outerdiameter (r): 80 mm) was worked as shown in FIG. 21 (P: pitch, D: depth) under the conditions shown in Table 11E.

Next, a light-receiving member for electrophotography was prepared following various procedures using the film deposition device in FIG. 20 under the conditions as shown in Table 10E (Sample Nos. 1101E–1104E).

Figure 62:
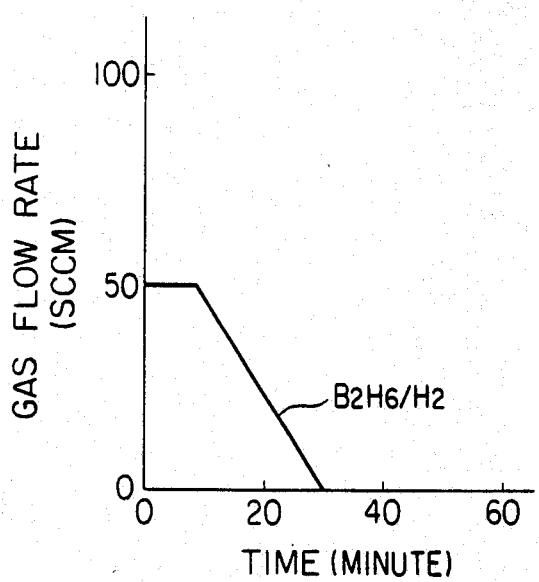

The boron-containing layer was formed while controlling the flow rate of $B_2H_6/H_2$ as shown in FIG. 62 by operating mass flow controller 2010 for $B_2H_6/H_2$ using a computer (HP9845B).

The thickness of each layer of the light-receiving members thus prepared was measured using an electron microscope to obtain the results as shown in Table 11E.

The light-receiving member for electrophotography as prepared above was subjected to image exposure by means of a device as shown in FIG. 26 (wavelength of layer beam: 780 nm, spot diameter 80 μm), followed by development and transfer to obtain an image. The image was free from any interference fringe pattern observed and proved to be satisfactory for practical application.

EXAMPLE 40

By means of a lathe, an aluminum substrate (length (L): 357 mm, outerdiameter (r): 80 mm) was worked as shown in FIG. 21 (P: pitch, D: depth) under the conditions shown in Table 13E.

Next, a light-receiving member for electrophotography was prepared following various procedures using the film deposition device in FIG. 20 under the conditions as shown in Table 12E (Sample Nos. 1301E–1304E).

Figure 39:
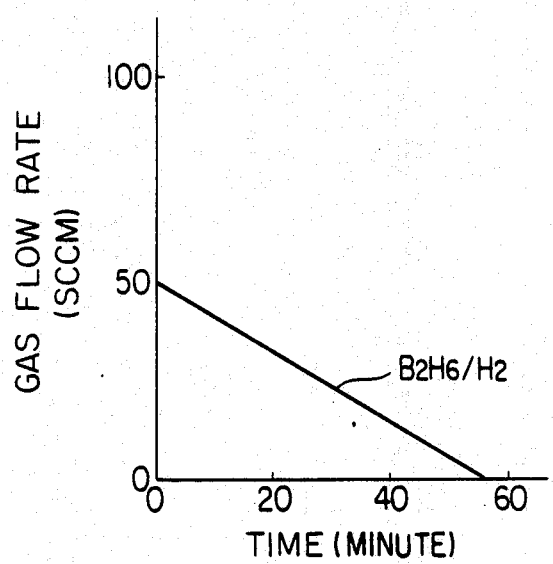

The boron-containing layer was formed while controlling the flow rate of $B_2H_6/H_2$ as shown in FIG. 39 by operating mass flow controller 2010 for $B_2H_6/H_2$ using a computer (HP9845B).

The thickness of each layer of the light-receiving members thus prepared was measured using an electron microscope to obtain the results as shown in Table 13E.

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 41

For Examples 33 through 40, light-receiving members for electrophotography (Sample Nos. 2001E-2020E) were prepared by use of $PH_3$ gas diluted with $H_2$ to 3000 vol.ppm in place of $B_2H_6$ gas diluted with $H_2$ to 3000 vol.ppm.

Other preparation conditions were the same as in Examples 33 through 40.

These light-receiving members for electrophotography were each subjected to image exposure by means of a device as shown in FIG. 26 (wavelength of laser beam: 780 nm, spot diameter 80 μm), followed by development and transfer to obtain an image. Each image was free from any interference fringe pattern observed and proved to be satisfactory for practical application.

EXAMPLE 42

In this Example, a semiconductor laser (wavelength: 780 nm) with a spot size of 80 μm was employed. Thus, on a cylindrical aluminum substrate [length (L) 357 mm, outer diameter (r) 80 mm] on which A-Si:H is to be deposited, a spiral groove was prepared by a lathe with a pitch (P) of 25 μm and a depth (D) of 0.8 S. The form of the groove is shown in FIG. 21.

Figure 63:
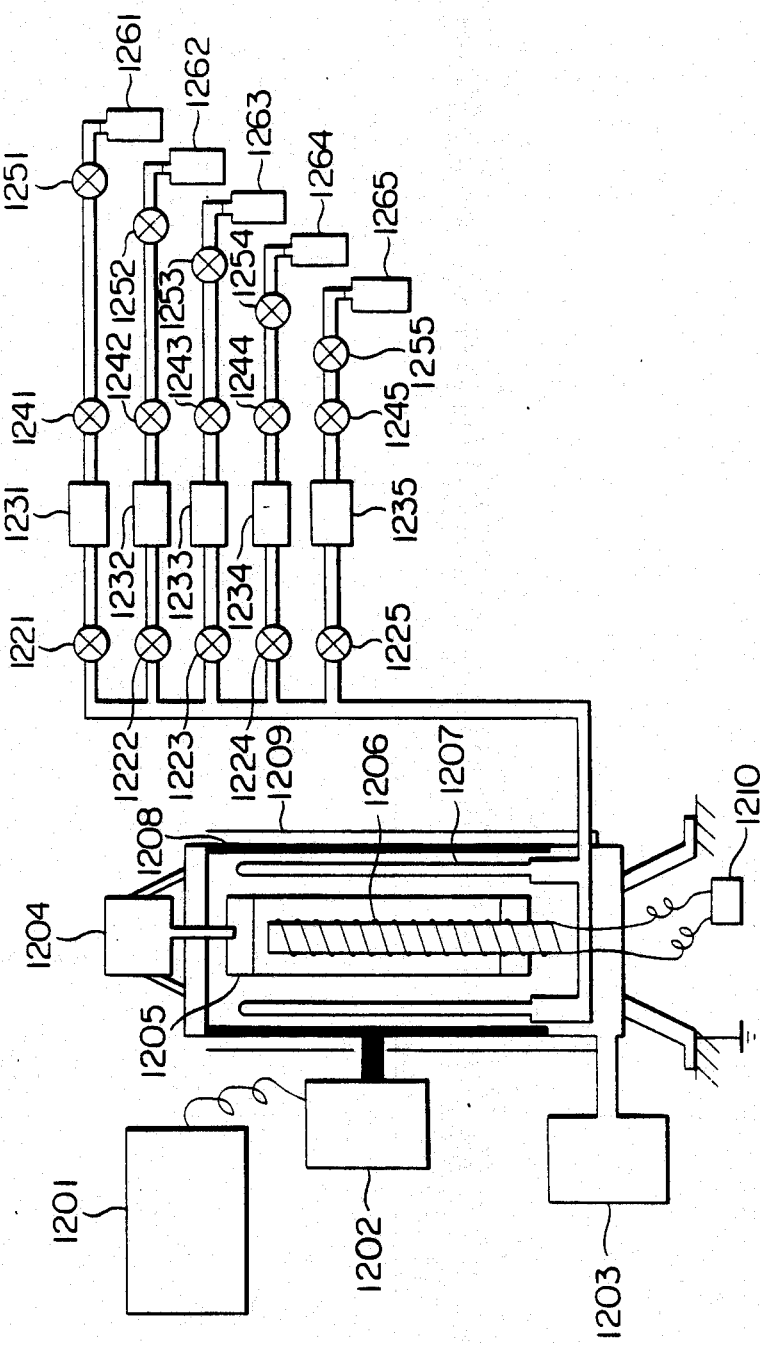

On this aluminum substrate, the light-receiving layer comprising the first layer and the second layer were deposited by means of the device as shown in FIG. 63 in the following manner.

First, the constitution of the device is to be explained. 1201 is a high frequency power source, 1202 is a matching box, 1203 is a diffusion pump and a mechanical booster pump, 1204 is a motor for rotation of the aluminum substrate, 1205 is an aluminum substrate, 1206 is a heater for heating the aluminum substrate, 1207 is a gas inlet tube, 1208 is a cathode electrode for introduction of high frequency, 1209 is a shield plate, 1210 is a power source for heater, 1221 to 1225, 1241 to 1245 are valves, 1231 to 1235 are mass flow controllers, 1251 to 1255 are regulators, 1261 is a hydrogen ($H_2$) bomb, 1262 is a silane ($SiH_4$) bomb, 1263 is an ammonia ($NH_3$) bomb, 1264 is a nitrogen monoxide (NO) bomb and 1265 is a germane ($GeH_4$) bomb.

Next, the preparation procedure is to be explained. All of the main cocks of the bombs 1261-1265 were closed, all the mass flow controllers and the valves were opened and the deposition device was internally evacuated by the diffusion pump 1203 to $10^{-7}$ Torr. At the same time, the aluminum substrate 1205 was heated by the heater 1206 to 250° C. and maintained constantly at 250° C. After the temperature of the aluminum substrate 1205 became constantly at 250° C., the valves 1221-1225, 1241-1245 and 1251-1255 were closed, the main cocks of bombs 1261-1265 were opened and diffusion pump 1203 was changed to the mechanical booster pump. The secondary pressure of the valves euipped with regulators 1251-1255 was set at 1.5 Kg/cm². The mass flow controller 1231 was set at 300 SCCM, and the valves 1241 and 1221 were successively opened to introduce $H_2$ gas in bomb 1261 into the deposition device.

Next, by setting the mass flow controllers 1232 and 1235 at 100 SCCM and 50 SCCM respectively, $SiH_4$ gas in bomb 1262 and $GeH_4$ in bomb 1265 was introduced into the deposition device according to the same procedure as introduction of $H_2$ gas. Then, by setting the mass flow controller 1234 so that the flow rate of NO gas in bomb 1264 may be 3.4 vol. % in an initial value relative to the sum total of $SiH_4$ gas flow rate and $GeH_4$ gas flow rate, NO gas was introduced into the deposition device according to the same procedure as introduction of $H_2$ gas.

When the inner pressure in the deposition device was stabilized at 0.2 Torr, the high frequency power source 1201 was turned on and glow discharge was generated between the aluminum substrate 1205 and the cathode electrode 1208 by controlling the matching box 1202, and a A-SiGe:H:O layer (A-SiGe:H layer containing O) was deposited to a thickness of 5 μm at a high frequency power of 150 W (the first layer). After deposition of a 5 μm thick A-SiGe:H:O layer, inflow of NO and $GeH_4$ was stopped by closing the valves 1224 and 1225 without discontinuing discharge.

And, A-Si:H layer (non-doped) with a thickness of 20 μm was deposited at a high frequency power of 150 W (the second layer). Then, with the high frequency power source and all the valves being closed, the deposition device was evacuated, the temperature of the aluminum substrate was lowered to room temperature and the substrate on which the light receiving layer was formed was taken out.

Figure 64:
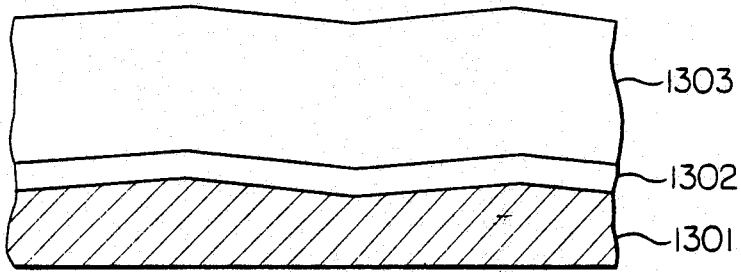

Separately, when the first layer and the second layer were formed on the same cylindrical aluminum substrate with the same surface characteristic under the same conditions and according to the same procedure as in the above case except for changing the high frequency power to 40 W, the surface of the light-receiving layer was found to be parallel to the surface of the substrate 1301, as shown in FIG. 64. The difference in the total layer thickness between the center and the both end portions of the aluminum substrate was 1 μm.

Figure 65:
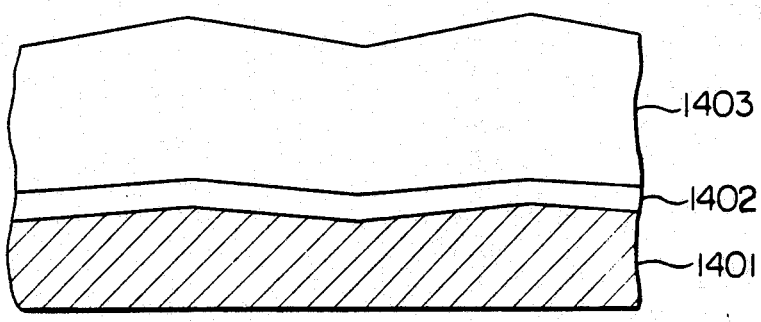

When the above high frequency power was made 160 W, the surface of the photosensitive layer 1403 and the surface of the substrate 1401 were unparallel to each other as shown in FIG. 65. In this case, the layer thickness difference in average layer thickness between the center and the both end portions was 2 μm.

For the two kinds of the light receiving members for electrophotography, image exposure was effected by means of the device shown in FIG. 26 with a semiconductor laser of a wavelength 780 nm with a spot size of 80 μm, followed by developing and transfer to obtain images. In the light receiving member with the surface characteristic as shown in FIG. 64 prepared at a high freqeuncy power of 40 W, interference fringe pattern was observed.

On the other hand, in the light receiving member having the surface characteristic as shown in FIG. 65, no interference fringe pattern was observed and there could be obtained a member exhibiting practically satisfactory electrophotographic characteristics.

EXAMPLE 43

The surfaces of cylindrical aluminum substrates were worked by a lathe as shown in Table 1F. On these (Nos. 101-108) aluminum substrates were prepared light receiving members for electrophotography under the same conditions as in Example 1 where no interference fringe pattern was observed (high frequency power 160 W) (Nos. 111F–118F). The difference in average layer thickness between the center and the both end portions of the aluminum substrate in the light receiving member for electrophotography was 2.2 μm.

The cross-sections of these light receiving members for electrophotography were observed by an electron microscope and the differences within the pitch of the second layer were measured to obtain the results as shown in Table 2F. For these light receiving members, image exposure was effected by means of the same device as shown in FIG. 26 similarly as in Example 42 using a semiconductor laser of wavelength 780 nm with a spot size of 80 μm to obtain the results as shown in Table 2F.

EXAMPLE 44

Light receiving members were prepared under the same conditions as in Example 43 except for the following points (No. 121F–128F). The first layer was made to have a thickness of 10 μm. The difference in average layer thickness between the center and the both ends of the first layer was 1.2 μm, with the average difference in thickness between the center and the both ends of the second layer was 2.3 μm. When the thickness of each layer prepared on each substate of Nos. 121F–128F was observed by an electron microscope, the results as shown in Table 3F were obtained. For these light receiving members, image exposure was conducted in the same image exposure device as in Example 42 to obtain the results as shown in Table 3F.

EXAMPLE 45

On cylindrical aluminum substrates (Nos. 101–108) having the surface characteristic as shown in Table 1F, light receiving members provided with the first layer containing nitrogen were prepared under the conditions as shown in Table 4F (Nos. 401F–408F).

The cross-sections of the light receiving members prepared under the above conditions were observed by an electron microscope. The average layer thickness of the first layer at the center and both ends of the cylinder was 0.09 μm. The average layer thickness of the second layer was 3 μm at the center and both ends of the cylinder.

The layer thickness difference within the short range of the second layer of each light receiving member can be seen from the results shown in Table 5F.

When these light receiving members were subjected to image exposure with laser beam similarly as described in Example 42, the results as shown in Table 5F were obtained.

EXAMPLE 46

On cylindrical aluminum substrates (Nos. 101–108) having the surface characteristic as shown in Table 1F, light receiving members provided with the first layer containing nitrogen were prepared under the conditions as shown in Table 6F (Nos. 501F–508F).

The cross-sections of the light receiving members prepared under the above conditions were observed by an electron microscope. The average layer thickness of the first layer at the center and both ends of the cylinder was 0.3 μm. The average layer thickness of the second layer was 3.2 μm at the center and both ends of the cylinder.

The layer thickness difference within the short range of the second layer of each light receiving member can be seen from the results shown in Table 7F.

When these light receiving members were subjected to image exposure with laser beam similarly as described in Example 42, the results as shown in Table 7F were obtained.

EXAMPLE 47

On cylindrical aluminum substrates (Cylinder Nos. 101–108) having the surface characteristic as shown in Table 1F, light receiving members provided with the first layer containing carbon were prepared under the conditions as shown in Table 8F (Nos. 901F–908F).

The cross-sections of the light receiving members prepared under the above conditions were observed by an electron microscope. The average layer thickness of the first layer at the center and both ends of the cylinder was 0.08 μm. The average layer thickness of the second layer was 2.5 μm at the center and both ends of the cylinder.

The layer thickness difference within the short range of the second layer of each light receiving member can be seen from the results shown in Table 9F.

When these light receiving members were subjected to image exposure with laser beam similarly as described in Example 42, the results as shown in Table 9F were obtained.

EXAMPLE 48

On cylindrical aluminum substrates (Nos. 101–108) having the surface characteristic as shown in Table 1F, light receiving members provided with the first layer containing carbon were prepared under the conditions as shown in Table 10F (Nos. 1101F–1108F).

The cross-sections of the light receiving members prepared under the above conditions were observed by an electron microscope. The average layer thickness of the first layer at the center and both ends of the cylinder was 1.1 μm. The average layer thickness of the second layer was 3.4 μm at the center and both ends of the cylinder.

The layer thickness difference within the short range of the second layer of each light receiving member can be seen from the results shown in Table 11F.

When these light receiving members were subjected to image exposure with laser beam similarly as described in Example 42, the results as shown in Table 11F were obtained.

EXAMPLE 49

A light-receiving member for electrophotography was prepared under the same conditions as described in Example 42 in the case when the high frequency power was made 160 W, except that, in formation of the first layer, the flow rate of NO gas was changed as shown in FIG. 17 relative to the sum of $SiH_4$ gas flow rate and the $GeH_4$ gas flow rate until the NO gas flow rate became zero on completion of layer preparation. Separately, the first layer and the second layer were formed under the same conditions and according to the same procedure as in the above case, except for changing the high frequency power to 40 W. As the result, the surface of the light-receiving layer was found to became parallel to the plane of the substrate 1301 as shown in FIG. 64. In this case, the difference in layer thickness of the whole layer between the center and both ends of the aluminum substrate 1301 was 1 μm.

On the other hand, when the above frequency power was made 160 W, the surface of the photosensitive layer 1403 and the surface of the substrate 1401 were non-parallel to each other as shown in FIG. 65. In this case, the layer thickness difference in average layer thickness between the center and both ends of aluminum substrate was found to be 2 μm.

For the two kinds of light-receiving members for electrophotography as prepared above, image exposure was effected with a semiconductor laser of wavelength 780 nm at a spot diameter of 80 μm by means of the device as shown in FIG. 26, followed by development and transfer to obtain an image. In the light-receiving member having the surface characteristic as shown in FIG. 65 prepared under the condition of high frequency power of 40 W during layer formation, an interference fringe pattern was observed On the other hand, in the light-receiving member having the surface characteristic as shown in FIG. 65, no interference fringe pattern was observed to give a product exhibiting electrophotographic characteristics acceptable in practical application.

EXAMPLE 50

The surfaces of cylindrical aluminum substrates were worked by a lathe as shown in Table 1F. On these (Cylinder Nos. 101–108) aluminum substrates were prepared light receiving members for electrophotography under the same conditions as in Example 49 where no interference fringe pattern was observed (high frequency power 160 W) (Nos. 1201F–1208F). The difference in average layer thickness between the center and the both end portions of the aluminum substrate in the light receiving member for electrophotography was 2.2 μm.

The cross-sections of these light receiving members for electorphotography were observed by an electron microscope and the differences within the pitch of the second layer were measured to obtain the results as shown in Table 12F. For these light receiving members, image exposure was effected by means of the same device as shown in FIG. 26 similarly as in Example 49 using a semiconductor laser of wavelength 780 nm with a spot size of 80 μm to obtain the results as shown in Table 12F.

EXAMPLE 51

Light receiving members were prepared under the same conditions as in Example 50 except for the following points (No. 1301F–1308F). The first layer was made to have a thickness of 10 μm. The difference in average layer thickness between the center and the both ends of the first layer was 1.2 μm, with the average difference in thickness distribution between the center and the both ends of the second layer was 2.3 μm. When the thickness of each layer prepared on each substrate of Nos. 1301F–1308F was observed by an electron microscope, the results as shown in Table 3F were obtained. For these light receiving members, image exposure was conducted in the same image exposure device as in Example 42 to obtain the results as shown in Table 13F.

EXAMPLE 52

On cylindrical aluminum substrates (Cylinder Nos. 101–108) having the surface characteristic as shown in Table 1F, light receiving members provided with the first layer containing nitrogen were prepared under the conditions as shown in Table 14F (Nos. 1501F–1508F), following otherwise the same conditions and procedure as in Example 50.

The cross-sections of the light receiving members prepared under the above conditions were observed by an electron microscope. The average layer thickness of the first layer at the center and both ends of the cylinder was 0.09 μm. The average layer thickness of the second layer was 3 μm at the center and both ends of the cylinder.

The layer thickness difference within the short range of the second layer of each light receiving member (Sample Nos. 1501F–1508F) can be seen from the results shown in Table 15F.

When these light receiving members (Sample Nos. 1501F–1508F) were subjected to image exposure with laser beam similarly as described in Example 42, the results as shown in Table 15F were obtained.

EXAMPLE 53

On cylindrical aluminum substrates (Cylinder Nos. 101–108) having the surface characteristic as shown in Table 1F, light receiving members provided with the first layer containing nitrogen were prepared under the conditions as shown in Table 16F (Nos. 1701F–1708F), following otherwise the same conditions and the procedure as in Example 50.

The cross-sections of the lgiht receiving members (Sample Nos. 1701F–1708F) prepared under the above conditions were observed by an electron microscope. The average layer thickness of the first layer at the center and both ends of the cylinder was 0.3 μm. The average layer thickness of the second layer was 0.3 μm at the center and both ends of the cylinder.

The layer thickness difference within the short rage of the photosensitive layer of each light receiving member (Sample Nos. 1701F–1708F) can be seen from the results shown in Table 17F.

When these light receiving members were subjected to image exposure with laser beam similarly as described in Example 42, the results as shown in Table 17F were obtained.

EXAMPLE 54

On cylindrical aluminum substrates (Cylinder Nos. 101–108) having the surface characteristic as shown in Table 1F, light receiving members provided with the layer containing nitrogen were prepared under the conditions as shown in Table 18F (No. 1901F–1908F), following otherwise the same conditions and the procedure as in Example 50.

The cross-sections of the light receiving members (Sample Nos. 1901F–1908F) prepared under the above conditions were observed by an electron microscope. The average layer thickness of the first layer at the center and both ends of the cylinder was 0.08 μm. The average layer thickness of the second layer was 2.5 μm at the center and both ends of the cylinder.

The layer thickness difference within the short range of the second layer of each member (Sample Nos. 1901F–1908F) can be seen from the results shown in Table 19F.

When these light receiving members (Sample Nos. 1901F–1908F) were subjected to image exposure with laser beam similarly as described in Example 42, the results as shown in Table 19F were obtained.

EXAMPLE 55

On cylindrical alumonum substrates (Cylinder Nos. 101-108) having the surface characteristic as shown in Table 1F, light receiving members provided with the first layer containing nitrogen were prepared under the conditions as shown in Table 20F, following otherwise the same conditions and the procedure as in Example 50. (Nos. 2101F-2108F)

The cross-sections of the light receiving members (Nos. 2101F-2108F) prepared under the above conditions were observed by an electron microscope. The average layer thickness of the first layer at the center and both ends of the cylinder was 1.1 µm. The average layer thickness of the second layer was 3.4 µm at the center and both ends of the cylinder.

The layer thickness difference within the short range of the second layer of each light receiving member (Nos. 2101F-2108F) can be seen from the results shown in Table 21F.

When these light receiving members (Sample Nos. 2101F-2108F) were subjected to image exposure with laser beam similarly as described in Example 42, the results as shown in Table 21F were obtained.

EXAMPLE 56

By means of the preparation device shown in FIG. 63, respective light receiving members for electrophotography (Sample Nos. 2201F-2204F) were prepared by carrying out layer formation on cylindrical aluminum substrates (Cylinder No. 150F) under the respective conditions as shown in Table 22F to Table 25F while changing the gas flow rate ratio of NO to $SiH_4$ according to the change rate curve of the gas flow rate ratio as shown in FIG. 66 to FIG. 69 with lapse of time for layer formation.

The thus prepared light receiving members were subjected to evaluation of characteristics, following the same conditions and the same procedure as in Example 42. As the result, in each sample, no interference fringe pattern was observed at all with naked eyes, and sufficiently good electrophotographic characteristics could be exhibited as suited for the object of the present invention.

EXAMPLE 57

Figure 66:
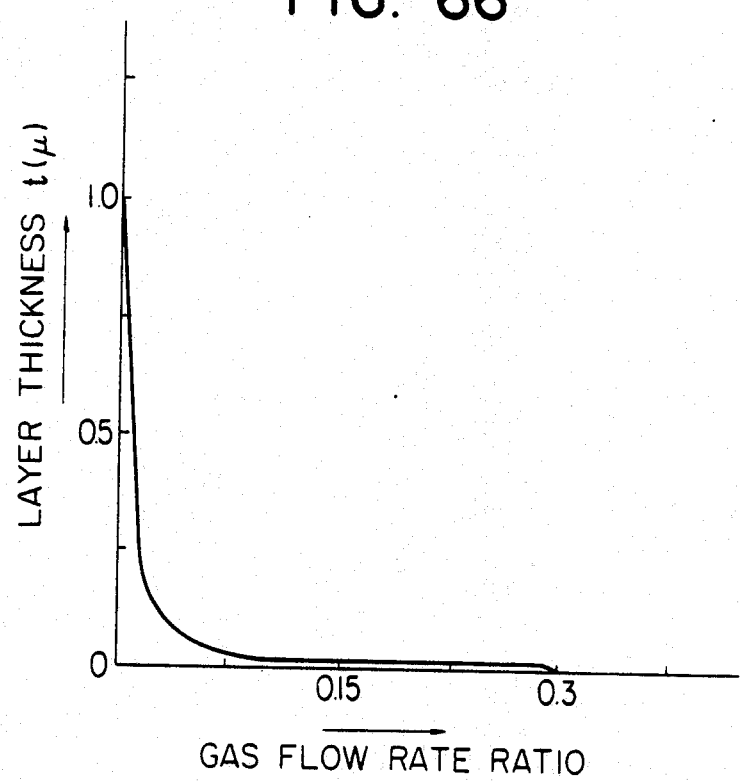
Figure 67:
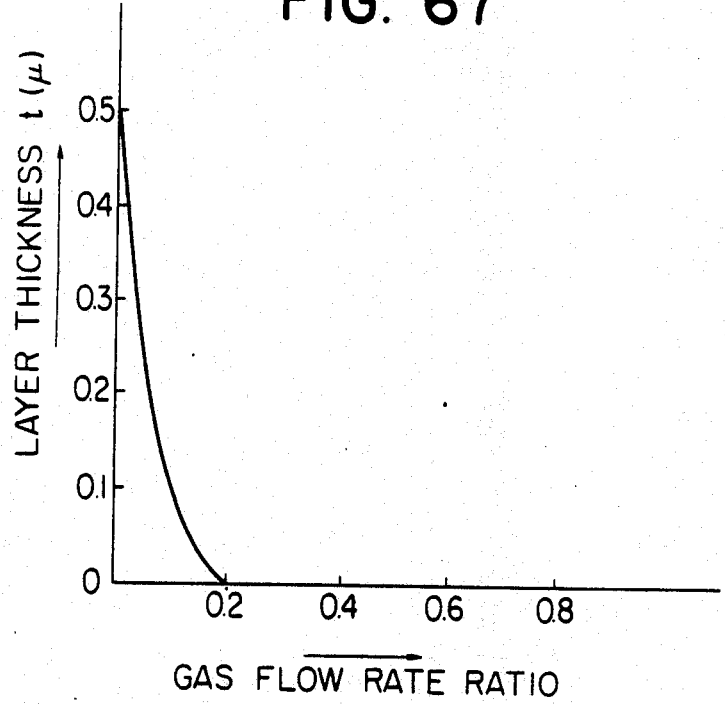

By means of the preparation device shown in FIG. 63, light receiving member for electrophotography was prepared by carrying out layer formation on cylindrical aluminum substrates (Cylinder No. 105) under the respective conditions as shown in Table 26F while changing the gas flow rate ratio of NO to $SiH_4$ according to the change rate curve of the gas flow rate ratio as shown in FIG. 66 with lapse of time for layer formation.

The thus prepared light receiving member was subjected to evaluation of characteristics, following the same conditions and the same procedure as in Example 42. As the result, in the sample, no interference fringe pattern was observed at all with naked eyes, and sufficiently good electrophotographic characteristics could be exhibited as suited for the object of the present invention.

EXAMPLE 58

Figure 68:
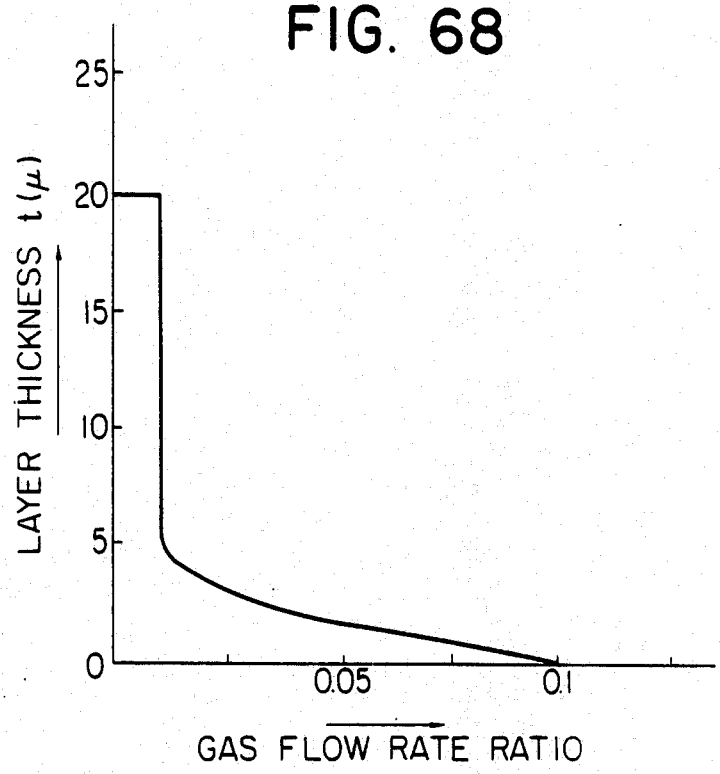
Figure 69:
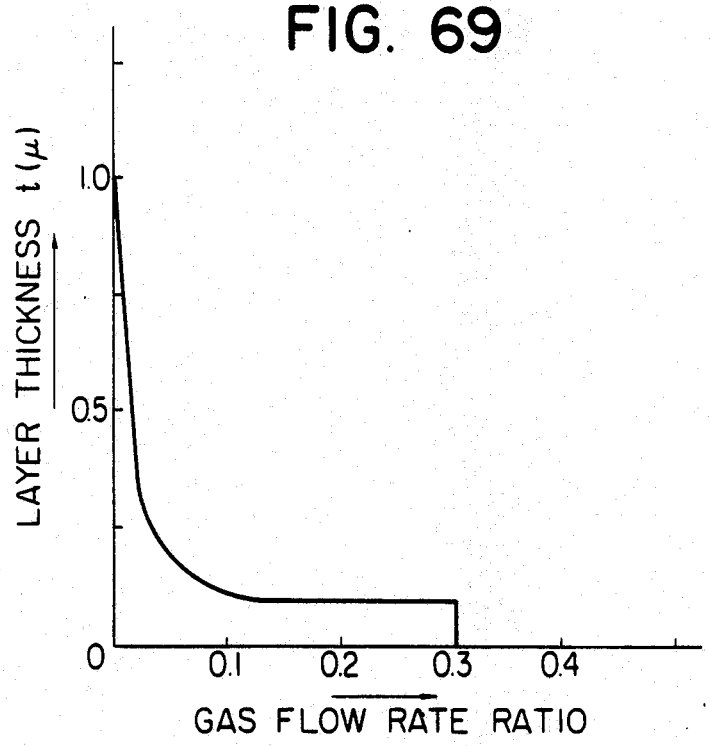

By means of the preparation device shown in FIG. 12, respective light receiving members for electrophotography (Sample Nos. 2206F-2207F) were prepared by carrying out layer formation on cylidrical aluminum substrates (Cylinder No. 105F) under the respective conditions as shown in Table 27F to Table 28F while changing the gas flow rate ratio of $NH_3$ to $SiH_4$ and $CH_4$ to $SiH_4$ according to the change rate curve of the gas flow rate ratio as shown in FIG. 68 with lapse of time for layer formation.

The thus prepared light receiving members were subjected to evaluation of characteristics, following the same conditions and the same procedure as in Example 42. As the result, in each sample, no interference fringe pattern was observed at all with naked eyes, and sufficiently good electrophotographic characteristics could be exhibited as suited for the object of the present invention.

EXAMPLE 59

By means of a lathe, four kinds of an aluminum substrate (length (L): 357 mm, outer diameter (r): 80 mm) was worked as shown in FIG. 21 (P: pitch, D: depth) under the conditions shown in Table 2G.

Next, a light-receiving member for electrophotography photography of a-Si type was prepared following various procedures using the film deposition device in FIG. 20 under the conditions as shown in Table 1G (Sample Nos. 201G-204G).

Figure 36:
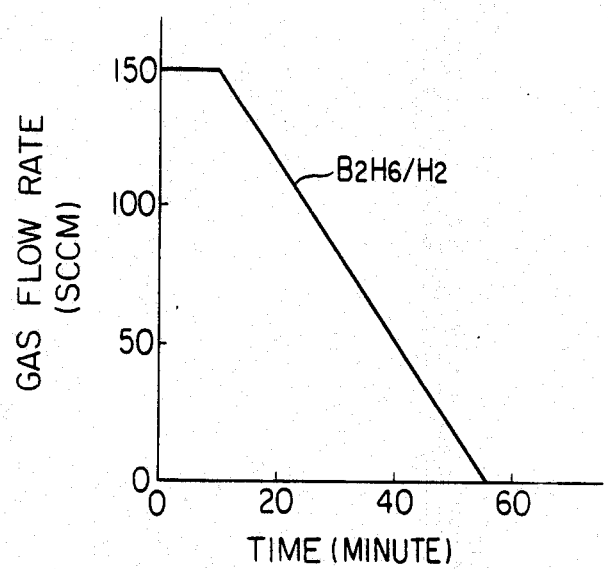

The first layer was formed while controlling each flow rate of $GeH_4$, $SiH_4$ and $B_2H_6/H_2$ as shown in FIGS. 22 and 36 by operating mass flow controllers 2008, 2007 and 2010 for $GeH_4$, $SiH_4$ and $B_2H_6/H_2$, respectively, using a computer (HP9845B).

The thickness of each layer of the light-receiving members thus prepared was measured using an electron microscope to obtain the results as shown in Table 2G.

The light-receiving member for electrophotography as prepared above was subjected to image exposure by means of a device as shown in FIG. 26 (wavelength of laser beam: 780 nm, spot diameter 80 µm), followed by development and transfer to obtain an image. The image was free from any interference fringe pattern observed and proved to be satisfactory for practical application (Sample Nos. 201G-204G).

EXAMPLE 60

By means of a lathe, four kinds of an aluminum substrate (length(L): 357 mm, outer diameter (r): 80 mm) was worked as shown in FIG. 21 (P: pitch, D: depth) under the conditions shown in Table 3G.

Next, a light-receiving member for electrophotography of a-Si type was prepared following various procedures using the film deposition device in FIG. 20 under the conditions as shown in Table 1G (Sample Nos. 301G-304G).

Figure 37:
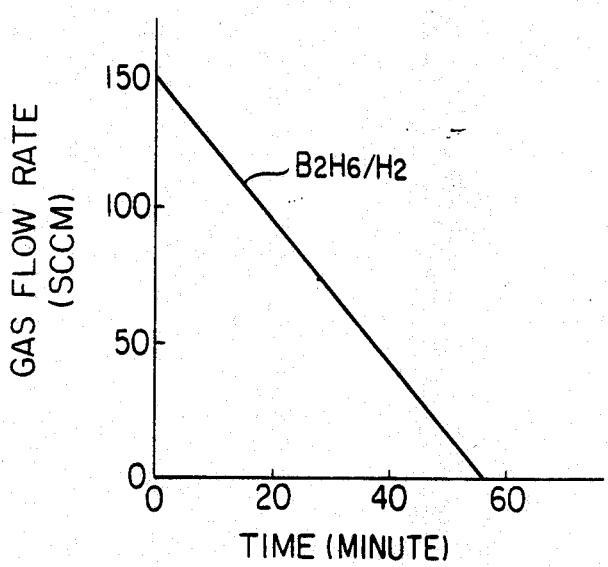

The first layer was formed while controlling each flow rate of $GeH_4$, $SiH_4$ and $B_2H_6/H_2$ as shown in FIGS. 23 and 37 be operating mass flow controllers 2008, 2007 and 2010 for $GeH_4$, $SiH_4$ and $B_2H_6/H_2$, respectively, using a computer (HP9845B).

The thickness of each layer of the lightreceiving members thus prepared was measured using an electron microscope to obtain the results as shown in Table 3G.

The light-receiving member for electrophotography as prepared above was subjected to image exposure by means of a device as shown in FIG. 26 (wavelength of laser beam: 780 nm, spot diameter 80 µm), followed by development and transfer to obtain an image. The image was free from any interference fringe pattern observed and proved to be satisfactory for practical application (Sample Nos. 301G-304G).

EXAMPLE 61

By means of a lathe, four kinds of an aluminum substrate (length (L): 357 mm, outer diameter (r): 80 mm) was worked as shown in FIG. 21 (P: Pitch, D: depth) under the conditions shown in Table 5G.

Next, a light-receiving member for electrophotography of a-Si type was prepared following various procedures using the film deposition device in FIG. 20 under the conditions as shown in Table 4G (Sample Nos. 501G–504G).

Figure 38:
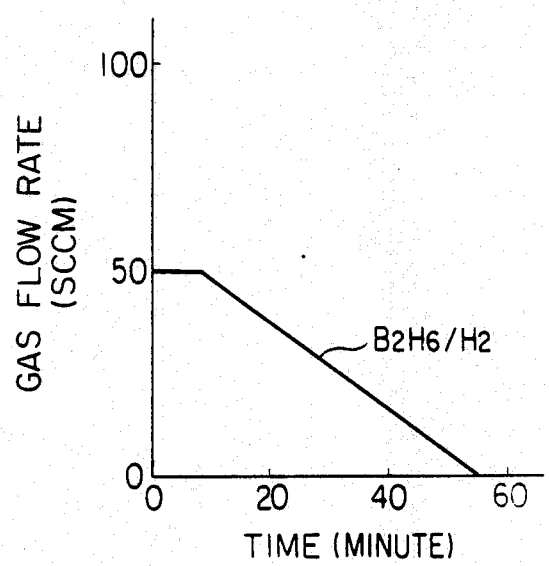

The first layer was formed while controlling each flow rate of $GeH_4$, $SiH_4$ and $B_2H_6/H_2$ as shown in FIGS. 24 and 38 by operating mass flow controllers 2008, 2007 and 2010 for $GeH_4$, $SiH_4$ and $B_2H_6/H_2$, respectively, using a computer (HP9845B).

The thickness of each layer of the light-receiving members thus prepared was measured using an electron microscope to obtain the results as shown in Table 5G.

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application (Sample Nos. 501G–504G).

EXAMPLE 62

By means of a lathe, four kinds of an aluminum substrate (length (L): 357 mm, outer diameter (r): 80 mm) was worked as shown in FIG. 21 (P: pitch, D: depth) under the conditions shown in Table 6G.

Next, a light-receiving member for electrophotography of a-Si type was prepared following various procedures using the film deposition device in FIG. 20 under the conditions as shown in Table 4G (Sample Nos. 601G–604G).

The first layer was formed while controlling each flow rate of $GeH_4$, $SiH_4$ and $B_2H_6/H_2$ as shown in FIGS. 25 and 39 by operating mass flow controllers 2008, 2007 and 2010 for $GeH_4$, $SiH_4$ and $B_2H_6/H_2$, respectively, using a computer (HP9845B).

The thickness of each layer of the light-receiving members thus prepared was measured using an electron microscope to obtain the results as shown in Table 6G.

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application (Sample Nos. 601G–604G).

EXAMPLE 63

By means of a lathe, four kinds of an aluminum substrate (length (L): 357 mm, outer diameter (r): 80 mm) was worked as shown in FIG. 21 (P: pitch, D: depth) under the conditions shown in Table 8G.

Next, a light-receiving member for electrophotography was prepared following various procedures using the film deposition device in FIG. 20 under the conditions as shown in Table 7G (Sample Nos. 801G–804G).

Figure 40:
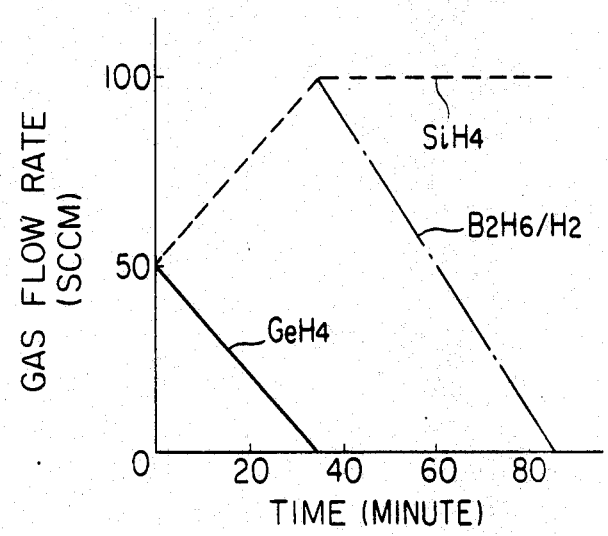

The first layer and the A layer were formed while controlling each flow rate of $GeH_4$, $SiH_4$ and $B_2H_6/H_2$ as shown in FIG. 40 by operating mass flow controllers 2008, 2007 and 2010 for $GeH_4$, $SiH_4$ and $B_2H_6/H_2$, respectively, using a computer (HP9845B).

The thickness of each layer of the light-receiving members thus prepared was measured using an electron microscope to obtain the results as shown in Table 8G.

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 64

By means of a lathe, four kinds of an aluminum substrate (length (L): 357 mm, outer diameter (r): 80 mm) was worked as shown in FIG. 21 (P: pitch, D: depth) under the conditions shown in Table 10G.

Next, a light-receiving member for electrophotography was prepared following various procedures using the film deposition device in FIG. 20 under the conditions as shown in Table 9G (Sample Nos. 1001G–1004G).

Figure 41:
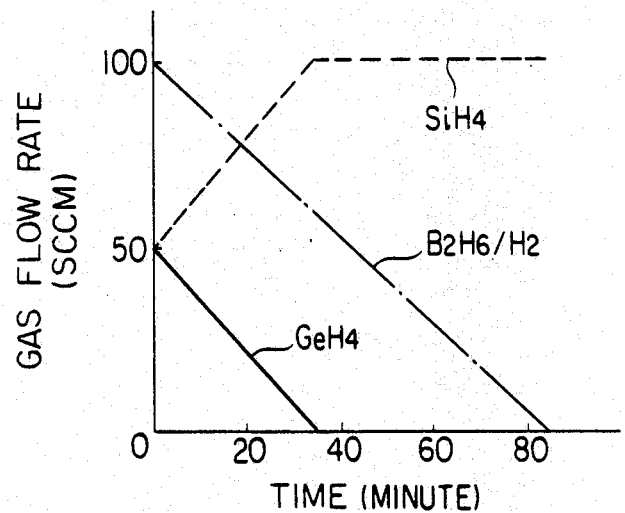

The first layer and the A layer were formed while controlling the flow rate of $GeH_4$, $SiH_4$ and $B_2H_6/H_2$ as shown in FIG. 41 by operating mass flow controllers 2008, 2007 and 2010 for $GeH_4$, $SiH_4$ and $B_2H_6/H_2$, respectively, using a computer (HP9845B).

The thickness of each layer of the light-receiving members thus prepared was measured using an electron microscope to obtain the results as shown in Table 10G.

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fronge pattern observed and proved to be satisfactory for practical application.

EXAMPLE 65

By means of a lathe, four kinds of an aluminum substrate (length (L): 357 mm, outer diameter (r): 80 mm) was worked as shown in FIG. 21 (P: pitch, D: depth) under the conditions shown in Table 12G.

Next, a light-receiving member for electrophotography was prepared following various procedures using the film deposition device in FIG. 20 under the conditions as shown in FIG. 11G (Sample Nos. 1201G–1204G)

Figure 42:
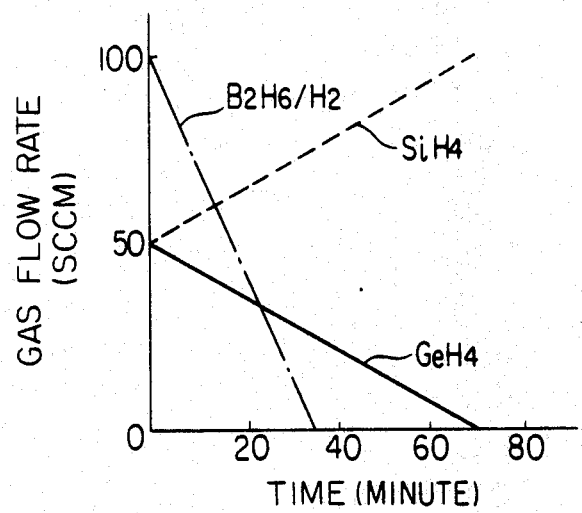

The first layer and the A layer were formed while controlling the flow rate of $GeH_4$, $SiH_4$ and $B_2H_6/H_2$ as shown in FIG. 42 by operating mass flow controllers 2008, 2007 and 2010 for $GeH_4$, $SiH_4$ and $B_2H_6/H_2$, respectively, using a computer (HP9845B).

The thickness of each layer of the light-receiving members thus prepared was measured using an electron microscope to obtain the results as shown in Table 12G.

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 66

By means of a lathe, an aluminum substrate (length (L): 357 mm, outer diameter (r): 80 mm) was worked as shown in FIG. 21 (P: pitch, D: depth) under the conditions shown in Table 2H (Nos. 201-204).

Next, a light-receiving member for electrophotography of a-Si:H containing oxygen was prepared following various procedures using the film deposition device in FIG. 20 under the conditions as shown in Table 1H (Sample Nos. 201H-204H).

The a-(Si;Ge):H layer as the first layer was formed while controlling the flow rate of $GeH_4$ and $SiH_4$ as shown in FIG. 22 by operating mass flow controllers 2008 and 2007 for $GeH_4$ and $SiH_4$, respectively, using a computer (HP9845B).

The thickness of each layer of the light-receiving members thus prepared was measured using an electron microscope to obtain the results as shown in Table 2H (Sample Nos. 201H-204H).

The light-receiving member for electrophotography as prepared above was subjected to image exposure by means of a device as shown in FIG. 26 (wavelength of laser beam: 780 nm, spot diameter 80 $\mu$m), followed by development and transfer to obtain an image. The image was free from any interference fringe pattern observed and proved to be satisfactory for practical application (Sample Nos. 201H-204H).

EXAMPLE 67

By means of a lathe, an aluminum substrate (length (L): 357 mm, outerdiameter (r): 80 mm) was worked as shown in FIG. 21 (P: pitch, D: depth) under the conditions shown in Table 4H (Nos. 401-404).

Next, a light-receiving member for electrophotography of a -Si:H containing carbon was prepared following various procedures using the film deposition device in FIG. 20 under the conditions as shown in Table 3H (Sample Nos. 401H-404H).

The a-(Si;Ge): H layer as the first layer was formed while controlling the flow rate of $GeH_4$ and $SiH_4$ as shown in FIG. 23 by operating mass flow controllers 2008 and 2007 for $GeH_4$ and $SiH_4$, respectively, using a computer (HP9845B).

The thickness of each layer of the light-receiving members thus prepared was measured using an electron microscope to obtain the results as shown in Table 4H (Sample Nos. 401H-404H).

The light-receiving member for electrophotography as prepared above was subjected to image exposure by means of a device as shown in FIG. 26 (wavelength of laser beam: 780 nm, spot diameter 80 $\mu$m), followed by development and transfer to obtain an image. The image was free from any interference fringe pattern observed and proved to be satisfactory for practical application (Samples No. 401H-404H).

EXAMPLE 68

By means of a lathe, an aluminum substrate (length (L): 357 mm, outerdiameter (r): 80 mm) was worked as shown in FIG. 21 (P: pitch, D: depth) under the conditions shown in Table 6H (Nos. 601-604).

Next, a light-receiving member for electrophotography of a-Si:H containing nitrogen was prepared following various procedures using the film deposition device in FIG. 20 under the conditions as shown in Table 5H (Sample Nos. 601H-604H).

The a-(Si;Ge): H layer as the first layer was formed while controlling the flow rate of $GeH_4$ and $SiH_4$ as shown in FIG. 24 by operating mass flow controllers 2008 and 2007 for $GeH_4$ and $SiH_4$, respectively, using a computer (HP9845B).

The thickness of each layer of the light-receiving members thus prepared was measured using an electron microscope to obtain the results as shown in Table 6H (Sample Nos. 601H-604H).

The light-receiving member for electrophotography as prepared above was subjected to image exposure by means of a device as shown in FIG. 26 (wavelength of laser beam: 780 nm, spot diameter 80 $\mu$m), followed by development and transfer to obtain an image. The image was free from any interference fringe pattern observed and proved to be satisfactory for practical application (Samples No. 601H-604H).

EXAMPLE 69

By means of a lathe, an aluminum substrate (length (L): 357 mm, outerdiameter (r): 80 mm) was worked as shown in FIG. 21 (P: pitch, D: depth) under the conditions shown in Table 8H (Nos. 801-804).

Next, a light-receiving member for electrophotography of a-Si:H containing nitrogen was prepared following various procedures using the film deposition device in FIG. 20 under the conditions as shown in Table 7H (Sample Nos. 801H-804H).

The a-(Si;Ge):H layer as the first layer was formed while controlling the flow rate of $GeH_4$ and $SiH_4$ as shown in FIG. 25 by operating mass flow controllers 2008 and 2007 for $GeH_4$ and $SiH_4$, respectively, using a computer (HP9845B).

The thickness of each layer of the light-receiving members thus prepared was measured using an electron microscope to obtain the results as shown in Table 8H (Sample Nos. 801H-804H).

The light-receiving member for electrophotography as prepared above was subjected to image exposure by means of a device as shown in FIG. 26 (wavelength of laser beam: 780 nm, spot diameter 80 $\mu$m), followed by development and transfer to obtain an image. The image was free from any interference fringe pattern observed and proved to be satisfactory for practical application (Samples No. 801H-804H).

EXAMPLE 70

Under the same conditions as in Example 69 except for changing $NH_3$ gas employed in Example 69 to NO gas, a light-receiving member for electrophotography of a-Si:H containing oxygen was prepared.

The characteristics of the light-receiving layer thus obtained were evaluated, following the same conditions and the procedure as in Example 69. As the result, no interference fringe pattern was observed at all with the naked eye and the electrophotographic characteristics exhibited were satisfactorily good as suited for the objects of the present invention.

EXAMPLE 71

Under the same conditions as in Example 69 except for changing $NH_3$ gas employed in Example 69 to $CH_4$ gas, a light-receiving member for electrophotography of a-Si:H containing carbon was prepared.

The characteristics of the light-receiving layer thus obtained were evaluated, following the same conditions and the procedure as in Example 69. As the result, no interference fringe pattern was observed at all with the naked eye and the electrophotographic characteristics exhibited were satisfactorily good as suited for the objects of the present invention.

EXAMPLE 72

Figure 70:
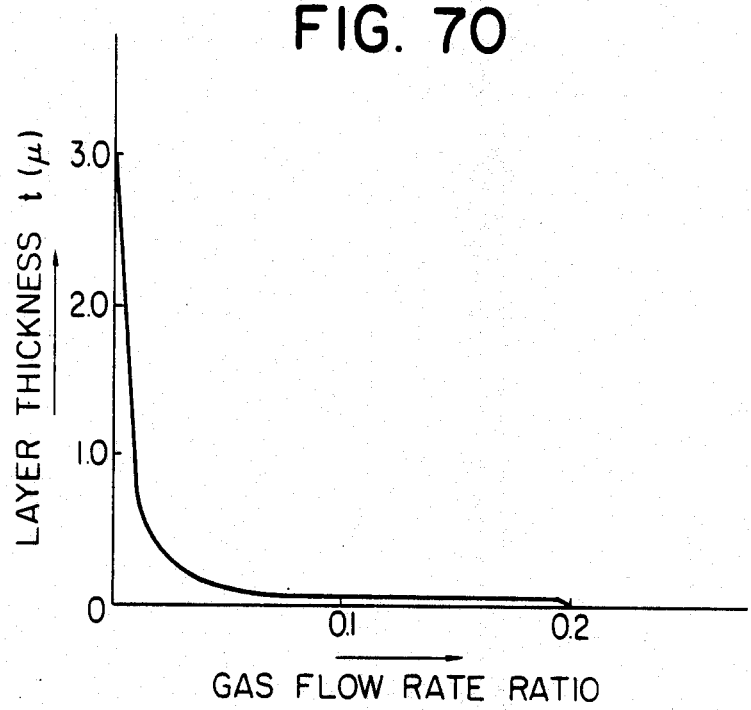

By means of the film deposition device shown in FIG. 20, light receiving member for electrophotography of a-Si:H containing oxygen was prepared following the same conditions as in Example 66 except for carrying out layer formation on cylindrical aluminum substrates (Cylinder No. 202) under the respective conditions as shown in Table 9H while changing the gas flow rate ratio of NO according to the change rate curve of the gas flow rate ratio as shown in FIG. 70 with lapse of time for layer formation.

The thus prepared light receiving member was subjected to evaluation of characteristics, following the same conditions and the same procedure as in Example 66. As the result, in the sample, no interference fringe pattern was observed at all with naked eyes, and sufficiently good electrophotographic characteristics could be exhibited as suited for the object of the present invention.

EXAMPLE 73

Figure 71:
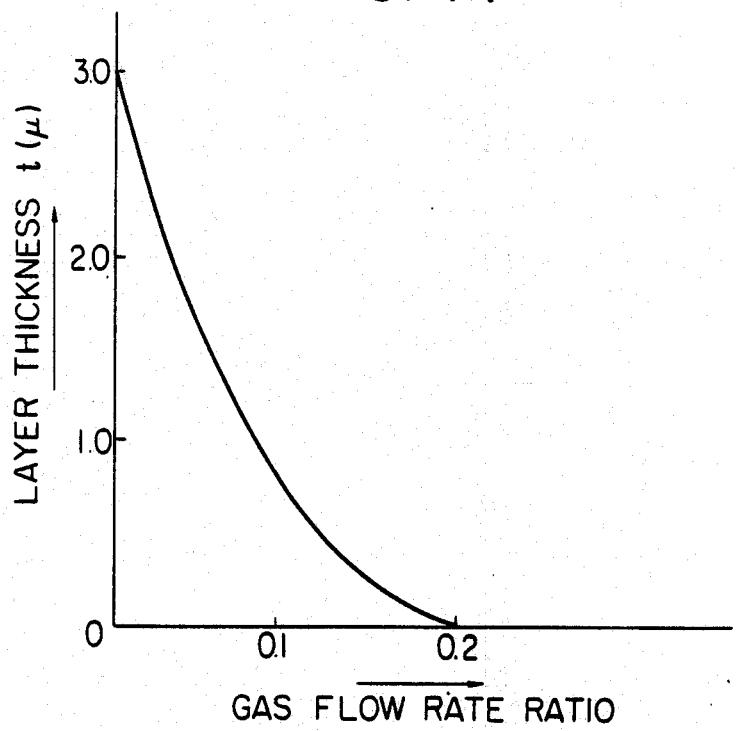

By means of the film deposition device shown in FIG. 20, light receiving member for electrophotography of a-Si:H containing nitrogen was prepared following the same conditions as in Example 69 except for carrying out layer formation on cylindrical aluminum substrate (Cylinder No. 202) under the respective conditions as shown in Table 10H while changing the gas flow rate ratio of $NH_3$ according to the change rate curve of the gas flow rate ratio as shown in FIG. 71 with lapse of time for layer formation.

The thus prepared light receiving member was subjected to evaluation of characteristics, following the same conditions and the same procedure as in Example 69. As the result, in the sample, no interference fringe pattern was observed at all with naked eyes, and sufficiently good electrophotographic characteristics could be exhibited as suited for the object of the present invention.

EXAMPLE 74

Figure 58:
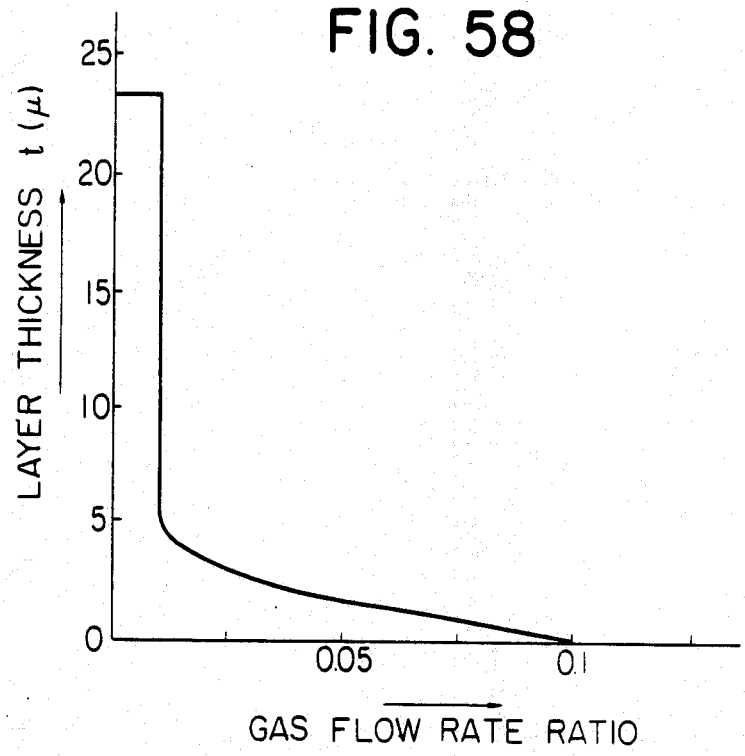

By means of the film deposition device shown in FIG. 20, light receiving member for electrophotography a-Si:H containing oxygen was prepared following the same conditions as in Example 69 except for carrying out layer formation on cylindrical aluminum substrate (Cylinder No. 202) under the respective conditions as shown in Table 11H while changing the gas flow rate ratio of NO according to the change rate curve of the gas flow rate ratio as shown in FIG. 58 with lapse of time for layer formation.

The thus prepared light receiving member was subjected to evaluation of characteristics, following the same conditions and the same procedure as in Example 69. As the result, in the sample, no interference fringe pattern was observed at all with naked eyes, and sufficiently good electrophotographic characteristics could be exhibited as suited for the object of the present invention.

EXAMPLE 75

Under the same conditions as in Example 74 except for changing NO gas employed in Example 74 to $NH_3$ gas, a light-receiving member for electrophotography of a-Si:H containing nitrogen was prepared.

The characteristics of the light-receiving layer thus obtained were evaluated, following the same conditions and the procedure as in Example 74. As the result, no interference fringe pattern was observed at all with the naked eye and the electrophotographic characteristics exhibited were satisfactorily good as suited for the objects of the present invention.

Example 76

Under the same conditions as in Example 74 except for changing NO gas employed in Example 74 to $CH_4$ gas, a light-receiving member for electrophotography of a-Si:H containing carbon was prepared.

The characteristics of the light-receiving layer thus obtained were evaluated, following the same conditions and the procedure as in Example 74. As the result, no interference fringe pattern was observed at all with the naked eye and the electrophotographic characteristics exhibited were satisfactorily good as suited for the objects of the present invention.

EXAMPLE 77

Figure 72:
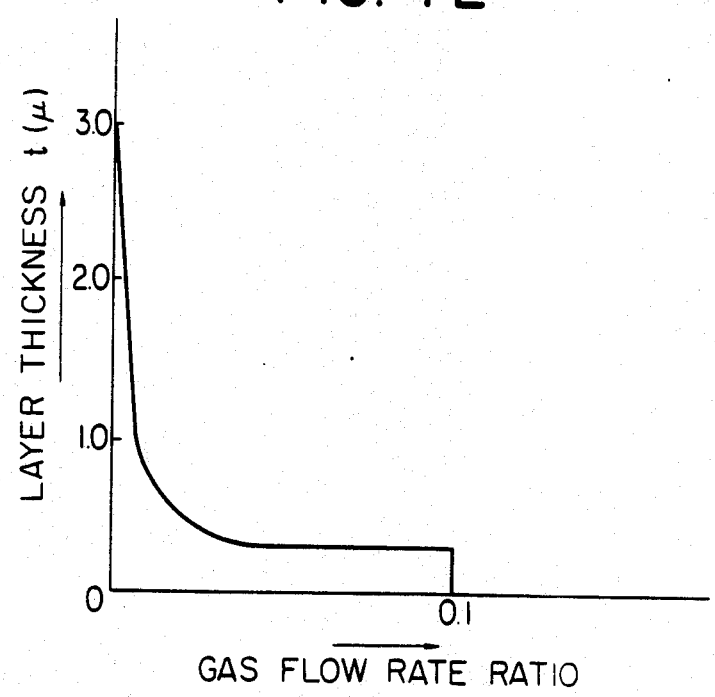

By means of the film deposition device shown in FIG. 20, light receiving member for electrophotography of a-Si:H containing carbon was prepared following the same conditions as in Example 66 except for carrying out layer formation on cylindrical aluminum substrate (Cylinder No. 202) under the respective conditions as shown in Table 12H while changing the gas flow rate ratio of $CH_4$ according to the change rate curve of the gas flow rate ratio as shown in FIG. 72 with lapse of time for layer formation.

The thus prepared light receiving member was subjected to evaluation of characteristics, following the same conditions and the same procedure as in Example 66. As the result, in the sample, no interference fringe pattern was observed at all with naked eyes, and sufficiently good electrophotographic characteristics could be exhibited as suited for the object of the present invention.

EXAMPLE 78

By means of a lathe, an aluminum substrate (length (L): 357 mm, outerdiameter (r): 80 mm) was worked as shown in FIG. 21 (P: pitch, D: depth) under the conditions shown in Table 2I (Nos. 201-204).

Next, a light-receiving member for electrophotography was prepared following various procedures using the film deposition device in FIG. 20 under the conditions as shown in Table 1I (Sample Nos. 201I-204I).

The thickness of each layer of the light-receiving members thus prepared was measured using an electron microscope to obtain the results as shown in Table 2I (Sample Nos. 201I-204I).

The light-receiving member for electrophotography as prepared above was subjected to image exposure by means of a device as shown in FIG. 26 (wavelength of laser beam: 780 nm, spot diameter 80 $\mu m$), followed by development and transfer to obtain an image. The image was free from any interference fringe pattern observed and proved to be satisfactory for practical application.

EXAMPLE 79

By means of a lathe, an aluminum substrate (length (L): 357 mm, outerdiameter (r): 80 mm) was worked as shown in FIG. 21 (P: pitch, D: depth) under the conditions shown in Table 4I (Nos. 401–404).

Next, a light-receiving member for electrophotography was prepared following various procedures using the film deposition device in FIG. 20 under the conditions as shown in Table 3I (Sample Nos. 401I–404I).

The thickness of each layer of the light-receiving members thus prepared was measured using an electron microscope to obtain the results as shown in Table 4I (Sample Nos. 401I–404I).

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 80

By means of a lathe, an aluminum substrate (length (L): 357 mm, outerdiameter (r): 80 mm) was worked as shown in FIG. 21 (P: pitch, D: depth) under the conditions shown in Table 6I (Nos. 601–604).

Next, a light-receiving member for electrophotography was prepared following various procedures using the film deposition device in FIG. 20 under the conditions as shown in Table 5I (Sample Nos. 601I–604I).

The thickness of each layer of the light-receiving members thus prepared was measured using an electron microscope to obtain the results as shown in Table 6I (Sample Nos. 601I–604I).

The light-receiving member for electrophotography as prepared above was subjected to image exposure by means of a device as shown in FIG. 26 (wavelength of laser beam: 780 nm, spot diameter 80 μm), followed by development and transfer to obtain an image. The image gas free from any interference fringe pattern observed and proved to be satisfactory for practical application.

EXAMPLE 81

By means of a lathe, an aluminum substrate (length (L): 357 mm, outerdiameter (r): 80 mm) was worked as shown in FIG. 21 (P: pitch, D: depth) under the conditions shown in Table 8I (Nos. 801–804).

Next, a light-receiving member for electrophotography was prepared following various procedures using the film deposition device in FIG. 20 under the conditions as shown in Table 7I (Sample Nos. 801I–804I).

The thickness of each layer of the light-receiving members thus prepared was measured using an electron microscope to obtain the results as shown in Table 8I (Sample Nos. 801I–804I).

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 82

By means of a lathe, an aluminum substrate (length (L): 357 mm, outer diameter (r): 80 mm) was worked as shown in FIG. 21 (P: pitch, D: depth) under the conditions shown in Table 10I (Cylinder Nos. 1001–1004).

Next, a light-receiving member for electrophotography was prepared following various procedures using the film deposition device in FIG. 20 under the conditions as shown in Table 9I (Sample Nos. 1001I–1004I).

The thickness of each layer of the light-receiving members thus prepared was measured using an electron microscope to obtain the results as shown in Table 10I (Sample Nos. 1001I–1004I).

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 83

By means of a lathe, an aluminum substrate (length (L): 357 mm, outer diameter (r): 80 mm) was worked as shown in FIG. 21 (P: pitch, D: depth) under the conditions shown in Table 12I (Cylinder Nos. 1201–1204).

Next, a light-receiving member for electrophotography was prepared following various procedures using the film deposition device in FIG. 20 under the conditions as shown in Table 11I (Sample Nos. 1201I–1204I).

The thickness of each layer of the light-receiving members thus prepared was measured using an electron microscope to obtain the results as shown in Table 12I (Sample Nos. 1201I–1204I).

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 84

By means of a lathe, an aluminum substrate (length (L): 357 mm, outer diameter (r): 80 mm) was worked as shown in FIG. 21 (P: pitch, D: depth) under the conditions shown in Table 14I (Cylinder Nos. 1401–1404).

Figure 73:
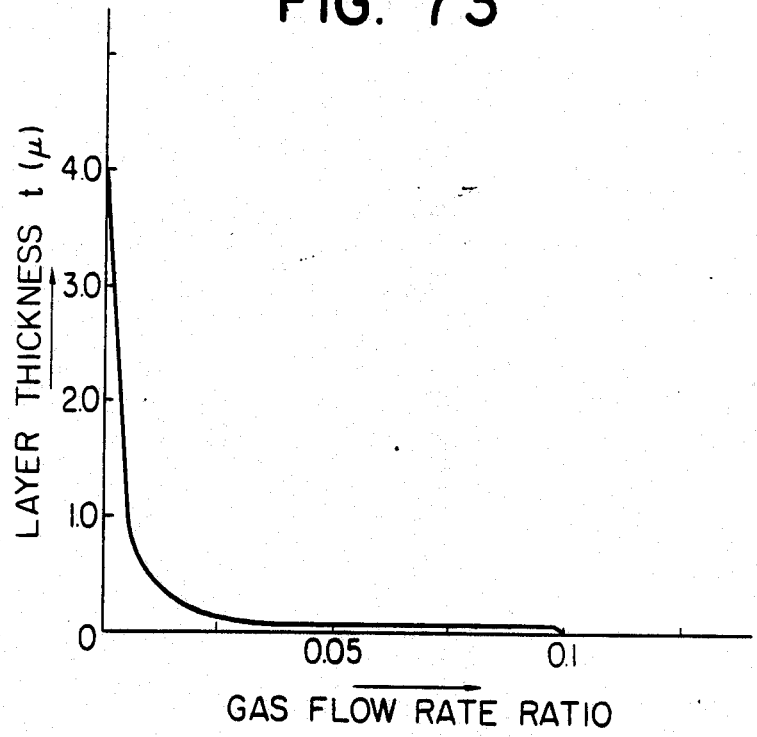

Next, a light-receiving member for electrophotography was prepared following various procedures using the film deposition device in FIG. 20 under the conditions as shown in Table 13I. During the formation of the layer, the flow rate ratio of CH$_4$ gas to SiH$_4$ gas was changed following the change in rate curve as shown in FIG. 73 (Sample Nos. 1401I–404I).

The thickness of each layer of the light-receiving members thus prepared was measured using an electron microscope to obtain the results as shown in Table 14I (Sample Nos. 1401I–1404I).

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 85

By means of a lathe, an aluminum substrate (length (L): 357 mm, outer diameter (r): 80 mm) was worked as shown in FIG. 21 (P: pitch, D: depth) under the conditions shown in Table 16I (Cylinder Nos. 1601–1604).

Figure 74:
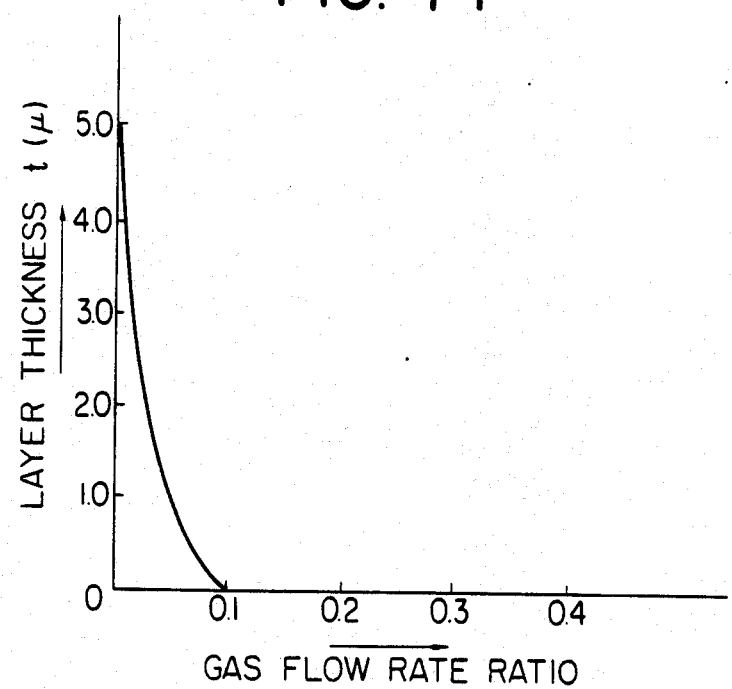

Next, a light-receiving member for electrophotography was prepared following various procedures using the film deposition device in FIG. 20 under the conditions as shown in Table 15I. During the formation of the layer, the flow rate ratio of NO gas to the sum total of $GeH_4$ gas and $SiH_4$ gas was changed following the change in rate curve as shown in FIG. 74 (Sample Nos. 1601I–1604I).

The thickness of each layer of the light-receiving members thus prepared was measured using an electron micoscope to obtain the results as shown in Table 16I (Sample Nos. 1601I–1604I).

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 86

By means of a lathe, an aluminum substrate (length (L): 357 mm, outer diameter (r): 80 mm) was worked as shown in FIG. 21 (P: pitch, D: depth) under the conditions shown in Table 18I (Cylinder Nos. 1801–1804)

Figure 57:
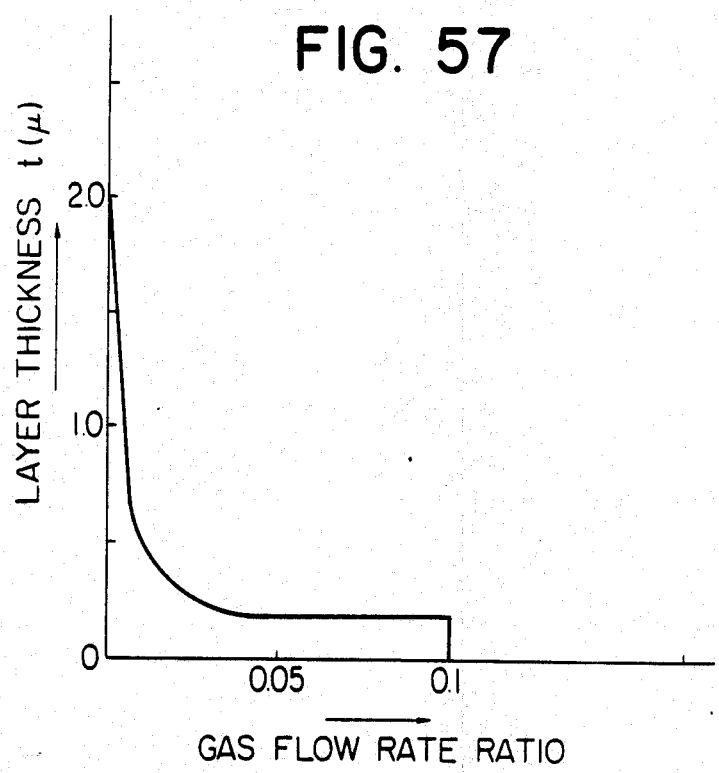

Next, a light-receiving member for electrophotography was prepared following various procedures using the film deposition device in FIG. 20 under the conditions as shown in Table 17I. During the formation of the layer, the flow rate ratio of $NH_3$ gas to the sum total of $GeH_4$ gas and $SiH_4$ gas was changed following the change in rate curve as shown in FIG. 57 (Sample Nos. 1801I–1804I).

The thickness of each layer of the light-receiving members thus prepared was measured using an electron microscope to obtain the results as shown in Table 18I (Sample Nos. 1801I–1804I).

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 87

By means of a lathe, an aluminum substrate (length (L): 357 mm, outerdiameter (r): 80 mm) was worked as shown in FIG. 21 (P: pitch, D: depth) under the conditions shown in Table 20I (Cylinder Nos. 2001–2004).

Figure 75:
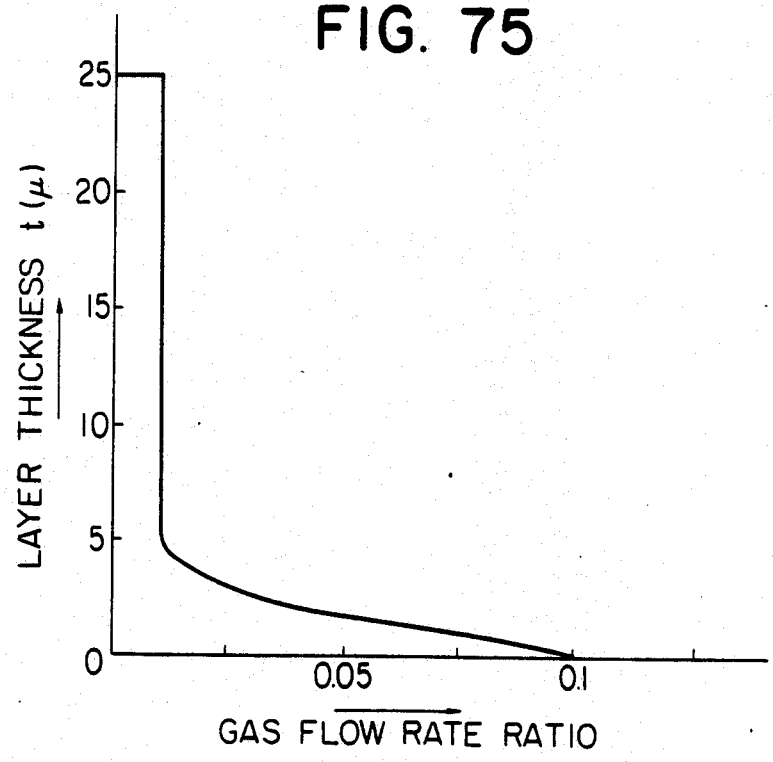

Next, a light-receiving member for electrophotography was prepared following various procedures using the film deposition device in FIG. 20 under the conditions as shown in Table 19I. During the formation of the layer, the flow rate ratio of $CH_4$ gas to the sum total of $GeH_4$ gas and $SiH_4$ gas was changed following the change in rate curve as shown in FIG. 75 (Sample Nos. 2001I–2004I).

The thickness of each layer of the light-receiving members thus prepared was measured using an electron microscope to obtain the results as shown in Table 20I (Sample Nos. 2001I–2004I).

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 88

By means of a lathe, an aluminum substrate (length (L): 357 mm, outerdiameter (r): 80 mm) was worked as shown in FIG. 21 (P: pitch, D: depth) under the conditions shown in Table 22I (Cylinder Nos. 2201–2204).

Figure 76:
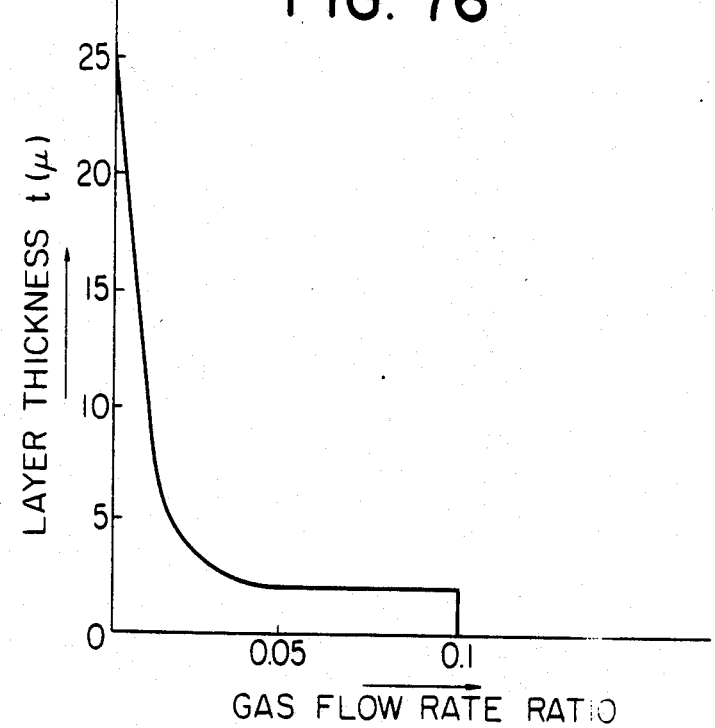

Next, a light receiving member for electrophotography was prepared following various procedures using the film deposition device in FIG. 20 under the conditions as shown in Table 21I. During the formation of the layer, the flow rate ratio of NO gas to the sum total of $GeH_4$ gas and $SiH_4$ gas was changed following the change in rate curve as shown in FIG. 76 (Sample Nos. 2201I–2204I).

The thickness of each layer of the light-receiving members thus prepared was measured using an electron microscope to obtain the results as shown in Table 22I (Sample Nos. 2201I–2204I).

The light-receiving member for electro-photography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 89

By means of a lathe, an aluminum substrate (length (L): 357 mm, outerdiameter (r): 80 mm) was worked as shown in FIG. 21 (P: pitch, D: depth) under the conditions shown in Table 24I (Cylinder Nos. 2401–2404).

Figure 77:
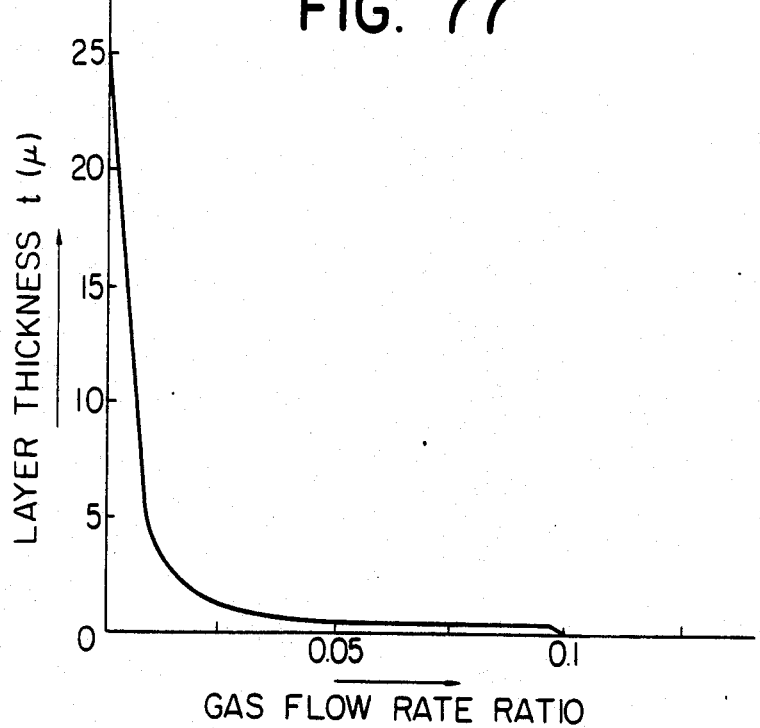

Next, a light-receiving member for electrophotography was prepared following various procedures using the film deposition device in FIG. 20 under the conditions as shown in Table 23I. During the formation of the layer, the flow rate ratio of $NH_3$ gas to the sum total of $GeH_4$ gas and $SiH_4$ gas was changed following the change in rate curve as shown in FIG. 77 (Sample Nos. 2401I–2404I).

The thickness of each layer of the light-receiving members thus prepared was measured using an electron microscope to obtain the results as shown in Table 24I (Sample Nos. 2401I–2404I).

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 90

By means of a lathe, an aluminum substrate (length (L): 357 mm, outerdiameter (r): 80 mm) was worked as shown in FIG. 21 (P: pitch, D: depth) under the conditions shown in Table 26I (Cylinder Nos. 2601–2604).

Next, a light-receiving member for electrophotography was prepared following various procedures using the film deposition device in FIG. 20 under the conditions as shown in Table 25I (Sample Nos. 2601I–2604I).

The thickness of each layer of the light-receiving members thus prepared was measured using an electron microscope to obtain the results as shown in Table 26I (Sample Nos. 2601I-2604I).

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 91

By means of a lathe, an aluminum substrate (length (L): 357 mm, outerdiameter (r): 80 mm) was worked as shown in FIG. 21 (P: pitch, D: depth) under the conditions shown in Table 28I (Cylinder Nos. 2801-2804).

Next, a light-receiving member for electrophotography was prepared following various procedures using the film deposition device in FIG. 20 under the conditions as shown in Table 27I (Sample Nos. 2801I-2804I).

The thickness of each layer of the light-receiving members thus prepared was measured using an electron microscope to obtain the results as shown in Table 28I (Sample Nos. 2801I-2804I).

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 92

For Examples 78 through 91, light-receiving members for electrophotography (Samples No. 2901I-2956I) were prepared by use of $PH_3$ gas diluted with $H_2$ to 3000 vol.ppm in place of $B_2H_6$ gas diluted with $H_2$ to 3000 vol.ppm.

Other preparation conditions were the same as in Examples 78 through 91.

These light-receiving members for electrophotography were each subjected to image exposure by means of a device as shown in FIG. 26 (wavelength of laser beam: 780 nm, spot diameter 80 μm), followed by development and transfer to obtain an image. Each image was free from any interference fringe pattern observed and proved to be satisfactory for practical application.

EXAMPLE 93

By means of a lathe, an aluminum substrate (length (L): 357 mm, outerdiameter (r): 80 mm) was worked as shown in FIG. 21 (P: pitch, D: depth) under the conditions shown in Table 2J (Cylinder Nos. 201-204).

Next, a light-receiving member for electrophotography of a-Si was prepared following various procedures using the film deposition device in FIG. 20 under the conditions as shown in Table 1J (Sample Nos. 201J-204J).

The a-SiGe:H:B:O layer as the first layer was formed while controlling the flow rate of $GeH_4$ and $SiH_4$ as shown in FIG. 22 by operating mass flow controllers 2008 and 2007 for $GeH_4$ and $SiH_4$, respectively, using a computer (HP9845B).

The thickness of each layer of the light-receiving members thus prepared was measured using an electron microscope to obtain the results as shown in Table 2J.

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application (Sample Nos. 201J-204J).

EXAMPLE 94

By means of a lathe, an aluminum substrate (length (L): 357 mm, outerdiameter (r): 80 mm) was worked as shown in FIG. 21 (P: pitch, D: depth) under the conditions shown in Table 3J (Nos. 301-304).

Next, a light-receiving member for electrophotography of a-Si was prepared following various procedures using the film deposition device in FIG. 20 under the conditions as shown in Table 1J (Sample Nos. 301J-304J).

The a-SiGe:H:B:O layer as the first layer was formed while controlling the flow rate of $GeH_4$ and $SiH_4$ as shown in FIG. 23 by operating mass flow controllers 2008 and 2007 for $GeH_4$ and $SiH_4$, respectively, using a computer (HP9845B).

The thickness of each layer of the light-receiving members thus prepared was measured using an electron microscope to obtain the results as shown in Table 3J.

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application (Sample Nos. 301J-304J).

EXAMPLE 95

Under the same conditions as and following the same manner as in Example 93 except for changing NO gas employed in Example 93 to $NH_3$ gas, a light-receiving member for electrophotography of a-Si type (Sample Nos. 401J-404J).

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application (Sample Nos. 401J-404J).

EXAMPLE 96

Under the same conditions as and following the same manner as in Example 93 except for changing NO gas employed in Example 93 to $CH_4$ gas, a light-receiving member for electrophotography of a-Si type (Sample Nos. 501J-504J).

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application (Sample Nos. 501J-504J).

EXAMPLE 97

By means of a lathe, an aluminum substrate (length (L): 357 mm, outerdiameter (r): 80 mm) was worked as shown in FIG. 21 (P: pitch, D: depth) under the conditions shown in Table 5J (Nos. 601–604).

Next, a light-receiving member for electrophotography of a-Si was prepared following various procedures using the film deposition device in FIG. 20 under the conditions as shown in Table 4J (Sample Nos. 601J–604J).

The a-SiGe:H:B:N layer as the first layer was formed while controlling the flow rate of $GeH_4$ and $SiH_4$ as shown in FIG. 24 by operating mass flow controllers 2008 and 2007 for $GeH_4$ and $SiH_4$, respectively, using a computer (HP9845B).

The thickness of each layer of the light-receiving members thus prepared was measured using an electron microscope to obtain the results as shown in Table 5J.

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application (Sample Nos. 601J–604J).

EXAMPLE 98

By means of a lathe, an aluminum substrate (length (L): 357 mm, outerdiameter (r): 80 mm) was worked as shown in FIG. 21 (P: pitch, D: depth) under the conditions shown in Table 6J (Nos. 701–704).

Next, a light-receiving member for electrophotography of a-Si was prepared following various procedures using the film deposition device in FIG. 20 under the conditions as shown in Table 4J (Sample Nos. 701J–704J).

The a-SiGe:H:B:N layer as the first layer was formed while controlling the flow rate of $GeH_4$ and $SiH_4$ as shown in FIG. 25 by operating mass flow controllers 2008 and 2007 for $GeH_4$ and $SiH_4$, respectively, using a computer (HP9845B).

The thickness of each layer of the light-receiving members thus prepared was measured using an electron microscope to obtain the results as shown in Table 6J.

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application (Sample Nos. 701J–704J).

EXAMPLE 99

Under the same conditions as and following the same manner as in Example 97 except for changing $NH_3$ gas employed in Example 97 to NO gas, a light-receiving member for electrophotography of a-Si type (Sample Nos. 801J–804J).

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application (Sample Nos. 801J–804J).

EXAMPLE 100

Under the same conditions as and following the same manner as in Example 97 except for changing $NH_3$ gas employed in Example 97 to $CH_4$ gas, a light-receiving member for electrophotography of a-Si type (Sample Nos. 901J–904J).

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application (Sample Nos. 901J–904J).

EXAMPLE 101

By means of a lathe, an aluminum substrate (length (L): 357 mm, outerdiameter (r): 80 mm) was worked as shown in FIG. 21 (P: pitch, D: depth) under the conditions shown in Table 8J.

Next, a light-receiving member for electrophotography of a-Si:H was prepared following various procedures using the film deposition device in FIG. 20 under the conditions as shown in Table 7J (Sample Nos. 1001J–1004J).

The a-SiGe:H:B:C layer as the first layer was formed while controlling the flow rate of $GeH_4$ and $SiH_4$ as shown in FIG. 22 by operating mass flow controllers 2008 and 2007 for $GeH_4$ and $SiH_4$, respectively, using a computer (HP9845B).

During the formation of the layer, the flow rate ratio of $CH_4$ gas to the sum total of $GeH_4$ gas and $SiH_4$ gas was changed following the change in rate curve as shown in FIG. 72.

The thickness of each layer of the light-receiving members thus prepared was measured using an electron microscope to obtain the results as shown in Table 8J.

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 102

Under the same conditions as and following the same manner as in Example 101 except for changing $CH_4$ gas employed in Example 101 to NO gas, a light-receiving member for electrophotography of a-Si type (Sample Nos. 1101J–1104J).

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application (Sample Nos. 1101J–1104J).

EXAMPLE 103

Under the same conditions as and following the same manner as in Example 101 except for changing $CH_4$ gas employed in Example 101 to $NH_3$ gas, a light-receiving member for electrophotography of a-Si type (Sample Nos. 1201J–1204J).

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application (Sample Nos. 1201J–1204J).

EXAMPLE 104

By means of a lathe, an aluminum substrate (length (L): 357 mm, outerdiameter (r): 80 mm) was worked as shown in FIG. 21 (P: pitch, D: depth) under the conditions shown in Table 10J.

Next, a light-receiving member for electrophotography was prepared following various procedures using the film deposition device in FIG. 20 under the conditions as shown in Table 9J (Sample Nos. 1301J–1304J).

The a-SiGe:H:B:O layer as the first layer was formed while controlling the flow rate of GeH$_4$ and SiH$_4$ as shown in FIG. 24 by operating mass flow controllers 2008 and 2007 for GeH$_4$ and SiH$_4$, respectively, using a computer (HP9845B).

Figure 78:
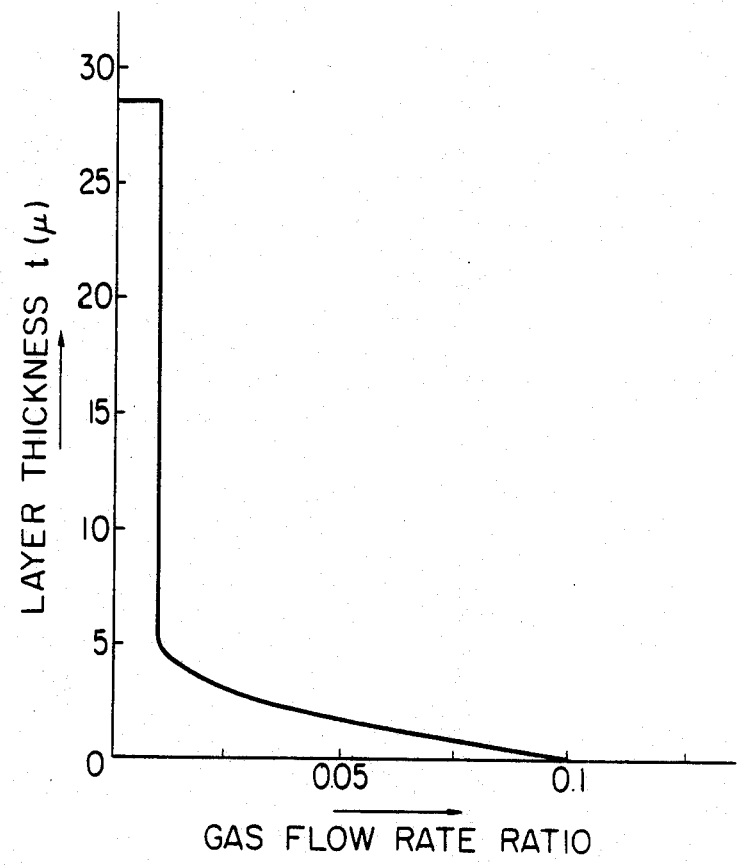

During the formation of the layer, the flow rate ratio of NO gas to the sum total of GeH$_4$ gas and SiH$_4$ gas was changed following the change in rate curve as shown in FIG. 78.

The thickness of each layer of the light-receiving members thus prepared was measured using an electron microscope to obtain the results as shown in Table 10J.

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 105

By means of a lathe, an aluminum substrate (length (L): 357 mm, outerdiameter (r): 80 mm) was worked as shown in FIG. 21 (P: pitch, D: depth) under the conditions shown in Table 12J.

Next, a light-receiving member for electrophotography was prepared following various procedures using the film deposition device in FIG. 20 under the conditions as shown in Table 11J (Sample Nos. 1401J–1404J).

The a-SiGe:H:B:N layer as the first layer was formed while controlling the flow rate of GeH$_4$ and SiH$_4$ as shown in FIG. 25 by operating mass flow controllers 2008 and 2007 for GeH$_4$ and SiH$_4$, respectively, using a computer (HP9845B).

Figure 79:
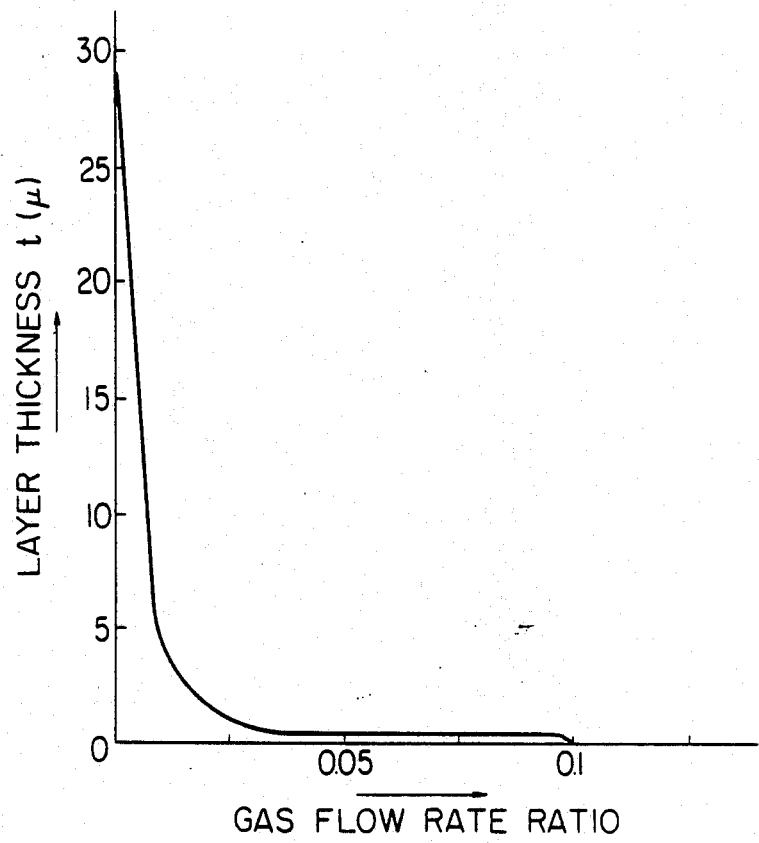

During the formation of the layer, the flow rate ratio of NH$_3$ gas to the sum total of GeH$_4$ gas and SiH$_4$ gas was changed following the change in rate curve as shown in FIG. 79.

The thickness of each layer of the light-receiving members thus prepared was measured using an electron microscope to obtain the results as shown in Table 12J.

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 106

By means of a lathe, an aluminum substrate (length (L): 357 mm, outerdiameter (r): 80 mm) was worked as shown in FIG. 21 (P: pitch, D: depth) under the conditions shown in Table 14J.

Next, a light-receiving member for electrophotography was prepared following various procedures using the film deposition device in FIG. 20 under the conditions as shown in Table 13J (Sample Nos. b 1501J–1504J).

The a-SiGe:H:B:C layer as the first layer was formed while controlling the flow rate of GeH$_4$ and SiH$_4$ as shown in FIG. 23 by operating mass flow controllers 2008 and 2007 for GeH$_4$ and SiH$_4$, respectively, using a computer (HP9845B).

Figure 80:
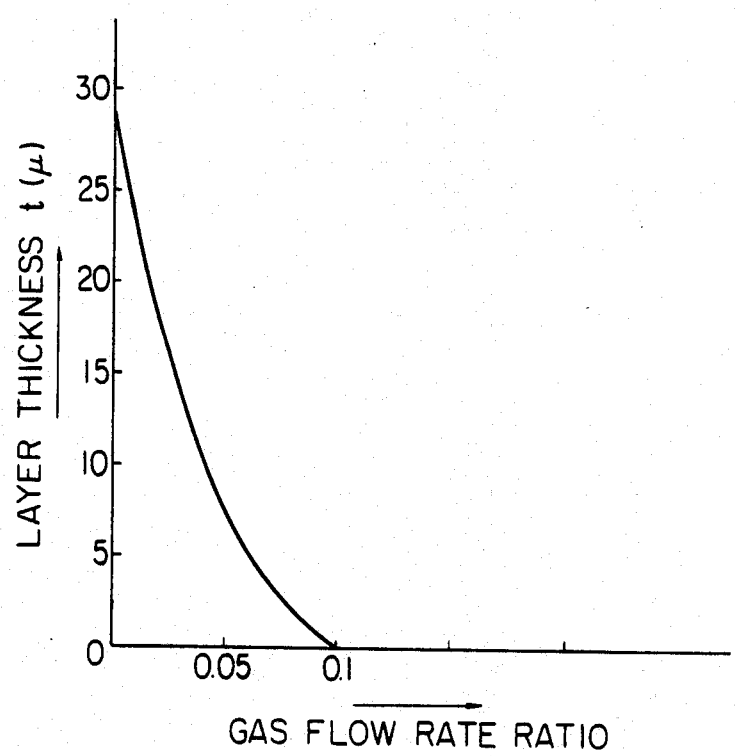

During the formation of the layer, the flow rate ratio of CH$_4$ gas to the sum total of GeH$_4$ gas and SiH$_4$ gas was changed following the change in rate curve as shown in FIG. 80.

The thickness of each layer of the light-receiving members thus prepared was measured using an electron microscope to obtain the results as shown in Table 14J.

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 107

For Examples 93 through 106, light-receiving members for electrophotography (Samples No. 1601J–1656J) were prepared by use of PH$_3$ gas diluted with H$_2$ to 3000 vol.ppm in place of B$_2$H$_6$ gas diluted with H$_2$ to 3000 vol.ppm.

Other preparation conditions were the same as in Example 93 through 106.

These light-receiving members for electrophotography were each subjected to image exposure by means of a device as shown in FIG. 26 (wavelength of laser beam: 780 nm, spot diameter 80 μm), followed by development and transfer to obtain an image. Each image was free from any interference fringe pattern observed and proved to be satisfactory for practical application.

EXAMPLE 108

By means of a lathe, an aluminum substrate was worked to have the surface characteristic of No. 101 A shown in Table 1A.

Next, by use of the deposition device shown in FIG. 20, following various procedures under the conditions as shown in Table 2K, a light-receiving member for electrophotography of A-Si type was deposited on the above aluminum substrate.

The layer thickness distribution of the light-receiving member for electrophotography of A-Si type thus prepared was measured by an electron microscope to find that the average layer thickness difference was 0.1 μm between the center and both ends of the first layer and 2 μm between the center and both ends of the second layer, with the layer thickness difference at the minute portion being 0.02 μm in the first layer and 0.3 μm in the second layer.

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 109

By means of a lathe, an aluminum substrate was worked by the same manner as in Example 108 to have the surface characteristic of No. 102 A shown in Table 1A.

Next, by use of the deposition device shown in FIG. 20, following the same procedures as in Example 1 under the conditions as shown in Table 3K, a light-receiving member for electrophotography of A-Si type was deposited on the above aluminum substrate.

The layer thickness distribution of the light-receiving member for electrophotography of A-Si type thus prepared was measured by an electron microscope to find that the average layer thickness difference was 0.1 μm between the center and both ends of the first layer and 2 μm between the center and both ends of the second layer, with the layer thickness difference at the minute portion being 0.03 μm in the first layer and 0.3 μm in the second layer.

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 110

By means of a lathe, an aluminum substrate was worked by the same manner as in Example 108 to have the surface characteristic of No. 103 A shown in Table 1A.

Next, by use of the deposition device shown in FIG. 20, following the same procedures as in Example 108 under the conditions as shown in Table 4K, a light-receiving member for electrophotography of A-Si type was deposited on the above aluminum substrate.

The layer thickness distribution of the light-receiving member for electrophotography of A-Si type thus prepared was measured by an electron microscope to find that the average layer thickness difference was 0.6 μm between the center and both ends of the first layer and 2 μm between the center and both ends of the second layer, with the layer thickness difference at the minute portion being 0.1 μm in the first layer and 0.3 μm in the second layer.

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 111

By means of a lathe, an aluminum substrate was worked by the same manner as in Example 108 to have the surface characteristic of No. 104 A shown in Table 1A.

Next, by use of the deposition device shown in FIG. 20, following the same procedures as in Example 108 under the conditions as shown in Table 5K, a light-receiving member for electrophotography of A-Si type was deposited on the above aluminum substrate.

The layer thickness distribution of the light-receiving member for electrophotography of A-Si type thus prepared was measured by an electron microscope to find that the average layer thickness difference was 0.8 μm between the center and both ends of the first layer and 2 μm between the center and both ends of the second layer, with the layer thickness difference at the minute portion being 0.15 μm in the first layer and 0.3 μm in the second layer.

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 112

Under the same conditions as and following the same manner as in Example 110 except for changing $CH_4$ gas employed in Example 110 to $NH_3$ gas, a light-receiving member for electrophotography of a-Si type.

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 113

Under the same conditions as and following the same manner as in Example 110 except for changing NO gas employed in Example 110 to $CH_4$ gas, a light-receiving member for electrophotography of a-Si type.

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 114

By means of a lathe, an aluminum substrate (length (L): 357 mm, outerdiameter (r): 80 mm) was worked as shown in FIG. 21 (P: pitch, D: depth) under the conditions shown in Table 7K.

Next, a light-receiving member for electrophotography was prepared following various procedures using the film deposition device in FIG. 20 under the conditions as shown in Table 6K (Sample Nos. 701K-704K).

Figure 56:
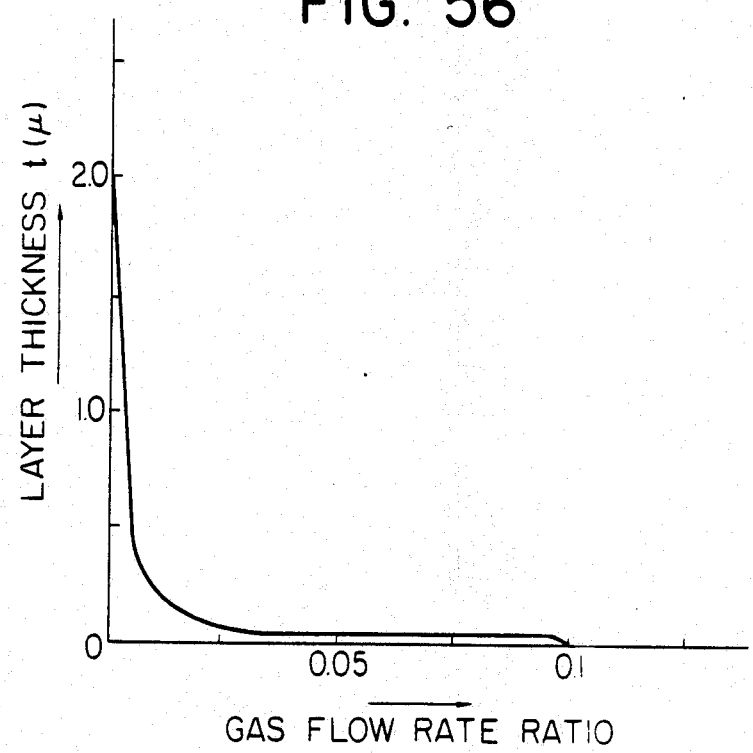

The boron-containing layer was formed while controlling the flow rate of $B_2H_6/H_2$ as shown in Fog. 60 and the nitrogen-containing layer was formed while controlling the flow rate of $NH_3$ as shown in FIG. 56, by operating mass flow controllers 2010 and 2009 for $B_2H_6H_2$ and $NH_3$ respectively, using a computer (HP9845B).

The thickness of each layer of the light-receiving members thus prepared was measured using an electron microscope to obtain the results as shown in Table 7K.

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 115

Under the same conditions as and following the same manner as in Example 114 except for changing $NH_3$ gas employed in Example 114 to NO gas, a light-receiving member for electrophotography of a-Si type The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application (Sample Nos. 801K–804K).

EXAMPLE 116

Under the same conditions as and following the same manner as in Example 114 except for changing $NH_3$ gas employed in Example 114 to $CH_4$ gas, a light-receiving member for electrophotography of a-Si type (Sample Nos. 901K–904K).

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application (Sample Nos. 901K–904K).

EXAMPLE 117

By means of a lathe, an aluminum substrate (length (L) 357 mm, outerdiameter (r): 80 mm) was worked as shown in FIG. 21 (P: pitch, D: depth) under the conditions shown in Table 9K.

Next, a light-receiving member for electrophotography was prepared following various procedures using the film deposition device in FIG. 20 under the conditions as shown in Table 8K (Sample Nos. 1001K–1004K).

The boron-containing layer was formed while controlling the flow rate of $B_2H_6/H_2$ as shown in FIG. 61 and the carbon-containing layer was formed while controlling the flow rate of $CH_4$ as shown in FIG. 57, by operating mass flow controllers 2010 and 2009 for $B_2H_6/H_2$ and $CH_4$, respectively, using a computer (HP9845B).

The thickness of each layer of the light-receiving members thus prepared was measured using an electron microscope to obtain the results as shown in Table 9K.

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 118

Under the same conditions as and following the same manner as in Example 117 except for changing $CH_4$ gas employed in Example 117 to $NH_3$ gas, a light-receiving member for electrophotography of a-Si type (Sample Nos. 1101K–1104K).

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application (Sample Nos. 1101K–1104K).

EXAMPLE 119

Under the same conditions as and following the same manner as in Example 117 except for changing $CH_4$ gas employed in Example 117 to $NH_3$ gas, a light-receiving member for electrophotography of a-Si type (Sample Nos. 1201K–1204K).

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application (Sample Nos. 1201K–1204K).

EXAMPLE 120

By means of a lathe, an aluminum substrate (length (L): 357 mm, outer diameter (r): 80 mm) was worked as shown in FIG. 21 (P: pitch, D: depth) under the conditions shown in Table 11K.

Next, a light-receiving member for electrophotography was prepared following various procedures using the film deposition device in FIG. 20 under the conditions as shown in Table 10K (Sample Nos. 1301K–1304K).

The boron-containing layer was formed while controlling the flow rate of $B_2H_6/H_2$ as shown in FIG. 62 and the oxygen-containing layer was formed while controlling the flow rate of NO as shown in FIG. 58, by operating mass flow controllers 2010 and 2009 for $B_2H_6/H_2$ and NO, respectively, using a computer (HP9845B).

The thickness of each layer of the light-receiving members thus prepared was measured using an electron microscope to obtain the results as shown in Table 11K.

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 121

Under the same conditions as and following the same manner as in Example 120 except for changing NO gas employed in Example 120 to $NH_3$ gas, a light-receiving member for electrophotography of a-Si type (Sample Nos. 1401K–1404K).

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application (Sample Nos. 1401K–1404K).

EXAMPLE 122

Under the same conditions as and following the same manner as in Example 120 except for changing NO gas employed in Example 120 to $CH_4$ gas a light-receiving member for electrophotography of a-Si type (Sample Nos. 1501K–1504K).

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any inferference fringe pattern observed and proved to be satisfactory for practical application (Sample Nos. 1501K–1504K).

EXAMPLE 123

By means of a lathe, an aluminum substrate (length (L): 357 mm, outer diameter (r): 80 mm) was worked as shown in FIG. 21 (P: pitch, D: depth) under the conditions shown in Table 13K.

Next, a light-receiving member for electrophotography was prepared following various procedures using the film deposition device in FIG. 20 under the conditions as shown in Table 12K (Sample Nos. 1601K–1604K).

Figure 59:
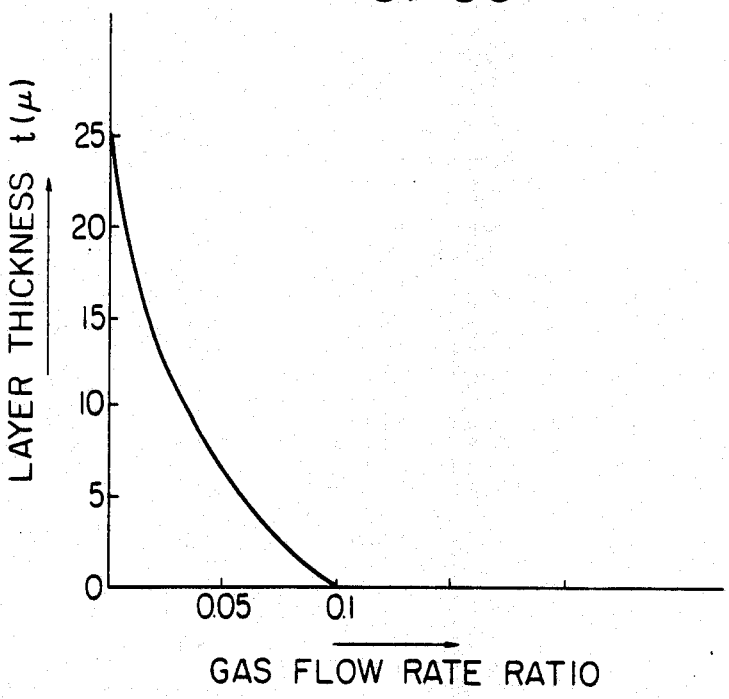

The boron-containing layer was formed while controlling the flow rate of $B_2H_6/H_2$ as shown in FIG. 39 and the nitrogen-containing layer was formed while controlling the flow rate of $NH_3$ as shown in FIG. 59, by operating mass flow controllers 2010 and 2009 for $B_2H_6/H_2$ and $NH_3$, respectively, using a computer (HP9845B).

The thickness of each layer of the light-receiving members thus prepared was measured using an electron microscope to obtain the results as shown in Table 13K.

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 124

Under the same conditions as and following the same manner as in Example 123 except for changing $NH_3$ gas employed in Example 123 to NO gas, a light-receiving member for electrophotography of a-Si type (Sample Nos. 1701K–1704K).

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application (Sample Nos. 1701K–1704K).

EXAMPLE 125

Under the same conditions as and following the same manner as in Example 124 except for changing $NH_3$ gas employed in Example 124 to $CH_4$ gas, a light-receiving member for electrophotography of a-Si type (Sample Nos. 1801K–1804K).

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application (Sample Nos. 1801K–1804K).

EXAMPLE 126

For Examples 108 through 125, light-receiving members for electrophotography (Samples No. 1901K–1950K) were prepared by use of $PH_3$ gas diluted with $H_2$ to 3000 vol. ppm in place of $B_2H_6$ gas diluted with $H_2$ to 3000 vol. ppm.

Other preparation conditions were the same as in Examples 108 through 125.

These light-receiving members for electrophotography were each subjected to image exposure by means of a device as shown in FIG. 26 (wavelength of laser beam: 780 nm, spot diameter 80 μm), followed by development and transfer to obtain an image. Each image was free from any interference fringe pattern observed and proved to be satisfactory for practical application.

EXAMPLE 127

By means of a lathe, four kinds of aluminum substrate (length (L): 357 mm, outer diameter (r): 80 mm) were worked as shown in FIG. 21 (P: pitch, D: depth) under the conditions shown in Table 2L.

Next, a light-receiving member for electrophotography of a-Si type was prepared following various procedures using the film deposition device in FIG. 20 under the conditions as shown in Table 1L (Sample Nos. 101L–104L).

The first layer was formed while controlling the flow rate of $GeH_4$, $SiH_4$ and $B_2H_6/H_2$ as shown in FIGS. 22 and 36 by operating mass flow controllers 2008, 2007 and 2010 for $GeH_4$, $SiH_4$ and $B_2H_6/H_2$, respectively, using a computer (HP9845B).

The thickness of each layer of the light-receiving members thus prepared was measured using an electron microscope to obtain the results as shown in Table 2L.

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application (Samples Nos. 101L–104L).

EXAMPLE 128

By means of a lathe, four kinds of an aluminum substrate (length (L): 357 mm, outer diameter (r): 80 mm) was worked as shown in FIG. 21 (P: pitch, D: depth) under the conditions shown in Table 3L.

Next, a light-receiving member for electrophotography of a-Si type was prepared following various procedures using the film deposition device in FIG. 20 under the conditions as shown in Table 1L (Sample Nos. 201L-204L).

The first layer was formed while controlling the flow rate of GeH$_4$, SiH$_4$ and B$_2$H$_6$/H$_2$ as shown in FIGS. 23 and 37 by operating mass flow controllers 2008, 2007 and 2010 for GeH$_4$, SiH$_4$ and B$_2$H$_6$/H$_2$, respectively, using a computer (HP9845B).

The thicknews of each layer of the light-receiving members thus prepared was measured using an electron microscope to obtain the results as shown in Table 3L.

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application (Sample Nos. 201L-204L).

EXAMPLE 129

By means of a lathe, four kinds of an aluminum substrate (length (L): 357 mm, outer diameter (r): 80 mm) was worked as shown in FIG. 21 (P: pitch, D: depth) under the conditions shown in Table 5L.

Next, a light-receiving member for electrophotography of a-Si type was prepared following various procedures using the film deposition device in FIG. 20 under the conditions as shown in Table 4L (Sample Nos. 301L-304L).

The first layer was formed while controlling the flow rate of GeH$_4$, SiH$_4$ and B$_2$H$_6$/H$_2$ as shown in FIGS. 24 and 38 by operating mass flow controllers 2008, 2007 and 2010 for GeH$_4$, SiH$_4$ and B$_2$H$_6$/H$_2$, respectively, using a computer (HP9845B).

The thickness of each layer of the light-receiving members thus prepared was measured using an electron microscope to obtain the results as shown in Table 5L.

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application (Sample Nos. 301L-304L).

EXAMPLE 130

By means of a lathe, four kinds of an aluminum substrate (length (L): 357 mm, outer diameter (r): 80 mm) was worked as shown in FIG. 21 (P: pitch, D: depth) under the conditions shown in Table 6L.

Next, a light-receiving member for electrophotography of a-Si type was prepared following various procedures using the film deposition device in FIG. 20 under the conditions as shown in Table 4L (Sample Nos. 401L-404L).

The first layer was formed while controlling the flow rate of GeH$_4$, SiH$_4$ and B$_2$H$_6$/H$_2$ as shown in FIGS. 25 and 39 by operating mass flow controllers 2008, 2007 and 2010 for GeH$_4$, SiH$_4$ and B$_2$H$_6$/H$_2$, respectively, using a computer (HP9845B).

The thickness of each layer of the light-receiving members thus prepared was measured using an electron microscope to obtain the results as shown in Table 6L.

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application (Sample Nos. 401L-404L).

EXAMPLE 131

By means of a lathe, four kinds of an aluminum substrate (length (L): 357 mm, outer diameter (r): 80 mm) was worked as shown in FIG. 21 (P: pitch, D: depth) under the conditions shown in Table 8L.

Next, a light-receiving rember for electrophotography of a-Si type was prepared following various procedures using the film deposition device in FIG. 20 under the conditions as shown in Table 7L (Sample Nos. 501L-504L).

The first layer and the A layer was formed while controlling the flow rate of GeH$_4$, SiH$_4$ and B$_2$H$_6$/H$_2$ as shown in FIG. 40 by operating mass flow controllers 2008, 2007 and 2010 for GeH$_4$, SiH$_4$ and B$_2$H$_6$/H$_2$, respectively, using a computer (HP9845B).

The thickness of each layer of the light-receiving members thus prepared was measured using an electron microscope to obtain the results as shown in Table 8L.

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 132

By means of a lathe, four kinds of an aluminum substrate (length (L): 357 mm, outer diameter (r): 80 mm) was worked as shown in FIG. 21 (P: pitch, D: depth) under the conditions shown in Table 10L.

Next, a light-receiving member for electrophotography of a-Si type was prepared following various procedures using the film deposition device in FIG. 20 under the conditions as shown in Table 9L (Sample Nos. 601L-604L).

The first layer and the A layer was formed while controlling the flow rate of GeH$_4$, SiH$_4$ and B$_2$H$_6$/H$_2$ as shown in FIG. 41 by operating mass flow controllers 2008, 2007 and 2010 for GeH$_4$, SiH$_4$ and B$_2$H$_6$/H$_2$, respectively, using a computer (HP9845B).

The thickness of each layer of the light-receiving members thus prepared was measured using an electron microscope to obtain the results as shown in Table 10L.

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 133

By means of a lathe, four kinds of an aluminum substrate (length (L): 357 mm, outer diameter (r): 80 mm) was worked as shown in FIG. 21 (P: pitch, D: depth) under the conditions shown in Table 12L.

Next, a light-receiving member for electrophotography of a-Si type was prepared following various procedures using the film deposition device in FIG. 20 under the conditions as shown in Table 11L (Sample Nos. 701L–704L).

The first layer and the A layer was formed while controlling the flow rate of $GeH_4$, $SiH_4$ and $B_2H_6/H_2$ as shown in FIG. 42 by operating mass flow controllers 2008, 2007 and 2010 for $GeH_4$, $SiH_4$ and $B_2H_6/H_2$, respectively, using a computer (HP9845B).

The thickness of each layer of the light-receiving members thus prepared was measured using an electron microscope to obtain the results as shown in Table 12L.

The light-receiving member for electrophotography as prepared above was subjected to image exposure by means of a device as shown in FIG. 26 (wavelength of laser beam: 780 nm, spot diameter 80 $\mu$m), followed by development and transfer to obtain an image. The image was free from any interference fringe pattern observed and proved to be satisfactory for practical application (Sample Nos. 701L–704L).

EXAMPLE 134

Under the same conditions as and following the same manner as in Example 127 except for changing NO gas employed in Example 127 to $NH_3$ gas, a light-receiving member for electrophotography of a-Si type (Sample Nos. 801L–804L).

The light-receiving member for electrophotography as prepared above was subjected to image exposure by means of a device as shown in FIG. 26 (wavelength of laser beam: 780 nm, spot diameter 80 $\mu$m), followed by development and transfer to obtain an image. The image was free from any interference fringe pattern observed and proved to be satisfactory for practical application (Sample Nos. 801L–804L).

EXAMPLE 135

Under the same conditions as and following the same manner as in Example 127 except for changing NO gas employed in Example 127 to $CH_4$ gas, a light-receiving member for electrophotography of a-Si type (Sample Nos. 901L–904L).

The light-receiving member for electrophotography as prepared above was subjected to image exposure by means of a device as shown in FIG. 26 (wavelength of laser beam: 780 nm, spot diameter 80 $\mu$m), followed by development and transfer to obtain an image. The image was free from any interference fringe pattern observed and proved to be satisfactory for practical application (Sample Nos. 901L–904L).

EXAMPLE 136

Under the same conditions as and following the same manner as in Example 129 except for changing $NH_3$ gas employed in Example 129 to NO gas, a light-receiving member for electrophotography of a-Si type (Sample Nos. 1001L–1004L).

The light-receiving member for electrophotography as prepared above was subjected to image exposure by means of a device as shown in FIG. 26 (wavelength of laser beam: 780 nm, spot diameter 80 $\mu$m), followed by development and transfer to obtain an image. The image was free from any interference fringe pattern observed and proved to be satisfactory for practical application (Sample Nos. 1001L–1004L).

EXAMPLE 137

Under the same conditions as and following the same manner as in Example 129 except for changing $NH_3$ gas employed in Example 129 to $CH_4$ gas, a light-receiving member for electrophotography of a-Si type (Sample Nos. 1101L–1104L).

The light-receiving member for electrophotography as prepared above was subjected to image exposure by means of a device as shown in FIG. 26 (wavelength of laser beam: 780 nm, spot diameter 80 $\mu$m), followed by development and transfer to obtain an image. The image was free from any interference fringe pattern observed and proved to be satisfactory for practical application (Sample Nos. 1101L–1104L).

EXAMPLE 138

Under the same conditions as and following the same manner as in Example 131 except for changing $CH_4$ gas employed in Example 131 to NO gas, a light-receiving member for electrophotography of a-Si type (Sample Nos. 1201L–1204L).

The light-receiving member for electrophotography as prepared above was subjected to image exposure by means of a device as shown in FIG. 26 (wavelength of laser beam: 780 nm, spot diameter 80 $\mu$m), followed by development and transfer to obtain an image. The image was free from any interference fringe pattern observed and proved to be satisfactory for practical application (Sample Nos. 1201L–1204L).

EXAMPLE 139

Under the same conditions as and following the same manner as in Example 131 except for changing $CH_4$ gas employed in Example 131 to $NH_3$ gas, a light-receiving member for electrophotography of a-Si type (Sample Nos. 1301L–1304L).

The light-receiving member for electrophotography as prepared above was subjected to image exposure by means of a device as shown in FIG. 26 (wavelength of laser beam: 780 nm, spot diameter 80 $\mu$m), followed by development and transfer to obtain an image. The image was free from any interference fringe pattern observed and proved to be satisfactory for practical application (Sample Nos. 1301L–1304L).

EXAMPLE 140

By means of a lathe, an aluminum substrate (length (L): 357 mm, outer diameter (r): 80 mm) was worked as shown in FIG. 21 (P: pitch, D: depth) under the conditions shown in Table 14L.

Next, a light-receiving member for electrophotography was prepared following various procedures using the film deposition device in FIG. 20 under the conditions as shown in Table 13L (Samples Nos. 1401L–1404L).

Figure 52:
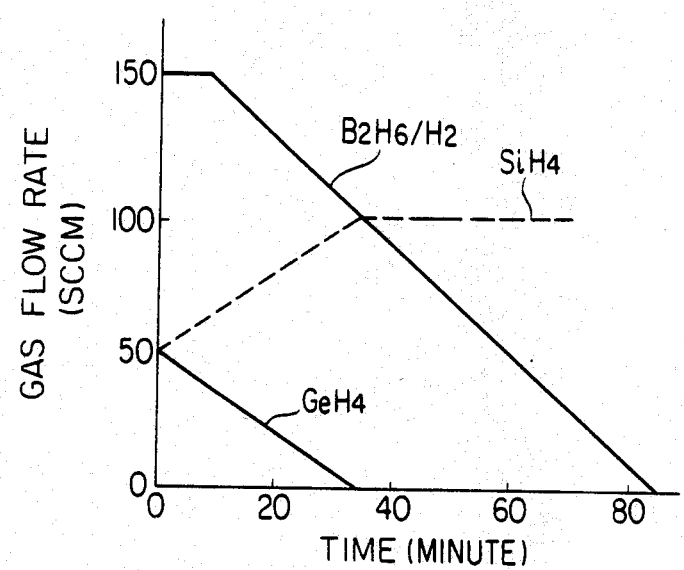

The boron-containing layer was formed while controlling the flow rate of $SiH_4$, $GeH_4$ and $B_2H_6/H_2$ as shown in FIG. 52 and the nitrogen atom-containing layer was formed while controlling the flow rate of $NH_3$ as shown in FIG. 56, by operating mass flow controllers 2007, 2008, 2010 and 2009 for $SiH_4$, $GeH_4$, $B_2H_6/H_2$ and $NH_3$, respectively, using a computer (HP9845B).

The thickness of each layer of the light-receiving members thus prepared was measured using an electron microscope to obtain the results as shown in Table 14L.

The light-receiving member for electrophotography as prepared above was subjected to image exposure by means of a device as shown in FIG. 26 (wavelength of laser beam: 780 nm, spot diameter 80 $\mu$m), followed by development and transfer to obtain an image. The image was free from any interference fringe pattern observed and proved to be satisfactory for practical application.

EXAMPLE 141

Under the same conditions as and following the same manner as in Example 140 except for changing $NH_3$ gas employed in Example 140 to NO gas, a light-receiving member for electrophotography of a-Si type (Sample Nos. 1501L–1504L).

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application (Sample Nos. 1501L–1504L).

EXAMPLE 142

Under the same conditions as and following the same manner as in Example 140 except for changing $NH_3$ gas employed in Example 140 to $CH_4$ gas, a light-receiving member for electrophotography of a-Si type (Sample Nos. 1601L–1604L).

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application (Sample Nos. 1601L–1604L).

EXAMPLE 143

By means of a lathe, an aluminum substrate (length (L): 357 mm, outer diameter (r): 80 mm) was worked as shown in FIG. 21 (P: pitch, D: depth) under the conditions shown in Table 16L.

Next, a light-receiving member for electrophotography was prepared following various procedures using the film deposition device in FIG. 20 under the conditions as shown in Table 15L (Sample Nos. 1701L–1704L).

Figure 53:
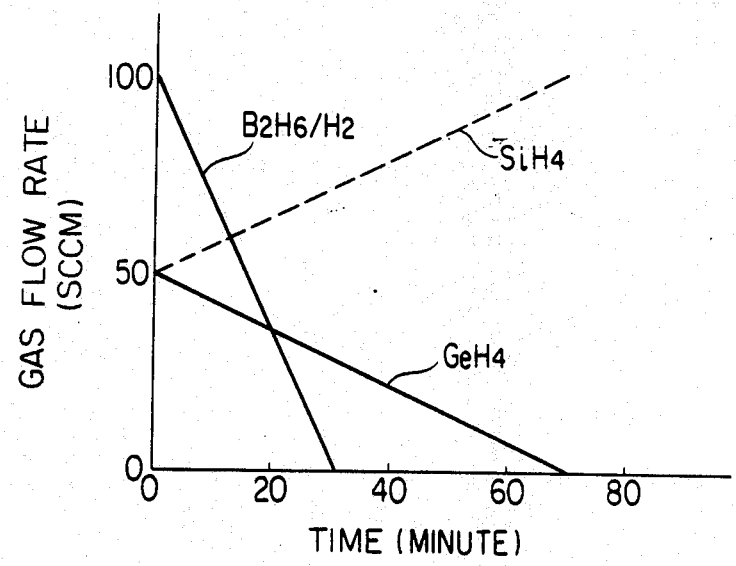

The flow rate of $SiH_4$, $GeH_4$, and $B_2H_6/H_2$ were controlled as shown in FIG. 53 and the carbon-containing layer was formed while controlling the flow rate of $CH_4$ as shown in FIG. 57, by operating mass flow controllers 2007, 2008, 2010 and 2009 for $SiH_4$, $GeH_4$, $B_2H_6/H_2$ and $CH_4$, respectively, using a computer (HP9845B).

The thickness of each layer of the light-receiving members thus prepared was measured using an electron microscope to obtain the results as shown in Table 16L.

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 144

Under the same conditions as and following the same manner as in Example 143 except for changing $CH_4$ gas employed in Example 143 to NO gas, a light-receiving member for electrophotography of a-Si type (Sample Nos. 1801L–1804L).

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application (Sample Nos. 1801L–1804L).

EXAMPLE 145

Under the same conditions as and following the same manner as in Example 143 except for changing $CH_4$ gas employed in Example 143 to $NH_3$ gas, a light-receiving member for electrophotography of a-Si type (Sample Nos. 1901L–1904L).

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application (Sample Nos. 1901L–1904L).

EXAMPLE 146

By means of a lathe, an aluminum substrate (length (L): 357 mm, outer diameter (r): 80 mm) was worked as shown in FIG. 21 (P: pitch, D: depth) under the conditions shown in Table 18L.

Next, a light-receiving member for electrophotography was prepared following various procedures using the film deposition device in FIG. 20 under the conditions as shown in Table 17L (Sample Nos. 2001L–2004L).

Figure 54:
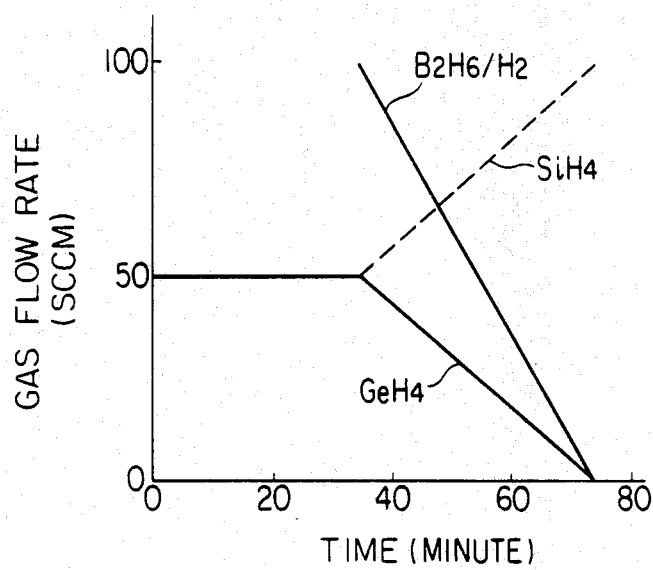

The flow rate of $SiH_4$, $GeH_4$ and $B_2H_6/H_2$ were controlled as shown in FIG. 54 and the oxygen atom-containing layer was formed while controlling the flow rate of NO as shown in FIG. 58, by operating mass flow controllers 2007, 2008, 2010 and 2009 for $SiH_4$, $GeH_4$, $B_2H_6/H_2$ and NO, respectively, using a computer (HP9845B).

The thickness of each layer of the light-receiving members thus prepared was measured using an electron microscope to obtain the results as shown in Table 18L.

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 147

Under the same conditions as and following the same manner as in Example 146 except for changing NO gas employed in Example 146 to $NH_3$ gas, a light-receiving member for electrophotography of a-Si type (Sample Nos. 2101L–2104L).

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application (Sample Nos. 2101L–2104L).

EXAMPLE 148

Under the same conditions as and following the same manner as in Example 146 except for changing NO gas employed in Example 146 to CH$_4$ gas, a light-receiving member for electrophotography of a-Si type (Sample Nos. 2201L-2204L).

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application (Sample Nos. 2201L-2204L).

EXAMPLE 149

By means of a lathe, an aluminum substrate (length (L): 357 mm, outer diameter (r): 80 mm) was worked as shown in FIG. 21 (P: pitch, D: depth) under the conditions shown in Table 20L.

Next, a light-receiving member for electrophotography was prepared following various procedures using the film deposition device in FIG. 20 under the conditions as shown in Table 19L (Sample Nos. 2301L-2304L).

Figure 55:
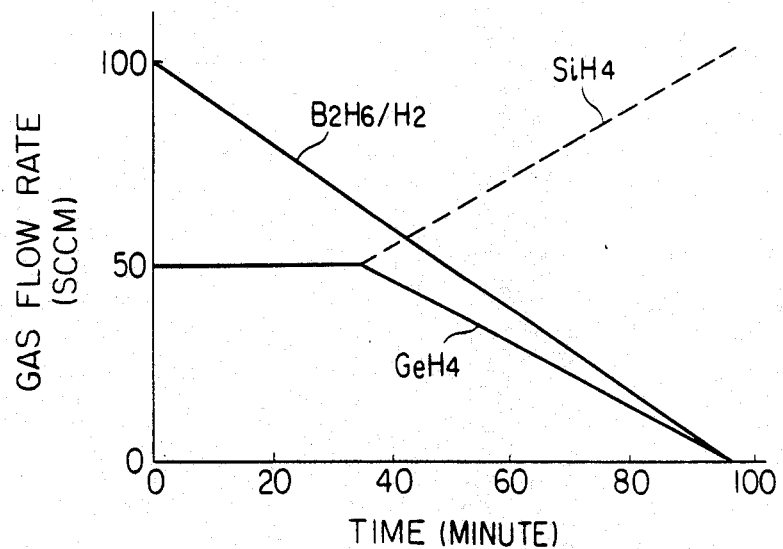

The flow rate of SiH$_4$, GeH$_4$ and B$_2$H$_6$/H$_2$ were controlled as shown in FIG. 55 and the nitrogen-containing layer was formed while controlling the flow rate of NH$_3$ as shown in FIG. 59, by operating mass flow controllers 2007, 2008, 2010 and 2009 for SiH$_4$, GeH$_4$, B$_2$H$_6$/H$_2$ and NH$_3$, respectively, using a computer (HP9845B).

The thickness of each layer of the light-receiving member thus prepared was measured using an electron microscope to obtain the results as shown in Table 20L.

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 150

Under the same conditions as and following the same manner as in Example 149 except for changing NH$_3$ gas employed in Example 149 to NO gas, a light-receiving member for electrophotography of a-Si type (Sample Nos. 2401L-2404L).

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application (Sample Nos. 2401L-2404L).

EXAMPLE 151

Under the same conditions as and following the same manner as in Example 149 except for changing NH$_3$ gas employed in Example 149 to CH$_4$ gas, a light-receiving member for electrophotography of a-Si type (Sample Nos. 2501L-2504L).

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application (Sample Nos. 2501L-2504L).

EXAMPLE 152

For Examples 127 through 151, light-receiving members for electrophotography (Sample Nos. 2601L-2700L) were prepared by use of PH$_3$ gas diluted with H$_2$ to 3000 vol. ppm in place of B$_2$H$_6$ gas diluted with H$_2$ to 3000 vol. ppm.

Other preparation conditions were the same as in Example 127 through 151.

These light-receiving members for electrophotography were each subjected to image exposure by means of a device as shown in FIG. 26 (wavelength of laser beam: 780 nm, spot diameter 80 μm), followed by development and transfer to obtain an image. Each image was free from any interference fringe pattern observed and proved to be satisfactory for practical application.

TABLE 1A

| Item | Substrate No. | | | |
|---|---|---|---|---|
| | 101A | 102A | 103A | 104A |
| Pitch (μm) | 50 | 40 | 25 | 10 |
| Depth (μm) | 2.1 | 1.7 | 0.8 | 0.6 |
| Angle (degree) | 5.0 | 4.8 | 3.7 | 6.8 |

TABLE 2A

| | Starting gas | Gas flow rate (SCCM) | Discharging power (W) | Deposition rate (Å/sec) | Layer thickness (μ) |
|---|---|---|---|---|---|
| First layer | H$_2$ | 300 | 100 | 10 | 1 |
| | GeH$_4$ | 100 | | | |
| Second layer | H$_2$ | 300 | 300 | 24 | 20 |
| | SiH$_4$ | 300 | | | |

TABLE 3A

| | Starting gas | Gas flow rate (SCCM) | Discharging power (W) | Deposition rate (Å/sec) | Layer thickness (μ) |
|---|---|---|---|---|---|
| First layer | H$_2$ | 300 | 100 | 14 | 3 |
| | SiH$_4$ | 50 | | | |
| | GeH$_4$ | 100 | | | |
| Second layer | H$_2$ | 300 | 300 | 24 | 20 |
| | SiH$_4$ | 300 | | | |

TABLE 4A

| | Starting gas | Gas flow rate (SCCM) | Discharging power (W) | Deposition rate (Å/sec) | Layer thickness (μ) |
|---|---|---|---|---|---|
| First layer | H$_2$ | 300 | 100 | 12 | 5 |
| | SiH$_4$ | 100 | | | |
| | GeH$_4$ | 50 | | | |
| Second layer | H$_2$ | 300 | 300 | 24 | 20 |
| | SiH$_4$ | 300 | | | |

TABLE 5A

| | Starting gas | Gas flow rate (SCCM) | Discharging power (W) | Deposition rate (Å/sec) | Layer thickness (μ) |
|---|---|---|---|---|---|
| First layer | H$_2$ | 300 | 100 | 8 | 7 |
| | SiH$_4$ | 135 | | | |

TABLE 5A-continued

| | Starting gas | Gas flow rate (SCCM) | Discharging power (W) | Deposition rate (Å/sec) | Layer thickness ($\mu$) |
|---|---|---|---|---|---|
| Second layer | GeH$_4$ | 15 | | | |
| | H$_2$ | 300 | 300 | 24 | 20 |
| | SiH$_4$ | 300 | | | |

TABLE 1B

| | Starting gas | Gas flow rate (SCCM) | Discharging power (W) | Deposition rate (Å/sec) | Layer thickness ($\mu$) |
|---|---|---|---|---|---|
| First layer | H$_2$ | 300 | 100 | 9 | 3 |
| | GeH$_4$ | 100 → 0 | | | |
| | SiH$_4$ | 0 → 100 | | | |
| | | GeH$_4$ + SiH$_4$ = 100 | | | |
| Second layer | H$_2$ | 300 | 300 | 24 | 20 |
| | SiH$_4$ | 300 | | | |

TABLE 2B

| | | Substrate No. | | | |
|---|---|---|---|---|---|
| | | 201B | 202B | 203B | 204B |
| Surface structure of Al substrate | Pitch ($\mu$m) | 50 | 40 | 25 | 10 |
| | Depth ($\mu$m) | 2.1 | 1.7 | 0.8 | 0.6 |
| | Angle (degree) | 5.0 | 4.8 | 3.7 | 6.8 |
| Thickness of light receiving layer | Average difference in layer thickness between center and both ends ($\mu$m) | 3.2 | 3.2 | 3.2 | 3.2 |
| | Difference in layer thickness of minute portion ($\mu$m) | 0.51 | 0.44 | 0.41 | 0.61 |

TABLE 3B

| | | Substrate No. | | | |
|---|---|---|---|---|---|
| | | 301B | 302B | 303B | 304B |
| Surface structure of Al substrate | Pitch ($\mu$m) | 50 | 40 | 25 | 10 |
| | Depth ($\mu$m) | 2.1 | 1.7 | 0.8 | 0.6 |
| | Angle (degree) | 5.0 | 4.8 | 3.7 | 6.8 |
| Thickness of light receiving layer | Average difference in layer thickness between center and both ends ($\mu$m) | 3.2 | 3.2 | 3.2 | 3.2 |
| | Difference in layer thickness of minute portion ($\mu$m) | 0.45 | 0.42 | 0.39 | 0.50 |

TABLE 4B

| | Starting gas | Gas flow rate (SCCM) | Discharging power (W) | Deposition rate (Å/sec) | Layer thickness ($\mu$) |
|---|---|---|---|---|---|
| First layer | H$_2$ | 300 | 100 | 9 | 3 |
| | GeH$_4$ | 50 → 0 | | | |
| | SiH$_4$ | 50 → 100 | | | |
| | | GeH$_4$ + SiH$_4$ = 100 | | | |
| Second layer | H$_2$ | 300 | 300 | 24 | 20 |
| | SiH$_4$ | 300 | | | |

TABLE 5B

| | | Substrate No. | | | |
|---|---|---|---|---|---|
| | | 501B | 502B | 503B | 504B |
| Surface structure of Al substrate | Pitch ($\mu$m) | 50 | 40 | 25 | 10 |
| | Depth ($\mu$m) | 2.1 | 1.7 | 0.8 | 0.6 |
| | Angle (degree) | 5.0 | 4.8 | 3.7 | 6.8 |
| Thickness of light receiving layer | Average difference in layer thickness between center and both ends ($\mu$m) | 3.2 | 3.2 | 3.2 | 3.2 |
| | Difference in layer thickness of minute portion ($\mu$m) | 0.42 | 0.40 | 0.38 | 0.48 |

TABLE 6B

| | | Substrate No. | | | |
|---|---|---|---|---|---|
| | | 601B | 602B | 603B | 604B |
| Surface structure of Al substrate | Pitch ($\mu$m) | 50 | 40 | 25 | 10 |
| | Depth ($\mu$m) | 2.1 | 1.7 | 0.8 | 0.6 |
| | Angle (degree) | 5.0 | 4.8 | 3.7 | 6.8 |
| Thickness of light receiving layer | Average difference in layer thickness between center and both ends ($\mu$m) | 3.2 | 3.2 | 3.2 | 3.2 |
| | Difference in layer thickness of minute portion ($\mu$m) | 0.40 | 0.38 | 0.36 | 0.45 |

TABLE 1C

| Layer constitution | Starting gas | Gas flow rate (SCCM) | Discharging power (W) | Deposition rate (Å/sec) | Layer thickness ($\mu$) |
|---|---|---|---|---|---|
| First layer | H$_2$ | 300 | 100 | 10 | 3 |
| | SiH$_4$ | 100 | | | |
| | GeH$_4$ | 100 | | | |
| | B$_2$H$_6$/H$_2$ (= 3000 vol ppm) | 100 | | | |
| Second layer | H$_2$ | 300 | 300 | 24 | 20 |
| | SiH$_4$ | 300 | | | |

TABLE 2C

| | | No. | | | |
|---|---|---|---|---|---|
| | | 201C | 202C | 203C | 204C |
| Surface structure of Al substrate | Pitch ($\mu$m) | 50 | 40 | 25 | 10 |
| | Depth ($\mu$m) | 2.1 | 1.7 | 0.8 | 0.6 |
| | Angle (degree) | 5.0 | 4.8 | 3.7 | 6.8 |
| Thickness of light receiving layer | Average difference in layer thickness between center and both ends of first layer ($\mu$m) | 1 | 1 | 1 | 1 |
| | Difference in layer thickness of minute portion in first layer ($\mu$m) | 0.2 | 0.15 | 0.1 | 0.25 |
| | Average difference in layer thickness between center and both ends of second layer ($\mu$m) | 3 | 3 | 3 | 3 |
| | Difference in layer thickness of minute portion in second layer ($\mu$m) | 0.55 | 0.4 | 0.3 | 0.6 |

TABLE 3C

| Layer constitution | | Starting gas | Gas flow rate (SCCM) | Discharging power (W) | Deposition rate (Å/sec) | Layer thickness (μ) |
|---|---|---|---|---|---|---|
| First layer | | H₂ | 300 | 100 | 10 | 1 |
| | | SiH₄ | 100 | | | |
| | | GeH₄ | 100 | | | |
| | | B₂H₆/H₂ | 100 | | | |
| | | (= 300 vol ppm) | | | | |
| Second layer | Layer A | H₂ | 300 | 100 | 8 | 5 |
| | | SiH₄ | 100 | | | |
| | | B₂H₆/H₂ | 100 | | | |
| | | (= 300 vol ppm) | | | | |
| | Layer B | H₂ | 300 | 300 | 24 | 20 |
| | | SiH₄ | 300 | | | |

TABLE 4C

| | | No. | | | |
|---|---|---|---|---|---|
| | | 401C | 402C | 403C | 404C |
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving layer | Average difference in layer thickness between center and both ends of first layer (μm) | 0.1 | 0.1 | 0.1 | 0.1 |
| | Difference in layer thickness of minute portion in first layer (μm) | 0.04 | 0.03 | 0.02 | 0.05 |
| | Second layer — Average difference in layer thickness between center and both ends of layer A (μm) | 1.5 | 1.5 | 1.5 | 1.5 |
| | Difference in layer thickness of minute portion in layer A (μm) | 0.2 | 0.12 | 0.1 | 0.3 |
| | Average difference in layer thickness between center and both ends of layer B (μm) | 3 | 3 | 3 | 3 |
| | Difference in layer thickness of minute portion in layer B (μm) | 0.55 | 0.4 | 0.3 | 0.6 |

TABLE 5C

| Layer constitution | | Starting gas | Gas flow rate (SCCM) | Discharging power (W) | Deposition rate (Å/sec) | Layer thickness (μ) |
|---|---|---|---|---|---|---|
| First layer | | H₂ | 300 | 100 | 10 | 1 |
| | | SiH₄ | 100 | | | |
| | | GeH₄ | 100 | | | |
| | | B₂H₆/H₂ | 50 | | | |
| | | (= 3000 vol ppm) | | | | |
| Second layer | Layer A | H₂ | 300 | 100 | 8 | 5 |
| | | SiH₄ | 100 | | | |
| | | B₂H₆/H₂ | 100 | | | |
| | | (= 3000 vol ppm) | | | | |
| | Layer B | H₂ | 300 | 300 | 24 | 20 |
| | | SiH₄ | 300 | | | |

TABLE 6C

| | | No. | | | |
|---|---|---|---|---|---|
| | | 601C | 602C | 603C | 604C |
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving layer | Average difference in layer thickness between center and both ends of first layer (μm) | 0.12 | 0.12 | 0.12 | 0.12 |
| | Difference in layer thickness of minute portion in first layer (μm) | 0.05 | 0.04 | 0.03 | 0.06 |
| | Second layer — Average difference in layer thickness between center and both ends of layer A (μm) | 1.5 | 1.5 | 1.5 | 1.5 |
| | Difference in layer thickness of minute portion in layer A (μm) | 0.2 | 0.12 | 0.1 | 0.3 |
| | Average difference in layer thickness between center and both ends of layer B (μm) | 3 | 3 | 3 | 3 |
| | Difference in layer thickness of minute portion in layer B (μm) | 0.55 | 0.4 | 0.4 | 0.6 |

TABLE 7C

| Layer constitution | | Starting gas | Gas flow rate (SCCM) | Discharging power (W) | Deposition rate (Å/sec) | Layer thickness (μ) |
|---|---|---|---|---|---|---|
| First layer | | $H_2$ | 300 | 100 | 10 | 1 |
| | | $SiH_4$ | 100 | | | |
| | | $GeH_4$ | 100 | | | |
| | | $B_2H_6/H_2$ (= 3000 vol ppm) | 150 | | | |
| Second layer | Layer A | $H_2$ | 300 | 100 | 8 | 5 |
| | | $SiH_4$ | 100 | | | |
| | | $B_2H_6/H_2$ (= 3000 vol ppm) | 100 | | | |
| | Layer B | $H_2$ | 300 | 300 | 24 | 20 |
| | | $SiH_4$ | 300 | | | |

TABLE 9C

| Layer constitution | | Starting gas | Gas flow rate (SCCM) | Discharging power (W) | Deposition rate (Å/sec) | Layer thickness (μ) |
|---|---|---|---|---|---|---|
| First layer | | $H_2$ | 300 | 100 | 10 | 1 |
| | | $SiH_4$ | 100 | | | |
| | | $GeH_4$ | 100 | | | |
| Second layer | Layer A | $H_2$ | 300 | 100 | 8 | 5 |
| | | $SiH_4$ | 100 | | | |
| | | $B_2H_6/H_2$ (= 3000 vol ppm) | 100 | | | |
| | Layer B | $H_2$ | 300 | 300 | 24 | 20 |
| | | $SiH_4$ | 300 | | | |

TABLE 8C

| | | No. | | | |
|---|---|---|---|---|---|
| | | 801C | 802C | 803C | 804C |
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving layer | Average difference in layer thickness between center and both ends of first layer (μm) | 0.1 | 0.1 | 0.1 | 0.1 |
| | Difference in layer thickness of minute portion in first layer (μm) | 0.05 | 0.04 | 0.03 | 0.06 |
| | Second layer — Average difference in layer thickness between center and both ends of layer A (μm) | 1.6 | 1.6 | 1.6 | 1.6 |
| | Difference in layer thickness of minute portion in layer A (μm) | 0.2 | 0.13 | 0.11 | 0.3 |
| | Average difference in layer thickness between center and both ends of layer B (μm) | 3.1 | 3.1 | 3.1 | 3.1 |
| | Difference in layer thickness of minute portion in layer B (μm) | 0.55 | 0.4 | 0.4 | 0.6 |

TABLE 10C

| | | No. | | | |
|---|---|---|---|---|---|
| | | 1001C | 1002C | 1003C | 1004C |
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving layer | Average difference in layer thickness between center and both ends of first layer (μm) | 0.12 | 0.12 | 0.12 | 0.12 |
| | Difference in layer thickness of minute portion in first layer (μm) | 0.05 | 0.04 | 0.03 | 0.06 |
| | Second Layer — Average difference in layer thickness between center and both ends of layer A (μm) | 1.5 | 1.5 | 1.5 | 1.5 |
| | Difference in layer thickness of minute portion in layer A (μm) | 0.2 | 0.12 | 0.1 | 0.3 |
| | Average difference in layer thickness between center and both ends of layer B (μm) | 3 | 3 | 3 | 3 |
| | Difference in layer thickness of minute portion in layer B (μm) | 0.55 | 0.4 | 0.39 | 0.6 |

TABLE 11C

| Layer constitution | | Starting gas | Gas flow rate (SCCM) | Discharging power (W) | Deposition rate (Å/Sec) | Layer thickness (μ) |
|---|---|---|---|---|---|---|
| First layer | Layer A | $H_2$ | 300 | 100 | 10 | 2 |
| | | $SiH_4$ | 100 | | | |
| | | $GeH_4$ | 100 | | | |
| | | $B_2H_6/H_2$ (= 3000 vol ppm) | 100 | | | |
| | Layer B | $H_2$ | 300 | 100 | 10 | 2 |
| | | $SiH_4$ | 100 | | | |
| | | $GeH_4$ | 100 | | | |
| Second layer | | $H_2$ | 300 | 300 | 24 | 20 |
| | | $SiH_4$ | 300 | | | |
| | | $B_2H_6/H_2$ (= 50 vol ppm) | 50 | | | |

TABLE 12C

| | | | No. | | | |
|---|---|---|---|---|---|---|
| | | | 1201C | 1202C | 1203C | 1204C |
| Surface structure of Al substrate | | Pitch (μm) | 50 | 40 | 25 | 10 |
| | | Depth (μm) | 2.1 | 1.7 | 0.8 | 0.6 |
| | | Angle (degree) | 5.0 | 4.8 | 3.7 | 6.8 |
| Thickness of light receiving layer | First layer | Average difference in layer thickness between center and both ends of layer A (μm) | 0.2 | 0.2 | 0.2 | 0.2 |
| | | Difference in layer thickness of minute portion in layer A (μm) | 0.1 | 0.1 | 0.1 | 0.12 |
| | | Average difference in layer thickness between center and both ends of layer B (μm) | 0.22 | 0.22 | 0.22 | 0.22 |
| | | Difference in layer thickness of minute portion in layer B (μm) | 0.11 | 0.1 | 0.1 | 0.13 |
| | | Average difference in layer thickness between center and both ends of second layer (μm) | 3 | 3 | 3 | 3 |
| | | Difference in layer thickness of minute portion in second layer (μm) | 0.55 | 0.4 | 0.39 | 0.6 |

TABLE 13C

| Layer constitution | | Starting gas | Gas flow rate (SCCM) | Discharging power (W) | Deposition rate (Å/Sec) | Layer thickness (μ) |
|---|---|---|---|---|---|---|
| First layer | Layer A | $H_2$ | 300 | 100 | 10 | 2 |
| | | $SiH_4$ | 100 | | | |
| | | $GeH_4$ | 100 | | | |
| | Layer B | $H_2$ | 300 | 100 | 10 | 2 |
| | | $SiH_4$ | 200 | | | |
| | | $GeH_4$ | 100 | | | |
| | | $B_2H_6/H_2$ (= 50 vol ppm) | 100 | | | |
| Second layer | | $H_2$ | 300 | 300 | 24 | 20 |
| | | $SiH_4$ | 300 | | | |
| | | $B_2H_6/H_2$ (= 50 vol ppm) | 100 | | | |

TABLE 14C

| | | No. | 1401C | 1402C | 1403C | 1404C |
|---|---|---|---|---|---|---|
| Surface structure of Al substrate | | Pitch (μm) | 50 | 40 | 25 | 10 |
| | | Depth (μm) | 2.1 | 1.7 | 0.8 | 0.6 |
| | | Angle (degree) | 5.0 | 4.8 | 3.7 | 6.8 |
| Thickness of light receiving layer | First layer | Average difference in layer thickness between center and both ends of layer A (μm) | 0.2 | 0.2 | 0.2 | 0.2 |
| | | Difference in layer thickness of minute portion in layer A (μm) | 0.1 | 0.1 | 0.1 | 0.12 |
| | | Average difference in layer thickness between center and both ends of layer B (μm) | 0.22 | 0.22 | 0.22 | 0.22 |

TABLE 14C-continued

| No. | 1401C | 1402C | 1403C | 1404C |
|---|---|---|---|---|
| Difference in layer thickness of minute portion in layer B (μm) | 0.11 | 0.1 | 0.1 | 0.13 |
| Average difference in layer thickness between center and both ends of second layer (μm) | 3 | 3 | 3 | 3 |
| Difference in layer thickness of minute portion in second layer (μm) | 0.55 | 0.4 | 0.39 | 0.6 |

TABLE 15C

| Layer Constitution | Starting Gas | Gas Flow rate (SCCM) | Discharging power (W) | Deposition rate (Å/Sec) | Layer thickness (μ) |
|---|---|---|---|---|---|
| First layer | H₂ | 300 | 100 | 10 | 5 |
| | GeH₄ | 50 | | | |
| | SiH₄ | 50 | | | |
| | B₂H₆/H₂ | 100 | | | |
| | (= 3000 vol ppm) | | | | |
| Second layer | H₂ | 300 | 300 | 24 | 20 |
| | SiH₄ | 300 | | | |

TABLE 16C

| | No. | 1601C | 1602C | 1603C | 1604C |
|---|---|---|---|---|---|
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving layer | Average difference in layer thickness between center and both ends of first layer (μm) | 1.5 | 1.5 | 1.5 | 1.5 |
| | Difference in layer thickness of minute portion in first layer (μm) | 0.2 | 0.12 | 0.1 | 0.3 |
| | Average difference in layer thickness between center and both ends of second layer (μm) | 3 | 3 | 3 | 3 |
| | Difference in layer thickness of minute portion in second layer (μm) | 0.55 | 0.4 | 0.3 | 0.6 |

TABLE 17C

| Layer constitution | Starting gas | Gas flow rate (SCCM) | Discharging power (W) | Deposition rate (Å/Sec) | Layer thickness (μ) |
|---|---|---|---|---|---|
| First layer | H₂ | 300 | 100 | 10 | 2 |
| | GeH₄ | 50 | | | |
| | SiH₄ | 200 | | | |
| | B₂H₆/H₂ (= 100 vol ppm) | 50 | | | |
| Second layer Layer A | H₂ | 300 | 100 | 8 | 3 |
| | SiH₄ | 250 | | | |
| | B₂H₆/H₂ (= 100 vol ppm) | 50 | | | |
| Layer B | H₂ | 300 | 300 | 24 | 20 |
| | SiH₄ | 300 | | | |
| | B₂H₆/H₂ (= 100 vol ppm) | 50 | | | |

TABLE 18C

| | No. | 1801C | 1802C | 1803C | 1804C |
|---|---|---|---|---|---|
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving layer | Average difference in layer thickness between center and both ends of first layer (μm) | 0.2 | 0.2 | 0.2 | 0.2 |
| | Difference in layer thickness of minute portion in first layer (μm) | 0.14 | 0.12 | 0.1 | 0.16 |
| Second layer | Average difference in layer thickness between center and both ends of layer A (μm) | 0.3 | 0.3 | 0.3 | 0.3 |

TABLE 18C-continued

| | No. | 1801C | 1802C | 1803C | 1804C |
|---|---|---|---|---|---|
| | Difference in layer thickness of minute portion in layer A ($\mu$m) | 0.2 | 0.14 | 0.13 | 0.21 |
| | Average difference in layer thickness between center and both ends of layer B ($\mu$m) | 3 | 3 | 3 | 3 |
| | Difference in layer thickness of minute portion in layer B ($\mu$m) | 0.57 | 0.4 | 0.3 | 0.6 |

TABLE 19C

| Layer constitution | | Starting gas | Gas flow rate (SCCM) | Discharging power (W) | Deposition rate (Å/sec) | Layer thickness ($\mu$) |
|---|---|---|---|---|---|---|
| First layer | | $H_2$ | 300 | 100 | 10 | 2 |
| | | $GeH_4$ | 50 | | | |
| | | $SiH_4$ | 50 | | | |
| | | $B_2H_6/H_2$ (= 3000 vol ppm) | 50 | | | |
| Second layer | Layer A | $H_2$ | 300 | 100 | 8 | 3 |
| | | $SiH_4$ | 100 | | | |
| | | $B_2H_6/H_2$ (= 3000 vol ppm) | 100 | | | |
| | Layer B | $H_2$ | 300 | 300 | 24 | 20 |
| | | $SiH_4$ | 300 | | | |

TABLE 20C

| | | No. | 2001C | 2002C | 2003C | 2004C |
|---|---|---|---|---|---|---|
| Surface structure of Al substrate | | Pitch ($\mu$m) | 50 | 40 | 25 | 10 |
| | | Depth ($\mu$m) | 2.1 | 1.7 | 0.8 | 0.6 |
| | | Angle (degree) | 5.0 | 4.8 | 3.7 | 6.8 |
| Thickness of light receiving layer | | Average difference in layer thickness between center and both ends of first layer ($\mu$m) | 0.2 | 0.2 | 0.2 | 0.2 |
| | | Difference in layer thickness of minute portion in first layer ($\mu$m) | 0.13 | 0.11 | 0.1 | 0.2 |
| | Second layer | Average difference in layer thickness between center and both ends of layer A ($\mu$m) | 0.4 | 0.4 | 0.4 | 0.4 |
| | | Difference in layer thickness of minute portion in layer A ($\mu$m) | 0.13 | 0.12 | 0.11 | 0.2 |
| | | Average difference in layer thickness between center and both ends of layer B ($\mu$m) | 3 | 3 | 3 | 3 |
| | | Difference in layer thickness of minute portion in layer B ($\mu$m) | 0.6 | 0.5 | 0.4 | 0.7 |

TABLE 21C

| Layer constitution | | Starting gas | Gas flow rate (SCCM) | Discharging power (W) | Deposition rate (Å/Sec) | Layer thickness ($\mu$) |
|---|---|---|---|---|---|---|
| First layer | | $H_2$ | 300 | 100 | 10 | 2 |
| | | $GeH_4$ | 50 | | | |
| | | $SiH_4$ | 50 | | | |
| | | $B_2H_6/H_2$ (= 3000 vol ppm) | 150 | | | |
| Second layer | Layer A | $H_2$ | 300 | 100 | 8 | 3 |
| | | $SiH_4$ | 100 | | | |
| | | $B_2H_6/H_2$ (= 3000 vol ppm) | 100 | | | |
| | Layer B | $H_2$ | 300 | 300 | 24 | 20 |
| | | $SiH_4$ | 300 | | | |

TABLE 22C

| | No. | 2201C | 2202C | 2203C | 2204C |
|---|---|---|---|---|---|
| Surface structure of Al | Pitch ($\mu$m) | 50 | 40 | 25 | 10 |
| | Depth ($\mu$m) | 2.1 | 1.7 | 0.8 | 0.6 |
| | Angle (degree) | 5.0 | 4.8 | 3.7 | 6.8 |

TABLE 22C-continued

| | No. | 2201C | 2202C | 2203C | 2204C |
|---|---|---|---|---|---|
| substrate | | | | | |
| Thickness of light receiving layer | Average difference in layer thickness between center and both ends of first layer (μm) | 0.2 | 0.2 | 0.2 | 0.2 |
| | Difference in layer thickness of minute portion in first layer (μm) | 0.12 | 0.11 | 0.1 | 0.14 |
| | Second layer — Average difference in layer thickness between center and both ends of layer A (μm) | 0.4 | 0.4 | 0.4 | 0.4 |
| | Difference in layer thickness of minute portion in layer A (μm) | 0.17 | 0.15 | 0.13 | 0.18 |
| | Average difference in layer thickness between center and both ends of layer B (μm) | 3.2 | 3.2 | 3.2 | 3.2 |
| | Difference in layer thickness of minute portion in layer B (μm) | 0.6 | 0.55 | 0.5 | 0.7 |

TABLE 23C

| Layer constitution | | Starting gas | Gas flow rate (SCCM) | Discharging power (W) | Deposition rate (Å/Sec) | Layer thickness (μ) |
|---|---|---|---|---|---|---|
| First layer | | $H_2$ | 300 | 100 | 10 | 2 |
| | | $GeH_4$ | 50 | | | |
| | | $SiH_4$ | 50 | | | |
| Second layer | Layer A | $H_2$ | 300 | 100 | 8 | 3 |
| | | $GeH_4$ | 100 | | | |
| | | $B_2H_6/H_2$ (= 3000 vol ppm) | 100 | | | |
| | Layer B | $H_2$ | 300 | 300 | 24 | 20 |
| | | $SiH_4$ | 300 | | | |

TABLE 24C

| | | No. | 2401C | 2402C | 2403C | 2404C |
|---|---|---|---|---|---|---|
| Surface structure of Al substrate | | Pitch (μm) | 50 | 40 | 25 | 10 |
| | | Depth (μm) | 2.1 | 1.7 | 0.8 | 0.6 |
| | | Angle (degree) | 5.0 | 4.8 | 3.7 | 6.8 |
| Thickness of light receiving layer | Average difference in layer thickness between center and both ends of first layer (μm) | | 0.2 | 0.2 | 0.2 | 0.2 |
| | Difference in layer thickness of minute portion in first layer (μm) | | 0.12 | 0.11 | 0.1 | 0.14 |
| | Second layer — Average difference in layer thickness between center and both ends of layer A (μm) | | 0.4 | 0.4 | 0.4 | 0.4 |
| | Difference in layer thickness of minute portion in layer A (μm) | | 0.17 | 0.15 | 0.13 | 0.18 |
| | Average difference in layer thickness between center and both ends of layer B (μm) | | 3.2 | 3.2 | 3.2 | 3.2 |
| | Difference in layer thickness of minute portion in layer B (μm) | | 0.6 | 0.55 | 0.5 | 0.7 |

TABLE 25C

| Layer constitution | | Starting gas | Gas flow rate (SCCM) | Discharging power (W) | Deposition rate (Å/Sec) | Layer thickness (μ) |
|---|---|---|---|---|---|---|
| First layer | Layer A | $H_2$ | 300 | 100 | 10 | 2 |
| | | $GeH_4$ | 50 | | | |
| | | $SiH_4$ | 50 | | | |
| | | $B_2H_6/H_2$ (= 3000 vol ppm) | 100 | | | |
| | Layer B | $H_2$ | 300 | 100 | 10 | 2 |
| | | $GeH_4$ | 50 | | | |
| | | $SiH_4$ | 50 | | | |
| Second layer | | $H_2$ | 300 | 300 | 24 | 20 |
| | | $SiH_4$ | 300 | | | |

TABLE 26C

| | | No. | | | |
|---|---|---|---|---|---|
| | | 2601C | 2602C | 2603C | 2604C |
| Surface structure of Al substrate | Pitch ($\mu$m) | 50 | 40 | 25 | 10 |
| | Depth ($\mu$m) | 2.1 | 1.7 | 0.8 | 0.6 |
| | Angle (degree) | 5.0 | 4.8 | 3.7 | 6.8 |
| Thickness of light receiving layer | First layer Average difference in layer thickness between center and both ends of layer A ($\mu$m) | 0.2 | 0.2 | 0.2 | 0.2 |
| | Difference in layer thickness of minute portion in layer A ($\mu$m) | 0.13 | 0.11 | 0.1 | 0.15 |
| | Average difference in layer thickness between center and both ends of layer B ($\mu$m) | 0.2 | 0.2 | 0.2 | 0.2 |
| | Difference in layer thickness of minute portion in layer B ($\mu$m) | 0.13 | 0.12 | 0.11 | 0.14 |
| | Average difference in layer thickness between center and both ends of second layer ($\mu$m) | 3 | 3 | 3 | 3 |
| | Difference in layer thickness of minute portion in second layer ($\mu$m) | 0.5 | 0.44 | 0.4 | 0.6 |

TABLE 27C

| Layer constitution | | Starting gas | Gas flow rate (SCCM) | Discharging power (W) | Deposition rate (Å/Sec) | Layer thickness ($\mu$) |
|---|---|---|---|---|---|---|
| First layer | Layer A | $H_2$ | 300 | 100 | 10 | 2 |
| | | $GeH_4$ | 50 | | | |
| | | $SiH_4$ | 50 | | | |
| | Layer B | $H_2$ | 300 | 100 | 10 | 2 |
| | | $GeH_4$ | 50 | | | |
| | | $SiH_4$ | 50 | | | |
| | | $B_2H_6/H_2$ (= 3000 vol ppm) | 100 | | | |
| Second layer | | $H_2$ | 300 | 300 | 24 | 20 |
| | | $SiH_4$ | 300 | | | |

TABLE 28C

| | | No. | | | |
|---|---|---|---|---|---|
| | | 2801C | 2802C | 2803C | 2804C |
| Surface structure of Al substrate | Pitch ($\mu$m) | 50 | 40 | 25 | 10 |
| | Depth ($\mu$m) | 2.1 | 1.7 | 0.8 | 0.6 |
| | Angle (degree) | 5.0 | 4.8 | 3.7 | 6.8 |
| Thickness of light receiving | First layer Average difference in layer thickness between center and both ends of layer A ($\mu$m) | 0.2 | 0.2 | 0.2 | 0.2 |
| | Difference in layer thickness of minute portion in layer A ($\mu$m) | 0.11 | 0.11 | 0.1 | 0.13 |
| | Average difference in layer thickness between center and both ends of layer B ($\mu$m) | 0.21 | 0.21 | 0.21 | 0.21 |
| | Difference in layer thickness of minute portion in layer B ($\mu$m) | 0.13 | 0.12 | 0.11 | 0.14 |
| | Average difference in layer thickness between center and both ends of second layer ($\mu$m) | 3 | 3 | 3 | 3 |
| | Difference in layer thickness of minute portion in second layer ($\mu$m) | 0.4 | 0.35 | 0.3 | 0.5 |

TABLE 1D

| | Starting gas | Gas flow rate (SCCM) | Discharging power (W) | Deposition rate (Å/sec) | Layer thickness ($\mu$) |
|---|---|---|---|---|---|
| First layer | $H_2$ | 300 | 100 | 9 | 3 |
| | $GeH_4$ | 100 → 0 | | | |
| | $SiH_4$ | 0 → 100 | | | |
| | $B_2H_6/H_2$ | $GeH_4 + SiH_4 =$ | | | |

TABLE 1D-continued

| | Starting gas | Gas flow rate (SCCM) | Discharging power (W) | Deposition rate (Å/sec) | Layer thickness ($\mu$) |
|---|---|---|---|---|---|
| | (= 3000 vol ppm) | 100 | | | |
| Second layer | $H_2$ | 300 | 300 | 24 | 20 |
| | $SiH_4$ | 300 | | | |

TABLE 2D

| | | Sample No. | | | |
|---|---|---|---|---|---|
| | | 201D | 202D | 203D | 204D |
| Surface structure of Al substrate | Pitch ($\mu$m) | 50 | 40 | 25 | 10 |
| | Depth ($\mu$m) | 2.1 | 1.7 | 0.8 | 0.6 |
| | Angle (degree) | 5.0 | 4.8 | 3.7 | 6.8 |
| Thickness of light receiving layer | Average difference in layer thickness between center and both ends of first layer ($\mu$m) | 1 | 1 | 1 | 1 |
| | Difference in layer thickness of minute portion in first layer ($\mu$m) | 0.2 | 0.15 | 0.1 | 0.25 |
| | Average difference in layer thickness between center and both ends of second layer ($\mu$m) | 3 | 3 | 3 | 3 |
| | Difference in layer | 0.51 | 0.44 | 0.41 | 0.61 |

TABLE 2D-continued

| | | Sample No. | | | |
|---|---|---|---|---|---|
| | | 201D | 202D | 203D | 204D |
| | thickness of minute portion in second layer ($\mu$m) | | | | |

TABLE 3D

| | | Sample No. | | | |
|---|---|---|---|---|---|
| | | 301D | 302D | 303D | 304D |
| Surface structure of Al substrate | Pitch ($\mu$m) | 50 | 45 | 20 | 15 |
| | Depth ($\mu$m) | 2.41 | 1.89 | 0.65 | 0.89 |
| | Angle (degree) | 5.0 | 4.8 | 3.7 | 6.8 |
| Thickness of light receiving layer | Average difference in layer thickness between center and both ends of first layer ($\mu$m) | 1 | 1 | 1 | 1 |
| | Difference in layer thickness of minute portion in first layer ($\mu$m) | 0.19 | 0.14 | 0.1 | 0.25 |
| | Average difference in layer thickness between center and both ends of second layer ($\mu$m) | 3.1 | 3.1 | 3.1 | 3.1 |
| | Difference in layer thickness of minute portion in second layer ($\mu$m) | 0.45 | 0.42 | 0.39 | 0.50 |

TABLE 4D

| Layer constitution | | Starting gas | Gas flow rate (SCCM) | Discharging power (W) | Deposition rate (Å/sec) | Layer thickness ($\mu$) |
|---|---|---|---|---|---|---|
| First layer | | $H_2$ | 300 | 100 | 10 | 3 |
| | | $GeH_4$ | 100 → 0 | | | |
| | | $SiH_4$ | 0 → 100 | | | |
| | | $B_2H_6/H_2$ (= 3000 vol ppm) | 100 | | | |
| | | $GeH_4 + SiH_4 =$ | 100 | | | |
| Second Layer | A | $H_2$ | 300 | 100 | 8 | 5 |
| | | $SiH_4$ | 100 | | | |
| | | $B_2H_6/H_2$ (= 3000 vol ppm) | 100 | | | |
| | Layer B | $H_2$ | 300 | 300 | 24 | 20 |
| | | $SiH_4$ | 300 | | | |

TABLE 5D

| | | Sample No. | | | |
|---|---|---|---|---|---|
| | | 501D | 502D | 503D | 504D |
| Surface structure of Al substrate | Pitch ($\mu$m) | 50 | 40 | 25 | 10 |
| | Depth ($\mu$m) | 2.1 | 1.7 | 0.8 | 0.6 |
| | Angle (degree) | 5.0 | 4.8 | 3.7 | 6.8 |
| Thickness of light receiving layer | Average difference in layer thickness between center and both ends of first layer ($\mu$m) | 0.1 | 0.1 | 0.1 | 0.1 |
| | Difference in layer thickness of minute portion in first layer ($\mu$m) | 0.04 | 0.03 | 0.02 | 0.05 |
| | Second layer: Average difference in layer thickness between center and both ends of layer A ($\mu$m) | 1.5 | 1.5 | 1.5 | 1.5 |
| | Difference in layer thickness of minute portion in layer A ($\mu$m) | 0.2 | 0.12 | 0.1 | 0.3 |
| | Average difference in layer thickness between center and both ends of layer B ($\mu$M) | 3 | 3 | 3 | 3 |
| | Difference in layer thickness of minute | 0.55 | 0.4 | 0.3 | 0.6 |

TABLE 5D-continued

|  | Sample No. | | | |
|---|---|---|---|---|
|  | 501D | 502D | 503D | 504D |
| portion on layer B ($\mu$m) | | | | |

TABLE 6D

|  |  | Sample No. | | | |
|---|---|---|---|---|---|
|  |  | 601D | 602D | 603D | 604D |
| Surface structure of Al substrate | Pitch ($\mu$m) | 55 | 45 | 20 | 15 |
|  | Depth ($\mu$m) | 2.41 | 1.89 | 0.65 | 0.89 |
|  | Angle (degree) | 5.0 | 4.8 | 3.7 | 6.8 |
| Thickness of light receiving layer | Average difference in layer thickness between center and both ends of first layer ($\mu$m) | 0.1 | 0.1 | 0.1 | 0.1 |
|  | Difference in layer thickness of minute portion in first layer ($\mu$m) | 0.04 | 0.03 | 0.02 | 0.05 |
|  | Second layer — Average difference in layer thickness between center and both ends of layer A ($\mu$m) | 1.49 | 1.49 | 1.49 | 1.49 |
|  | Difference in layer thickness of minute portion in layer A ($\mu$m) | 0.2 | 0.12 | 0.1 | 0.3 |
|  | Average difference in layer thickness between center and both ends of layer B ($\mu$m) | 2.9 | 2.9 | 2.9 | 2.9 |
|  | Difference in layer thickness of minute portion in layer B ($\mu$m) | 0.51 | 0.44 | 0.41 | 0.61 |

TABLE 7D

| Layer constitution | Starting gas | Gas flow rate (SCCM) | Discharging power (W) | Deposition rate (Å/sec) | Layer thickness ($\mu$) |
|---|---|---|---|---|---|
| First layer | H$_2$ | 300 | 100 | 10 | 3 |
|  | GeH$_4$ | 100 → 0 | | | |
|  | SiH$_4$ | 0 → 100 | | | |
|  | B$_2$H$_6$/H$_2$ (= 3000 vol ppm) | 100 | | | |
|  | | GeH$_4$ + SiH$_4$ = 100 | | | |
| Second layer | H$_2$ | 300 | 300 | 24 | 20 |
|  | SiH$_4$ | 300 | | | |

TABLE 8D

|  |  | Sample No. | | | |
|---|---|---|---|---|---|
|  |  | 801D | 802D | 803D | 804D |
| Surface structure | Pitch ($\mu$m) | 50 | 40 | 25 | 10 |
|  | Depth ($\mu$m) | 2.1 | 1.7 | 0.8 | 0.6 |
| of Al substrate | Angle (degree) | 5.0 | 4.8 | 3.7 | 6.8 |
| Thickness of light receiving layer | Average difference in layer thickness between center and both ends of first layer ($\mu$m) | 1 | 1 | 1 | 1 |
|  | Difference in layer thickness of minute portion in first layer ($\mu$m) | 0.2 | 0.15 | 0.1 | 0.25 |
|  | Average difference in layer thickness between center and both ends of second layer ($\mu$m) | 3 | 3 | 3 | 3 |
|  | Difference in layer thickness of minute portion in second layer ($\mu$m) | 0.55 | 0.4 | 0.3 | 0.6 |

TABLE 9D

| Layer constitution | Starting gas | | Gas flow rate (SCCM) | Discharging power (W) | Deposition rate (Å/sec) | Layer thickness ($\mu$) |
|---|---|---|---|---|---|---|
| First layer | H$_2$ | | 300 | 100 | 10 | 3 |
|  | GeH$_4$ | | 50 → 0 | | | |
|  | SiH$_4$ | | 50 → 100 | | | |
|  | B$_2$H$_6$/H$_2$ (= 3000 vol ppm) | | 50 | | | |
|  |  | | GeH$_4$ + SiH$_4$ = 100 | | | |
| Second layer | Layer A | H$_2$ | 300 | 100 | 8 | 5 |
|  |  | SiH$_4$ | 100 | | | |
|  |  | B$_2$H$_6$/H$_2$ (= 3000 vol ppm) | 100 | | | |
|  | Layer B | H$_2$ | 300 | 300 | 24 | 20 |
|  |  | SiH$_4$ | 300 | | | |

TABLE 10D

| | | Sample No. | | | |
|---|---|---|---|---|---|
| | | 1001D | 1002D | 1003D | 1004D |
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving layer | Average difference in layer thickness between center and both ends of first layer (μm) | 0.12 | 0.12 | 0.12 | 0.12 |
| | Difference in layer thickness of minute portion in first layer (μm) | 0.05 | 0.04 | 0.03 | 0.06 |
| | Second layer — Average difference in layer thickness between center and both ends of layer A (μm) | 1.5 | 1.5 | 1.5 | 1.5 |
| | Difference in layer thickness of minute portion in layer A (μm) | 0.2 | 0.12 | 0.1 | 0.3 |
| | Average difference in layer thickness between center and both ends of layer B (μM) | 3 | 3 | 3 | 3 |
| | Difference in layer thickness of minute portion on layer B (μm) | 0.55 | 0.4 | 0.4 | 0.6 |

TABLE 11D

| Layer constitution | | Starting gas | Gas flow rate (SCCM) | Discharging power (W) | Deposition rate (Å/Sec) | Layer thickness (μ) |
|---|---|---|---|---|---|---|
| First layer | | $H_2$ | 300 | 100 | 10 | 3 |
| | | $GeH_4$ | 50 → 0 | | | |
| | | $SiH_4$ | 50 → 100 | | | |
| | | | $GeH_4 + SiH_4 = 100$ | | | |
| Second layer | Layer A | $H_2$ | 300 | 100 | 8 | 5 |
| | | $SiH_4$ | 100 | | | |
| | | $B_2H_6/H_2$ (= 3000 vol ppm) | 100 | | | |
| | Layer B | $H_2$ | 300 | 300 | 24 | 20 |
| | | $SiH_4$ | 300 | | | |

TABLE 12D

| | | Sample No. | | | |
|---|---|---|---|---|---|
| | | 1201D | 1202D | 1203D | 1204D |
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving layer | Average difference in layer thickness between center and both ends of first layer (μm) | 0.12 | 0.12 | 0.12 | 0.12 |
| | Difference in layer thickness of minute portion in first layer (μm) | 0.05 | 0.04 | 0.03 | 0.06 |
| | Second layer — Average difference in layer thickness between center and both ends of layer A (μm) | 1.5 | 1.5 | 1.5 | 1.5 |
| | Difference in layer thickness of minute portion in layer A (μm) | 0.2 | 0.12 | 0.1 | 0.3 |
| | Average difference in layer thickness between center and both ends of layer B (μM) | 3 | 3 | 3 | 3 |
| | Difference in layer thickness of minute portion on layer B (μm) | 0.55 | 0.4 | 0.39 | 0.6 |

TABLE 13D

| Layer constitution | | Starting gas | Gas flow rate (SCCM) | Discharging power (W) | Deposition rate (Å/Sec) | Layer thickness (μ) |
|---|---|---|---|---|---|---|
| First layer | Layer A | $H_2$ | 300 | 100 | 10 | 1.5 |
| | | $GeH_4$ | 100 → 50 | | | |
| | | $SiH_4$ | 0 → 50 | | | |

TABLE 13D-continued

| Layer constitution | Starting gas | Gas flow rate (SCCM) | Discharging power (W) | Deposition rate (Å/Sec) | Layer thickness (μ) |
|---|---|---|---|---|---|
| | B₂H₆/H₂ (= 3000 vol ppm) | 100 | | | |
| Layer B | H₂ | 300 | 100 | 10 | 1.5 |
| | GeH₄ | 50 → 0 | | | |
| | SiH₄ | 50 → 100 | | | |
| Second layer | H₂ | 300 | 300 | 24 | 20 |
| | SiH₄ | 300 | | | |

TABLE 14D

| | | No. | | | |
|---|---|---|---|---|---|
| | | 1401D | 1402D | 1403D | 1404D |
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving layer | First layer: Average difference in layer thickness between center and both ends of layer A (μm) | 0.2 | 0.2 | 0.2 | 0.2 |
| | Difference in layer thickness of minute portion in layer A (μm) | 0.1 | 0.1 | 0.1 | 0.12 |
| | Average difference in layer thickness between center and both ends of layer B (μm) | 0.22 | 0.22 | 0.22 | 0.22 |
| | Difference in layer thickness of minute portion in layer B (μm) | 0.11 | 0.1 | 0.1 | 0.13 |
| | Average difference in layer thickness between center and both ends of second layer (μm) | 3 | 3 | 3 | 3 |
| | Difference in layer thickness of minute portion in second layer (μm) | 0.55 | 0.4 | 0.39 | 0.6 |

TABLE 2E

| | Starting gas | Gas flow rate (SCCM) | Discharging power (W) | Deposition rate (Å/sec) | Layer thickness (μ) |
|---|---|---|---|---|---|
| First layer | H₂ | 300 | 100 | 5 | 2 |
| | GeH₄ | 100 | | | |
| | SiH₄ | 100 | | | |
| | B₂H₆/H₂ (= 3000 vol ppm) | B₂H₆/(GeH₄ + SiH₄) = 3/100 → 0 | | | |
| Second layer | H₂ | 300 | 300 | 24 | 20 |
| | SiH₄ | 300 | | | |

TABLE 3E

| | Starting gas | Gas flow rate (SCCM) | Discharging power (W) | Deposition rate (Å/sec) | Layer thickness (μ) |
|---|---|---|---|---|---|
| First layer | H₂ | 300 | 100 | 14 | 3 |
| | SiH₄ | 50 | | | |
| | GeH₄ | 100 | | | |
| | B₂H₆/H₂ (= 3000 vol ppm) | B₂H₆/(GeH₄ + SiH₄) = 5/100 → 0 | | | |
| Second layer | H₂ | 300 | 300 | 24 | 20 |
| | SiH₄ | 300 | | | |

TABLE 4E

| | Starting gas | Gas flow rate (SCCM) | Discharging power (W) | Deposition rate (Å/sec) | Layer thickness (μ) |
|---|---|---|---|---|---|
| First layer | H₂ | 300 | 100 | 12 | 5 |
| | SiH₄ | 100 | | | |
| | GeH₄ | 50 | | | |
| | B₂H₆/H₂ (= 3000 vol ppm) | B₂H₆/(GeH₄ + SiH₄) = | | | |

TABLE 4E-continued

| | Starting gas | Gas flow rate (SCCM) | Discharging power (W) | Deposition rate (Å/sec) | Layer thickness (μ) |
|---|---|---|---|---|---|
| Second layer | H₂<br>SiH₄ | 1/100 → 0<br>300<br>300 | 300 | 24 | 20 |

TABLE 5E

| | Starting gas | Gas flow rate (SCCM) | Discharging power (W) | Deposition rate (Å/sec) | Layer thickness (μ) |
|---|---|---|---|---|---|
| First layer | H₂<br>SiH₄<br>GeH₄<br>B₂H₆/H₂<br>(= 3000 vol ppm) | 300<br>135<br>15<br>B₂H₆/<br>(GeH₄ + SiH₄) =<br>1/100 → 0 | 100 | 8 | 7 |
| Second layer | H₂<br>SiH₄ | 300<br>300 | 300 | 24 | 20 |

TABLE 6E

| Layer constitution | Starting gas | Gas flow rate (SCCM) | Discharging power (W) | Deposition rate (Å/sec) | Layer thickness (μ) |
|---|---|---|---|---|---|
| First layer | H₂<br>GeH₄<br>SiH₄<br>B₂H₆/H₂<br>(= 3000 vol ppm) | 300<br>50<br>50<br>150 → 110 | 100 | 10 | 2 |
| Second layer — Layer A | H₂<br>SiH₄<br>B₂H₆/H₂<br>(= 3000 vol ppm) | 300<br>100<br>110 → 0 | 100 | 10 | 3 |
| Layer B | H₂<br>SiH₄ | 300<br>300 | 300 | 24 | 20 |

TABLE 7E

| | | No. 701E | No. 702E | No. 703E | No. 704E |
|---|---|---|---|---|---|
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving layer | Average difference in layer thickness between center and both ends of first layer (μm) | 0.2 | 0.2 | 0.2 | 0.2 |
| | Difference in layer thickness of minute portion in first layer (μm) | 0.12 | 0.11 | 0.1 | 0.14 |
| | Second layer — Average difference in layer thickness between center and both ends of layer A (μm) | 0.4 | 0.4 | 0.4 | 0.4 |
| | Difference in layer thickness of minute portion in layer A (μm) | 0.17 | 0.15 | 0.13 | 0.18 |
| | Average difference in layer thickness between center and both ends of layer B (μm) | 3.2 | 3.2 | 3.2 | 3.2 |
| | Difference in layer thickness of minute portion in layer B (μm) | 0.6 | 0.55 | 0.5 | 0.7 |

TABLE 8E

| Layer constitution | Starting gas | Gas flow rate (SCCM) | Discharging power (W) | Deposition rate (Å/sec) | Layer thickness (μ) |
|---|---|---|---|---|---|
| First layer — Layer A | H₂<br>GeH₄<br>SiH₄<br>B₂H₆/H₂<br>(= 3000 vol ppm) | 300<br>50<br>50<br>100 → 0 | 100 | 10 | 2 |
| Layer | H₂ | 300 | 100 | 10 | 2 |

TABLE 8E-continued

| Layer constitution | | Starting gas | Gas flow rate (SCCM) | Discharging power (W) | Deposition rate (Å/sec) | Layer thickness ($\mu$) |
|---|---|---|---|---|---|---|
| | B | GeH$_4$ | 50 | | | |
| | | SiH$_4$ | 50 | | | |
| Second layer | | H$_2$ | 300 | 300 | 24 | 20 |
| | | SiH$_4$ | 300 | | | |

TABLE 9E

| | | | Sample No. | | | |
|---|---|---|---|---|---|---|
| | | | 901E | 902E | 903E | 904E |
| Surface structure of Al substrate | Pitch ($\mu$m) | | 50 | 40 | 25 | 10 |
| | Depth ($\mu$m) | | 2.1 | 1.7 | 0.8 | 0.6 |
| | Angle (degree) | | 5.0 | 4.8 | 3.7 | 6.8 |
| Thickness of light receiving layer | First layer | Average difference in layer thickness between center and both ends of layer A ($\mu$m) | 0.2 | 0.2 | 0.2 | 0.2 |
| | | Difference in layer thickness of minute portion in layer A ($\mu$m) | 0.13 | 0.11 | 0.1 | 0.15 |
| | | Average difference in layer thickness between center and both ends of layer B ($\mu$m) | 0.2 | 0.2 | 0.2 | 0.2 |
| | | Difference in layer thickness of minute portion in layer B ($\mu$m) | 0.13 | 0.12 | 0.11 | 0.14 |
| | Average difference in layer thickness between center and both ends of second layer ($\mu$m) | | 3 | 3 | 3 | 3 |
| | Difference in layer thickness of minute portion in second layer ($\mu$m) | | 0.5 | 0.4 | 0.4 | 0.6 |

TABLE 10E

| Layer constitution | | Starting gas | Gas flow rate (SCCM) | Discharging power (W) | Deposition rate (Å/Sec) | Layer thickness ($\mu$) |
|---|---|---|---|---|---|---|
| First layer | Layer A | H$_2$ | 300 | 100 | 10 | 2 |
| | | GeH$_4$ | 50 | | | |
| | | SiH$_4$ | 50 | | | |
| | Layer B | H$_2$ | 300 | 100 | 10 | 2 |
| | | GeH$_4$ | 50 | | | |
| | | SiH$_4$ | 50 | | | |
| | | B$_2$H$_6$/H$_2$ (= 3000 vol ppm) | 50 → 0 | | | |
| Second layer | | H$_2$ | 300 | 300 | 24 | 20 |
| | | SiH$_4$ | 300 | | | |

TABLE 11E

| | | | No. | | | |
|---|---|---|---|---|---|---|
| | | | 1101E | 1102E | 1103E | 1104E |
| Surface structure of Al substrate | Pitch ($\mu$m) | | 50 | 40 | 25 | 10 |
| | depth ($\mu$m) | | 2.1 | 1.7 | 0.8 | 0.6 |
| | Angle (degree) | | 5.0 | 4.8 | 3.7 | 6.8 |
| Thickness of light receiving layer | First layer | Average difference in layer thickness between center and both ends of layer A ($\mu$m) | 0.2 | 0.2 | 0.2 | 0.2 |
| | | Difference in layer thickness of minute portion in layer A ($\mu$m) | 0.11 | 0.11 | 0.1 | 0.13 |
| | | Average difference in layer thickness between center and both ends of layer B ($\mu$m) | 0.21 | 0.21 | 0.21 | 0.21 |
| | | Difference in layer thickness of minute portion in layer B ($\mu$m) | 0.13 | 0.12 | 0.11 | 0.14 |
| | Average difference in layer thickness between center and both ends of second layer ($\mu$m) | | 3 | 3 | 3 | 3 |
| | Difference in layer thickness of minute portion in second layer | | 0.4 | 0.35 | 0.3 | 0.5 |

TABLE 11E-continued

|  | No. | | | |
|---|---|---|---|---|
|  | 1101E | 1102E | 1103E | 1104E |
| (μm) |  |  |  |  |

TABLE 12E

| Layer constitution | | Starting gas | Gas flow rate (SCCM) | Discharging power (W) | Deposition rate (Å/Sec) | Layer thickness (μ) |
|---|---|---|---|---|---|---|
| First layer | | H₂ | 300 | 100 | 10 | 2 |
| | | GeH₄ | 50 | | | |
| | | SiH₄ | 50 | | | |
| | | B₂H₆/H₂ (= 3000 vol ppm) | 50 → 25 | | | |
| Second layer | Layer A | H₂ | 300 | 100 | 8 | 3 |
| | | GeH₄ | 50 | | | |
| | | SiH₄ | 50 | | | |
| | | B₂H₆/H₂ (= 3000 vol ppm) | 25 → 0 | | | |
| | Layer B | H₂ | 300 | 300 | 24 | 20 |
| | | SiH₄ | 300 | | | |

TABLE 13E

| | | No. | | | |
|---|---|---|---|---|---|
| | | 1301E | 1302E | 1303E | 1304E |
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving layer | Average difference in layer thickness between center and both ends of first layer (μm) | 0.2 | 0.2 | 0.2 | 0.2 |
| | Difference in layer thickness of minute portion in first layer (μm) | 0.12 | 0.11 | 0.1 | 0.14 |
| | Second layer — Average difference in layer thickness between center and both ends of layer A (μm) | 0.4 | 0.4 | 0.4 | 0.4 |
| | Difference in layer thickness of minute portion in layer A (μm) | 0.17 | 0.15 | 0.13 | 0.18 |
| | Average difference in layer thickness between center and both ends of layer B (μm) | 3.2 | 3.2 | 3.2 | 3.2 |
| | Difference in layer thickness of minute portion in layer B (μm) | 0.6 | 0.55 | 0.5 | 0.7 |

TABLE 1F

| | No. | | | | | | | |
|---|---|---|---|---|---|---|---|---|
| | 101F | 102F | 103F | 104F | 105F | 106F | 107F | 108F |
| Pitch (μm) | 600 | 200 | 100 | 50 | 40 | 25 | 10 | 5.0 |
| Depth (μm) | 1.0 | 10 | 1.8 | 2.1 | 1.7 | 0.8 | 0.2 | 2 |
| Angle (degree) | 0.2 | 5.7 | 2.1 | 5.0 | 4.8 | 3.7 | 2.3 | 38 |

TABLE 2F

| | NO. | | | | | | | |
|---|---|---|---|---|---|---|---|---|
| | 111F | 112F | 113F | 114F | 115F | 116F | 117F | 118F |
| Cylinder NO. | 101 | 102 | 103 | 104 | 105 | 106 | 107 | 108 |
| Difference in layer thickness (μm) | 0.06 | 0.08 | 0.16 | 0.18 | 0.41 | 0.31 | 0.11 | 3.2 |
| Interference fringe | X | X | O | O | ⊙ | ⊙ | Δ | X |

X Practically unusable
Δ Practically satisfactory
O Practically very good
⊙ Practically excellent

TABLE 3F

| | No. | | | | | | | |
|---|---|---|---|---|---|---|---|---|
| | 121F | 122F | 123F | 124F | 125F | 126F | 127F | 128F |
| Cylinder No. | 101 | 102 | 103 | 104 | 105 | 106 | 107 | 108 |
| Difference in layer thickness of first layer (μm) | 0.05 | 0.041 | 0.1 | 0.19 | 0.31 | 0.22 | 0.1 | 2.6 |
| Difference in layer thickness of second layer (μm) | 0.06 | 0.07 | 0.11 | 0.22 | 0.41 | 0.32 | 0.1 | 3.6 |
| Interference | X | X | O | ⊙ | ⊙ | ⊙ | Δ | X |

TABLE 3F-continued

| | No. | | | | | | | |
|---|---|---|---|---|---|---|---|---|
| | 121F | 122F | 123F | 124F | 125F | 126F | 127F | 128F |
| fringe | | | | | | | | |

X Practically unusable
Δ Practically satisfactory
○ Practically very good
◉ Practically excellent

TABLE 4F

| Layer | Starting gas | Flow rate (SCCM) | High frequency power (W) | Layer thickness ($\mu$) |
|---|---|---|---|---|
| First layer | $H_2$ | 300 | 160 | 3 |
| | $SiH_4$ | 100 | | |
| | $GeH_4$ | 50 | | |
| | $NH_3$ | 30 | | |
| Second layer | $H_2$ | 300 | 300 | 20 |
| | $SiH_4$ | 300 | | |

TABLE 5F

| | NO. | | | | | | | |
|---|---|---|---|---|---|---|---|---|
| | 401F | 402F | 403F | 404F | 405F | 406F | 407F | 408F |
| Cylinder NO. | 101 | 102 | 103 | 104 | 105 | 106 | 107 | 108 |
| Difference in layer thickness ($\mu$m) | 0.07 | 0.08 | 0.17 | 0.20 | 0.42 | 0.33 | 0.11 | 2.8 |
| Interference fringe | X | X | ◉ | ◉ | ◉ | ◉ | Δ | X |

X Practically unusable
Δ Practically satisfactory
○ Practically very good
◉ Practically excellent

TABLE 6F

| Layer | Starting gas | Flow rate (SCCM) | High frequency power (W) | Layer thickness ($\mu$) |
|---|---|---|---|---|
| First layer | $H_2$ | 300 | 160 | 5 |
| | $SiH_4$ | 100 | | |
| | $GeH_4$ | 50 | | |
| | $NH_3$ | 15 | | |
| Second layer | $H_2$ | 300 | 200 | 20 |
| | $SiH_4$ | 300 | | |
| | $NH_3$ | 15 | | |

TABLE 7F

| | No. | | | | | | | |
|---|---|---|---|---|---|---|---|---|
| | 501F | 502F | 503F | 504F | 505F | 506F | 507F | 508F |
| Cylinder No. | 101 | 102 | 103 | 104 | 105 | 106 | 107 | 108 |
| Difference in layer thickness of first layer ($\mu$m) | 0.05 | 0.07 | 0.1 | 0.21 | 0.31 | 0.22 | 0.1 | 2.6 |
| Difference in layer thickness of second layer ($\mu$m) | 0.06 | 0.08 | 0.1 | 0.2 | 0.41 | 0.35 | 0.1 | 3.5 |
| Interference fringe | X | X | ○ | ◉ | ◉ | ◉ | Δ | X |

X Practically unusable
Δ Practically satisfactory
○ Practically very good
◉ Practically excellent

TABLE 8F

| Layer | Starting gas | Flow rate (SCCM) | High frequency power (W) | Layer thickness ($\mu$) |
|---|---|---|---|---|
| First layer | $H_2$ | 300 | 170 | 2.8 |
| | $SiH_4$ | 50 | | |
| | $GeH_4$ | 100 | | |
| | $CH_4$ | 15 | | |
| Second layer | $H_2$ | 300 | 200 | 21 |
| | $SiH_4$ | 300 | | |
| | $CH_4$ | 15 | | |

TABLE 9F

| | No. | | | | | | | |
|---|---|---|---|---|---|---|---|---|
| | 901F | 902F | 903F | 904F | 905F | 906F | 907F | 908F |
| Cylinder No. | 101 | 102 | 103 | 104 | 105 | 106 | 107 | 108 |
| Difference in layer thickness of first layer ($\mu$m) | 0.07 | 0.09 | 0.16 | 0.19 | 0.46 | 0.35 | 0.1 | 3.2 |
| Interference fringe | X | X | ○ | ○ | ◉ | ◉ | Δ | X |

X Practically unusable
Δ Practically satisfactory
○ Practically very good
◉ Practically excellent

TABLE 10F

| Layer | Starting gas | Flow rate (SCCM) | High frequency power (W) | Layer thickness ($\mu$) |
|---|---|---|---|---|
| First layer | $H_2$ | 300 | 170 | 5.1 |
| | $SiH_4$ | 100 | | |
| | $GeH_4$ | 60 | | |
| | $CH_4$ | 16 | | |
| Second layer | $H_2$ | 300 | 230 | 22 |
| | $SiH_4$ | 300 | | |

TABLE 11F

| | No. | | | | | | | |
|---|---|---|---|---|---|---|---|---|
| | 1101F | 1102F | 1103F | 1104F | 1105F | 1106F | 1107F | 1108F |
| Cylinder No. | 101 | 102 | 103 | 104 | 105 | 106 | 107 | 108 |
| Difference in layer thickness of first layer ($\mu$m) | 0.05 | 0.06 | 0.1 | 0.22 | 0.31 | 0.21 | 0.1 | 2.7 |
| Difference in layer thickness of second | 0.07 | 0.08 | 0.11 | 0.35 | 0.45 | 0.31 | 0.1 | 3.5 |

TABLE 11F-continued

| | No. | | | | | | | |
|---|---|---|---|---|---|---|---|---|
| | 1101F | 1102F | 1103F | 1104F | 1105F | 1106F | 1107F | 1108F |
| layer (μm) | | | | | | | | |
| Interference fringe | X | X | ○ | ○ | ⊙ | ⊙ | Δ | X |

X Practically unusable
Δ Practically satisfactory
○ Practically very good
⊙ Practically excellent

TABLE 12F

| | No. | | | | | | | |
|---|---|---|---|---|---|---|---|---|
| | 1201F | 1202F | 1203F | 1204F | 1205F | 1206F | 1207F | 1208F |
| Cylinder No. | 101 | 102 | 103 | 104 | 105 | 106 | 107 | 108 |
| Difference in layer thickness (μm) | 0.06 | 0.08 | 0.16 | 0.18 | 0.41 | 0.31 | 0.11 | 3.2 |
| Interference fringe and electrophotographic characteristics | X | X | ○ | ○ | ⊙ | ⊙ | Δ | X |

X Practically unusable
Δ Practically satisfactory
○ Practically very good
⊙ Practically excellent

TABLE 13F

| No. | | | | | | | | |
|---|---|---|---|---|---|---|---|---|
| | 1301F | 1302F | 1303F | 1304F | 1305F | 1306F | 1307F | 1308F |
| Cylinder No. | 101 | 102 | 103 | 104 | 105 | 106 | 107 | 108 |
| Difference in layer thickness of first layer (μm) | 0.05 | 0.041 | 0.1 | 0.19 | 0.31 | 0.22 | 0.1 | 2.6 |
| Difference in layer thickness of second layer (μm) | 0.06 | 0.07 | 0.11 | 0.22 | 0.41 | 0.32 | 0.1 | 2.6 |
| Interference fringe and electrophotographic characteristics | X | X | ○ | ⊙ | ⊙ | ⊙ | Δ | X |

X Practically unusable
Δ Practically satisfactory
○ Practically very good
⊙ Practically excellent

TABLE 14F

| Layer | Starting gas | Flow rate (SCCM) | High frequency power (W) | Layer thickness (μ) |
|---|---|---|---|---|
| First layer | H$_2$ | 300 | 160 | 3 |
| | SiH$_4$ | 50 | | |
| | GeH$_4$ | 100 | | |
| | NH$_3$ | 30~0 | | |
| Second layer | H$_2$ | 300 | 300 | 20 |
| | SiH$_4$ | 300 | | |

TABLE 16F

| Layer | Starting gas | Flow rate (SCCM) | High frequency power (W) | Layer thickness (μ) |
|---|---|---|---|---|
| First layer | H$_2$ | 300 | 160 | 5 |
| | SiH$_4$ | 100 | | |
| | GeH$_4$ | 50 | | |
| | NH$_3$ | 15~0 | | |
| Second layer | H$_2$ | 300 | 200 | 20 |
| | SiH$_4$ | 300 | | |
| | NH$_3$ | | | |

TABLE 15F

| | No. | | | | | | | |
|---|---|---|---|---|---|---|---|---|
| | 1501F | 1502F | 1503F | 1504F | 1505F | 1506F | 1507F | 1508F |
| Cylinder No. | 101 | 102 | 103 | 104 | 105 | 106 | 107 | 108 |
| Difference in layer thickness (μm) | 0.07 | 0.08 | 0.17 | 0.20 | 0.42 | 0.33 | 0.11 | 2.8 |
| Interference fringe and electrophotographic characteristics | X | X | ○ | ⊙ | ⊙ | ⊙ | Δ | X |

X Practically unusable
Δ Practically satisfactory
○ Practically very good
⊙ Practically excellent

TABLE 17F

| | No. | | | | | | | |
|---|---|---|---|---|---|---|---|---|
| | 1701F | 1702F | 1703F | 1704F | 1705F | 1706F | 1707F | 1708F |
| Cylinder No. | 101 | 102 | 103 | 104 | 105 | 106 | 107 | 108 |
| Difference in layer thickness of first layer (μm) | 0.05 | 0.07 | 0.1 | 0.21 | 0.31 | 0.22 | 0.1 | 2.6 |
| Difference in layer thickness of second layer (μm) | 0.06 | 0.08 | 0.1 | 0.2 | 0.41 | 0.35 | 0.1 | 3.5 |
| Interference fringe and electrophotographic characteristics | X | X | ○ | ⊚ | ⊚ | ⊚ | Δ | X |

X Practically unusable
Δ Practically satisfactory
○ Practically very good
⊚ Practically excellent

TABLE 18F

| Layer | Starting gas | Flow rate (SCCM) | High frequency power (W) | Layer thickness (μ) |
|---|---|---|---|---|
| First layer | $H_2$ | 300 | 170 | 2.8 |
| | $SiH_4$ | 100 | | |
| | $GeH_4$ | 50 | | |
| | $CH_4$ | 15~0 | | |
| Second layer | $H_2$ | 300 | 200 | 21 |
| | $SiH_4$ | 300 | | |

TABLE 20F

| Layer | Starting Gas | Flow rate (SCCM) | High frequency power (W) | Layer thickness (μ) |
|---|---|---|---|---|
| First layer | $H_2$ | 300 | 170 | 5.1 |
| | $SiH_4$ | 100 | | |
| | $GeH_4$ | 60 | | |
| | $CH_4$ | 16~0 | | |
| Second layer | $H_2$ | 300 | 230 | 22 |
| | $SiH_4$ | 300 | | |
| | $CH_4$ | | | |

TABLE 19F

| | No. | | | | | | | |
|---|---|---|---|---|---|---|---|---|
| | 1901F | 1902F | 1903F | 1904F | 1905F | 1906F | 1907F | 1908F |
| Cylinder No. | 101 | 102 | 103 | 104 | 105 | 106 | 107 | 108 |
| Difference in layer thickness (μm) | 0.07 | 0.09 | 0.16 | 0.19 | 0.46 | 0.35 | 0.1 | 3.2 |
| Interference fringe and electrophotographic characteristics | X | X | ○ | ⊚ | ⊚ | ⊚ | Δ | X |

X Practically unusable
Δ Practically satisfactory
○ Practically very good
⊚ Practically excellent

TABLE 21F

| | No. | | | | | | | |
|---|---|---|---|---|---|---|---|---|
| | 2101F | 2102F | 2103F | 2104F | 2105F | 2106F | 2107F | 2108F |
| Cylinder No. | 101 | 102 | 103 | 104 | 105 | 106 | 107 | 108 |
| Difference in layer thickness of first layer (μm) | 0.05 | 0.06 | 0.1 | 0.22 | 0.31 | 0.21 | 0.1 | 2.7 |
| Difference in layer thickness of second layer (μm) | 0.07 | 0.08 | 0.11 | 0.35 | 0.45 | 0.31 | 0.1 | 3.5 |
| Interference fringe and electrophotographic characteristics | X | X | ○ | ⊚ | ⊚ | ⊚ | Δ | X |

X Practically unusuable
Δ Practically satisfactory
○ Practically very good
⊚ Practically excellent TABLE 22F
(Sample No. 2201F)

| Layer constitution | Gases employed | Flow rate (SCCM) | Flow rate ratio | Discharging power (W) | Layer formation rate (Å/Sec) | Layer thickness (μ) |
|---|---|---|---|---|---|---|
| First | $SiH_4/He = 0.05$ | $SiH_4 + GeH_4 = 50$ | $NO/(SiH_4 + GeH_4) = 3/10$~0 | 150 | 12 | 1 |

TABLE 22F-continued (Sample No. 2201F)

| Layer constitution | Gases employed | Flow rate (SCCM) | Flow rate ratio | Discharging power (W) | Layer formation rate (Å/Sec) | Layer thickness (μ) |
|---|---|---|---|---|---|---|
| layer | $GeH_4/He = 0.05$ NO | | | | | |
| Second layer | $SiH_4/He = 0.05$ | $SiH_4 = 50$ | | 150 | 12 | 20 |

TABLE 23F (Sample No. 2203F)

| Layer constitution | Gases employed | Flow rate (SCCM) | Flow rate ratio | Discharging power (W) | Layer formation rate (Å/Sec) | Layer thickness (μ) |
|---|---|---|---|---|---|---|
| First layer | $SiH_4/He = 0.05$ $GeH_4/He = 0.05$ NO | $SiH_4 + GeH_4 = 50$ | $NO/(SiH_4 + GeH_4) = 2/10\sim0$ | 150 | 12 | 0.5 |
| Second layer | $SiH_4/He = 0.05$ | $SiH_4 = 50$ | | 150 | 12 | 20 |

TABLE 24F (Sample No. 2203F)

| Layer constitution | Gases employed | Flow rate (SCCM) | Flow rate ratio | Discharging power (W) | Layer formation rate (Å/Sec) | Layer thickness (μ) |
|---|---|---|---|---|---|---|
| First layer | $SiH_4/He = 0.05$ $GeH_4/He = 0.05$ NO | $SiH_4 + GeH_4 = 50$ | $NO/(SiH_4 + GeH_4) = 1/10\sim1/100$ | 160 | 14 | 5 |
| Second layer | $SiH_4/He = 0.05$ | $SiH_4 = 50$ | $NO/SiH_4 = 1/100$ | 160 | 14 | 15 |

TABLE 25F (Sample No. 2204F)

| Layer constitution | Gases employed | Flow rate (SCCM) | Flow rate ratio | Discharging power (W) | Layer formation rate (Å/Sec) | Layer thickness (μ) |
|---|---|---|---|---|---|---|
| First layer | $SiH_4/He = 0.05$ $GeH_4/He = 0.05$ NO | $SiH_4 + GeH_4 = 50$ | $NO/(SiH_4 + GeH_4) = 3/10\sim0$ | 160 | 14 | 1.0 |
| Second layer | $SiH_4/He = 0.05$ | $SiH_4 = 50$ | | 160 | 12 | 15 |

TABLE 26F (Sample No. 2205F)

| Layer constitution | Gases employed | Flow rate (SCCM) | Flow rate ratio | Discharging power (W) | Layer formation rate (Å/Sec) | Layer thickness (μ) |
|---|---|---|---|---|---|---|
| First layer | $SiH_4/He = 0.05$ $GeH_4/He = 0.05$ NO | $SiH_4 + GeH_4 = 50$ | $NO/(SiH_4 + GeH_4) = 3/10\sim0$ | 170 | 15 | 1 |
| Second layer | $SiH_4/He = 0.05$ | $SiH_4 = 50$ | | 170 | 15 | 20 |

TABLE 27F (Sample No. 2206F)

| Layer constitution | Gases employed | Flow rate (SCCM) | Flow rate ratio | Discharging power (W) | Layer formation rate (Å/Sec) | Layer thickness (μ) |
|---|---|---|---|---|---|---|
| First layer | $SiH_4/He = 0.05$ $GeH_4/He = 0.05$ $NH_3$ | $SiH_4 + GeH_4 = 50$ | $NH_3/(SiH_4 + GeH_4) = 1/10\sim1/100$ | 160 | 14 | 5 |
| Second | $SiH_4/He = 0.05$ | $SiH_4 = 50$ | $NH_3/SiH_4 = 1/100$ | 160 | 14 | 15 |

TABLE 27F-continued (Sample No. 2206F)

| Layer constitution | Gases employed | Flow rate (SCCM) | Flow rate ratio | Discharging power (W) | Layer formation rate (Å/Sec) | Layer thickness (μ) |
|---|---|---|---|---|---|---|
| layer | | | | | | |

TABLE 28F (Sample No. 2207F)

| Layer constitution | Gases employed | Flow rate (SCCM) | Flow rate ratio | Discharging power (W) | Layer formation rate (Å/Sec) | Layer thickness (μ) |
|---|---|---|---|---|---|---|
| First layer | $SiH_4/He = 0.05$ $GeH_4/He = 0.05$ $CH_4$ | $SiH_4 + GeH_4 = 50$ | $CH_4/(SiH_4 + GeH_4) = 1/10 \sim 1/100$ | 160 | 14 | 5 |
| Second layer | $SiH_4/He = 0.05$ $CH_4$ | $SiH_4 = 50$ | $CH_4/SiH_4 = 1/100$ | 160 | 14 | 15 |

TABLE 1G

| | Starting gas | Gas flow rate (SCCM) | Discharging power (W) | Deposition rate (Å/sec) | Layer thickness (μ) |
|---|---|---|---|---|---|
| First layer | $H_2$ $GeH_4$ $SiH_4$ $B_2H_6/H_2$ (= 3000 vol ppm) | 300 $100 \to 0$ $0 \to 100$ $GeH_4 + SiH_4 = 100$ $150 \to 0$ | 100 | 9 | 3 |
| Second layer | $H_2$ $SiH_4$ | 300 300 | 300 | 24 | 20 |

TABLE 4G

| | Starting gas | Gas flow rate (SCCM) | Discharging power (W) | Deposition rate (Å/sec) | Layer thickness (μ) |
|---|---|---|---|---|---|
| First layer | $H_2$ $GeH_4$ $SiH_4$ $B_2H_6/H_2$ (= 3000 vol ppm) | 300 $50 \to 0$ $50 \to 100$ $GeH_4 + SiH_4 = 100$ $50 \to 0$ | 100 | 9 | 3 |
| Second layer | $H_2$ $SiH_4$ | 300 300 | 300 | 24 | 20 |

TABLE 2G

| | Sample No. | 201G | 202G | 203G | 204G |
|---|---|---|---|---|---|
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving layer | Average difference in layer thickness between center and both ends (μm) | 3.2 | 3.2 | 3.2 | 3.2 |
| | Difference in layer thickness of minute portion (μm) | 0.51 | 0.44 | 0.41 | 0.61 |

TABLE 5G

| | Sample No. | 501G | 502G | 503G | 504G |
|---|---|---|---|---|---|
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving layer | Average difference in layer thickness between center and both ends (μm) | 3.2 | 3.2 | 3.2 | 3.2 |
| | Difference in layer thickness of minute portion (μm) | 0.42 | 0.40 | 0.38 | 0.48 |

TABLE 3G

| | Sample No. | 301G | 302G | 303G | 304G |
|---|---|---|---|---|---|
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving layer | Average difference in layer thickness between center and both ends (μm) | 3.2 | 3.2 | 3.2 | 3.2 |
| | Difference in layer thickness of minute portion (μm) | 0.45 | 0.42 | 0.39 | 0.50 |

TABLE 6G

| | Sample No. | 601G | 602G | 603G | 604G |
|---|---|---|---|---|---|
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving layer | Average difference in layer thickness between center and both ends (μm) | 3.2 | 3.2 | 3.2 | 3.2 |
| | Difference in layer thickness of minute portion (μm) | 0.40 | 0.38 | 0.36 | 0.45 |

TABLE 7G

| Layer constitution | | Starting gas | Gas flow rate (SCCM) | Discharging power (W) | Deposition rate (Å/sec) | Layer thickness (μ) |
|---|---|---|---|---|---|---|
| First layer | | $H_2$ | 300 | 100 | 10 | 2 |
| | | $GeH_4$ | 50 → 0 | | | |
| | | $SiH_4$ | 50 → 0 | | | |
| Second layer | Layer A | $H_2$ | 300 | 100 | 10 | 3 |
| | | $SiH_4$ | 100 | | | |
| | | $B_2H_6/H_2$ (= 3000 vol ppm) | 100 → 0 | | | |
| | Layer B | $H_2$ | 300 | 300 | 24 | 20 |
| | | $SiH_4$ | 300 | | | |

TABLE 8G

| | | Sample No. | | | |
|---|---|---|---|---|---|
| | | 801G | 802G | 803G | 804G |
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving layer | Average difference in layer thickness between center and both ends of first layer (μm) | 0.2 | 0.2 | 0.2 | 0.2 |
| | Difference in layer thickness of minute portion in first layer (μm) | 0.13 | 0.11 | 0.1 | 0.2 |
| | Second layer: Average difference in layer thickness between center and both ends of layer A (μm) | 0.4 | 0.4 | 0.4 | 0.4 |
| | Difference in layer thickness of minute portion in layer A (μm) | 0.13 | 0.12 | 0.11 | 0.2 |
| | Average difference in layer thickness between center and both ends of layer B (μm) | 3 | 3 | 3 | 3 |
| | Difference in layer thickness of minute portion in layer B (μm) | 0.6 | 0.5 | 0.4 | 0.7 |

TABLE 9G

| Layer constitution | | Starting gas | Gas flow rate (SCCM) | Discharging power (W) | Deposition rate (Å/sec) | Layer thickness (μ) |
|---|---|---|---|---|---|---|
| First layer | | $H_2$ | 300 | 100 | 10 | 2 |
| | | $GeH_4$ | 50 → 0 | | | |
| | | $SiH_4$ | 50 → 100 | | | |
| | | $B_2H_6/H_2$ (= 3000 vol ppm) | 100 → 60 | | | |
| Second layer | Layer A | $H_2$ | 300 | 100 | 10 | 3 |
| | | $SiH_4$ | 100 | | | |
| | | $B_2H_6/H_2$ (= 3000 vol ppm) | 60 → 0 | | | |
| | Layer B | $H_2$ | 300 | 300 | 24 | 20 |
| | | $SiH_4$ | 300 | | | |

TABLE 10G

| | | Sample No. | | | |
|---|---|---|---|---|---|
| | | 1001G | 1002G | 1003G | 1004G |
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving layer | Average difference in layer thickness between center and both ends of first layer (μm) | 0.2 | 0.2 | 0.2 | 0.2 |
| | Difference in layer thickness of minute portion in first layer (μm) | 0.14 | 0.12 | 0.1 | 0.16 |
| | Second layer: Average difference in layer thickness between center and both ends of layer A (μm) | 0.3 | 0.3 | 0.3 | 0.3 |
| | Difference in layer thickness of minute portion in layer A (μm) | 0.2 | 0.14 | 0.13 | 0.21 |

TABLE 10G-continued

| | Sample No. | | | |
|---|---|---|---|---|
| | 1001G | 1002G | 1003G | 1004G |
| Average difference in layer thickness between center and both ends of layer B (μm) | 3 | 3 | 3 | 3 |
| Difference in layer thickness of minute portion in layer B (μm) | 0.57 | 0.4 | 0.3 | 0.6 |

TABLE 11G

| Layer constitution | | Starting gas | Gas flow rate (SCCM) | Discharging power (W) | Deposition rate (Å/Sec) | Layer thickness (μ) |
|---|---|---|---|---|---|---|
| First layer | Layer A | $H_2$ | 300 | 100 | 10 | 2 |
| | | $GeH_4$ | 50 → 25 | | | |
| | | $SiH_4$ | 50 → 75 | | | |
| | | $B_2H_6/H_2$ (= 3000 vol ppm) | 100 → 0 | | | |
| | Layer B | $H_2$ | 300 | 100 | 10 | 2 |
| | | $GeH_4$ | 25 → 0 | | | |
| | | $SiH_4$ | 75 → 100 | | | |
| Second layer | | $H_2$ | 300 | 300 | 24 | 20 |
| | | $SiH_4$ | 300 | | | |

TABLE 12G

| | | | Sample No. | | | |
|---|---|---|---|---|---|---|
| | | | 1201G | 1202G | 1203G | 1204G |
| Surface structure of Al substrate | | Pitch (μm) | 50 | 40 | 25 | 10 |
| | | Depth (μm) | 2.1 | 1.7 | 0.8 | 0.6 |
| | | Angle (degree) | 5.0 | 4.8 | 3.7 | 6.8 |
| Thickness of light receiving layer | First layer | Average difference in layer thickness between center and both ends of layer A (μm) | 0.2 | 0.2 | 0.2 | 0.2 |
| | | Difference in layer thickness of minute portion in layer A (μm) | 0.1 | 0.1 | 0.1 | 0.12 |
| | | Average difference in layer thickness between center and both ends of layer B (μm) | 0.22 | 0.22 | 0.22 | 0.22 |
| | | Difference in layer thickness of minute portion in layer B (μm) | 0.11 | 0.1 | 0.1 | 0.13 |
| | Average difference in layer thickness between center and both ends of second layer (μm) | | 3 | 3 | 3 | 3 |
| | Difference in layer thickness of minute portion in second layer (μm) | | 0.55 | 0.4 | 0.39 | 0.6 |

TABLE 1H

| | Starting gas | Gas flow rate (SCCM) | Discharging power (W) | Deposition rate (Å/sec) | Layer thickness (μ) |
|---|---|---|---|---|---|
| First layer | $H_2$ | 300 | 100 | 9 | 3 |
| | $GeH_4$ | 100 → 0 | | | |
| | $SiH_4$ | 0 → 100 | 100 | 9 | 3 |
| | | $GeH_4 + SiH_4 =$ 100 | | | |
| | NO | 10 | | | |
| Second layer | $H_2$ | 300 | 300 | 24 | 20 |
| | $SiH_4$ | 300 | | | |

TABLE 2H

| | | Sample No. | | | |
|---|---|---|---|---|---|
| | | 201H | 202H | 203H | 204H |
| Surface structure of Al | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |

TABLE 2H-continued

| | | Sample No. | | | |
|---|---|---|---|---|---|
| | | 201H | 202H | 203H | 204H |
| substrate Thickness of light receiving layer | Average difference in layer thickness between center and both ends (μm) | 3.2 | 3.2 | 3.2 | 3.2 |
| | Difference in layer thickness of minute portion (μm) | 0.51 | 0.44 | 0.41 | 0.61 |

TABLE 3H

| | Starting gas | Gas flow rate (SCCM) | Discharging power (W) | Deposition rate (Å/sec) | Layer thickness (μ) |
|---|---|---|---|---|---|
| First layer | $H_2$ | 300 | 100 | 9 | 3 |
| | $GeH_4$ | 100 → 0 | | | |
| | $SiH_4$ | 0 → 100 | | | |

TABLE 3H-continued

| | Starting gas | Gas flow rate (SCCM) | Discharging power (W) | Deposition rate (Å/sec) | Layer thickness (μ) |
|---|---|---|---|---|---|
| | | GeH₄ + SiH₄ = 100 | | | |
| | CH₄ | 10 | | | |
| Second layer | H₂ | 300 | 300 | 24 | 20 |
| | SiH₄ | 300 | | | |

TABLE 4H

| | | Sample No. | | | |
|---|---|---|---|---|---|
| | | 401H | 402H | 403H | 404H |
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving layer | Average difference in layer thickness between center and both ends (μm) | 3.2 | 3.2 | 3.2 | 3.2 |
| | Difference in layer thickness of minute portion (μm) | 0.45 | 0.42 | 0.39 | 0.50 |

TABLE 5H

| | Starting gas | Gas flow rate (SCCM) | Discharging power (W) | Deposition rate (Å/sec) | Layer thickness (μ) |
|---|---|---|---|---|---|
| First layer | H₂ | 300 | 100 | 9 | 3 |
| | GeH₄ | 50 → 0 | | | |
| | SiH₄ | 50 → 100 | | | |
| | | GeH₄ + SiH₄ = 100 | | | |
| | NH₃ | 10 | | | |
| Second layer | H₂ | 300 | 300 | 24 | 20 |
| | SiH₄ | 300 | | | |

TABLE 6H

| | | Sample No. | | | |
|---|---|---|---|---|---|
| | | 601H | 602H | 603H | 604H |
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving layer | Average difference in layer thickness between center and both ends (μm) | 3.2 | 3.2 | 3.2 | 3.2 |
| | Difference in layer thickness of minute portion (μm) | 0.42 | 0.40 | 0.38 | 0.48 |

TABLE 7H

| | Starting gas | Gas flow rate (SCCM) | Discharging power (W) | Deposition rate (Å/sec) | Layer thickness (μ) |
|---|---|---|---|---|---|
| First layer | H₂ | 300 | 100 | 9 | 3 |
| | GeH₄ | 50 → 0 | | | |
| | SiH₄ | 50 → 100 | | | |
| | | GeH₄ + SiH₄ = 100 | | | |
| | NH₃ | 6 | | | |
| Second layer | H₂ | 300 | 300 | 24 | 20 |
| | SiH₄ | 300 | | | |
| | NH₃ | 6 | | | |

TABLE 8H

| | | Sample No. | | | |
|---|---|---|---|---|---|
| | | 801H | 802H | 803H | 804H |
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving layer | Average difference in layer thickness between center and both ends (μm) | 3.2 | 3.2 | 3.2 | 3.2 |
| | Difference in layer thickness of minute portion (μm) | 0.40 | 0.38 | 0.36 | 0.45 |

TABLE 9H

| | Starting gas | Gas flow rate (SCCM) | Discharging power (W) | Deposition rate (Å/sec) | Layer thickness (μ) |
|---|---|---|---|---|---|
| First layer | H₂ | 300 | 100 | 9 | 3 |
| | GeH₄ | 100 → 0 | | | |
| | SiH₄ | 0 → 100 | | | |
| | | GeH₄ + SiH₄ = 100 | | | |
| | NO | 20 → 0 | | | |
| Second layer | H₂ | 300 | 300 | 24 | 20 |
| | SiH₄ | 300 | | | |

TABLE 10H

| | Starting gas | Gas flow rate (SCCM) | Discharging power (W) | Deposition rate (Å/Sec) | Layer thickness (μ) |
|---|---|---|---|---|---|
| First layer | H₂ | 300 | 100 | 9 | 3 |
| | GeH₄ | 100 → 0 | | | |
| | SiH₄ | 0 → 100 | | | |
| | | GeH₄ + SiH₄ = 100 | | | |
| | NH₃ | 20 → 0 | | | |
| Second layer | H₂ | 300 | 300 | 24 | 20 |
| | SiH₄ | 300 | | | |

TABLE 11H

| | Starting gas | Gas flow rate (SCCM) | Discharging power (W) | Deposition rate (Å/Sec) | Layer thickness (μ) |
|---|---|---|---|---|---|
| First layer | H$_2$ | 300 | 100 | 9 | 3 |
| | GeH$_4$ | 100 → 0 | | | |
| | SiH$_4$ | 0 → 100 | | | |
| | | GeH$_4$ + SiH$_4$ = 100 | | | |
| | NO | 10 → * | | | |
| Second layer | H$_2$ | 300 | 300 | 24 | 20 |
| | SiH$_4$ | 300 | | | |
| | NO | * → 0 | | | |

Note: The symbol * represents continuity of change in the gas flow rate. The same note applies to the subsequent other tables.

TABLE 12H

| | Starting gas | Gas flow rate (SCCM) | Discharging power (W) | Deposition rate (Å/Sec) | Layer thickness (μ) |
|---|---|---|---|---|---|
| First layer | H$_2$ | 300 | 100 | 9 | 3 |
| | GeH$_4$ | 100 → 0 | | | |
| | SiH$_4$ | 0 → 100 | | | |
| | | GeH$_4$ + SiH$_4$ = 100 | | | |
| | CH$_4$ | 10 → 0 | | | |
| Second layer | H$_2$ | 300 | 300 | 24 | 20 |
| | SiH$_4$ | 300 | | | |

TABLE 1I

| Layer constitution | Starting gas | Gas flow rate (SCCM) | Discharging power (W) | Deposition rate (Å/sec) | Layer thickness (μ) |
|---|---|---|---|---|---|
| First layer | H$_2$ | 300 | 100 | 10 | 3 |
| | SiH$_4$ | 200 | | | |
| | GeH$_4$ | 100 | | | |
| | B$_2$H$_6$/H$_2$ (= 3000 vol ppm) | 100 | | | |
| | NO | 10 | | | |
| Second layer | H$_2$ | 300 | 300 | 24 | 20 |
| | SiH$_4$ | 300 | | | |

TABLE 2I

| | | No. | | | |
|---|---|---|---|---|---|
| | | 201I | 202I | 203I | 204I |
| Surface structure | Pitch (μm) | 50 | 40 | 25 | 10 |
| | Depth (μm) | 2.1 | 1.7 | 0.8 | 0.6 |

TABLE 2I-continued

| | | No. | | | |
|---|---|---|---|---|---|
| | | 201I | 202I | 203I | 204I |
| of Al substrate | Angle (degree) | 5.0 | 4.8 | 3.7 | 6.8 |
| Thickness of light receiving layer | Average difference in layer thickness between center and both ends of first layer (μm) | 1 | 1 | 1 | 1 |
| | Difference in layer thickness of minute portion in first layer (μm) | 0.2 | 0.15 | 0.1 | 0.25 |
| | Average difference in layer thickness between center and both ends of second layer (μm) | 3 | 3 | 3 | 3 |
| | Difference in layer thickness of minute portion in second layer (μm) | 0.55 | 0.4 | 0.3 | 0.6 |

TABLE 3I

| Layer constitution | | Starting gas | Gas flow rate (SCCM) | Discharging power (W) | Deposition rate (Å/sec) | Layer thickness (μ) |
|---|---|---|---|---|---|---|
| First layer | | H$_2$ | 300 | 100 | 10 | 1 |
| | | SiH$_4$ | 100 | | | |
| | | GeH$_4$ | 100 | | | |
| | | B$_2$H$_6$/H$_2$ (= 3000 vol ppm) | 100 | | | |
| | | NH$_3$ | 11 | | | |
| Second layer | Layer A | H$_2$ | 300 | 100 | 8 | 5 |
| | | SiH$_4$ | 100 | | | |
| | | B$_2$H$_6$/H$_2$ (= 3000 vol ppm) | 100 | | | |
| | Layer B | H$_2$ | 300 | 300 | 24 | 20 |
| | | SiH$_4$ | 300 | | | |

TABLE 4I

| | | No. | | | |
|---|---|---|---|---|---|
| | | 401I | 402I | 403I | 404I |
| Surface structure | Pitch (μm) | 50 | 40 | 25 | 10 |
| | Depth (μm) | 2.1 | 1.7 | 0.8 | 0.6 |

TABLE 4I-continued

| | | No. | | | |
|---|---|---|---|---|---|
| | | 401I | 402I | 403I | 404I |
| of Al substrate | Angle (degree) | 5.0 | 4.8 | 3.7 | 6.8 |
| Thickness of light receiving layer | Average difference in layer thickness between center and both ends of first layer (μm) | 0.1 | 0.1 | 0.1 | 0.1 |
| | Difference in layer thickness of minute portion in first layer (μm) | 0.04 | 0.03 | 0.02 | 0.05 |
| | Second layer — Average difference in layer thickness between center and both ends of layer A (μm) | 1.5 | 1.5 | 1.5 | 1.5 |
| | Difference in layer thickness of minute portion in layer A (μm) | 0.2 | 0.12 | 0.1 | 0.3 |
| | Average difference in layer thickness between center and both ends of layer B (μm) | 3 | 3 | 3 | 3 |
| | Difference in layer thickness of minute portion in layer B (μm) | 0.55 | 0.4 | 0.3 | 0.6 |

TABLE 5I

| Layer constitution | Starting gas | Gas flow rate (SCCM) | Discharging power (W) | Deposition rate (Å/sec) | Layer thickness (μ) |
|---|---|---|---|---|---|
| First layer | $H_2$ | 300 | 100 | 10 | 1 |
| | $SiH_4$ | 100 | | | |
| | $GeH_4$ | 100 | | | |
| | $B_2H_6/H_2$ (= 3000 vol ppm) | 50 | | | |
| | $CH_4$ | 10 | | | |
| Second layer — Layer A | $H_2$ | 300 | 100 | 8 | 5 |
| | $SiH_4$ | 100 | | | |
| | $B_2H_6/H_2$ (= 3000 vol ppm) | 100 | | | |
| Layer B | $H_2$ | 300 | 300 | 24 | 20 |
| | $SiH_4$ | 300 | | | |

TABLE 6I

| | | No. | | | |
|---|---|---|---|---|---|
| | | 601I | 602I | 603I | 604I |
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving layer | Average difference in layer thickness between center and both ends of first layer (μm) | 0.12 | 0.12 | 0.12 | 0.12 |
| | Difference in layer thickness of minute portion in first layer (μm) | 0.05 | 0.04 | 0.03 | 0.06 |
| | Second layer — Average difference in layer thickness between center and both ends of layer A (μm) | 1.5 | 1.5 | 1.5 | 1.5 |
| | Difference in layer thickness of minute portion in layer A (μm) | 0.2 | 0.12 | 0.1 | 0.3 |
| | Average difference in layer thickness between center and both ends of layer B (μm) | 3 | 3 | 3 | 3 |
| | Difference in layer thickness of minute portion in layer B (μm) | 0.55 | 0.4 | 0.4 | 0.6 |

TABLE 7I

| Layer constitution | Starting gas | Gas flow rate (SCCM) | Discharging power (W) | Deposition rate (Å/sec) | Layer thickness (μ) |
|---|---|---|---|---|---|
| First layer | $H_2$ | 300 | 100 | 10 | 1 |
| | $SiH_4$ | 100 | | | |
| | $GeH_4$ | 100 | | | |
| | $B_2H_6/H_2$ | 150 | | | |

TABLE 7I-continued

| Layer constitution | | Starting gas | Gas flow rate (SCCM) | Discharging power (W) | Deposition rate (Å/sec) | Layer thickness ($\mu$) |
|---|---|---|---|---|---|---|
| | | (= 3000 vol ppm) | | | | |
| | | NO | 10 | | | |
| Second layer | Layer A | $H_2$ | 300 | 100 | 8 | 5 |
| | | $SiH_4$ | 100 | | | |
| | | $B_2H_6/H_2$ | 100 | | | |
| | | (= 3000 vol ppm) | | | | |
| | | NO | 10 | | | |
| | Layer B | $H_2$ | 300 | 300 | 24 | 20 |
| | | $SiH_4$ | 300 | | | |
| | | NO | 10 | | | |

TABLE 8I

| | | No. | | | |
|---|---|---|---|---|---|
| | | 801I | 802I | 803I | 804I |
| Surface structure of Al substrate | Pitch ($\mu$m) | 50 | 40 | 25 | 10 |
| | Depth ($\mu$m) | 2.1 | 1.7 | 0.8 | 0.6 |
| | Angle (degree) | 5.0 | 4.8 | 3.7 | 6.8 |
| Thickness of light receiving layer | Average difference in layer thickness between center and both ends of first layer ($\mu$m) | 0.1 | 0.1 | 0.1 | 0.1 |
| | Difference in layer thickness of minute portion in first layer ($\mu$m) | 0.05 | 0.04 | 0.03 | 0.06 |
| | Second layer — Average difference in layer thickness between center and both ends of layer A ($\mu$m) | 1.6 | 1.6 | 1.6 | 1.6 |
| | Difference in layer thickness of minute portion in layer A ($\mu$m) | 0.2 | 0.13 | 0.11 | 0.3 |
| | Average difference in layer thickness between center and both ends of layer B ($\mu$m) | 3.1 | 3.1 | 3.1 | 3.1 |
| | Difference in layer thickness of minute portion in layer B ($\mu$m) | 0.55 | 0.4 | 0.4 | 0.6 |

TABLE 9I

| Layer constitution | | Starting gas | Gas flow rate (SCCM) | Discharging power (W) | Deposition rate (Å/sec) | Layer thickness ($\mu$) |
|---|---|---|---|---|---|---|
| First layer | | $H_2$ | 300 | 100 | 10 | 1 |
| | | $SiH_4$ | 100 | | | |
| | | $GeH_4$ | 100 | | | |
| | | $NH_3$ | 12 | | | |
| Second layer | Layer A | $H_2$ | 300 | 100 | 8 | 5 |
| | | $SiH_4$ | 100 | | | |
| | | $B_2H_6/H_2$ | 100 | | | |
| | | (= 3000 vol ppm) | | | | |
| | | $NH_3$ | 12 | | | |
| | Layer B | $H_2$ | 300 | 300 | 24 | 20 |
| | | $SiH_4$ | 300 | | | |
| | | $NH_3$ | 12 | | | |

TABLE 10I

| | | No. | | | |
|---|---|---|---|---|---|
| | | 1001I | 1002I | 1003I | 1004I |
| Surface structure of Al substrate | Pitch ($\mu$m) | 50 | 40 | 25 | 10 |
| | Depth ($\mu$m) | 2.1 | 1.7 | 0.8 | 0.6 |
| | Angle (degree) | 5.0 | 4.8 | 3.7 | 6.8 |
| Thickness of light receiving layer | Average difference in layer thickness between center and both ends of first layer ($\mu$m) | 0.12 | 0.12 | 0.12 | 0.12 |
| | Difference in layer thickness of minute portion in first layer ($\mu$m) | 0.05 | 0.04 | 0.03 | 0.06 |
| | Second layer — Average difference in layer thickness between center and both ends of layer A ($\mu$m) | 1.5 | 1.5 | 1.5 | 1.5 |
| | Difference in layer | 0.2 | 0.12 | 0.1 | 0.3 |

TABLE 10I-continued

| | No. | | | |
|---|---|---|---|---|
| | 1001I | 1002I | 1003I | 1004I |
| thickness of minute portion in layer A (μm) Average difference in layer thickness between center and both ends of layer B (μm) | 3 | 3 | 3 | 3 |
| Difference in layer thickness of minute portion in layer B (μm) | 0.55 | 0.4 | 0.39 | 0.6 |

TABLE 11I

| Layer constitution | | Starting gas | Gas flow rate (SCCM) | Discharging power (W) | Deposition rate (Å/Sec) | Layer thickness (μ) |
|---|---|---|---|---|---|---|
| First layer | Layer A | $H_2$ | 300 | 100 | 10 | 2 |
| | | $SiH_4$ | 100 | | | |
| | | $GeH_4$ | 100 | | | |
| | | $B_2H_6/H_2$ (= 3000 vol ppm) | 100 | | | |
| | | $CH_4$ | 8 | | | |
| | Layer B | $H_2$ | 300 | 100 | 10 | 2 |
| | | $SiH_4$ | 100 | | | |
| | | $GeH_4$ | 100 | | | |
| | | $CH_4$ | 8 | | | |
| Second layer | | $H_2$ | 300 | 300 | 24 | 20 |
| | | $SiH_4$ | 300 | | | |
| | | $CH_4$ | 8 | | | |

TABLE 12I

| | | | No. | | | |
|---|---|---|---|---|---|---|
| | | | 1201I | 1202I | 1203I | 1204I |
| Surface structure of Al substrate | Pitch (μm) | | 50 | 40 | 25 | 10 |
| | Depth (μm) | | 2.1 | 1.7 | 0.8 | 0.6 |
| | Angle (degree) | | 5.0 | 4.8 | 3.7 | 6.8 |
| Thickness of light receiving layer | First layer | Average difference in layer thickness between center and both ends of layer A (μm) | 0.2 | 0.2 | 0.2 | 0.2 |
| | | Difference in layer thickness of minute portion in layer A (μm) | 0.1 | 0.1 | 0.1 | 0.12 |
| | | Average difference in layer thickness between center and both ends of layer B (μm) | 0.22 | 0.22 | 0.22 | 0.22 |
| | | Difference in layer thickness of minute portion in layer B (μm) | 0.11 | 0.1 | 0.1 | 0.13 |
| | Average difference in layer thickness between center and both ends of second layer (μm) | | 3 | 3 | 3 | 3 |
| | Difference in layer thickness of minute portion in second layer (μm) | | 0.55 | 0.4 | 0.39 | 0.6 |

TABLE 13I

| Layer constitution | | Starting gas | Gas flow rate (SCCM) | Discharging power (W) | Deposition rate (Å/Sec) | Layer thickness (μ) |
|---|---|---|---|---|---|---|
| First layer | Layer A | $H_2$ | 300 | 100 | 10 | 2 |
| | | $SiH_4$ | 100 | | | |
| | | $GeH_4$ | 100 | | | |
| | | $CH_4$ | 10~* | | | |
| | Layer B | $H_2$ | 300 | 100 | 10 | 2 |
| | | $SiH_4$ | 100 | | | |
| | | $GeH_4$ | 100 | | | |
| | | $B_2H_6/H_2$ (= 3000 vol ppm) | 100 | | | |
| | | $CH_4$ | *~0 | | | |
| Second layer | | $H_2$ | 300 | 300 | 24 | 20 |
| | | $SiH_4$ | 300 | | | |

TABLE 14I

| | | No. | | | |
|---|---|---|---|---|---|
| | | 1401I | 1402I | 1403I | 1404I |
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving layer | First layer — Average difference in layer thickness between center and both ends of layer A (μm) | 0.2 | 0.2 | 0.2 | 0.2 |
| | Difference in layer thickness of minute portion in layer A (μm) | 0.1 | 0.1 | 0.1 | 0.12 |
| | Average difference in layer thickness between center and both ends of layer B (μm) | 0.22 | 0.22 | 0.22 | 0.22 |
| | Difference in layer thickness of minute portion in layer B (μm) | 0.11 | 0.1 | 0.1 | 0.13 |
| | Average difference on layer thickness between center and both ends of second layer (μm) | 3 | 3 | 3 | 3 |
| | Difference in layer thickness of minute portion in second layer (μm) | 0.55 | 0.4 | 0.39 | 0.6 |

TABLE 15I

| Layer constitution | Starting gas | Gas flow rate (SCCM) | Discharging power (W) | Deposition rate (Å/Sec) | Layer thickness (μ) |
|---|---|---|---|---|---|
| First layer | $H_2$ | 300 | 100 | 10 | 5 |
| | $GeH_4$ | 50 | | | |
| | $SiH_4$ | 50 | | | |
| | $B_6H_6/H_2$ (= 3000 vol ppm) | 100 | | | |
| | NO | 10~0 | | | |
| Second layer | $H_2$ | 300 | 300 | 24 | 20 |
| | $SiH_4$ | 300 | | | |

TABLE 16I

| | | No. | | | |
|---|---|---|---|---|---|
| | | 1601I | 1602I | 1603I | 1604I |
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving layer | Average difference in layer thickness between center and both ends of first layer (μm) | 1.5 | 1.5 | 1.5 | 1.5 |
| | Difference in layer thickness of minute portion in first layer (μm) | 0.2 | 0.12 | 0.1 | 0.3 |
| | Average difference in layer thickness between center and both ends of second layer (μm) | 3 | 3 | 3 | 3 |
| | Difference in layer thickness of minute portion in second layer (μm) | 0.55 | 0.4 | 0.3 | 0.6 |

TABLE 17I

| Layer constitution | | Starting gas | Gas flow rate (SCCM) | Discharging power (W) | Deposition rate (Å/Sec) | Layer thickness (μ) |
|---|---|---|---|---|---|---|
| First layer | | $H_2$ | 300 | 100 | 10 | 2 |
| | | $GeH_4$ | 50 | | | |
| | | $SiH_4$ | 50 | | | |
| | | $B_2H_6/H_2$ (= 3000 vol ppm) | 100 | | | |
| | | $NH_3$ | 10~0 | | | |
| Second layer | Layer A | $H_2$ | 300 | 100 | 8 | 3 |
| | | $SiH_4$ | 100 | | | |

TABLE 17I-continued

| Layer constitution | | Starting gas | Gas flow rate (SCCM) | Discharging power (W) | Deposition rate (Å/Sec) | Layer thickness (μ) |
|---|---|---|---|---|---|---|
| | | B$_2$H$_6$/H$_2$ (= 3000 vol ppm) | 100 | | | |
| | Layer B | H$_2$ | 300 | 300 | 24 | 20 |
| | | SiH$_4$ | 300 | | | |

TABLE 18I

| | | No. 1801I | No. 1802I | No. 1803I | No. 1804I |
|---|---|---|---|---|---|
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving layer | Average difference in layer thickness between center and both ends of first layer (μm) | 0.2 | 0.2 | 0.2 | 0.2 |
| | Difference in layer thickness of minute portion in first layer (μm) | 0.14 | 0.12 | 0.1 | 0.16 |
| | Second layer — Average difference in layer thickness between center and both ends of layer A (μm) | 0.3 | 0.3 | 0.3 | 0.3 |
| | Difference in layer thickness of minute portion in layer A (μm) | 0.2 | 0.14 | 0.13 | 0.21 |
| | Average difference in layer thickness between center and both ends of layer B (μm) | 3 | 3 | 3 | 3 |
| | Difference in layer thickness of minute portion in layer B (μm) | 0.57 | 0.4 | 0.3 | 0.6 |

TABLE 19I

| Layer constitution | | Starting gas | Gas flow rate (SCCM) | Discharging power (W) | Deposition rate (Å/Sec) | Layer thickness (μ) |
|---|---|---|---|---|---|---|
| First layer | | H$_2$ | 300 | 100 | 10 | 2 |
| | | GeH$_4$ | 50 | | | |
| | | SiH$_4$ | 50 | | | |
| | | B$_2$H$_6$/H$_2$ (= 3000 vol ppm) | 50 | | | |
| | | CH$_4$ | 10~* | | | |
| Second layer | Layer A | H$_2$ | 300 | 100 | 8 | 3 |
| | | SiH$_4$ | 100 | | | |
| | | B$_2$H$_6$/H$_2$ (= 3000 vol ppm) | 100 | | | |
| | | CH$_4$ | *~** | | | |
| | Layer B | H$_2$ | 300 | 300 | 24 | 20 |
| | | SiH$_4$ | 300 | | | |
| | | CH$_4$ | **~0 | | | |

Note: The symbols * and ** represent continuity of change in the gas flow rate respectively. The same note applies to the subsequent other tables.

TABLE 20I

| | | No. 2001I | No. 2002I | No. 2003I | No. 2004I |
|---|---|---|---|---|---|
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving layer | Average difference in layer thickness between center and both ends of first layer (μm) | 0.2 | 0.2 | 0.2 | 0.2 |
| | Difference in layer thickness of minute portion in first layer (μm) | 0.13 | 0.11 | 0.1 | 0.2 |
| | Second layer — Average difference in layer thickness between center and both ends of layer A (μm) | 0.4 | 0.4 | 0.4 | 0.4 |
| | Difference in layer thickness of minute portion in layer A (μm) | 0.13 | 0.12 | 0.11 | 0.2 |

TABLE 20I-continued

| | | No. | | | |
|---|---|---|---|---|---|
| | | 2001I | 2002I | 2003I | 2004I |
| | Average difference in layer thickness between center and both ends of layer B ($\mu$m) | 3 | 3 | 3 | 3 |
| | Difference in layer thickness of minute portion in layer B ($\mu$m) | 0.6 | 0.5 | 0.4 | 0.7 |

TABLE 21I

| Layer constitution | | Starting gas | Gas flow rate (SCCM) | Discharging power (W) | Deposition rate (Å/Sec) | Layer thickness ($\mu$) |
|---|---|---|---|---|---|---|
| First layer | | $H_2$ | 300 | 100 | 10 | 2 |
| | | $GeH_4$ | 50 | | | |
| | | $SiH_4$ | 50 | | | |
| | | $B_2H_6/H_2$ (= 3000 vol ppm) | 150 | | | |
| | | NO | 10~* | | | |
| Second layer | Layer A | $H_2$ | 300 | 100 | 8 | 3 |
| | | $SiH_4$ | 100 | | | |
| | | $B_2H_6/H_2$ (= 3000 vol ppm) | 100 | | | |
| | | NO | *~** | | | |
| | Layer B | $H_2$ | 300 | 300 | 24 | 20 |
| | | $SiH_4$ | 300 | | | |
| | | NO | **~0 | | | |

TABLE 22I

| | | No. | | | |
|---|---|---|---|---|---|
| | | 2201I | 2202I | 2203I | 2204I |
| Surface structure of Al substrate | Pitch ($\mu$m) | 50 | 40 | 25 | 10 |
| | Depth ($\mu$m) | 2.1 | 1.7 | 0.8 | 0.6 |
| | Angle (degree) | 5.0 | 4.8 | 3.7 | 6.8 |
| Thickness of light receiving layer | Average difference in layer thickness between center and both ends of first layer ($\mu$m) | 0.2 | 0.2 | 0.2 | 0.2 |
| | Difference in layer thickness of minute portion in first layer ($\mu$m) | 0.12 | 0.11 | 0.1 | 0.14 |
| | Second layer — Average difference in layer thickness between center and both ends of layer A ($\mu$m) | 0.4 | 0.4 | 0.4 | 0.4 |
| | Difference in layer thickness of minute portion in layer A ($\mu$m) | 0.17 | 0.15 | 0.13 | 0.18 |
| | Average difference in layer thickness between center and both ends of layer B ($\mu$m) | 3.2 | 3.2 | 3.2 | 3.2 |
| | Difference in layer thickness of minute portion in layer B ($\mu$m) | 0.6 | 0.55 | 0.5 | 0.7 |

TABLE 23I

| Layer constitution | | Starting gas | Gas flow rate (SCCM) | Discharging power (W) | Deposition rate (Å/Sec) | Layer thickness ($\mu$) |
|---|---|---|---|---|---|---|
| First layer | | $H_2$ | 300 | 100 | 10 | 2 |
| | | $GeH_4$ | 50 | | | |
| | | $SiH_4$ | 50 | | | |
| | | $NH_3$ | 10~* | | | |
| Second layer | Layer A | $H_2$ | 300 | 100 | 8 | 3 |
| | | $SiH_4$ | 100 | | | |
| | | $B_2H_6/H_2$ (= 3000 vol ppm) | 100 | | | |
| | | $NH_3$ | *~** | | | |
| | Layer B | $H_2$ | 300 | 300 | 24 | 20 |
| | | $SiH_4$ | 300 | | | |
| | | $NH_3$ | **~0 | | | |

TABLE 24I

| | | No. | | | |
|---|---|---|---|---|---|
| | | 2401I | 2402I | 2403I | 2404I |
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving layer | Average difference in layer thickness between center and both ends of first layer (μm) | 0.2 | 0.2 | 0.2 | 0.2 |
| | Difference in layer thickness of minute portion in first layer (μm) | 0.12 | 0.11 | 0.1 | 0.14 |
| | Second layer — Average difference in layer thickness between center and both ends of layer A (μm) | 0.4 | 0.4 | 0.4 | 0.4 |
| | Difference in layer thickness of minute portion in layer A (μm) | 0.17 | 0.15 | 0.13 | 0.18 |
| | Average difference in layer thickness between center and both ends of layer B (μm) | 3.2 | 3.2 | 3.2 | 3.2 |
| | Difference in layer thickness of minute portion in layer B (μm) | 0.6 | 0.55 | 0.5 | 0.7 |

TABLE 25I

| Layer constitution | | Starting gas | Gas flow rate (SCCM) | Discharging power (W) | Deposition rate (Å/Sec) | Layer thickness (μ) |
|---|---|---|---|---|---|---|
| First layer | Layer A | $H_2$ | 300 | 100 | 10 | 2 |
| | | $GeH_4$ | 50 | | | |
| | | $SiH_4$ | 50 | | | |
| | | $B_2H_6/H_2$ (= 3000 vol ppm) | 100 | | | |
| | | NO | 8 | | | |
| | Layer B | $H_2$ | 300 | 100 | 10 | 2 |
| | | $GeH_4$ | 50 | | | |
| | | $SiH_4$ | 50 | | | |
| Second layer | | $H_2$ | 300 | 300 | 24 | 20 |
| | | $SiH_4$ | 300 | | | |

TABLE 26I

| | | No. | | | |
|---|---|---|---|---|---|
| | | 2601I | 2602I | 2603I | 2604I |
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving layer | First layer — Average difference in layer thickness between center and both ends of layer A (μm) | 0.2 | 0.2 | 0.2 | 0.2 |
| | Difference in layer thickness of minute portion in layer A (μm) | 0.13 | 0.11 | 0.1 | 0.15 |
| | Average difference in layer thickness between center and both ends of layer B (μm) | 0.2 | 0.2 | 0.2 | 0.2 |
| | Difference in layer thickness of minute portion in layer B (μm) | 0.13 | 0.12 | 0.11 | 0.14 |
| | Average difference in layer thickness between center and both ends of second layer (μm) | 3 | 3 | 3 | 3 |
| | Difference in layer thickness of minute portion in second layer (μm) | 0.5 | 0.44 | 0.4 | 0.6 |

TABLE 27I

| Layer constitution | | Starting gas | Gas flow rate (SCCM) | Discharging power (W) | Deposition rate (Å/Sec) | Layer thickness (μ) |
|---|---|---|---|---|---|---|
| First layer | Layer A | $H_2$ | 300 | 100 | 10 | 2 |
| | | $GeH_4$ | 50 | | | |
| | | $SiH_4$ | 50 | | | |

TABLE 27I-continued

| Layer constitution | Starting gas | Gas flow rate (SCCM) | Discharging power (W) | Deposition rate (Å/Sec) | Layer thickness (μ) |
|---|---|---|---|---|---|
| Layer B | NH₃ | 11 | | | |
| | H₂ | 300 | 100 | 10 | 2 |
| | GeH₄ | 50 | | | |
| | SiH₄ | 50 | | | |
| | B₂H₆/H₂ (= 3000 vol ppm) | 100 | | | |
| Second layer | H₂ | 300 | 300 | 24 | 20 |
| | SiH₄ | 300 | | | |

TABLE 28I

| | | No. | | | |
|---|---|---|---|---|---|
| | | 2801I | 2802I | 2803I | 2804I |
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving layer | First layer Average difference in layer thickness between center and both ends of layer A (μm) | 0.2 | 0.2 | 0.2 | 0.2 |
| | Difference in layer thickness of minute portion in layer A (μm) | 0.11 | 0.11 | 0.1 | 0.13 |
| | Average difference in layer thickness between center and both ends of layer B (μm) | 0.21 | 0.21 | 0.21 | 0.21 |
| | Difference in layer thickness of minute portion in layer B (μm) | 0.13 | 0.12 | 0.11 | 0.14 |
| | Average difference in layer thickness between center and both ends of second layer (μm) | 3 | 3 | 3 | 3 |
| | Difference in layer thickness of minute portion in second layer (μm) | 0.4 | 0.35 | 0.3 | 0.5 |

TABLE 1J

| | Starting gas | Gas flow rate (SCCM) | Discharging power (W) | Deposition rate (Å/sec) | Layer thickness (μ) |
|---|---|---|---|---|---|
| First layer | H₂ | 300 | 100 | 9 | 3 |
| | GeH₄ | 100 → 0 | | | |
| | SiH₄ | 0 → 100 | | | |
| | B₂H₆/H₂ (= 3000 vol ppm) | GeH₄ + SiH₄ = 100 | | | |
| | NO | 12 | | | |
| Second layer | H₂ | 300 | 300 | 24 | 20 |
| | SiH₄ | 300 | | | |

TABLE 2J

| | | Sample No. | | | |
|---|---|---|---|---|---|
| | | 201J | 202J | 203J | 204J |
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving layer | Average difference in layer thickness between center and both ends of first layer (μm) | 1 | 1 | 1 | 1 |
| | Difference in layer thickness of minute portion in first layer (μm) | 0.2 | 0.15 | 0.1 | 0.25 |
| | Average difference in layer thickness between center and both ends of second layer (μm) | 3 | 3 | 3 | 3 |
| | Difference in layer thickness of minute portion in second layer (μm) | 0.51 | 0.44 | 0.41 | 0.61 |

TABLE 3J

| | | Sample No. | | | |
|---|---|---|---|---|---|
| | | 301J | 302J | 303J | 304J |
| Surface structure of Al substrate | Pitch (μm) | 55 | 45 | 20 | 15 |
| | Depth (μm) | 2.41 | 1.89 | 0.65 | 0.89 |
| | Angle (degree) | 5.0 | 4.8 | 3.7 | 6.8 |
| Thickness of light receiving layer | Average difference in layer thickness between center and both ends of first layer (μm) | 1 | 1 | 1 | 1 |
| | Difference in layer thickness of minute portion in first layer (μm) | 0.19 | 0.14 | 0.1 | 0.25 |

TABLE 3J-continued

| | Sample No. | | | |
|---|---|---|---|---|
| | 301J | 302J | 303J | 304J |
| Average difference in layer thickness between center and both ends of second layer ($\mu$m) | 3.1 | 3.1 | 3.1 | 3.1 |
| Difference in layer thickness of minute portion in second layer ($\mu$m) | 0.45 | 0.42 | 0.39 | 0.50 |

TABLE 4J

| Layer constitution | | Starting gas | Gas flow rate (SCCM) | Discharging power (W) | Deposition rate (Å/sec) | Layer thickness ($\mu$) |
|---|---|---|---|---|---|---|
| First layer | | $H_2$ | 300 | 100 | 10 | 3 |
| | | $GeH_4$ | 50 → 0 | | | |
| | | $SiH_4$ | 50 → 100 | | | |
| | | $B_2H_6/H_2$ (= 3000 vol ppm) | 100 $GeH_4 + SiH_4 = 100$ | | | |
| | | $NH_3$ | 8 | | | |
| Second layer | Layer A | $H_2$ | 300 | | 8 | 5 |
| | | $SiH_4$ | 100 | | | |
| | | $B_2H_6/H_2$ (= 3000 vol ppm) | 100 | | | |
| | | $NH_3$ | 8 | | | |
| | Layer B | $H_2$ | 300 | 300 | 24 | 20 |
| | | $SiH_4$ | 300 | | | |
| | | $NH_3$ | 8 | | | |

TABLE 5J

| | | Sample No. | | | |
|---|---|---|---|---|---|
| | | 601J | 602J | 603J | 604J |
| Surface structure of Al substrate | Pitch ($\mu$m) | 50 | 40 | 25 | 10 |
| | Depth ($\mu$m) | 2.1 | 1.7 | 0.8 | 0.6 |
| | Angle (degree) | 5.0 | 4.8 | 3.7 | 6.8 |
| Thickness of light receiving layer | Average difference in layer thickness between center and both ends of first layer ($\mu$m) | 0.1 | 0.1 | 0.1 | 0.1 |
| | Difference in layer thickness of minute portion in first layer ($\mu$m) | 0.04 | 0.03 | 0.02 | 0.05 |
| | Second layer Average difference in layer thickness between center and both ends of layer A ($\mu$m) | 1.5 | 1.5 | 1.5 | 1.5 |
| | Difference in layer thickness of minute portion in layer A ($\mu$m) | 0.2 | 0.12 | 0.1 | 0.3 |
| | Average difference in layer thickness between center and both ends of layer B ($\mu$m) | 3 | 3 | 3 | 3 |
| | Difference in layer thickness of minute portion in layer B ($\mu$m) | 0.55 | 0.4 | 0.3 | 0.6 |

TABLE 6J

| | | Sample No. | | | |
|---|---|---|---|---|---|
| | | 701J | 702J | 703J | 704J |
| Surface structure of Al substrate | Pitch ($\mu$m) | 55 | 45 | 20 | 15 |
| | Depth ($\mu$m) | 2.41 | 1.89 | 0.65 | 0.89 |
| | Angle (degree) | 5.0 | 4.8 | 3.7 | 6.8 |
| Thickness of light receiving layer | Average difference in layer thickness between center and both ends of first layer ($\mu$m) | 0.1 | 0.1 | 0.1 | 0.1 |
| | Difference in layer thickness of minute portion in first layer ($\mu$m) | 0.04 | 0.03 | 0.02 | 0.05 |
| | Second layer Average difference in layer thickness between center and both ends of layer A ($\mu$m) | 1.49 | 1.49 | 1.49 | 1.49 |
| | Difference in layer thickness of minute portion in layer A ($\mu$m) | 0.2 | 0.12 | 0.1 | 0.3 |
| | Average difference in layer thickness between center and both ends of layer B ($\mu$m) | 2.9 | 2.9 | 2.9 | 2.9 |

TABLE 6J-continued

| | | Sample No. | | | |
|---|---|---|---|---|---|
| | | 701J | 702J | 703J | 704J |
| Difference in layer thickness of minute portion in layer B (μm) | | 0.51 | 0.44 | 0.41 | 0.61 |

TABLE 7J

| | Starting gas | Gas flow rate (SCCM) | Discharging power (W) | Deposition rate (Å/sec) | Layer thickness (μ) |
|---|---|---|---|---|---|
| First layer | $H_2$ | 300 | 100 | 10 | 3 |
| | $GeH_4$ | 100 → 0 | | | |
| | $SiH_4$ | 0 → 100 | | | |
| | $B_2H_6/H_2$ | 100 | | | |
| | (= 3000 vol ppm) | $GeH_4 + SiH_4 = 100$ | | | |
| | $CH_4$ | 10 → 0 | | | |
| Second layer | $H_2$ | 300 | 300 | 24 | 20 |
| | $SiH_4$ | 300 | | | |

TABLE 8J

| | | Sample No. | | | |
|---|---|---|---|---|---|
| | | 1001J | 1002J | 1003J | 1004J |
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving layer | Average difference in layer thickness between center and both ends of first layer (μm) | 1 | 1 | 1 | 1 |
| | Difference in layer thickness of minute portion in first layer (μm) | 0.2 | 0.15 | 0.1 | 0.25 |
| | Average difference in layer thickness between center and both ends of second layer (μm) | 3 | 3 | 3 | 3 |
| | Difference in layer thickness of minute portion in second layer (μm) | 0.55 | 0.4 | 0.3 | 0.6 |

TABLE 9J

| Layer constitution | | Starting gas | Gas flow rate (SCCM) | Discharging power (W) | Deposition rate (Å/sec) | Layer thickness (μ) |
|---|---|---|---|---|---|---|
| First layer | | $H_2$ | 300 | 100 | 10 | 3 |
| | | $GeH_4$ | 50 → 0 | | | |
| | | $SiH_4$ | 50 → 100 | | | |
| | | $B_2H_6/H_2$ | 50 | | | |
| | | (= 3000 vol ppm) | $GeH_4 + SiH_4 = 100$ | | | |
| | | NO | 10 → * | | | |
| Second layer | Layer A | $H_2$ | 300 | 100 | 8 | 5 |
| | | $SiH_4$ | 100 | | | |
| | | $B_2H_6/H_2$ | 100 | | | |
| | | (= 3000 vol ppm) | | | | |
| | | NO | * → ** | | | |
| | Layer B | $H_2$ | 300 | 300 | 24 | 20 |
| | | $SiH_4$ | 300 | | | |
| | | NO | ** → 0 | | | |

TABLE 10J

| | | Sample No. | | | |
|---|---|---|---|---|---|
| | | 1301J | 1302J | 1303J | 1304J |
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light | Average difference in layer thickness between center and both | 0.12 | 0.12 | 0.12 | 0.12 |

TABLE 10J-continued

|  |  | Sample No. | | | |
|---|---|---|---|---|---|
|  |  | 1301J | 1302J | 1303J | 1304J |
| receiving layer | ends of first layer (μm) Difference in layer thickness of minute portion in first layer (μm) | 0.05 | 0.04 | 0.03 | 0.06 |
|  | Second layer — Average difference in layer thickness between center and both ends of layer A (μm) | 1.5 | 1.5 | 1.5 | 1.5 |
|  | Difference in layer thickness of minute portion in layer A (μm) | 0.2 | 0.12 | 0.1 | 0.3 |
|  | Average difference in layer thickness between center and both ends of layer B (μm) | 3 | 3 | 3 | 3 |
|  | Difference in layer thickness of minute portion in layer B (μm) | 0.55 | 0.4 | 0.4 | 0.6 |

TABLE 11J

| Layer constitution | | Starting gas | Gas flow rate (SCCM) | Discharging power (W) | Deposition rate (Å/Sec) | Layer thickness (μ) |
|---|---|---|---|---|---|---|
| First layer | | $H_2$ | 300 | 100 | 10 | 3 |
| | | $GeH_4$ | 50 → 0 | | | |
| | | $SiH_4$ | 50 → 100 | | | |
| | | | $GeH_4 + SiH_4 = 100$ | | | |
| | | $NH_3$ | 10 → * | | | |
| Second layer | Layer A | $H_2$ | 300 | 100 | 8 | 5 |
| | | $SiH_4$ | 100 | | | |
| | | $B_2H_6/H_2$ (= 3000 vol ppm) | 100 | | | |
| | | $NH_3$ | * → ** | | | |
| | Layer B | $H_2$ | 300 | 300 | 24 | 20 |
| | | $SiH_4$ | 300 | | | |
| | | $NH_3$ | ** → 0 | | | |

TABLE 12J

|  |  | Sample No. | | | |
|---|---|---|---|---|---|
|  |  | 1401J | 1402J | 1403J | 1404J |
| Surface structure of Al substrate | Pitch (μm) | 50 | 40 | 25 | 10 |
|  | Depth (μm) | 2.1 | 1.7 | 0.8 | 0.6 |
|  | Angle (degree) | 5.0 | 4.8 | 3.7 | 6.8 |
| Thickness of light receiving layer | Average difference in layer thickness between center and both ends of first layer (μm) | 0.12 | 0.12 | 0.12 | 0.12 |
|  | Difference in layer thickness of minute portion in first layer (μm) | 0.05 | 0.04 | 0.03 | 0.06 |
|  | Second layer — Average difference in layer thickness between center and both ends of layer A (μm) | 1.5 | 1.5 | 1.5 | 1.5 |
|  | Difference in layer thickness of minute portion in layer A (μm) | 0.2 | 0.12 | 0.1 | 0.3 |
|  | Average difference in layer thickness between center and both ends of layer B (μm) | 3 | 3 | 3 | 3 |
|  | Difference in layer thickness of minute portion in layer B (μm) | 0.55 | 0.4 | 0.39 | 0.6 |

TABLE 13J

| Layer constitution | | Starting gas | Gas flow rate (SCCM) | Discharging power (W) | Deposition rate (Å/Sec) | Layer thickness (μ) |
|---|---|---|---|---|---|---|
| First layer | Layer A | $H_2$ | 300 | 100 | 10 | 1.5 |
| | | $GeH_4$ | 100 → 50 | | | |
| | | $SiH_4$ | 0 → 50 | | | |
| | | $B_2H_6/H_2$ (= 3000 vol ppm) | 100 | | | |
| | | $CH_4$ | 10 → * | | | |
| | Layer | $H_2$ | 300 | 100 | 10 | 1.5 |

TABLE 13J-continued

| Layer constitution | Starting gas | Gas flow rate (SCCM) | Discharging power (W) | Deposition rate (Å/Sec) | Layer thickness (μ) |
|---|---|---|---|---|---|
| B | GeH₄ | 50 → 0 | | | |
| | SiH₄ | 50 → 100 | | | |
| | CH₄ | * → ** | | | |
| Second layer | H₂ | 300 | 300 | 24 | 20 |
| | SiH₄ | 300 | | | |
| | CH₄ | ** → 0 | | | |

TABLE 14J

| | | Sample No. | | | |
|---|---|---|---|---|---|
| | | 1501J | 1502J | 1503J | 1504J |
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving layer | First layer Average difference in layer thickness between center and both ends of layer A (μm) | 0.2 | 0.2 | 0.2 | 0.2 |
| | Difference in layer thickness of minute portion in layer A (μm) | 0.1 | 0.1 | 0.1 | 0.12 |
| | Average difference in layer thickness between center and both ends of layer B (μm) | 0.22 | 0.22 | 0.22 | 0.22 |
| | Difference in layer thickness of minute portion in layer B (μm) | 0.11 | 0.1 | 0.1 | 0.13 |
| | Average difference in layer thickness between center and both ends of second layer (μm) | 3 | 3 | 3 | 3 |
| | Difference in layer thickness of minute portion in second layer (μm) | 0.55 | 0.4 | 0.39 | 0.6 |

TABLE 2K

| | Starting gas | Gas flow rate (SCCM) | Discharging power (W) | Deposition rate (Å/sec) | Layer thickness (μ) |
|---|---|---|---|---|---|
| First layer | H₂ | 300 | 100 | 10 | 1 |
| | GeH₄ | 100 | | | |
| | SiH₄ | 100 | | | |
| | B₂H₆/H₂ (= 3000 vol ppm) | B₂H₆/(GeH₄ + SiH₄) = 3/100 → 0 | | | |
| | NO | 12 | | | |
| Second layer | H₂ | 300 | 300 | 24 | 20 |
| | SiH₄ | 300 | | | |

TABLE 3K

| | Starting gas | Gas flow rate (SCCM) | Discharging power (W) | Deposition rate (Å/sec) | Layer thickness (μ) |
|---|---|---|---|---|---|
| First layer | H₂ | 300 | 100 | 14 | 3 |
| | SiH₄ | 50 | | | |
| | GeH₄ | 100 | | | |
| | B₂H₆/H₂ (= 3000 vol ppm) | B₂H₆/(GeH₄ + SiH₄) = 5/100 → 0 | | | |
| | NH₃ | 10 | | | |
| Second layer | H₂ | 300 | 300 | 24 | 20 |
| | SiH₄ | 300 | | | |
| | NH₃ | 10 | | | |

TABLE 4K

| | Starting gas | Gas flow rate (SCCM) | Discharging power (W) | Deposition rate (Å/sec) | Layer thickness (μ) |
|---|---|---|---|---|---|
| First layer | H₂ | 300 | 100 | 12 | 5 |
| | SiH₄ | 100 | | | |
| | GeH₄ | 50 | | | |

TABLE 4K-continued

| | Starting gas | Gas flow rate (SCCM) | Discharging power (W) | Deposition rate (Å/sec) | Layer thickness (μ) |
|---|---|---|---|---|---|
| | $B_2H_6/H_2$ (= 3000 vol ppm) | $B_2H_6/$ $(GeH_4 + SiH_4) =$ $1/100 \rightarrow 0$ | | | |
| | $CH_4$ | 15 | | | |
| Second | $H_2$ | 300 | 300 | 24 | 20 |
| layer | $SiH_4$ | 300 | | | |

TABLE 5K

| | Starting gas | Gas flow rate (SCCM) | Discharging power (W) | Deposition rate (Å/sec) | Layer thickness (μ) |
|---|---|---|---|---|---|
| First | $H_2$ | 300 | 100 | 8 | 7 |
| layer | $SiH_4$ | 135 | | | |
| | $GeH_4$ | 15 | | | |
| | $B_2H_6/H_2$ (= 3000 vol ppm) | $B_2H_6/$ $(GeH_4 + SiH_4) =$ $1/100 \rightarrow 0$ | | | |
| | NO | 15 | | | |
| Second | $H_2$ | 300 | 300 | 24 | 20 |
| layer | $SiH_4$ | 300 | | | |
| | NO | 15 | | | |

TABLE 6K

| Layer constitution | | Starting gas | Gas flow rate (SCCM) | Discharging power (W) | Deposition rate (Å/sec) | Layer thickness (μ) |
|---|---|---|---|---|---|---|
| First layer | | $H_2$ | 300 | 100 | 10 | 2 |
| | | $GeH_4$ | 50 | | | |
| | | $SiH_4$ | 50 | | | |
| | | $B_2H_6/H_2$ (= 3000 vol ppm) | $100 \rightarrow 110$ | | | |
| | | $NH_3$ | $10 \rightarrow 0$ | | | |
| Second layer | Layer A | $H_2$ | 300 | 100 | 10 | 3 |
| | | $SiH_4$ | 100 | | | |
| | | $B_2H_6/H_2$ (= 3000 vol ppm) | $110 \rightarrow 0$ | | | |
| | Layer B | $H_2$ | 300 | 300 | 24 | 20 |
| | | $SiH_4$ | 300 | | | |

TABLE 7K

| | | | Sample No. | | | |
|---|---|---|---|---|---|---|
| | | | 701K | 702K | 703K | 704K |
| Surface structure of Al substrate | | Pitch (μm) | 50 | 40 | 25 | 10 |
| | | Depth (μm) | 2.1 | 1.7 | 0.8 | 0.6 |
| | | Angle (degree) | 5.0 | 4.8 | 3.7 | 6.8 |
| Thickness of light receiving layer | | Average difference in layer thickness between center and both ends of first layer (μm) | 0.2 | 0.2 | 0.2 | 0.2 |
| | | Difference in layer thickness of minute portion in first layer (μm) | 0.12 | 0.11 | 0.1 | 0.14 |
| | Second layer | Average difference in layer thickness between center and both ends of layer A (μm) | 0.4 | 0.4 | 0.4 | 0.4 |
| | | Difference in layer thickness of minute portion in layer A (μm) | 0.17 | 0.15 | 0.13 | 0.18 |
| | | Average difference in layer thickness between center and both ends of layer B (μm) | 3.2 | 3.2 | 3.2 | 3.2 |
| | | Difference in layer thickness of minute portion in layer B (μm) | 0.6 | 0.55 | 0.5 | 0.7 |

TABLE 8K

| Layer constitution | | Starting gas | Gas flow rate (SCCM) | Discharging power (W) | Deposition rate (Å/sec) | Layer thickness ($\mu$) |
|---|---|---|---|---|---|---|
| First layer | Layer A | $H_2$ | 300 | 100 | 10 | 2 |
| | | $GeH_4$ | 50 | | | |
| | | $SiH_4$ | 50 | | | |
| | | $B_2H_6/H_2$ (= 3000 vol ppm) | 100 | | | |
| | | $CH_4$ | 10 → 0 | | | |
| | Layer B | $H_2$ | 300 | 100 | 10 | 2 |
| | | $GeH_4$ | 50 | | | |
| | | $SiH_4$ | 50 | | | |
| Second layer | | $H_2$ | 300 | 300 | 24 | 20 |
| | | $SiH_4$ | 300 | | | |

TABLE 9K

| | | Sample No. | | | |
|---|---|---|---|---|---|
| | | 1001K | 1002K | 1003K | 1004K |
| Surface structure of Al substrate | Pitch ($\mu$m) | 50 | 40 | 25 | 10 |
| | Depth ($\mu$m) | 2.1 | 1.7 | 0.8 | 0.6 |
| | Angle (degree) | 5.0 | 4.8 | 3.7 | 6.8 |
| Thickness of light receiving layer | First layer Average difference in layer thickness between center and both ends of layer A ($\mu$m) | 0.2 | 0.2 | 0.2 | 0.2 |
| | Difference in layer thickness of minute portion in layer A ($\mu$m) | 0.13 | 0.11 | 0.1 | 0.15 |
| | Average difference in layer thickness between center and both ends of layer B ($\mu$m) | 0.2 | 0.2 | 0.2 | 0.2 |
| | Difference in layer thickness of minute portion in layer B ($\mu$m) | 0.13 | 0.12 | 0.11 | 0.14 |
| | Average difference in layer thickness between center and both ends of second layer ($\mu$m) | 3 | 3 | 3 | 3 |
| | Difference in layer thickness of minute portion in second layer ($\mu$m) | 0.5 | 0.44 | 0.4 | 0.6 |

TABLE 10K

| Layer constitution | | Starting gas | Gas flow rate (SCCM) | Discharging power (W) | Deposition rate (Å/Sec) | Layer thickness ($\mu$) |
|---|---|---|---|---|---|---|
| First layer | Layer A | $H_2$ | 300 | 100 | 10 | 2 |
| | | $GeH_4$ | 50 | | | |
| | | $SiH_4$ | 50 | | | |
| | | NO | 10 → * | | | |
| | Layer B | $H_2$ | 300 | 100 | 10 | 2 |
| | | $GeH_4$ | 50 | | | |
| | | $SiH_4$ | 50 | | | |
| | | $B_2H_6/H_2$ (= 3000 vol ppm) | 100 | | | |
| | | NO | * → ** | | | |
| Second layer | | $H_2$ | 300 | 300 | 24 | 20 |
| | | $SiH_4$ | 300 | | | |
| | | NO | ** → 0 | | | |

TABLE 11K

| | | No. | | | |
|---|---|---|---|---|---|
| | | 1301K | 1302K | 1303K | 1304K |
| Surface structure of Al substrate | Pitch ($\mu$m) | 50 | 40 | 25 | 10 |
| | Depth ($\mu$m) | 2.1 | 1.7 | 0.8 | 0.6 |
| | Angle (degree) | 5.0 | 4.8 | 3.7 | 6.8 |
| Thickness of light receiving layer | First layer Average difference in layer thickness between center and both ends of layer A ($\mu$m) | 0.2 | 0.2 | 0.2 | 0.2 |
| | Difference in layer thickness of minute portion in layer A ($\mu$m) | 0.11 | 0.11 | 0.1 | 0.13 |
| | Average difference in layer thickness between center and | 0.21 | 0.21 | 0.21 | 0.21 |

TABLE 11K-continued

| | | No. | | | |
|---|---|---|---|---|---|
| | | 1301K | 1302K | 1303K | 1304K |
| | both ends of layer B (μm) | | | | |
| | Difference in layer thickness of minute portion in layer B (μm) | 0.13 | 0.12 | 0.11 | 0.14 |
| | Average difference in layer thickness between center and both ends of second layer (μm) | 3 | 3 | 3 | 3 |
| | Difference in layer thickness of minute portion in second layer (μm) | 0.4 | 0.35 | 0.3 | 0.5 |

TABLE 12K

| Layer constitution | | Starting gas | Gas flow rate (SCCM) | Discharging power (W) | Deposition rate (Å/Sec) | Layer thickness (μ) |
|---|---|---|---|---|---|---|
| First layer | | $H_2$ | 300 | 100 | 10 | 2 |
| | | $GeH_4$ | 50 | | | |
| | | $SiH_4$ | 50 | | | |
| | | $B_2H_6/H_2$ (= 3000 vol ppm) | 100 → 110 | | | |
| | | $NH_3$ | 10 → * | | | |
| Second layer | Layer A | $H_2$ | 300 | 100 | 8 | 3 |
| | | $GeH_4$ | 50 | | | |
| | | $SiH_4$ | 50 | | | |
| | | $B_2H_6/H_2$ (= 3000 vol ppm) | 100 | | | |
| | | $NH_3$ | * → ** | | | |
| | Layer B | $H_2$ | 300 | 300 | 24 | 20 |
| | | $SiH_4$ | 300 | | | |
| | | $NH_3$ | ** → 0 | | | |

TABLE 13K

| | | No. | | | |
|---|---|---|---|---|---|
| | | 1601K | 1602K | 1603K | 1604K |
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving layer | Average difference in layer thickness between center and both ends of first layer (μm) | 0.2 | 0.2 | 0.2 | 0.2 |
| | Difference in layer thickness of minute portion in first layer (μm) | 0.12 | 0.11 | 0.1 | 0.14 |
| | Second layer: Average difference in layer thickness between center and both ends of layer A (μm) | 0.4 | 0.4 | 0.4 | 0.4 |
| | Difference in layer thickness of minute portion in layer A (μm) | 0.17 | 0.15 | 0.13 | 0.18 |
| | Average difference in layer thickness between center and both ends of layer B (μm) | 3.2 | 3.2 | 3.2 | 3.2 |
| | Difference in layer thickness of minute portion in layer B (μm) | 0.6 | 0.55 | 0.5 | 0.7 |

TABLE 1L

| | Starting gas | Gas flow rate (SCCM) | Discharging power (W) | Deposition rate (Å/sec) | Layer thickness (μ) |
|---|---|---|---|---|---|
| First layer | $H_2$ | 300 | 100 | 9 | 3 |
| | $GeH_4$ | 100 → 0 | | | |
| | $SiH_4$ | 0 → 100 | | | |
| | | $GeH_4 + SiH_4 = 100$ | | | |
| | $B_2H_6/H_2$ (= 3000 vol ppm) | 150 → 0 | | | |
| | NO | 12 | | | |
| Second layer | $H_2$ | 300 | 300 | 24 | 20 |
| | $SiH_4$ | 300 | | | |

TABLE 2L

| | | Sample No. | | | |
|---|---|---|---|---|---|
| | | 101L | 102L | 103L | 104L |
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving layer | Average difference in layer thickness between center and both ends (μm) | 3.2 | 3.2 | 3.2 | 3.2 |
| | Difference in layer thickness of minute portion (μm) | 0.51 | 0.44 | 0.41 | 0.61 |

TABLE 3L

| | | Sample No. | | | |
|---|---|---|---|---|---|
| | | 201L | 202L | 203L | 204L |
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving layer | Average difference in layer thickness between center and both ends (μm) | 3.2 | 3.2 | 3.2 | 3.2 |
| | Difference in layer thickness of minute portion (μm) | 0.45 | 0.42 | 0.39 | 0.50 |

TABLE 4L

| | Starting gas | Gas flow rate (SCCM) | Discharging power (W) | Deposition rate (Å/sec) | Layer thickness (μ) |
|---|---|---|---|---|---|
| First layer | H$_2$ | 300 | 100 | 9 | 3 |
| | GeH$_4$ | 50 → 0 | | | |
| | SiH$_4$ | 50 → 100 | | | |
| | | GeH$_4$ + SiH$_4$ = 100 | | | |
| | B$_2$H$_6$/H$_2$ (= 3000 vol ppm) | 50 → 0 | | | |
| | NH$_3$ | 12 | | | |
| Second layer | H$_2$ | 300 | 300 | 24 | 20 |
| | SiH$_4$ | 300 | | | |
| | NH$_3$ | 12 | | | |

TABLE 5L

| | | Sample No. | | | |
|---|---|---|---|---|---|
| | | 301L | 302L | 303L | 304L |
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving layer | Average difference in layer thickness between center and both ends (μm) | 3.2 | 3.2 | 3.2 | 3.2 |
| | Difference in layer thickness of minute portion (μm) | 0.42 | 0.40 | 0.38 | 0.48 |

TABLE 6L

| | | Sample No. | | | |
|---|---|---|---|---|---|
| | | 401L | 402L | 403L | 404L |
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving layer | Average difference in layer thickness between center and both ends (μm) | 3.2 | 3.2 | 3.2 | 3.2 |
| | Difference in layer thickness of minute portion (μm) | 0.40 | 0.38 | 0.36 | 0.45 |

TABLE 7L

| Layer constitution | | Starting gas | Gas flow rate (SCCM) | Discharging power (W) | Deposition rate (Å/sec) | Layer thickness (μ) |
|---|---|---|---|---|---|---|
| First layer | | H$_2$ | 300 | 100 | 10 | 2 |
| | | GeH$_4$ | 50 → 0 | | | |
| | | SiH$_4$ | 50 → 100 | | | |
| | | CH$_4$ | 15 | | | |
| Second layer | Layer A | H$_2$ | 300 | 100 | 10 | 3 |
| | | SiH$_4$ | 100 | | | |
| | | B$_2$H$_6$/H$_2$ (= 3000 vol ppm) | 100 → 0 | | | |
| | Layer B | H$_2$ | 300 | 300 | 24 | 20 |
| | | SiH$_4$ | 300 | | | |

TABLE 8L

| | | Sample No. | | | |
|---|---|---|---|---|---|
| | | 501L | 502L | 503L | 504L |
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving | Average difference in layer thickness between center and both ends of first layer (μm) | 0.2 | 0.2 | 0.2 | 0.2 |

TABLE 8L-continued

| | | Sample No. | | | |
|---|---|---|---|---|---|
| | | 501L | 502L | 503L | 504L |
| layer | Difference in layer thickness of minute portion in first layer (μm) | 0.13 | 0.11 | 0.1 | 0.2 |
| | Second layer Average difference in layer thickness between center and both ends of layer A (μm) | 0.4 | 0.4 | 0.4 | 0.4 |
| | Difference in layer thickness of minute portion in layer A (μm) | 0.13 | 0.12 | 0.11 | 0.2 |
| | Average difference in layer thickness between center and both ends of layer B (μm) | 3 | 3 | 3 | 3 |
| | Difference in layer thickness of minute portion in layer B (μm) | 0.6 | 0.5 | 0.4 | 0.7 |

TABLE 9L

| Layer constitution | | Starting gas | Gas flow rate (SCCM) | Discharging power (W) | Deposition rate (Å/sec) | Layer thickness (μ) |
|---|---|---|---|---|---|---|
| First layer | | $H_2$ | 300 | 100 | 10 | 2 |
| | | $GeH_4$ | 50 → 0 | | | |
| | | $SiH_4$ | 50 → 100 | | | |
| | | $B_2H_6/H_2$ (= 3000 vol ppm) | 100 | | | |
| | | NO | 10 | | | |
| Second layer | Layer A | $H_2$ | 300 | 100 | 10 | 3 |
| | | $SiH_4$ | 100 | | | |
| | | $B_2H_6/H_2$ (= 3000 vol ppm) | 100 → 0 | | | |
| | | NO | 10 | | | |
| | Layer B | $H_2$ | 300 | 300 | 24 | 20 |
| | | $SiH_4$ | 300 | | | |
| | | NO | 10 | | | |

TABLE 10L

| | | Sample No. | | | |
|---|---|---|---|---|---|
| | | 601L | 602L | 603L | 604L |
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving layer | Average difference in layer thickness between center and both ends of first layer (μm) | 0.2 | 0.2 | 0.2 | 0.2 |
| | Difference in layer thickness of minute portion in first layer (μm) | 0.14 | 0.12 | 0.1 | 0.16 |
| | Second layer Average difference in layer thickness between center and both ends of layer A (μm) | 0.3 | 0.3 | 0.3 | 0.3 |
| | Difference in layer thickness of minute portion in layer A (μm) | 0.2 | 0.14 | 0.13 | 0.21 |
| | Average difference in layer thickness between center and both ends of layer B (μm) | 3 | 3 | 3 | 3 |
| | Difference in layer thickness of minute portion in layer B (μm) | 0.57 | 0.4 | 0.3 | 0.6 |

TABLE 11L

| Layer constitution | | Starting gas | Gas flow rate (SCCM) | Discharging power (W) | Deposition rate (Å/Sec) | Layer thickness (μ) |
|---|---|---|---|---|---|---|
| First layer | Layer A | $H_2$ | 300 | 100 | 10 | 2 |
| | | $GeH_4$ | 50 → 25 | | | |
| | | $SiH_4$ | 50 → 75 | | | |
| | | $B_2H_6/H_2$ (= 3000 vol ppm) | 100 → 0 | | | |
| | | $NH_3$ | 10 | | | |
| | Layer | $H_2$ | 300 | 100 | 10 | 2 |

TABLE 11L-continued

| Layer constitution | Starting gas | Gas flow rate (SCCM) | Discharging power (W) | Deposition rate (Å/Sec) | Layer thickness (μ) |
|---|---|---|---|---|---|
| B | GeH$_4$ | 25 → 0 | | | |
| | SiH$_4$ | 75 → 100 | | | |
| | NH$_3$ | 10 | | | |
| Second layer | H$_2$ | 300 | 300 | 24 | 20 |
| | SiH$_4$ | 300 | | | |

TABLE 12L

| | | Sample No. | | | |
|---|---|---|---|---|---|
| | | 701L | 702L | 703L | 704L |
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving layer | First layer Average difference in layer thickness between center and both ends of layer A (μm) | 0.2 | 0.2 | 0.2 | 0.2 |
| | Difference in layer thickness of minute portion in layer A (μm) | 0.1 | 0.1 | 0.1 | 0.12 |
| | Average difference in layer thickness between center and both ends of layer B (μm) | 0.22 | 0.22 | 0.22 | 0.22 |
| | Difference in layer thickness of minute portion in layer B (μm) | 0.11 | 0.1 | 0.1 | 0.13 |
| | Average difference in layer thickness between center and both ends of second layer (μm) | 3 | 3 | 3 | 3 |
| | Difference in layer thickness of minute portion in second layer (μm) | 0.55 | 0.4 | 0.39 | 0.6 |

TABLE 13L

| Layer constitution | | Starting gas | Gas flow rate (SCCM) | Discharging power (W) | Deposition rate (Å/Sec) | Layer thickness (μ) |
|---|---|---|---|---|---|---|
| First layer | | H$_2$ | 300 | 100 | 10 | 2 |
| | | GeH$_4$ | 50 → 0 | | | |
| | | SiH$_4$ | 50 → 100 | | | |
| | | B$_2$H$_6$/H$_2$ (= 3000 vol ppm) | 150 → 110 | | | |
| | | NH$_3$ | 10 → 0 | | | |
| Second layer | Layer A | H$_2$ | 300 | 100 | 10 | 3 |
| | | SiH$_4$ | 100 | | | |
| | | B$_2$H$_6$/H$_2$ (= 3000 vol ppm) | 110 → 0 | | | |
| | Layer B | H$_2$ | 300 | 300 | 24 | 20 |
| | | SiH$_4$ | 300 | | | |

TABLE 14L

| | | Sample No. | | | |
|---|---|---|---|---|---|
| | | 1401L | 1402L | 1403L | 1404L |
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving layer | Average difference in layer thickness between center and both ends of first layer (μm) | 0.2 | 0.2 | 0.2 | 0.2 |
| | Difference in layer thickness of minute portion in first layer (μm) | 0.12 | 0.11 | 0.1 | 0.14 |
| | Second layer Average difference in layer thickness between center and both ends of layer A (μm) | 0.4 | 0.4 | 0.4 | 0.4 |
| | Difference in layer thickness of minute portion in layer A (μm) | 0.17 | 0.15 | 0.13 | 0.18 |
| | Average difference in layer thickness between center and both ends of layer B (μm) | 3.2 | 3.2 | 3.2 | 3.2 |

TABLE 14L-continued

| | | Sample No. | | | |
|---|---|---|---|---|---|
| | | 1401L | 1402L | 1403L | 1404L |
| | Difference in layer thickness of minute portion in layer B (μm) | 0.6 | 0.55 | 0.5 | 0.7 |

TABLE 15L

| Layer constitution | | Starting gas | Gas flow rate (SCCM) | Discharging power (W) | Deposition rate (Å/Sec) | Layer thickness (μ) |
|---|---|---|---|---|---|---|
| First layer | Layer A | $H_2$ | 300 | 100 | 10 | 2 |
| | | $GeH_4$ | 50 → * | | | |
| | | $SiH_4$ | 50 → ** | | | |
| | | $B_2H_6/H_2$ (= 3000 vol ppm) | 100 → 0 | | | |
| | | $CH_4$ | 10 → 0 | | | |
| | Layer B | $H_2$ | 300 | 100 | 10 | 2 |
| | | $GeH_4$ | * → 0 | | | |
| | | $SiH_4$ | ** → 100 | | | |
| Second layer | | $H_2$ | 300 | 300 | 24 | 20 |
| | | $SiH_4$ | 300 | | | |

TABLE 16L

| | | | Sample No. | | | |
|---|---|---|---|---|---|---|
| | | | 1701L | 1702L | 1703L | 1704L |
| Surface structure of Al substrate | Pitch (μm) | | 50 | 40 | 25 | 10 |
| | Depth (μm) | | 2.1 | 1.7 | 0.8 | 0.6 |
| | Angle (degree) | | 5.0 | 4.8 | 3.7 | 6.8 |
| Thickness of light receiving layer | First layer | Average difference in layer thickness between center and both ends of layer A (μm) | 0.2 | 0.2 | 0.2 | 0.2 |
| | | Difference in layer thickness of minute portion in layer A (μm) | 0.13 | 0.11 | 0.1 | 0.15 |
| | | Average difference in layer thickness between center and both ends of layer B (μm) | 0.2 | 0.2 | 0.2 | 0.2 |
| | | Difference in layer thickness of minute portion in layer B (μm) | 0.13 | 0.12 | 0.11 | 0.14 |
| | Average difference in layer thickness between center and both ends of second layer (μm) | | 3 | 3 | 3 | 3 |
| | Difference in layer thickness of minute portion in second layer (μm) | | 0.5 | 0.44 | 0.4 | 0.6 |

TABLE 17L

| Layer constitution | | Starting gas | Gas flow rate (SCCM) | Discharging power (W) | Deposition rate (Å/Sec) | Layer thickness (μ) |
|---|---|---|---|---|---|---|
| First layer | Layer A | $H_2$ | 300 | 100 | 10 | 2 |
| | | $GeH_4$ | 50 | | | |
| | | $SiH_4$ | 50 | | | |
| | | NO | 10 → * | | | |
| | Layer B | $H_2$ | 300 | 100 | 10 | 2 |
| | | $GeH_4$ | 50 → 0 | | | |
| | | $SiH_4$ | 50 → 100 | | | |
| | | $B_2H_6/H_2$ (= 3000 vol ppm) | 100 → 0 | | | |
| | | NO | * → ** | | | |
| Second layer | | $H_2$ | 300 | 300 | 24 | 20 |
| | | $SiH_4$ | 300 | | | |
| | | NO | ** → 0 | | | |

TABLE 18L

| | | No. | | | |
|---|---|---|---|---|---|
| | | 2001L | 2002L | 2003L | 2004L |
| Surface structure | Pitch (μm) | 50 | 40 | 25 | 10 |
| | Depth (μm) | 2.1 | 1.7 | 0.8 | 0.6 |

TABLE 18L-continued

| | | No. | | | |
|---|---|---|---|---|---|
| | | 2001L | 2002L | 2003L | 2004L |
| of Al substrate | Angle (degree) | 5.0 | 4.8 | 3.7 | 6.8 |
| Thickness of light receiving layer | First layer Average difference in layer thickness between center and both ends of layer A (μm) | 0.2 | 0.2 | 0.2 | 0.2 |
| | Difference in layer thickness of minute portion in layer A (μm) | 0.11 | 0.11 | 0.1 | 0.13 |
| | Average difference in layer thickness between center and both ends of layer B (μm) | 0.21 | 0.21 | 0.21 | 0.21 |
| | Difference in layer thickness of minute portion in layer B (μm) | 0.13 | 0.12 | 0.11 | 0.14 |
| | Average difference in layer thickness between center and both ends of second layer (μm) | 3 | 3 | 3 | 3 |
| | Difference in layer thickness of minute portion in second layer (μm) | 0.4 | 0.35 | 0.3 | 0.5 |

TABLE 19L

| Layer constitution | Starting gas | Gas flow rate (SCCM) | Discharging power (W) | Deposition rate (Å/Sec) | Layer thickness (μ) |
|---|---|---|---|---|---|
| First layer | $H_2$ | 300 | 100 | 10 | 2 |
| | $GeH_4$ | 50 | | | |
| | $SiH_4$ | 50 | | | |
| | $B_2H_6/H_2$ (= 3000 vol ppm) | 100 → (a) | | | |
| | $NH_3$ | 10 → * | | | |
| Second layer | Layer A $H_2$ | 300 | 100 | 8 | 3 |
| | $GeH_4$ | 50 → 0 | | | |
| | $SiH_4$ | 50 → 100 | | | |
| | $B_2H_6/H_2$ (= 3000 vol ppm) | (a) → 0 | | | |
| | $NH_3$ | * → ** | | | |
| | Layer B $H_2$ | 300 | 300 | 24 | 20 |
| | $SiH_4$ | 300 | | | |
| | $NH_3$ | ** → 0 | | | |

TABLE 20L

| | | No. | | | |
|---|---|---|---|---|---|
| | | 2301L | 2302L | 2303L | 2304L |
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving layer | Average difference in layer thickness between center and both ends of first layer (μm) | 0.2 | 0.2 | 0.2 | 0.2 |
| | Difference in layer thickness of minute portion in first layer (μm) | 0.12 | 0.11 | 0.1 | 0.14 |
| | Second layer Average difference in layer thickness between center and both ends of layer A (μm) | 0.4 | 0.4 | 0.4 | 0.4 |
| | Difference in layer thickness of minute portion in layer A (μm) | 0.17 | 0.15 | 0.13 | 0.18 |
| | Average difference in layer thickness between center and both ends of layer B (μm) | 3.2 | 3.2 | 3.2 | 3.2 |
| | Difference in layer thickness of minute portion in layer B (μm) | 0.6 | 0.55 | 0.5 | 0.7 |

What we claim is:

1. A light-receiving member comprising light-receiving layer of a multi-layer structure having a first layer comprising an amorphous material containing silicon atoms and germanium atoms and a second layer comprising an amorphous material containing silicon atoms and exhibiting photoconductivity provided on a substrate successively from the substrate side, said light-receiving layer having at least one pair of non-parallel interfaces within a short range and said non-parallel interfaces being arranged in a large number in at least one direction within the plane perpendicular to the layer thickness direction.

2. An electrophotographic system comprising a light-receiving member comprising a light-receiving layer of multi-layer structure having a first layer comprising an amorphous material containing silicon atoms and germanium atoms and a second layer comprising ans amorphous material containing a silicon atoms and exhibiting photoconductivity provided on a substrate successively from the substrate side, said light-receiving layer having at least one pair of non-parallel interfaces within a short range and said non-parallel interfaces being arranged in a large number in at least one direction within the plane perpendicular to the layer thickness direction.

3. The invention according to claims 1 or 2, wherein the non-parallel interfaces are arranged regularly.

4. The invention according to claims 1 or 2, wherein the non-parallel interfaces are arranged in cycles.

5. The invention member according to claims 1 or 2, wherein the short range is 0.3 to 500µ.

6. The invention member according to claims 1 or 2, wherein the non-parallel interfaces are formed on the basis of the unevenness arranged regularly provided on the surface of said substrate.

7. The invention according to claim 6, wherein the said unevenness is formed by reverse-v-shaped linear projections.

8. The invention according to claim 7, wherein the longitudinal section of said reverse-V-Shaped linear projection is substantially an isosceles triangle.

9. The invention according to claim 7, wherein the longitudinal section of said reverse-V-shaped linear projection is substantially a right triangle.

10. The invention according to claim 7, wherein the longitudinal section of said reverse-V-shaped linear projection is substantially a scalene triangle.

11. The invention according to claims 1 or 2, wherein the substrate is cylindrical.

12. The invention according to claim 11, wherein the reverse-V-shaped linear projection has a spiral structure within the plane of said substrate.

13. The invention according to claim 12, wherein the spiral structure is a multiple spiral structure.

14. The invention according to claim 7, wherein the reverse-V-shaped linear projection is divided in its edge line direction.

15. The invention according to claim 11, wherein the edge line direction of the reverse-V-shaped linear projection is along the center axis of the cylindrical substrate.

16. The invention according to claim 6, wherein the unevenness has slanted planes.

17. The invention according to claim 16, wherein the slanted planes are mirror finished.

18. The invention according to claim 6, wherein on the free surface of the light-receiving layer is formed an unevenness arranged with the same pitch as the unevenness provided on the substrate surface.

19. The invention according to claim 1, wherein the distribution state of germanium atoms in the first layer is ununiform in the layer thickness direction.

20. The invention according to claim 19, the ununiform distribution state of germanium atoms is more enriched toward the substrate side.

21. The invention according to claims 1 or 2, wherein a substance for controlling conductivity is contained in the first layer.

22. The invention according to claim 21, wherein the substance for controlling conductivity is an atom belonging to the group III or the group V of the periodic table.

23. The invention according to claims 1 or 2, wherein a substance for controlling conductivity is contained in the second layer.

24. The invention according to claim 23, wherein the substance for controlling conductivity is an atom belonging to the group III or the group V of the periodic table.

25. The invention according to claims 1 or 2, wherein the light-receiving layer has a layer region (PN) containing a substance for controlling conductivity.

26. The invention according to claim 25, the distribution state of the substance for controlling conductivity in the layer region (PN) is ununiform in the layer thickness direction.

27. The invention according to claim 25, in the distribution state of the substance for controlling conductivity in the layer region (PN) is uniform in the layer thickness direction.

28. The invention according to claim 25, wherein the substance for controlling conductivity is an atom belonging to the group III or the group V of the periodic table.

29. The invention according to claim 25, the layer region (PN) is provided in the first layer.

30. The invention according to claim 25, wherein the layer region (PN) is provided in the second layer.

31. The invention according to claim 25, the layer region (PN) is provided at the end portion on the substrate side of the light-receiving layer.

32. The invention according to claim 25, the layer region (PN) is provided over both the first layer and the second layer.

33. The invention according to claim 25, the layer region (PN) occupies a layer region in the light-receiving layer.

34. The invention according to claim 33, wherein the content of the substance for controlling conductivity in the layer region (PN) is 0.01 to $5 \times 10^4$ atomic ppm.

35. The invention according to claims 1 or 2, wherein at least one of hydrogen atoms and halogen atoms are contained in the first layer.

36. The invention according to claims 1 or 2, wherein 0.01 to 40 atomic % of hydrogen atoms are contained in the first layer.

37. The invention according to claims 1 or 2, wherein 0.01 to 40 atomic % of halogen atoms are contained in the first layer.

38. The invention according to claims 1 or 2, wherein 0.01 to 40 atomic % as a total of hydrogen atoms and halogen atoms are contained in the first layer.

39. The invention according to claims 1 or 2, wherein 1 to 40 atomic % of hydrogen atoms are contained in the second layer.

40. The invention according to claims 1 or 2, wherein 1 to 40 atomic % of halogen atoms are contained in the second layer.

41. The invention according to claims 1 or 2, wherein 1 to 40 atomic % as a total of hydrogen atoms and halogen atoms are contained in the second layer.

42. The invention according to claims 1 or 2, wherein at least one of hydrogen atoms and halogen atoms are contained in the second layer.

43. The invention according to claims 1 or 2, wherein the light-receiving layer contains at least one kind of atoms selected from oxygen atoms, carbon atoms and nitrogen atoms.

44. The invention according to claims 1 or 2, wherein the light-receiving layer has a layer region (OCN) containing at least one kind of atoms (OCN) selected from oxygen atoms, carbon atoms and nitrogen atoms.

45. The invention according to claim 44, wherein the layer region (OCN) is provided at the end portion on the substrate side of the light-receiving layer.

46. The invention according to claim 45, wherein the layer region (OCN) contains 0.001 to 50 atomic % of oxygen atoms.

47. The invention according to claim 45, wherein the layer region (OCN) contains 0.001 to 50 atomic % of carbon atoms.

48. The invention member according to claim 45, wherein the layer region (OCN) contains 0.001 to 50 atomic % of nitrogen atoms.

49. The invention according to claim 45, wherein oxygen atoms are contained in the layer region (OCN) in ununiform distribution state in the layer thickness direction.

50. The invention according to claim 45, wherein oxygen atoms are contained in the layer region (OCN) in uniform distribution state in the layer thickness direction.

51. The invention according to claim 45, wherein carbon atoms are contained in the layer region (OCN) in ununiform distribution state in the layer thickness direciton.

52. The invention according to claim 45, wherein carbon atoms are, contained in the layer region (OCN) in uniform distribution state in the layer thickness direction.

53. The invention according to claim 45, wherein nitrogen atoms are contained in the layer region (OCN) in uniform distribution state in the layer thickness direction.

54. The invention according to claim 45, wherein nitrogen atoms are contained in the layer region (OCN) in uniform disitribution state in the layer thickness direction.

55. The invention according to claims 1 or 2, wherein the first layer has a layer thickness of 30 Å to 50$\mu$.

56. The invention according to claims 1 or 2, wherein the second layer has a layer thickness of 0.5 to 90$\mu$.

57. The invention according to claims 1 or 2, wherein the light-receiving layer has a layer thickness of 1 to 100$\mu$.

58. The invention according to claims 1 or 2, wherein the layer thickness $T_B$ of the first layer and the layer thickness T of the second layer satisfy the relationship of $T_B/T \leq 1$.

59. An electrophotographic image forming process comprising;
 (a) applying a charging treatment to the light receiving member of claim 1;
 (b) irradiating the light receiving member with a laser beam carrying information to form an electrostatic latent image; and
 (c) developing said electrostatic latent image.

UNITED STATES PATENT AND TRADEMARK OFFICE
CERTIFICATE OF CORRECTION

PATENT NO. : 4,675,263
DATED : June 23, 1987
INVENTOR(S) : KEISHI SAITOH, ET AL.

Page 1 of 19

It is certified that error appears in the above-identified patent and that said Letters Patent is hereby corrected as shown below:

Title page:

AT [21] UNDER APPL. NO.

Line 1,    "709,688" should read --709,888--.

COLUMN 1

Line 3,    "A-SI:GE" should read --A-Si:Ge--.
    Line 4,    "A-SI:" should read --A-Si--,
    Line 10,    "application" should read --applications--.

COLUMN 2

Line 17,    "an" should read --a--.
    Line 39,    "$R_1$ from" should read --$R_1$ reflected from--.

COLUMN 4

Line 38,    "interferance" should read --interference--.

COLUMN 5

Line 65,    "accompnaying" should read --accompanying--.

COLUMN 6

Line 12,    "(A)]undergoes" should read --(A)] undergoes--.
    Line 17,    "lgiht" should read --light--.
    Line 38,    "exsit" should read --exist--.
    Line 62,    "$(d_5-d_6)$" should read --$(d_5-d_6)$--.

UNITED STATES PATENT AND TRADEMARK OFFICE
CERTIFICATE OF CORRECTION

PATENT NO. : 4,675,263
DATED : June 23, 1987
INVENTOR(S) : KEISHI SAITOH, ET AL.

It is certified that error appears in the above-identified patent and that said Letters Patent is hereby corrected as shown below:

COLUMN 8

Line 3, "more" should be deleted.
Line 4, "is" should read --in--.
Line 21, "an" should read --a--.
Line 47, "the all" should read --all the--.
Line 52, "now the" should read --now to the--.

COLUMN 9

Line 1, "A-" should read --"A- --.
Line 2, "Si(h,X))" should read --Si(H,X)")--.

COLUMN 10

Line 44, "stantly" should read --stant--.

COLUMN 11

Line 67, "80μ most" should read --80μ, most--.

COLUMN 13

Line 14, "so called" should read --so-called--.'
Line 45, "ion plating" should read --ion-plating--.

COLUMN 14

Line 12, "siH$_2$I$_2$," should read --SiH$_2$I$_2$,--.

COLUMN 15

Line 53, "depending on" should be deleted.

UNITED STATES PATENT AND TRADEMARK OFFICE
CERTIFICATE OF CORRECTION

PATENT NO. : 4,675,263
DATED : June 23, 1987
INVENTOR(S) : KEISHI SAITOH, ET AL.

It is certified that error appears in the above-identified patent and that said Letters Patent is hereby corrected as shown below:

COLUMN 16

Line 15, "so called" should read --so-called--.
Line 18, "condutivity" should read --conductivity--.
Line 18, "and n-type impurities and/or" should read --and/or n-type impurities and--.
Line 33, "may be" should read --may--.

COLUMN 17

Line 25, "so called" should read --so-called--.
Line 30, "so" should read --so- --.

COLUMN 18

Line 12, "constantly" should read --constant--.
Line 25, "$t_T$," should read --$t_T$.--.
Line 25, "the $t_4$" should read --the position $t_4$--.
Line 56, "in Figure," should read --in the Figure,--.
Line 61, "shown FIGS." should read --shown in FIGS.--.

COLUMN 19

Line 33, "Typical" should read --As typical--.

COLUMN 20

Line 48, "atomc" should read --atomic--.
Line 60, "under" should read --in--.
Line 60, "with" should read --of--.

UNITED STATES PATENT AND TRADEMARK OFFICE
CERTIFICATE OF CORRECTION

PATENT NO. : 4,675,263
DATED : June 23, 1987
INVENTOR(S) : KEISHI SAITOH, ET AL.

It is certified that error appears in the above-identified patent and that said Letters Patent is hereby corrected as shown below:

COLUMN 21

Line 38, "constantly" should read --constant--.

COLUMN 23

Line 49, "acetyllene" should read --acetylene--.

COLUMN 24

Line 9, "variationis" should read --variation is--.
Line 66, "points" should read --viewpoints--.

COLUMN 25

Line 39, "subsequently," should read --Subsequently,--.

COLUMN 26

Line 44, The right margin should be closed up.
Line 45, "ent and transfer to" should be deleted.

COLUMN 27

Line 15, "sane" should read --same--.
Line 31, "780μnm," should read --780nm,--.

COLUMN 31

Line 23, "fill" should read --film--.
Line 23, "undcr" should read --under--.

UNITED STATES PATENT AND TRADEMARK OFFICE
CERTIFICATE OF CORRECTION

PATENT NO. : 4,675,263  
DATED : June 23, 1987  
INVENTOR(S) : KEISHI SAITOH, ET AL.

Page 5 of 19

It is certified that error appears in the above-identified patent and that said Letters Patent is hereby corrected as shown below:

COLUMN 32

Line 6, "shbwn" should read --shown--.  
Line 8, "Thc" should read --The--.

COLUMN 33

Line 45, "outerdiareter" should read --outerdiameter--.

COLUMN 34

Line 27, "preparstion" should read --preparation--.  
Line 29, "electrophogogra-" should read --electrophotogra- --.  
Line 49, "operation" should read --operating--.

COLUMN 35

Line 27, "504)." should be deleted.  
Line 33, "a- SiGe:H:B" should read --a-SiGe:H:B--.

COLUMN 36

Line 46, "fifst" should read --first--.

COLUMN 37

Line 35, "firmed" should read --formed--.  
Line 57, "diduted" should read --diluted--.

UNITED STATES PATENT AND TRADEMARK OFFICE
CERTIFICATE OF CORRECTION

PATENT NO. : 4,675,263

DATED : June 23, 1987

INVENTOR(S) : KEISHI SAITOH, ET AL.

It is certified that error appears in the above-identified patent and that said Letters Patent is hereby corrected as shown below:

COLUMN 40

Line 8, "a-Si: type" should read --a-Si type--.
Line 23, "image The" should read --image. The--.
Line 48, "layer" should read --laser--.

COLUMN 41

Line 48, "pcwer" should read --power--.
Line 53, "monoxida" should read --monoxide--.
Line 55, "proccdure" should read --procedure--.
line 67, "euipped" should read --equipped--.

COLUMN 42

Line 6, "GeH:" should read --$GeH_4$--.
Line 20, "a" should read --an--.
Line 23, "A-SiGe:H:0" should read --A-SiGe:H:O--.
line 57, "freqeuncy" should read --frequency--.

COLUMN 43

Line 28, "substate" should read --substrate--.

COLUMN 44

Line 64, "became" should read --become--.

UNITED STATES PATENT AND TRADEMARK OFFICE
CERTIFICATE OF CORRECTION

PATENT NO. : 4,675,263
DATED : June 23, 1987
INVENTOR(S) : KEISHI SAITOH, ET AL.

It is certified that error appears in the above-identified patent and that said Letters Patent is hereby corrected as shown below:

COLUMN 45

Line 36,    "electorphotography" should read --electrophotography--.

COLUMN 46

Line 28,    "lgiht" should read --light--.
    Line 35,    "rage" should read --range--.

COLUMN 47

Line 3,    "alumonun" should read --aluminum--.
    Line 41,    "suffu-" should read --suffi- --.
    Line 67,    "cylidrical" should read --cylindrical--.

COLUMN 48

Line 21,    "photography" should be deleted.
    Line 55,    "be" should read --by--.
    Line 58,    "lightreceiving" should read --light-receiving--.

COLUMN 50

Line 38,    "fronge" should read --fringe--.

COLUMN 51

Line 36,    "a -Si:H" should read --a-Si:H--.

COLUMN 53

Line 49,    "phy a-Si:H" should read --phy of a-Si:H--.

UNITED STATES PATENT AND TRADEMARK OFFICE
CERTIFICATE OF CORRECTION

PATENT NO. : 4,675,263
DATED : June 23, 1987
INVENTOR(S) : KEISHI SAITOH, ET AL.

It is certified that error appears in the above-identified patent and that said Letters Patent is hereby corrected as shown below:

COLUMN 55

Line 38,   "gas" should read --was--.

COLUMN 58

Line 13,   "light receiving" should read --light-receiving--.
    Line 25,   "electro-photography" should read --electrophotography--.

COLUMN 60

Line 44,   "type (Sample" should read --type was prepared (Sample--.
    Line 59,   "type (Sample" should read --type was prepared (Sample--.

COLUMN 61

Line 61,   "type (Sample" should read --type was prepared (Sample--.

COLUMN 62

Line 8,    "type (Sample" should read --type was prepared (Sample--.
    Line 54,   "type (Sample" should read --type was prepared (Sample--.

COLUMN 63

Line 1,    "type (Sample" should read --type was prepared (Sample--.

UNITED STATES PATENT AND TRADEMARK OFFICE
CERTIFICATE OF CORRECTION

PATENT NO. : 4,675,263
DATED : June 23, 1987
INVENTOR(S) : KEISHI SAITOH, ET AL.

It is certified that error appears in the above-identified patent and that said Letters Patent is hereby corrected as shown below:

COLUMN 64

Line 12, "b" should be deleted.
Line 42, "Example" should read --Examples--.

COLUMN 66

Line 30, "type." should read --type was prepared.--.
Line 45, "type." should read --type was prepared.--.
Line 65, "FOG. 60" should read --FIG. 60--.

COLUMN 67

Line 1, "$B_2H_6H_2$" should read --$B_2H_6/H_2$--.
Line 19, "type" should read --type was prepared (Sample Nos. 801K-804K).--.
Line 33, "type (Sample " should read --type was prepared (Sample--.

COLUMN 68

Line 9, "type (Sample" should read --type was prepared (Sample--.
Line 24, "type (Sample" should read --type was prepared (Sample--.

COLUMN 69

Line 1, "type (Sample" should read --type was prepared (Sample--.
Line 15, "gas a" should read --gas, a--.
Line 16, "type (Sample" should read --type was prepared (Sample--.

UNITED STATES PATENT AND TRADEMARK OFFICE
CERTIFICATE OF CORRECTION

PATENT NO. : 4,675,263
DATED : June 23, 1987
INVENTOR(S) : KEISHI SAITOH, ET AL.

It is certified that error appears in the above-identified patent and that said Letters Patent is hereby corrected as shown below:

COLUMN 69

Line 23, "inferference" should read --interference--.
Line 61, "type (Sample" should read --type was prepared (Sample--.

COLUMN 70

Line 8, "type (Sample" should read --type was prepared (Sample--.

COLUMN 71

Line 9, "thicknews" should read --thickness--.

COLUMN 73

Line 24, "type (Sample" should read --type was prepared (Sample--.
Line 39, "type (Sample" should read --type was prepared (Sample--.
line 54, "type (Sample" should read --type was prepared (Sample--.

COLUMN 74

Line 1, "type (Sample" should read --type was prepared (Sample--.
Line 16, "type (Sample" should read --type was prepared (Sample--.
line 31, "type (Sample" should read --type was prepared (Sample--.

UNITED STATES PATENT AND TRADEMARK OFFICE
CERTIFICATE OF CORRECTION

PATENT NO. : 4,675,263

DATED : June 23, 1987

INVENTOR(S) : KEISHI SAITOH, ET AL.

It is certified that error appears in the above-identified patent and that said Letters Patent is hereby corrected as shown below:

COLUMN 75

Line 8, "type (Sample" should read --type was prepared (Sample--.

Line 23, "type (Sample" should read --type was prepared (Sample--.

line 67, "type (Sample" should read --type was prepared (Sample--.

COLUMN 76

Line 14, "type (Sample" should read --type was prepared (Sample--.

Line 59, "type (Sample" should read --type was prepared (Sample--.

COLUMN 77

Line 6, "type (Sample" should read --type was prepared (Sample--.

Line 50, "type (Sample" should read --type was prepared (Sample--.

line 65, "type (Sample" should read --type was prepared (Sample--.

COLUMN 78

Line 15, "Example" should read --Examples--.

UNITED STATES PATENT AND TRADEMARK OFFICE
CERTIFICATE OF CORRECTION

PATENT NO. : 4,675,263

DATED : June 23, 1987

INVENTOR(S) : KEISHI SAITOH, ET AL.

It is certified that error appears in the above-identified patent and that said Letters Patent is hereby corrected as shown below:

COLUMN 84

TABLE 9C, "$H_2$ $SiH_4$ $GeH_4$" should read --$H_2$ $Si_2H_6$ $GeH_4$--.

COLUMN 93

TABLE 28C, "Thickness of light receiving" should read --Thickness of light receiving layer--.

COLUMN 96

TABLE 5D, "(μM)" should read --(μm)--.

COLUMN 97

TABLE 5D, cont., "on layer B" should read --in layer B--.

COLUMN 99

TABLE 10D, "(μM)" should read --(μm)--.
TABLE 10D, "on layer B" should read --in layer B--.
TABLE 12D, "(μM)" should read --(μm)--.
TABLE 12D, "on layer B" should read --in layer B--.

UNITED STATES PATENT AND TRADEMARK OFFICE
CERTIFICATE OF CORRECTION

PATENT NO. : 4,675,263
DATED : June 23, 1987
INVENTOR(S) : KEISHI SAITOH, ET AL.

It is certified that error appears in the above-identified patent and that said Letters Patent is hereby corrected as shown below:

COLUMN 108

TABLE 2F, cont.,  " Practically very good"
                    Practically excellent should read -- ○ Practically very good--.
      ◉ Practically excellent

COLUMN 109

TABLE 3F, cont.,  " Practically very good"
                    Practically excellent should read -- ○ Practically very good--.
      ◉ Practically excellent TABLE 5F, "X X ◉ ◉ ◉ ◉ Δ X" should read
         --X X ○ ◉ ◉ ◉ Δ X--.

TABLE 5F,    " Practically very good"
              Practically excellent should read -- ○ Practically very good--.
      ◉ Practically excellent

UNITED STATES PATENT AND TRADEMARK OFFICE
CERTIFICATE OF CORRECTION

PATENT NO. : 4,675,263
DATED : June 23, 1987
INVENTOR(S) : KEISHI SAITOH, ET AL.

It is certified that error appears in the above-identified patent and that said Letters Patent is hereby corrected as shown below:

COLUMN 110

TABLE 7F, cont., " Practically very good"
  Practically excellent should read

-- ○ Practically very good--.
  ⊚ Practically excellent

TABLE 9F, cont., " Practically very good"
  Practically excellent should read

-- ○ Practically very good--.
  ⊚ Practically excellent

COLUMN 111

TABLE 11F, cont., "X X ○ ○ ⊚ ⊚ Δ X" should read
  --X X ○ ⊚ ⊚ ⊚ Δ X--.

TABLE 11F cont., " Practically very good"
  Practically excellent should read

-- ○ Practically very good--.
  ⊚ Practically excellent

UNITED STATES PATENT AND TRADEMARK OFFICE
CERTIFICATE OF CORRECTION

PATENT NO. : 4,675,263
DATED : June 23, 1987
INVENTOR(S) : KEISHI SAITOH, ET AL.

It is certified that error appears in the above-identified patent and that said Letters Patent is hereby corrected as shown below:

COLUMN 111

TABLE 12F,   " Practically very good"
                  Practically excellent should read -- ○ Practically very good --.
          ◉ Practically excellent TABLE 13F,   " Practically very good"
                  Practically excellent should read -- ○ Practically very good --.
          ◉ Practically excellent TABLE 15F,   " Practically very good"
                  Practically excellent should read -- ○ Practically very good --.
          ◉ Practically excellent

COLUMN 113

TABLE 17F,   "electrophoto" should read --electrophoto- --.
    TABLE 17F,   " Practically very good"
                  Practically excellent should read -- ○ Practically very good --.
          ◉ Practically excellent

UNITED STATES PATENT AND TRADEMARK OFFICE
CERTIFICATE OF CORRECTION

PATENT NO. : 4,675,263
DATED : June 23, 1987
INVENTOR(S) : KEISHI SAITOH, ET AL.

It is certified that error appears in the above-identified patent and that said Letters Patent is hereby corrected as shown below:

COLUMN 113

TABLE 19F, "X X O ⊚ ⊚ ⊚ Δ X" should read
--X X O O ⊚ ⊚ Δ X--.

TABLE 19F, " Practically very good"
Practically excellent should read

-- O Practically very good--.
⊚ Practically excellent

TABLE 21F, " Practically very good"
Practically excellent should read

-- O Practically very good--.
⊚ Practically excellent

COLUMN 115

TABLE 23F, "(Sample No. 2203F)" should read --(Sample No. 2202F)--.

COLUMN 119

TABLE 7G, "50 → 0" should read --50 → 0--.
50 → 0"                      50 → 100

UNITED STATES PATENT AND TRADEMARK OFFICE
CERTIFICATE OF CORRECTION

PATENT NO. : 4,675,263
DATED : June 23, 1987
INVENTOR(S) : KEISHI SAITOH, ET AL.

It is certified that error appears in the above-identified patent and that said Letters Patent is hereby corrected as shown below:

COLUMN 121

TABLE 1H, "100    9    3" should read --100    9    3--.
         100    9    3

COLUMN 133

TABLE 14I, "difference on layer" should read --difference in layer--.

COLUMN 144

TABLE 4J, "    8    5" should read --100    8    5--.

COLUMN 151

TABLE 4K cont., "$GeH_4 + SiH_4) =$" should read --$(GeH_4 + SiH_4) =$--.

COLUMN 165

TABLE 19L, As a part of the table, --Note: The symbol (a) represents continuity of change in the gas flow rate-- should be inserted.

COLUMN 167

Line 5,   "multi-layer" should read --a multi-layer--.
Line 7,   "ans" should read --an--.
Line 8,   "a" should be deleted.
Line 19,  "member" should be deleted.
Line 21,  "member" should be deleted.

UNITED STATES PATENT AND TRADEMARK OFFICE
CERTIFICATE OF CORRECTION

PATENT NO. : 4,675,263
DATED : June 23, 1987
INVENTOR(S) : KEISHI SAITOH, ET AL.

It is certified that error appears in the above-identified patent and that said Letters Patent is hereby corrected as shown below:

COLUMN 167

Line 26, "reverse-v-shaped" should read --reverse-V-shaped--.
Line 29, "reverse-V-Shaped" should read --reverse-V-shaped--.
Line 63, "19, the" should read --19, wherein the--.

COLUMN 168

Line 15, "25, the" should read --25, wherein the--.
Line 19, "25, in" should read --25, wherein--.
Line 27, "25, the" should read --25, wherein the--.
Line 31, "25, the" should read --25, wherein the--.
Line 34, "25, the" should read --25, wherein the--.
Line 37, "25, the" should read --25, wherein the--.

COLUMN 169

Line 17, "member" should be deleted.
Line 31, "direciton." should read --direction--.

UNITED STATES PATENT AND TRADEMARK OFFICE
CERTIFICATE OF CORRECTION

PATENT NO. : 4,675,263
DATED : June 23, 1987
INVENTOR(S) : KEISHI SAITOH, ET AL.

It is certified that error appears in the above-identified patent and that said Letters Patent is hereby corrected as shown below:

COLUMN 170

Line 2, "are, contained" should read --are contained--.
Line 7, "uniform" should read --ununiform--.
Line 11, "disitribution" should read --distribution--.
Line 23, "TB/T≦1." should read --$T_B/T \leq 1$.--.
Line 25, "comprising;" should read --comprising:--.

Signed and Sealed this

Ninth Day of February, 1988

Attest:

DONALD J. QUIGG

Attesting Officer   Commissioner of Patents and Trademarks